US011658035B2

(12) United States Patent
Lee et al.

(10) Patent No.: US 11,658,035 B2
(45) Date of Patent: May 23, 2023

(54) SUBSTRATE PROCESSING METHOD

(71) Applicant: ASM IP Holding B.V., Almere (NL)

(72) Inventors: SeungHyun Lee, Tama (JP); Hyunchul Kim, Hwaseong-si (KR); SeungWoo Choi, Hwaseong-si (KR); YeaHyun Gu, Hwaseong-si (KR)

(73) Assignee: ASM IP Holding B.V., Versterkerstraat (NL)

( * ) Notice: Subject to any disclaimer, the term of this patent is extended or adjusted under 35 U.S.C. 154(b) by 0 days.

(21) Appl. No.: 17/358,860

(22) Filed: Jun. 25, 2021

(65) Prior Publication Data

US 2021/0407813 A1 Dec. 30, 2021

Related U.S. Application Data

(60) Provisional application No. 63/046,511, filed on Jun. 30, 2020.

(51) Int. Cl.

| | |
|---|---|
| ***H01L 21/3065*** | (2006.01) |
| ***H01L 21/308*** | (2006.01) |
| ***H01J 37/305*** | (2006.01) |

(52) U.S. Cl.

CPC ...... *H01L 21/3065* (2013.01); *H01J 37/3053* (2013.01); *H01L 21/308* (2013.01)

(58) Field of Classification Search

None

See application file for complete search history.

(56) References Cited

U.S. PATENT DOCUMENTS

| | | | |
|---|---|---|---|
| D30,036 | S | 1/1899 | Rhind |
| D31,889 | S | 11/1899 | Gill |
| D56,051 | S | 8/1920 | Cohn |
| 2,059,480 | A | 11/1936 | Obermaier |
| 2,161,626 | A | 6/1939 | Loughner et al. |
| 2,240,163 | A | 4/1941 | Pick |
| 2,266,416 | A | 12/1941 | Duclos |
| 2,280,778 | A | 4/1942 | Andersen |
| D142,841 | S | 11/1945 | D'Algodt |
| 2,410,420 | A | 11/1946 | Bennett |
| 2,441,253 | A | 5/1948 | Sarver |
| 2,480,557 | A | 8/1949 | Cummins |

(Continued)

FOREIGN PATENT DOCUMENTS

| | | |
|---|---|---|
| AT | 520629 | 6/2019 |
| CN | 1186873 | 7/1998 |

(Continued)

OTHER PUBLICATIONS

CNIPA; Office Action dated Jan. 10, 2013 in Application No. 201080015699.9.

(Continued)

*Primary Examiner* — Allan W. Olsen
(74) *Attorney, Agent, or Firm* — Snell & Wilmer L.L.P.

(57) ABSTRACT

A substrate processing method capable of improving etch selectivity without increasing the power includes: forming a first thin film on a structure; forming a material layer having wet etch resistance greater than that of the first thin film on the first thin film; removing a portion of the material layer using wet etching to expose a portion of the first thin film; and removing the exposed portion of the first thin film.

22 Claims, 8 Drawing Sheets

(56) References Cited

U.S. PATENT DOCUMENTS

| | | | |
|---|---|---|---|
| 2,563,931 | A | 8/1951 | Harrison |
| 2,660,061 | A | 11/1953 | Lewis |
| 2,745,640 | A | 5/1956 | Cushman |
| 2,847,320 | A | 8/1958 | Bulloff |
| 2,990,045 | A | 6/1961 | Root |
| 3,038,951 | A | 6/1962 | Mead |
| 3,089,507 | A | 5/1963 | Drake et al. |
| 3,094,396 | A | 6/1963 | Flugge et al. |
| 3,197,682 | A | 7/1965 | Klass et al. |
| 3,232,437 | A | 2/1966 | Hultgren |
| 3,263,502 | A | 8/1966 | Springfield |
| 3,332,286 | A | 7/1967 | Strong |
| 3,410,349 | A | 11/1968 | Troutman |
| 3,420,622 | A | 1/1969 | Donges et al. |
| 3,588,192 | A | 6/1971 | Drutchas et al. |
| 3,634,740 | A | 1/1972 | Stevko |
| 3,647,387 | A | 3/1972 | Benson |
| 3,647,716 | A | 3/1972 | Koches |
| 3,713,899 | A | 1/1973 | Sebestyen |
| 3,718,429 | A | 2/1973 | Williamson |
| 3,796,182 | A | 3/1974 | Rosler |
| 3,814,128 | A | 6/1974 | Grantham |
| 3,833,492 | A | 9/1974 | Bollyky |
| 3,854,443 | A | 12/1974 | Baerg |
| 3,862,397 | A | 1/1975 | Anderson et al. |
| 3,867,205 | A | 2/1975 | Schley |
| 3,885,504 | A | 5/1975 | Baermann |
| 3,887,790 | A | 6/1975 | Ferguson |
| 3,904,371 | A | 9/1975 | Neti |
| 3,913,058 | A | 10/1975 | Nishio et al. |
| 3,913,617 | A | 10/1975 | van Laar |
| 3,916,270 | A | 10/1975 | Wachtler et al. |
| 3,947,685 | A | 3/1976 | Meinel |
| 3,960,559 | A | 6/1976 | Suzuki |
| 3,962,004 | A | 6/1976 | Sonneborn |
| 3,983,401 | A | 9/1976 | Livesay |
| 3,997,638 | A | 12/1976 | Manning et al. |
| 4,048,110 | A | 9/1977 | Vanderspurt |
| 4,054,071 | A | 10/1977 | Patejak |
| 4,058,430 | A | 11/1977 | Suntola et al. |
| 4,079,944 | A | 3/1978 | Durley et al. |
| 4,093,491 | A | 6/1978 | Whelpton et al. |
| 4,099,041 | A | 7/1978 | Berkman et al. |
| D249,341 | S | 9/1978 | Mertz |
| 4,126,027 | A | 11/1978 | Smith et al. |
| 4,134,425 | A | 1/1979 | Gussefeld et al. |
| 4,145,699 | A | 3/1979 | Hu et al. |
| 4,149,237 | A | 4/1979 | Freitas |
| 4,152,760 | A | 5/1979 | Freitas et al. |
| 4,157,751 | A | 6/1979 | Grundken et al. |
| 4,164,959 | A | 8/1979 | Wurzburger |
| 4,176,630 | A | 12/1979 | Elmer |
| 4,179,530 | A | 12/1979 | Koppl et al. |
| 4,181,330 | A | 1/1980 | Kojima |
| 4,184,188 | A | 1/1980 | Briglia |
| 4,194,536 | A | 3/1980 | Stine et al. |
| 4,217,463 | A | 8/1980 | Swearingen |
| 4,229,064 | A | 10/1980 | Vetter et al. |
| 4,234,449 | A | 11/1980 | Wolson et al. |
| 4,241,000 | A | 12/1980 | McCauley et al. |
| 4,314,763 | A | 2/1982 | Steigmeier et al. |
| 4,322,592 | A | 3/1982 | Martin |
| 4,324,611 | A | 4/1982 | Vogel et al. |
| 4,333,735 | A | 6/1982 | Hardy |
| 4,355,912 | A | 10/1982 | Haak |
| 4,384,918 | A | 5/1983 | Abe |
| 4,389,973 | A | 6/1983 | Suntola et al. |
| D269,850 | S | 7/1983 | Preisler et al. |
| 4,393,013 | A | 7/1983 | McMenamin |
| 4,401,507 | A | 8/1983 | Engle |
| 4,412,133 | A | 10/1983 | Eckes et al. |
| 4,413,022 | A | 11/1983 | Suntola et al. |
| 4,414,492 | A | 11/1983 | Hanlet |
| 4,436,674 | A | 3/1984 | McMenamin |
| 4,444,990 | A | 4/1984 | Villar |
| D274,122 | S | 6/1984 | Stahel et al. |
| 4,454,370 | A | 6/1984 | Voznick |
| 4,455,193 | A | 6/1984 | Jeuch et al. |
| 4,465,716 | A | 8/1984 | Baber et al. |
| 4,466,766 | A | 8/1984 | Geren et al. |
| 4,479,831 | A | 10/1984 | Sandow |
| 4,480,284 | A | 10/1984 | Tojo et al. |
| 4,481,300 | A | 11/1984 | Hartnett et al. |
| 4,484,061 | A | 11/1984 | Zelinka et al. |
| 4,488,506 | A | 12/1984 | Heinecke et al. |
| 4,495,024 | A | 1/1985 | Bok |
| 4,496,828 | A | 1/1985 | Kusmierz et al. |
| 4,499,354 | A | 2/1985 | Hill et al. |
| 4,502,094 | A | 2/1985 | Lewin et al. |
| 4,504,439 | A | 3/1985 | Elter et al. |
| 4,512,113 | A | 4/1985 | Budinger |
| 4,512,841 | A | 4/1985 | Cunningham et al. |
| 4,520,116 | A | 5/1985 | Gentilman et al. |
| 4,520,421 | A | 5/1985 | Sakitani et al. |
| 4,527,005 | A | 7/1985 | McKelvey et al. |
| 4,534,816 | A | 8/1985 | Chen et al. |
| 4,535,628 | A | 8/1985 | Hope |
| 4,537,001 | A | 8/1985 | Uppstrom |
| 4,548,688 | A | 10/1985 | Mathews |
| 4,551,192 | A | 11/1985 | Di Milia et al. |
| 4,554,611 | A | 11/1985 | Lewin |
| 4,560,590 | A | 12/1985 | Bok |
| 4,570,328 | A | 2/1986 | Price et al. |
| 4,575,408 | A | 3/1986 | Bok |
| 4,575,636 | A | 3/1986 | Caprari |
| 4,578,560 | A | 3/1986 | Tanaka et al. |
| 4,579,080 | A | 4/1986 | Martin et al. |
| 4,579,378 | A | 4/1986 | Snyders |
| 4,579,623 | A | 4/1986 | Suzuki et al. |
| 4,581,520 | A | 4/1986 | Vu et al. |
| 4,590,326 | A | 5/1986 | Woldy |
| 4,611,966 | A | 9/1986 | Johnson |
| 4,620,998 | A | 11/1986 | Lalvani |
| 4,622,918 | A | 11/1986 | Bok |
| 4,624,728 | A | 11/1986 | Bithell et al. |
| D288,556 | S | 3/1987 | Wallgren |
| 4,653,541 | A | 3/1987 | Oehlschlaeger et al. |
| 4,654,226 | A | 3/1987 | Jackson et al. |
| 4,655,592 | A | 4/1987 | Allemand |
| 4,662,987 | A | 5/1987 | Bok |
| 4,664,769 | A | 5/1987 | Cuomo et al. |
| 4,670,126 | A | 6/1987 | Messer et al. |
| 4,681,134 | A | 7/1987 | Paris |
| 4,693,211 | A | 9/1987 | Ogami et al. |
| 4,700,089 | A | 10/1987 | Fujii et al. |
| 4,707,815 | A | 11/1987 | Yamasaki |
| 4,717,461 | A | 1/1988 | Strahl et al. |
| 4,718,637 | A | 1/1988 | Contin |
| 4,720,362 | A | 1/1988 | Gentilman et al. |
| 4,720,407 | A | 1/1988 | Sculke |
| 4,721,533 | A | 1/1988 | Phillippi et al. |
| 4,721,534 | A | 1/1988 | Phillippi et al. |
| 4,722,298 | A | 2/1988 | Rubin et al. |
| 4,724,272 | A | 2/1988 | Raniere et al. |
| 4,725,204 | A | 2/1988 | Powell |
| 4,735,259 | A | 4/1988 | Vincent |
| 4,738,618 | A | 4/1988 | Massey et al. |
| 4,738,748 | A | 4/1988 | Kisa |
| 4,747,367 | A | 5/1988 | Posa |
| 4,749,416 | A | 6/1988 | Greenspan |
| 4,750,520 | A | 6/1988 | Heim et al. |
| 4,753,192 | A | 6/1988 | Goldsmith et al. |
| 4,753,856 | A | 6/1988 | Haluska et al. |
| 4,756,794 | A | 7/1988 | Yoder |
| 4,764,076 | A | 8/1988 | Layman et al. |
| 4,770,590 | A | 9/1988 | Hugues et al. |
| 4,771,015 | A | 9/1988 | Kanai |
| 4,775,281 | A | 10/1988 | Prentakis |
| 4,776,744 | A | 10/1988 | Stonestreet et al. |
| 4,780,169 | A | 10/1988 | Stark et al. |
| 4,781,511 | A | 11/1988 | Harada et al. |
| 4,789,294 | A | 12/1988 | Sato et al. |
| 4,790,258 | A | 12/1988 | Drage et al. |
| 4,802,441 | A | 2/1989 | Waugh |

(56) References Cited

U.S. PATENT DOCUMENTS 4,804,086 A 2/1989 Grohrock
4,808,387 A 2/1989 Datta et al.
4,812,201 A 3/1989 Sakai et al.
4,812,217 A 3/1989 George et al.
4,821,674 A 4/1989 deBoer et al.
4,827,430 A 5/1989 Aid et al.
4,828,224 A 5/1989 Crabb et al.
4,830,515 A 5/1989 Cortes
4,837,113 A 6/1989 Luttmer et al.
4,837,185 A 6/1989 Yau et al.
4,854,263 A 8/1989 Chang et al.
4,854,266 A 8/1989 Simson et al.
4,857,137 A 8/1989 Tachi et al.
4,857,382 A 8/1989 Liu et al.
4,858,557 A 8/1989 Pozzetti et al.
4,863,374 A 9/1989 Vukovich
4,867,629 A 9/1989 Iwasawa et al.
4,871,523 A 10/1989 Datta et al.
4,874,273 A 10/1989 Tokisue et al.
4,880,982 A 11/1989 Hoksaas
4,882,199 A 11/1989 Sadoway et al.
4,886,162 A 12/1989 Ambrogio
4,916,091 A 4/1990 Freeman et al.
4,917,556 A 4/1990 Stark et al.
4,920,918 A 5/1990 Adams et al.
4,925,388 A 5/1990 Iseki et al.
4,931,135 A 6/1990 Horiuchi et al.
4,934,831 A 6/1990 Volbrecht
4,938,815 A 7/1990 McNeilly
D309,702 S 8/1990 Hall
4,949,671 A 8/1990 Davis et al.
4,949,848 A 8/1990 Kos
4,950,624 A 8/1990 Inuzima et al.
4,956,538 A 9/1990 Moslehi
4,958,061 A 9/1990 Wakabayashi et al.
D311,126 S 10/1990 Crowley
4,962,063 A 10/1990 Maydan et al.
4,963,506 A 10/1990 Liaw et al.
4,976,996 A 12/1990 Monkowski et al.
4,978,567 A 12/1990 Miller
4,984,904 A 1/1991 Nakano et al.
4,985,114 A 1/1991 Okudaira
4,986,215 A 1/1991 Yamada
4,987,102 A 1/1991 Nguyen et al.
4,987,856 A 1/1991 Hey
4,989,992 A 2/1991 Piai
4,991,614 A 2/1991 Hammel
5,002,632 A 3/1991 Loewenstein et al.
5,013,691 A 5/1991 Lory et al.
5,022,961 A 6/1991 Izumi et al.
5,027,746 A 7/1991 Frijlink
5,028,366 A 7/1991 Harakal et al.
D320,148 S 9/1991 Andrews
5,049,029 A 9/1991 Mitsui et al.
5,053,247 A 10/1991 Moore
5,057,436 A 10/1991 Ball
5,060,322 A 10/1991 Delepine
5,061,083 A 10/1991 Grimm et al.
5,062,386 A 11/1991 Christensen
5,064,337 A 11/1991 Asakawa et al.
5,065,698 A 11/1991 Koike
5,067,437 A 11/1991 Watanabe et al.
5,069,591 A 12/1991 Kinoshita
5,071,258 A 12/1991 Usher et al.
5,074,017 A 12/1991 Toya et al.
5,082,517 A 1/1992 Moslehi
5,084,126 A 1/1992 McKee
5,088,444 A 2/1992 Ohmine et al.
5,097,890 A 3/1992 Nakao
5,098,638 A 3/1992 Sawada
5,098,865 A 3/1992 Machado
5,104,514 A 4/1992 Quartarone
5,107,170 A 4/1992 Ishikawa et al.
5,108,192 A 4/1992 Mailliet et al.
5,110,407 A 5/1992 Ono et al.
5,114,683 A 5/1992 Hirase
5,116,018 A 5/1992 Friemoth et al.
5,117,121 A 5/1992 Watanabe et al.
D327,534 S 6/1992 Manville
5,119,760 A 6/1992 McMillan et al.
5,124,272 A 6/1992 Saito et al.
5,125,358 A 6/1992 Ueda et al.
5,125,710 A 6/1992 Gianelo
5,130,003 A 7/1992 Conrad
5,134,965 A 8/1992 Tokuda et al.
5,137,286 A 8/1992 Whitford
5,151,296 A 9/1992 Tokunaga
5,154,301 A 10/1992 Kos
5,158,128 A 10/1992 Inoue et al.
D330,900 S 11/1992 Wakegijig
5,167,716 A 12/1992 Boitnott et al.
5,167,761 A 12/1992 Westendorp et al.
5,174,881 A 12/1992 Iwasaki et al.
5,176,451 A 1/1993 Sasada
5,178,639 A 1/1993 Nishi
5,178,682 A 1/1993 Tsukamoto et al.
5,180,273 A 1/1993 Sakaya et al.
5,180,435 A 1/1993 Markunas et al.
5,181,779 A 1/1993 Shia et al.
5,182,232 A 1/1993 Chhabra et al.
5,183,511 A 2/1993 Yamazaki et al.
5,186,120 A 2/1993 Ohnishi et al.
D333,606 S 3/1993 Kanemitsu et al.
5,192,717 A 3/1993 Kawakami
5,193,912 A 3/1993 Saunders
5,193,969 A 3/1993 Rush et al.
5,194,401 A 3/1993 Adams et al.
5,199,603 A 4/1993 Prescott
5,208,961 A 5/1993 Lajoie
5,213,650 A 5/1993 Wang et al.
5,219,226 A 6/1993 James
5,221,556 A 6/1993 Hawkins et al.
5,225,366 A 7/1993 Yoder
5,226,383 A 7/1993 Bhat
5,226,713 A 7/1993 Matsumura
5,226,967 A 7/1993 Chen et al.
5,228,114 A 7/1993 Suzuki
5,231,062 A 7/1993 Mathers et al.
5,232,508 A 8/1993 Arena et al.
5,234,526 A 8/1993 Chen et al.
5,242,501 A 9/1993 McDiarmid
5,242,539 A 9/1993 Kumihashi et al.
5,243,195 A 9/1993 Nishi
5,243,202 A 9/1993 Mori et al.
5,246,218 A 9/1993 Yap et al.
5,246,500 A 9/1993 Samata et al.
5,249,960 A 10/1993 Monoe
5,250,092 A 10/1993 Nakano
5,252,133 A 10/1993 Miyazaki et al.
5,252,134 A 10/1993 Stauffer
5,259,881 A 11/1993 Edwards et al.
5,261,167 A 11/1993 Sakata
5,266,526 A 11/1993 Aoyama
5,268,989 A 12/1993 Moslehi et al.
5,271,967 A 12/1993 Kramer et al.
5,273,609 A 12/1993 Moslehi
5,277,932 A 1/1994 Spencer
5,278,494 A 1/1994 Obigane
5,279,886 A 1/1994 Kawai et al.
5,279,986 A 1/1994 Maloney et al.
5,280,894 A 1/1994 Witcraft et al.
5,281,274 A 1/1994 Yoder
5,284,519 A 2/1994 Gadgil
5,288,684 A 2/1994 Yamazaki et al.
5,294,572 A 3/1994 Granneman et al.
5,294,778 A 3/1994 Carman et al.
5,295,777 A 3/1994 Hodos
5,298,089 A 3/1994 Bowe et al.
5,305,417 A 4/1994 Najm et al.
5,306,666 A 4/1994 Izumi
5,306,946 A 4/1994 Yamamoto
5,308,650 A 5/1994 Krummel et al.
5,308,788 A 5/1994 Fitch et al.
5,310,410 A 5/1994 Begin et al.

(56) References Cited

U.S. PATENT DOCUMENTS

| | | | |
|---|---|---|---|
| 5,310,456 | A | 5/1994 | Kadomura |
| 5,312,245 | A | 5/1994 | Brannen et al. |
| 5,313,061 | A | 5/1994 | Drew et al. |
| 5,314,538 | A | 5/1994 | Maeda et al. |
| 5,314,570 | A | 5/1994 | Ikegaya et al. |
| 5,315,092 | A | 5/1994 | Takahashi et al. |
| 5,320,218 | A | 6/1994 | Yamashita et al. |
| 5,326,427 | A | 7/1994 | Jerbic |
| 5,328,360 | A | 7/1994 | Yokokawa |
| 5,328,810 | A | 7/1994 | Lowrey et al. |
| 5,335,309 | A | 8/1994 | Fujii et al. |
| 5,336,327 | A | 8/1994 | Lee |
| 5,338,362 | A | 8/1994 | Imahashi |
| 5,340,261 | A | 8/1994 | Oosawa et al. |
| 5,346,961 | A | 9/1994 | Shaw et al. |
| 5,348,774 | A | 9/1994 | Golecki et al. |
| 5,350,480 | A | 9/1994 | Gray |
| 5,354,433 | A | 10/1994 | Granneman et al. |
| 5,354,580 | A | 10/1994 | Goela et al. |
| 5,356,478 | A | 10/1994 | Chen et al. |
| 5,356,672 | A | 10/1994 | Schmitt et al. |
| 5,360,269 | A | 11/1994 | Ogawa et al. |
| 5,362,328 | A | 11/1994 | Gardiner et al. |
| 5,364,667 | A | 11/1994 | Rhieu |
| D353,452 | S | 12/1994 | Groenhoff |
| 5,374,315 | A | 12/1994 | Deboer et al. |
| D354,898 | S | 1/1995 | Nagy |
| 5,378,501 | A | 1/1995 | Foster et al. |
| 5,380,367 | A | 1/1995 | Bertone |
| 5,382,311 | A | 1/1995 | Ishikawa et al. |
| 5,387,265 | A | 2/1995 | Kakizaki et al. |
| 5,388,945 | A | 2/1995 | Garric et al. |
| 5,393,577 | A | 2/1995 | Uesugi et al. |
| 5,397,395 | A | 3/1995 | Sano et al. |
| 5,403,630 | A | 4/1995 | Matsui et al. |
| 5,404,082 | A | 4/1995 | Hernandez et al. |
| 5,407,449 | A | 4/1995 | Zinger |
| 5,407,867 | A | 4/1995 | Iwasaki et al. |
| 5,413,813 | A | 5/1995 | Cruse et al. |
| 5,414,221 | A | 5/1995 | Gardner |
| 5,415,753 | A | 5/1995 | Hurwitt et al. |
| 5,418,382 | A | 5/1995 | Blackwood et al. |
| 5,421,893 | A | 6/1995 | Perlov |
| 5,422,139 | A | 6/1995 | Fischer |
| 5,423,942 | A | 6/1995 | Robbins et al. |
| 5,426,137 | A | 6/1995 | Allen |
| 5,427,824 | A | 6/1995 | Inushima et al. |
| 5,430,011 | A | 7/1995 | Tanaka et al. |
| 5,431,734 | A | 7/1995 | Chapple-Sokol et al. |
| 5,443,646 | A | 8/1995 | Yamada et al. |
| 5,443,648 | A | 8/1995 | Ohkase |
| 5,443,686 | A | 8/1995 | Jones et al. |
| 5,444,217 | A | 8/1995 | Moore |
| 5,447,294 | A | 9/1995 | Sakata et al. |
| 5,453,124 | A | 9/1995 | Moslehi et al. |
| D363,464 | S | 10/1995 | Fukasawa |
| 5,456,207 | A | 10/1995 | Gedridge et al. |
| 5,456,757 | A | 10/1995 | Aruga et al. |
| 5,461,214 | A | 10/1995 | Peck et al. |
| 5,462,899 | A | 10/1995 | Ikeda |
| 5,463,176 | A | 10/1995 | Eckert |
| 5,464,313 | A | 11/1995 | Ohsawa |
| 5,474,410 | A | 12/1995 | Ozawa et al. |
| 5,474,612 | A | 12/1995 | Sato et al. |
| 5,478,429 | A | 12/1995 | Komino et al. |
| 5,480,488 | A | 1/1996 | Bittner et al. |
| 5,480,818 | A | 1/1996 | Matsumoto et al. |
| 5,482,559 | A | 1/1996 | Imai et al. |
| 5,484,484 | A | 1/1996 | Yamaga et al. |
| 5,494,439 | A | 2/1996 | Goldstein et al. |
| 5,494,494 | A | 2/1996 | Mizuno et al. |
| 5,496,408 | A | 3/1996 | Motoda et al. |
| 5,501,740 | A | 3/1996 | Besen et al. |
| 5,503,875 | A | 4/1996 | Imai et al. |
| 5,504,042 | A | 4/1996 | Cho et al. |

| | | | |
|---|---|---|---|
| 5,510,277 | A | 4/1996 | Cunningham et al. |
| 5,512,102 | A | 4/1996 | Yamazaki |
| 5,514,439 | A | 5/1996 | Sibley |
| 5,518,549 | A | 5/1996 | Hellwig |
| 5,518,780 | A | 5/1996 | Tamor et al. |
| 5,519,234 | A | 5/1996 | Paz de Araujo |
| 5,520,743 | A | 5/1996 | Takahashi et al. |
| 5,523,616 | A | 6/1996 | Yasuhide |
| 5,527,111 | A | 6/1996 | Lysen et al. |
| 5,527,417 | A | 6/1996 | Iida et al. |
| 5,531,218 | A | 7/1996 | Krebs |
| 5,531,835 | A | 7/1996 | Fodor et al. |
| 5,537,311 | A | 7/1996 | Stevens |
| 5,540,059 | A | 7/1996 | Yokokawa |
| 5,540,821 | A | 7/1996 | Tepman |
| 5,540,898 | A | 7/1996 | Davidson |
| 5,554,557 | A | 9/1996 | Koh |
| 5,556,275 | A | 9/1996 | Sakata et al. |
| 5,558,717 | A | 9/1996 | Zhao et al. |
| 5,559,046 | A | 9/1996 | Oishi et al. |
| 5,562,383 | A | 10/1996 | Iwai et al. |
| 5,562,947 | A | 10/1996 | White et al. |
| 5,562,952 | A | 10/1996 | Nakahigashi et al. |
| 5,565,038 | A | 10/1996 | Ashley |
| 5,569,402 | A | 10/1996 | Meisser et al. |
| 5,574,247 | A | 11/1996 | Nishitani et al. |
| 5,576,629 | A | 11/1996 | Turner |
| 5,577,331 | A | 11/1996 | Suzuki |
| 5,583,736 | A | 12/1996 | Anderson et al. |
| 5,584,936 | A | 12/1996 | Pickering et al. |
| 5,584,963 | A | 12/1996 | Takahashi |
| 5,586,585 | A | 12/1996 | Bonora et al. |
| 5,589,002 | A | 12/1996 | Su |
| 5,589,110 | A | 12/1996 | Motoda et al. |
| 5,595,606 | A | 1/1997 | Fujikawa et al. |
| 5,601,641 | A | 2/1997 | Stephens |
| 5,602,060 | A | 2/1997 | Kobayashi et al. |
| 5,604,410 | A | 2/1997 | Vollkommer et al. |
| 5,611,448 | A | 3/1997 | Chen |
| 5,616,264 | A | 4/1997 | Nishi et al. |
| 5,616,947 | A | 4/1997 | Tamura |
| 5,621,982 | A | 4/1997 | Yamashita |
| 5,632,919 | A | 5/1997 | MacCracken et al. |
| 5,637,153 | A | 6/1997 | Niino et al. |
| D380,527 | S | 7/1997 | Velez |
| 5,645,646 | A | 7/1997 | Beinglass et al. |
| 5,650,013 | A | 7/1997 | Yamazaki |
| 5,650,351 | A | 7/1997 | Wu |
| 5,653,807 | A | 8/1997 | Crumbaker |
| 5,656,093 | A | 8/1997 | Burkhart et al. |
| 5,661,263 | A | 8/1997 | Salvaggio |
| 5,662,470 | A | 9/1997 | Huussen et al. |
| 5,663,899 | A | 9/1997 | Zvonar et al. |
| 5,665,608 | A | 9/1997 | Chapple-Sokol et al. |
| 5,667,592 | A | 9/1997 | Boitnott et al. |
| 5,670,786 | A | 9/1997 | Meyer et al. |
| 5,679,215 | A | 10/1997 | Barnes et al. |
| 5,681,779 | A | 10/1997 | Pasch et al. |
| D386,076 | S | 11/1997 | Moore |
| 5,683,517 | A | 11/1997 | Shan |
| 5,683,561 | A | 11/1997 | Hollars et al. |
| 5,685,912 | A | 11/1997 | Nishizaka |
| 5,685,914 | A | 11/1997 | Hills et al. |
| 5,690,742 | A | 11/1997 | Ogata et al. |
| 5,695,567 | A | 12/1997 | Kordina |
| 5,697,706 | A | 12/1997 | Ciaravino et al. |
| 5,698,036 | A | 12/1997 | Ishii et al. |
| 5,700,729 | A | 12/1997 | Lee et al. |
| 5,708,825 | A | 1/1998 | Sotomayor |
| 5,709,745 | A | 1/1998 | Larkin et al. |
| 5,711,811 | A | 1/1998 | Suntola et al. |
| 5,716,133 | A | 2/1998 | Hosokawa et al. |
| 5,718,574 | A | 2/1998 | Shimazu |
| 5,720,927 | A | 2/1998 | Cripe et al. |
| D392,855 | S | 3/1998 | Pillow |
| 5,724,748 | A | 3/1998 | Brooks |
| 5,728,223 | A | 3/1998 | Murakami et al. |
| 5,728,425 | A | 3/1998 | Ebe et al. |
| 5,730,801 | A | 3/1998 | Tepman et al. |

(56) References Cited

U.S. PATENT DOCUMENTS 5,730,802 A 3/1998 Ishizumi et al.
5,732,597 A 3/1998 Devenyi
5,732,744 A 3/1998 Barr et al.
5,732,957 A 3/1998 Yu
5,736,314 A 4/1998 Hayes et al.
5,753,835 A 5/1998 Gustin
5,754,390 A 5/1998 Sandhu et al.
5,759,281 A 6/1998 Gurary et al.
5,761,328 A 6/1998 Solberg et al.
5,766,365 A 6/1998 Umutoy et al.
5,768,125 A 6/1998 Zinger et al.
5,769,952 A 6/1998 Komino
5,775,889 A 7/1998 Kobayashi et al.
5,777,838 A 7/1998 Tamagawa et al.
5,779,203 A 7/1998 Edlinger
5,781,693 A 7/1998 Ballance et al.
5,782,979 A 7/1998 Kaneno
5,790,750 A 8/1998 Anderson
5,791,782 A 8/1998 Wooten et al.
5,792,272 A 8/1998 Van Os et al.
5,796,074 A 8/1998 Edelstein et al.
5,801,104 A 9/1998 Schuegraf et al.
5,801,945 A 9/1998 Comer
5,804,505 A 9/1998 Yamada et al.
5,806,980 A 9/1998 Berrian
5,813,851 A 9/1998 Nakao
5,818,716 A 10/1998 Chin et al.
5,819,092 A 10/1998 Ferguson et al.
5,819,434 A 10/1998 Herchen et al.
5,820,366 A 10/1998 Lee
5,820,685 A 10/1998 Kurihra et al.
5,820,686 A 10/1998 Moore
5,826,129 A 10/1998 Hasebe et al.
5,827,420 A 10/1998 Shirazi et al.
5,827,435 A 10/1998 Samukawa
5,827,757 A 10/1998 Robinson et al.
5,836,483 A 11/1998 Disel
5,837,058 A 11/1998 Chen et al.
5,837,320 A 11/1998 Hampden-Smith et al.
5,844,683 A 12/1998 Pavloski et al.
5,846,332 A 12/1998 Zhao et al.
5,851,293 A 12/1998 Lane et al.
5,851,294 A 12/1998 Young et al.
5,851,299 A 12/1998 Cheng et al.
5,852,445 A 12/1998 Yoshikawa et al.
5,852,879 A 12/1998 Schumaier
5,853,484 A 12/1998 Jeong
D403,949 S 1/1999 Nakamura
D404,370 S 1/1999 Kimura
D404,372 S 1/1999 Ishii
5,855,680 A 1/1999 Soininen et al.
5,855,681 A 1/1999 Maydan et al.
5,855,687 A 1/1999 DuBois et al.
5,855,726 A 1/1999 Soraoka et al.
5,857,777 A 1/1999 Schuh
5,861,233 A 1/1999 Sekine et al.
5,862,302 A 1/1999 Okase
5,863,123 A 1/1999 Lee et al.
5,865,205 A 2/1999 Wilmer
5,866,795 A 2/1999 Wang et al.
5,871,586 A 2/1999 Crawley et al.
5,872,065 A 2/1999 Sivaramakrishnan
5,873,942 A 2/1999 Park
5,877,095 A 3/1999 Tamura et al.
5,879,128 A 3/1999 Tietz et al.
5,879,459 A 3/1999 Gadgil et al.
5,880,980 A 3/1999 Rothacher et al.
5,882,165 A 3/1999 Maydan et al.
5,884,640 A 3/1999 Fishkin et al.
5,888,304 A 3/1999 Umotoy et al.
5,891,251 A 4/1999 MacLeish et al.
5,893,741 A 4/1999 Huang
5,897,348 A 4/1999 Wu
5,897,378 A 4/1999 Eriguchi
5,897,379 A 4/1999 Ulrich et al.
5,897,710 A 4/1999 Sato et al.
D409,894 S 5/1999 McClurg
5,904,170 A 5/1999 Harvey et al.
D411,516 S 6/1999 Imafuku et al.
5,908,672 A 6/1999 Ryu
5,915,200 A 6/1999 Tokumasu et al.
5,915,562 A 6/1999 Nyseth et al.
5,916,365 A 6/1999 Sherman
D412,270 S 7/1999 Fredrickson
5,920,798 A 7/1999 Higuchi et al.
5,928,426 A 7/1999 Aitchison
D412,512 S 8/1999 Boisvert
5,937,142 A 8/1999 Moslehi et al.
5,937,323 A 8/1999 Orczyk et al.
5,939,886 A 8/1999 Turner et al.
5,947,718 A 9/1999 Weaver
5,950,327 A 9/1999 Peterson et al.
5,950,925 A 9/1999 Fukunaga et al.
5,954,375 A 9/1999 Trickle et al.
5,961,775 A 10/1999 Fujimura
5,968,275 A 10/1999 Lee et al.
5,970,621 A 10/1999 Bazydola
5,972,196 A 10/1999 Murphy et al.
5,975,492 A 11/1999 Brenes
5,976,973 A 11/1999 Ohira et al.
5,979,506 A 11/1999 Aarseth
5,982,931 A 11/1999 Ishimaru
5,984,391 A 11/1999 Vanderpot et al.
5,987,480 A 11/1999 Donohue et al.
5,989,342 A 11/1999 Ikeda et al.
5,992,453 A 11/1999 Zimmer
5,997,588 A 12/1999 Goodwin
5,997,768 A 12/1999 Scully
5,998,870 A 12/1999 Lee et al.
6,000,732 A 12/1999 Scheier et al.
6,001,183 A 12/1999 Gurary et al.
6,001,267 A 12/1999 Van Os et al.
6,004,204 A 12/1999 Luxton et al.
D419,652 S 1/2000 Hall et al.
6,013,553 A 1/2000 Wallace
6,013,920 A 1/2000 Gordon et al.
6,014,677 A 1/2000 Hayashi et al.
6,015,459 A 1/2000 Jamison et al.
6,015,465 A 1/2000 Kholodenko et al.
6,017,779 A 1/2000 Miyasaka
6,017,818 A 1/2000 Lu
6,022,180 A 2/2000 Motoyama et al.
6,022,802 A 2/2000 Jang
6,024,799 A 2/2000 Chen et al.
6,025,117 A 2/2000 Nakano et al.
6,027,163 A 2/2000 Longenecker et al.
6,029,602 A 2/2000 Bhatnagar
6,030,900 A 2/2000 Grassl et al.
6,033,215 A 3/2000 Ohsawa
6,035,101 A 3/2000 Sajoto et al.
6,035,804 A 3/2000 Arami et al.
6,039,809 A 3/2000 Toyama et al.
6,042,652 A 3/2000 Hyun
6,044,860 A 4/2000 Neu
6,045,260 A 4/2000 Schwartz et al.
6,048,154 A 4/2000 Wytman
6,050,506 A 4/2000 Guo et al.
6,053,982 A 4/2000 Halpin et al.
6,053,983 A 4/2000 Saeki et al.
6,054,013 A 4/2000 Collins et al.
6,054,678 A 4/2000 Miyazaki
6,060,691 A 5/2000 Minami et al.
6,060,721 A 5/2000 Huang
6,063,196 A 5/2000 Li et al.
6,066,204 A 5/2000 Haven
6,068,441 A 5/2000 Raaijmakers et al.
6,071,572 A 6/2000 Mosely et al.
6,072,163 A 6/2000 Armstrong et al.
6,073,973 A 6/2000 Boscaljon et al.
6,074,154 A 6/2000 Ueda et al.
6,074,443 A 6/2000 Venkatesh
6,074,514 A 6/2000 Bjorkman et al.
6,077,027 A 6/2000 Kawamura et al.
6,079,356 A 6/2000 Umotoy et al.

(56) References Cited

U.S. PATENT DOCUMENTS

| | | | |
|---|---|---|---|
| 6,079,927 | A | 6/2000 | Muka |
| 6,083,321 | A | 7/2000 | Lei et al. |
| 6,086,677 | A | 7/2000 | Umotoy et al. |
| 6,090,212 | A | 7/2000 | Mahawili |
| 6,090,442 | A | 7/2000 | Klaus et al. |
| 6,090,659 | A | 7/2000 | Laibowitz et al. |
| 6,091,062 | A | 7/2000 | Pfahnl et al. |
| 6,093,252 | A | 7/2000 | Wengert et al. |
| 6,093,253 | A | 7/2000 | Lofgren |
| 6,093,611 | A | 7/2000 | Gardner et al. |
| 6,095,083 | A | 8/2000 | Rice et al. |
| 6,096,133 | A | 8/2000 | Yuuki et al. |
| 6,096,267 | A | 8/2000 | Kishkovich |
| 6,099,302 | A | 8/2000 | Hong et al. |
| 6,099,649 | A | 8/2000 | Schmitt et al. |
| 6,099,651 | A | 8/2000 | Sajoto et al. |
| 6,102,565 | A | 8/2000 | Kita et al. |
| 6,104,002 | A | 8/2000 | Hirose et al. |
| 6,104,011 | A | 8/2000 | Juliano |
| 6,104,401 | A | 8/2000 | Parsons |
| 6,106,625 | A | 8/2000 | Koai et al. |
| 6,106,678 | A | 8/2000 | Shufflebotham |
| 6,110,531 | A | 8/2000 | Paz de Araujo et al. |
| 6,113,703 | A | 9/2000 | Anderson et al. |
| 6,119,710 | A | 9/2000 | Brown |
| 6,121,061 | A | 9/2000 | Van Bilsen et al. |
| 6,121,158 | A | 9/2000 | Benchikha et al. |
| 6,122,036 | A | 9/2000 | Yamasaki et al. |
| 6,124,600 | A | 9/2000 | Moroishi et al. |
| 6,125,789 | A | 10/2000 | Gupta et al. |
| 6,126,744 | A | 10/2000 | Hawkins et al. |
| 6,126,848 | A | 10/2000 | Li et al. |
| 6,127,249 | A | 10/2000 | Hu |
| 6,129,044 | A | 10/2000 | Zhao et al. |
| 6,129,546 | A | 10/2000 | Sada |
| 6,132,207 | A | 10/2000 | Stoutjesdijk |
| 6,134,807 | A | 10/2000 | Komino |
| 6,135,460 | A | 10/2000 | Wise et al. |
| 6,137,240 | A | 10/2000 | Bogdan |
| 6,139,239 | A | 10/2000 | Snijders |
| 6,139,983 | A | 10/2000 | Ohashi et al. |
| 6,140,252 | A | 10/2000 | Cho et al. |
| 6,143,079 | A | 11/2000 | Halpin |
| 6,143,082 | A | 11/2000 | McInerney et al. |
| 6,143,129 | A | 11/2000 | Savas et al. |
| 6,146,463 | A | 11/2000 | Yudovsky et al. |
| 6,148,761 | A | 11/2000 | Majewski et al. |
| 6,151,446 | A | 11/2000 | Hunter et al. |
| 6,152,070 | A | 11/2000 | Fairbairn et al. |
| 6,152,669 | A | 11/2000 | Morita et al. |
| 6,156,151 | A | 12/2000 | Komino et al. |
| 6,158,941 | A | 12/2000 | Muka et al. |
| 6,159,301 | A | 12/2000 | Sato et al. |
| 6,160,244 | A | 12/2000 | Ohashi |
| 6,161,500 | A | 12/2000 | Kopacz et al. |
| 6,162,323 | A | 12/2000 | Koshimizu |
| 6,164,894 | A | 12/2000 | Cheng |
| 6,174,809 | B1 | 1/2001 | Kang et al. |
| 6,176,929 | B1 | 1/2001 | Fukunaga et al. |
| 6,177,688 | B1 | 1/2001 | Linthicum et al. |
| 6,178,918 | B1 | 1/2001 | Van Os et al. |
| 6,179,955 | B1 | 1/2001 | Shin et al. |
| 6,180,979 | B1 | 1/2001 | Hofman et al. |
| 6,182,603 | B1 | 2/2001 | Shang et al. |
| 6,183,564 | B1 | 2/2001 | Reynolds et al. |
| 6,183,565 | B1 | 2/2001 | Granneman et al. |
| 6,187,672 | B1 | 2/2001 | Zhao et al. |
| 6,187,691 | B1 | 2/2001 | Fukuda |
| 6,189,482 | B1 | 2/2001 | Zhao et al. |
| 6,190,037 | B1 | 2/2001 | Das et al. |
| 6,190,113 | B1 | 2/2001 | Bui et al. |
| 6,190,634 | B1 | 2/2001 | Lieber et al. |
| 6,191,399 | B1 | 2/2001 | Van Bilsen |
| 6,194,037 | B1 | 2/2001 | Terasaki et al. |
| 6,200,897 | B1 | 3/2001 | Wang et al. |
| 6,201,999 | B1 | 3/2001 | Jevtic |
| 6,203,613 | B1 | 3/2001 | Gates et al. |
| 6,203,618 | B1 | 3/2001 | Hashizume et al. |
| 6,207,932 | B1 | 3/2001 | Yoo |
| 6,207,936 | B1 | 3/2001 | de Waard |
| 6,209,221 | B1 | 4/2001 | Beulens |
| 6,210,485 | B1 | 4/2001 | Zhao et al. |
| 6,212,789 | B1 | 4/2001 | Kato |
| 6,213,708 | B1 | 4/2001 | Allen |
| 6,214,122 | B1 | 4/2001 | Thompson |
| 6,214,717 | B1 | 4/2001 | Yan et al. |
| 6,217,658 | B1 | 4/2001 | Orczyk et al. |
| 6,217,662 | B1 | 4/2001 | Kong et al. |
| 6,218,288 | B1 | 4/2001 | Li et al. |
| 6,224,679 | B1 | 5/2001 | Sasaki et al. |
| 6,225,020 | B1 | 5/2001 | Jung et al. |
| 6,225,602 | B1 | 5/2001 | Buiijze et al. |
| 6,225,745 | B1 | 5/2001 | Srivastava |
| 6,230,650 | B1 | 5/2001 | Yamazaki |
| 6,231,290 | B1 | 5/2001 | Kikuchi et al. |
| 6,235,121 | B1 | 5/2001 | Honma et al. |
| 6,235,858 | B1 | 5/2001 | Swarup et al. |
| 6,238,734 | B1 | 5/2001 | Senzaki et al. |
| 6,239,402 | B1 | 5/2001 | Araki et al. |
| 6,239,715 | B1 | 5/2001 | Belton |
| 6,240,875 | B1 | 6/2001 | Wijck et al. |
| 6,241,822 | B1 | 6/2001 | Ide |
| 6,242,359 | B1 | 6/2001 | Misra |
| 6,243,654 | B1 | 6/2001 | Johnson et al. |
| 6,245,647 | B1 | 6/2001 | Akiyama et al. |
| 6,245,665 | B1 | 6/2001 | Yokoyama |
| 6,247,245 | B1 | 6/2001 | Ishii |
| 6,250,250 | B1 | 6/2001 | Maishev et al. |
| 6,255,221 | B1 | 7/2001 | Hudson et al. |
| 6,257,758 | B1 | 7/2001 | Culbertson |
| 6,261,648 | B1 | 7/2001 | Akiba et al. |
| 6,264,467 | B1 | 7/2001 | Lue et al. |
| 6,265,113 | B1 | 7/2001 | Rosasco et al. |
| 6,265,311 | B1 | 7/2001 | Hautala et al. |
| 6,270,572 | B1 | 8/2001 | Kim et al. |
| 6,271,148 | B1 | 8/2001 | Kao |
| 6,271,320 | B1 | 8/2001 | Keller et al. |
| 6,274,496 | B1 | 8/2001 | Leusink et al. |
| 6,274,878 | B1 | 8/2001 | Li et al. |
| 6,281,098 | B1 | 8/2001 | Wang |
| 6,281,141 | B1 | 8/2001 | Das et al. |
| 6,283,692 | B1 | 9/2001 | Perlov et al. |
| 6,284,050 | B1 | 9/2001 | Shi et al. |
| 6,284,149 | B1 | 9/2001 | Li et al. |
| 6,287,965 | B1 | 9/2001 | Kang et al. |
| 6,287,988 | B1 | 9/2001 | Nagamine et al. |
| 6,293,700 | B1 | 9/2001 | Lund et al. |
| D449,873 | S | 10/2001 | Bronson |
| 6,296,710 | B1 | 10/2001 | Allen et al. |
| 6,296,711 | B1 | 10/2001 | Loan et al. |
| 6,296,909 | B1 | 10/2001 | Spitsberg |
| 6,297,539 | B1 | 10/2001 | Ma et al. |
| 6,299,133 | B2 | 10/2001 | Waragai et al. |
| 6,302,964 | B1 | 10/2001 | Umotoy et al. |
| 6,303,523 | B2 | 10/2001 | Cheung |
| 6,305,898 | B1 | 10/2001 | Yamagishi et al. |
| 6,311,016 | B1 | 10/2001 | Yanagawa et al. |
| 6,312,525 | B1 | 11/2001 | Bright et al. |
| 6,315,512 | B1 | 11/2001 | Tabrizi et al. |
| 6,316,162 | B1 | 11/2001 | Jung et al. |
| 6,316,371 | B1 | 11/2001 | Oosterlaken et al. |
| 6,320,320 | B1 | 11/2001 | Bailey et al. |
| 6,321,680 | B2 | 11/2001 | Cook et al. |
| 6,321,780 | B1 | 11/2001 | Iwabuchi |
| D451,893 | S | 12/2001 | Robson |
| D452,220 | S | 12/2001 | Robson |
| 6,325,858 | B1 | 12/2001 | Wengert |
| 6,326,322 | B1 | 12/2001 | Kim et al. |
| 6,326,597 | B1 | 12/2001 | Lubomirsky et al. |
| 6,328,561 | B1 | 12/2001 | Hasper et al. |
| 6,328,864 | B1 | 12/2001 | Ishizawa et al. |
| 6,329,297 | B1 | 12/2001 | Balish |
| 6,333,275 | B1 | 12/2001 | Mayer et al. |
| 6,335,049 | B1 | 1/2002 | Basceri |

(56) References Cited

U.S. PATENT DOCUMENTS 6,335,240 B1 1/2002 Kim et al.
6,335,293 B1 1/2002 Luo et al.
6,342,427 B1 1/2002 Choi et al.
6,343,239 B1 1/2002 Toda et al.
6,344,084 B1 2/2002 Koinuma et al.
6,344,232 B1 2/2002 Jones et al.
6,346,419 B1 2/2002 Ryerson et al.
6,347,636 B1 2/2002 Xia
6,350,391 B1 2/2002 Livshits et al.
6,352,049 B1 3/2002 Yin et al.
6,352,945 B1 3/2002 Matsuki
6,357,984 B1 3/2002 Zinger et al.
6,363,294 B1 3/2002 Coronel et al.
D455,024 S 4/2002 Mimick et al.
6,367,410 B1 4/2002 Leahey et al.
6,368,773 B1 4/2002 Jung et al.
6,368,987 B1 4/2002 Kopacz et al.
6,370,796 B1 4/2002 Zucker
6,372,583 B1 4/2002 Tyagi
6,374,831 B1 4/2002 Chandran
6,375,312 B1 4/2002 Ikeda et al.
6,375,749 B1 4/2002 Boydston et al.
6,375,750 B1 4/2002 Van Os et al.
6,379,466 B1 4/2002 Sahin et al.
D457,609 S 5/2002 Piano
6,383,300 B1 5/2002 Saito et al.
6,383,566 B1 5/2002 Zagdoun
6,383,955 B1 5/2002 Matsuki
6,387,207 B1 5/2002 Janakiraman
6,387,823 B1 5/2002 Sonderman et al.
6,387,827 B1 5/2002 Mertens et al.
6,390,753 B1 5/2002 de Ridder et al.
6,390,754 B2 5/2002 Yamaga et al.
6,391,803 B1 5/2002 Kim et al.
6,395,650 B1 5/2002 Callegari et al.
6,398,184 B1 6/2002 Sowada et al.
6,399,022 B1 6/2002 Schuler et al.
6,402,806 B1 6/2002 Schmitt et al.
6,410,433 B1 6/2002 Hautala et al.
6,410,459 B2 6/2002 Blalock et al.
6,410,463 B1 6/2002 Matsuki
6,413,321 B1 7/2002 Kim et al.
6,413,583 B1 7/2002 Moghadam et al.
6,420,279 B1 7/2002 Ono et al.
6,423,949 B1 7/2002 Chen et al.
D461,233 S 8/2002 Whalen
D461,882 S 8/2002 Piano
6,428,859 B1 8/2002 Chiang et al.
6,429,465 B1 8/2002 Yagi et al.
6,432,206 B1 8/2002 Tolt
6,432,255 B1 8/2002 Sun et al.
6,432,479 B2 8/2002 Chang et al.
6,432,849 B1 8/2002 Endo et al.
6,433,298 B1 8/2002 Ishii
6,435,798 B1 8/2002 Satoh
6,435,865 B1 8/2002 Tseng et al.
6,436,819 B1 8/2002 Zhang
6,437,444 B2 8/2002 Andideh
6,438,502 B1 8/2002 Awtrey
6,439,822 B1 8/2002 Kimura et al.
6,440,261 B1 8/2002 Tepman et al.
6,441,350 B1 8/2002 Stoddard et al.
6,445,574 B1 9/2002 Saw et al.
6,446,573 B2 9/2002 Hirayama et al.
6,447,232 B1 9/2002 Davis et al.
6,447,651 B1 9/2002 Ishikawa et al.
6,447,937 B1 9/2002 Murakawa et al.
6,448,192 B1 9/2002 Kaushik
6,450,117 B1 9/2002 Murugesh et al.
6,450,757 B1 9/2002 Saeki
6,451,713 B1 9/2002 Tay et al.
6,452,017 B1 9/2002 Uhlenbrock et al.
6,454,860 B2 9/2002 Metzner et al.
6,454,909 B1 9/2002 Matsuse et al.
6,455,098 B2 9/2002 Tran et al.
6,455,225 B1 9/2002 Kong et al.
6,455,445 B2 9/2002 Matsuki
6,460,482 B1 10/2002 Kuibira et al.
6,461,435 B1 10/2002 Littau et al.
6,461,436 B1 10/2002 Campbell et al.
6,461,439 B1 10/2002 Granneman et al.
6,462,310 B1 10/2002 Ratliff et al.
6,464,825 B1 10/2002 Shinozaki
6,468,924 B2 10/2002 Lee
6,471,779 B1 10/2002 Nishio et al.
6,472,266 B1 10/2002 Yu et al.
6,474,987 B1 11/2002 Huang et al.
6,475,276 B1 11/2002 Elers et al.
6,475,902 B1 11/2002 Hausmann et al.
6,475,930 B1 11/2002 Junker et al.
6,478,872 B1 11/2002 Chae et al.
6,481,945 B1 11/2002 Hasper et al.
6,482,331 B2 11/2002 Lu et al.
6,482,663 B1 11/2002 Buckland
6,483,989 B1 11/2002 Okada et al.
6,488,774 B1 12/2002 Horie et al.
6,490,493 B1 12/2002 Dharnipragada
6,492,625 B1 12/2002 Boguslavskiy et al.
6,494,065 B2 12/2002 Babbitt
6,494,998 B1 12/2002 Brcka
6,496,819 B1 12/2002 Bello et al.
6,497,734 B1 12/2002 Barber et al.
6,497,767 B1 12/2002 Okase et al.
6,498,091 B1 12/2002 Chen et al.
6,499,533 B2 12/2002 Yamada
6,500,487 B1 12/2002 Holst et al.
6,502,530 B1 1/2003 Turlot et al.
6,503,079 B2 1/2003 Kogano et al.
6,503,330 B1 1/2003 Sneh et al.
6,503,365 B1 1/2003 Kim et al.
6,503,562 B1 1/2003 Saito et al.
6,503,826 B1 1/2003 Oda
6,506,009 B1 1/2003 Nulman et al.
6,506,253 B2 1/2003 Sakuma
6,507,410 B1 1/2003 Robertson et al.
6,511,539 B1 1/2003 Raaijmakers
6,514,313 B1 2/2003 Spiegelman
6,514,666 B1 2/2003 Choi et al.
6,521,295 B1 2/2003 Remington
6,521,547 B1 2/2003 Chang et al.
6,527,884 B1 3/2003 Takakuwa et al.
6,528,171 B1 3/2003 Endler et al.
6,528,430 B2 3/2003 Kwan
6,528,752 B1 3/2003 Ishii et al.
6,528,767 B2 3/2003 Bagley et al.
6,530,994 B1 3/2003 Mahawili
6,531,193 B2 3/2003 Fonash et al.
6,531,412 B2 3/2003 Conti et al.
6,534,133 B1 3/2003 Kaloyeros et al.
6,534,395 B2 3/2003 Werkhoven et al.
6,536,950 B1 3/2003 Green
6,539,891 B1 4/2003 Kang et al.
6,540,469 B2 4/2003 Matsunaga et al.
6,540,838 B2 4/2003 Sneh et al.
6,544,906 B2 4/2003 Rotondaro et al.
6,552,209 B1 4/2003 Lei et al.
6,558,517 B2 5/2003 Basceri
6,558,755 B2 5/2003 Berry et al.
6,559,026 B1 5/2003 Rossman et al.
6,562,094 B2 5/2003 Denker et al.
6,565,763 B1 5/2003 Asakawa et al.
6,566,278 B1 5/2003 Harvey et al.
6,569,239 B2 5/2003 Arai et al.
6,569,971 B2 5/2003 Roh et al.
6,573,030 B1 6/2003 Fairbairn et al.
6,574,644 B2 6/2003 Hsu et al.
6,576,062 B2 6/2003 Matsuse
6,576,064 B2 6/2003 Griffiths et al.
6,576,300 B1 6/2003 Berry et al.
6,576,564 B2 6/2003 Agarwal
6,578,589 B1 6/2003 Mayusumi
6,579,833 B1 6/2003 McNallan et al.
6,580,050 B1 6/2003 Miller et al.
6,582,174 B1 6/2003 Hayashi

(56) References Cited

U.S. PATENT DOCUMENTS

| | | | |
|---|---|---|---|
| 6,583,048 | B2 | 6/2003 | Vincent et al. |
| 6,583,572 | B2 | 6/2003 | Veltrop et al. |
| 6,587,108 | B1 | 7/2003 | Guerlain et al. |
| 6,589,352 | B1 | 7/2003 | Yudovsky et al. |
| 6,589,707 | B2 | 7/2003 | Lee et al. |
| 6,589,868 | B2 | 7/2003 | Rossman |
| 6,590,251 | B2 | 7/2003 | Kang et al. |
| 6,594,550 | B1 | 7/2003 | Okrah |
| 6,596,398 | B1 | 7/2003 | Russo et al. |
| 6,596,653 | B2 | 7/2003 | Tan |
| 6,598,559 | B1 | 7/2003 | Vellore et al. |
| 6,602,806 | B1 | 8/2003 | Xia et al. |
| 6,607,602 | B1 | 8/2003 | Granneman et al. |
| 6,607,868 | B2 | 8/2003 | Choi |
| 6,607,948 | B1 | 8/2003 | Sugiyama et al. |
| 6,608,745 | B2 | 8/2003 | Tsuruta et al. |
| 6,610,375 | B2 | 8/2003 | Akiba et al. |
| 6,613,685 | B1 | 9/2003 | Granneman et al. |
| 6,616,986 | B2 | 9/2003 | Sherman |
| 6,617,253 | B1 | 9/2003 | Chu et al. |
| 6,620,251 | B2 | 9/2003 | Kitano |
| 6,623,799 | B1 | 9/2003 | Lee et al. |
| 6,624,064 | B1 | 9/2003 | Sahin |
| 6,627,268 | B1 | 9/2003 | Fair et al. |
| 6,627,503 | B2 | 9/2003 | Ma et al. |
| 6,630,030 | B1 | 10/2003 | Suntola et al. |
| 6,632,478 | B2 | 10/2003 | Gaillard et al. |
| 6,633,364 | B2 | 10/2003 | Hayashi |
| 6,635,115 | B1 | 10/2003 | Fairbairn et al. |
| 6,635,117 | B1 | 10/2003 | Kinnard et al. |
| 6,635,578 | B1 | 10/2003 | Xu et al. |
| 6,638,839 | B2 | 10/2003 | Deng et al. |
| 6,640,145 | B2 | 10/2003 | Hoffberg et al. |
| 6,645,304 | B2 | 11/2003 | Yamaguchi |
| 6,648,974 | B1 | 11/2003 | Ogliari et al. |
| 6,649,921 | B1 | 11/2003 | Cekic et al. |
| 6,652,924 | B2 | 11/2003 | Sherman |
| 6,656,281 | B1 | 12/2003 | Ueda |
| 6,656,282 | B2 | 12/2003 | Kim et al. |
| 6,658,933 | B2 | 12/2003 | Allegre et al. |
| 6,659,111 | B1 | 12/2003 | Mouri et al. |
| 6,660,662 | B2 | 12/2003 | Ishikawa et al. |
| 6,662,817 | B2 | 12/2003 | Yamagishi |
| 6,663,332 | B1 | 12/2003 | Sluijk et al. |
| 6,673,196 | B1 | 1/2004 | Oyabu |
| 6,676,290 | B1 | 1/2004 | Lu |
| 6,676,759 | B1 | 1/2004 | Takagi |
| 6,679,194 | B2 | 1/2004 | Ham et al. |
| 6,682,971 | B2 | 1/2004 | Tsuneda et al. |
| 6,682,973 | B1 | 1/2004 | Paton et al. |
| 6,683,274 | B1 | 1/2004 | Kwon et al. |
| D486,891 | S | 2/2004 | Cronce |
| 6,684,659 | B1 | 2/2004 | Tanaka et al. |
| 6,684,719 | B2 | 2/2004 | Gehner et al. |
| 6,686,281 | B2 | 2/2004 | Yamazaki et al. |
| 6,688,784 | B1 | 2/2004 | Templeton |
| 6,689,220 | B1 | 2/2004 | Nguyen |
| 6,692,575 | B1 | 2/2004 | Omstead et al. |
| 6,692,576 | B2 | 2/2004 | Halpin et al. |
| 6,692,903 | B2 | 2/2004 | Chen et al. |
| 6,696,367 | B1 | 2/2004 | Aggarwal |
| 6,699,003 | B2 | 3/2004 | Saeki |
| 6,699,399 | B1 | 3/2004 | Qian et al. |
| 6,700,089 | B1 | 3/2004 | Hirooka |
| 6,709,989 | B2 | 3/2004 | Ramdani et al. |
| 6,710,364 | B2 | 3/2004 | Guldi et al. |
| 6,710,857 | B2 | 3/2004 | Kondo |
| 6,712,949 | B2 | 3/2004 | Gopal |
| 6,713,824 | B1 | 3/2004 | Mikata |
| 6,716,477 | B1 | 4/2004 | Komiyama et al. |
| 6,716,571 | B2 | 4/2004 | Gabriel |
| 6,719,499 | B1 | 4/2004 | Kuznetsov et al. |
| 6,720,260 | B1 | 4/2004 | Fair et al. |
| 6,720,262 | B2 | 4/2004 | Koh et al. |
| 6,720,531 | B1 | 4/2004 | Jacobson et al. |
| 6,722,837 | B2 | 4/2004 | Inui |
| 6,723,642 | B1 | 4/2004 | Lim et al. |
| 6,730,614 | B1 | 5/2004 | Lim et al. |
| 6,732,006 | B2 | 5/2004 | Haanstra et al. |
| 6,734,090 | B2 | 5/2004 | Agarwala et al. |
| 6,734,631 | B2 | 5/2004 | Juestel et al. |
| 6,737,716 | B1 | 5/2004 | Matsuo et al. |
| 6,740,853 | B1 | 5/2004 | Johnson et al. |
| 6,743,475 | B2 | 6/2004 | Skarp et al. |
| 6,743,738 | B2 | 6/2004 | Todd et al. |
| 6,745,095 | B1 | 6/2004 | Ben-Dov |
| 6,746,240 | B2 | 6/2004 | de Ridder et al. |
| 6,746,308 | B1 | 6/2004 | Bode et al. |
| 6,749,671 | B2 | 6/2004 | Holst et al. |
| 6,753,507 | B2 | 6/2004 | Fure et al. |
| 6,755,221 | B2 | 6/2004 | Jeong et al. |
| 6,756,085 | B2 | 6/2004 | Waldfried |
| 6,756,293 | B2 | 6/2004 | Li et al. |
| 6,756,318 | B2 | 6/2004 | Nguyen et al. |
| 6,759,098 | B2 | 7/2004 | Han |
| 6,760,981 | B2 | 7/2004 | Leap |
| 6,766,545 | B2 | 7/2004 | Hodges |
| 6,767,447 | B2 | 7/2004 | Uno et al. |
| D494,552 | S | 8/2004 | Tezuka et al. |
| 6,776,849 | B2 | 8/2004 | Aggarwal et al. |
| 6,780,704 | B1 | 8/2004 | Raaijmakers et al. |
| 6,783,875 | B2 | 8/2004 | Yamada et al. |
| 6,784,033 | B1 | 8/2004 | Yamazaki |
| 6,784,108 | B1 | 8/2004 | Donohoe et al. |
| D496,008 | S | 9/2004 | Takahashi et al. |
| 6,786,997 | B1 | 9/2004 | Yamazaki |
| D497,536 | S | 10/2004 | Fujiwara |
| D497,977 | S | 11/2004 | Engelbrektsson |
| 6,811,960 | B2 | 11/2004 | Lee et al. |
| 6,812,157 | B1 | 11/2004 | Gadgil |
| 6,815,350 | B2 | 11/2004 | Kim et al. |
| 6,815,352 | B1 | 11/2004 | Tamura et al. |
| 6,818,566 | B2 | 11/2004 | Leeson et al. |
| 6,818,864 | B2 | 11/2004 | Ptak |
| 6,820,570 | B2 | 11/2004 | Kilpela et al. |
| 6,821,889 | B2 | 11/2004 | Elers et al. |
| 6,821,910 | B2 | 11/2004 | Adomaitis et al. |
| 6,824,665 | B2 | 11/2004 | Shelnut et al. |
| 6,825,106 | B1 | 11/2004 | Gao et al. |
| 6,825,134 | B2 | 11/2004 | Law et al. |
| D499,620 | S | 12/2004 | Horner-Richardson et al. |
| 6,827,789 | B2 | 12/2004 | Lee et al. |
| 6,828,235 | B2 | 12/2004 | Takano |
| 6,831,004 | B2 | 12/2004 | Byun |
| 6,833,024 | B2 | 12/2004 | Holst et al. |
| 6,835,039 | B2 | 12/2004 | Van Den Berg |
| 6,838,122 | B2 | 1/2005 | Basceri et al. |
| 6,841,201 | B2 | 1/2005 | Shanov et al. |
| 6,843,202 | B2 | 1/2005 | Kusuda |
| 6,843,858 | B2 | 1/2005 | Rossman |
| 6,846,146 | B2 | 1/2005 | Inui |
| 6,846,515 | B2 | 1/2005 | Vrtis |
| 6,846,742 | B2 | 1/2005 | Rossman |
| 6,847,014 | B1 | 1/2005 | Benjamin et al. |
| 6,849,241 | B2 | 2/2005 | Dauelsberg et al. |
| 6,849,857 | B2 | 2/2005 | Ichiki et al. |
| 6,854,580 | B2 | 2/2005 | Braford |
| 6,858,524 | B2 | 2/2005 | Haukka et al. |
| 6,858,547 | B2 | 2/2005 | Metzner |
| 6,861,642 | B2 | 3/2005 | Ichiki et al. |
| 6,863,019 | B2 | 3/2005 | Shamouilian |
| 6,863,281 | B2 | 3/2005 | Endou et al. |
| 6,864,041 | B2 | 3/2005 | Brown |
| 6,867,086 | B1 | 3/2005 | Chen et al. |
| 6,867,153 | B2 | 3/2005 | Tokunaga |
| 6,867,859 | B1 | 3/2005 | Powell |
| 6,872,258 | B2 | 3/2005 | Park et al. |
| 6,872,259 | B2 | 3/2005 | Strang |
| D504,142 | S | 4/2005 | Horner-Richardson et al. |
| 6,874,247 | B1 | 4/2005 | Hsu |
| 6,874,480 | B1 | 4/2005 | Ismailov |
| 6,875,477 | B2 | 4/2005 | Trickett et al. |
| 6,875,677 | B1 | 4/2005 | Conley, Jr. et al. |
| 6,876,017 | B2 | 4/2005 | Goodner |

(56) References Cited

U.S. PATENT DOCUMENTS

| | | | |
|---|---|---|---|
| 6,876,191 | B2 | 4/2005 | de Ridder |
| 6,878,206 | B2 | 4/2005 | Tzu et al. |
| 6,878,402 | B2 | 4/2005 | Chiang et al. |
| 6,883,733 | B1 | 4/2005 | Lind |
| 6,884,066 | B2 | 4/2005 | Nguyen et al. |
| 6,884,295 | B2 | 4/2005 | Ishii |
| 6,884,319 | B2 | 4/2005 | Kim |
| 6,884,475 | B2 | 4/2005 | Basceri |
| D505,590 | S | 5/2005 | Greiner |
| 6,889,211 | B1 | 5/2005 | Yoshiura et al. |
| 6,889,864 | B2 | 5/2005 | Lindfors et al. |
| 6,890,596 | B2 | 5/2005 | Sarigiannis et al. |
| 6,895,158 | B2 | 5/2005 | Alyward et al. |
| 6,899,507 | B2 | 5/2005 | Yamagishi et al. |
| 6,902,395 | B2 | 6/2005 | Oosterlaken et al. |
| 6,902,647 | B2 | 6/2005 | Hasper |
| 6,909,839 | B2 | 6/2005 | Wang et al. |
| 6,911,092 | B2 | 6/2005 | Sneh |
| 6,913,152 | B2 | 7/2005 | Zuk |
| 6,913,796 | B2 | 7/2005 | Albano et al. |
| 6,916,398 | B2 | 7/2005 | Chen et al. |
| 6,916,559 | B2 | 7/2005 | Murakawa et al. |
| 6,917,755 | B2 | 7/2005 | Nguyen et al. |
| 6,924,078 | B2 | 8/2005 | Lee et al. |
| 6,928,890 | B2 | 8/2005 | Gehner et al. |
| 6,929,699 | B2 | 8/2005 | Whitesell |
| 6,929,700 | B2 | 8/2005 | Tan et al. |
| 6,930,041 | B2 | 8/2005 | Agarwal |
| 6,930,059 | B2 | 8/2005 | Conley, Jr. et al. |
| 6,935,269 | B2 | 8/2005 | Lee et al. |
| 6,939,579 | B2 | 9/2005 | Bondestam et al. |
| 6,939,817 | B2 | 9/2005 | Sandhu et al. |
| 6,942,753 | B2 | 9/2005 | Choi et al. |
| 6,949,204 | B1 | 9/2005 | Lenz et al. |
| 6,951,587 | B1 | 10/2005 | Namshima |
| 6,952,656 | B1 | 10/2005 | Cordova et al. |
| 6,953,609 | B2 | 10/2005 | Carollo |
| 6,955,741 | B2 | 10/2005 | Yamagishi |
| 6,955,836 | B2 | 10/2005 | Kumagai et al. |
| 6,955,928 | B1 | 10/2005 | Brennan |
| 6,963,052 | B2 | 11/2005 | Kuibira et al. |
| 6,972,055 | B2 | 12/2005 | Sferlazzo |
| 6,972,478 | B1 | 12/2005 | Waite et al. |
| 6,974,781 | B2 | 12/2005 | Timmermans et al. |
| 6,975,921 | B2 | 12/2005 | Verhaar |
| 6,976,822 | B2 | 12/2005 | Woodruff |
| RE38,937 | E | 1/2006 | Nakamura |
| 6,981,832 | B2 | 1/2006 | Zinger et al. |
| 6,982,046 | B2 | 1/2006 | Srivastava et al. |
| 6,982,103 | B2 | 1/2006 | Basceri et al. |
| 6,984,591 | B1 | 1/2006 | Buchanan et al. |
| 6,984,595 | B1 | 1/2006 | Yamazaki |
| 6,985,788 | B2 | 1/2006 | Haanstra et al. |
| 6,986,914 | B2 | 1/2006 | Elers et al. |
| 6,987,155 | B2 | 1/2006 | Roh et al. |
| 6,990,430 | B2 | 1/2006 | Hosek |
| 7,005,227 | B2 | 2/2006 | Yueh et al. |
| 7,005,391 | B2 | 2/2006 | Min |
| 7,008,879 | B2 | 3/2006 | Lee et al. |
| 7,010,580 | B1 | 3/2006 | Fu et al. |
| 7,017,514 | B1 | 3/2006 | Shepherd et al. |
| 7,018,941 | B2 | 3/2006 | Cui et al. |
| 7,021,330 | B2 | 4/2006 | Maula et al. |
| 7,021,881 | B2 | 4/2006 | Yamagishi |
| 7,036,453 | B2 | 5/2006 | Ishikawa et al. |
| 7,041,609 | B2 | 5/2006 | Vaartstra |
| 7,045,430 | B2 | 5/2006 | Ahn et al. |
| 7,049,226 | B2 | 5/2006 | Chung et al. |
| 7,049,247 | B2 | 5/2006 | Gates et al. |
| 7,052,584 | B2 | 5/2006 | Basceri |
| 7,053,009 | B2 | 5/2006 | Conley, Jr. et al. |
| 7,055,263 | B2 | 6/2006 | Wu et al. |
| 7,055,875 | B2 | 6/2006 | Bonora |
| 7,062,161 | B2 | 6/2006 | Kusuda et al. |
| D524,600 | S | 7/2006 | Austin et al. |
| D525,127 | S | 7/2006 | Cogley et al. |
| 7,070,178 | B2 | 7/2006 | Van Der Toorn et al. |
| 7,071,051 | B1 | 7/2006 | Jeon et al. |
| 7,073,834 | B2 | 7/2006 | Matsumoto et al. |
| 7,074,690 | B1 | 7/2006 | Gauri et al. |
| 7,077,614 | B1 | 7/2006 | Hasper et al. |
| 7,080,545 | B2 | 7/2006 | Dimeo et al. |
| 7,084,060 | B1 | 8/2006 | Furukawa |
| 7,084,079 | B2 | 8/2006 | Conti et al. |
| 7,085,623 | B2 | 8/2006 | Siegers |
| 7,086,347 | B2 | 8/2006 | Howald et al. |
| 7,088,003 | B2 | 8/2006 | Gates et al. |
| 7,090,394 | B2 | 8/2006 | Hashikura et al. |
| 7,092,287 | B2 | 8/2006 | Beulens et al. |
| 7,098,149 | B2 | 8/2006 | Lukas |
| 7,098,150 | B2 | 8/2006 | Misra et al. |
| 7,100,459 | B2 | 9/2006 | Gehner et al. |
| 7,101,763 | B1 | 9/2006 | Anderson et al. |
| 7,108,753 | B2 | 9/2006 | Wood |
| 7,109,098 | B1 | 9/2006 | Ramaswamy et al. |
| 7,109,114 | B2 | 9/2006 | Chen et al. |
| 7,111,232 | B1 | 9/2006 | Bascom |
| 7,115,305 | B2 | 10/2006 | Bronikowski et al. |
| 7,115,838 | B2 | 10/2006 | Kurara et al. |
| 7,122,085 | B2 | 10/2006 | Shero et al. |
| 7,122,222 | B2 | 10/2006 | Xiao et al. |
| 7,122,844 | B2 | 10/2006 | Nakamura et al. |
| 7,129,165 | B2 | 10/2006 | Basol et al. |
| 7,132,360 | B2 | 11/2006 | Schaeffer et al. |
| 7,135,421 | B2 | 11/2006 | Ahn et al. |
| 7,140,558 | B2 | 11/2006 | McCracken et al. |
| 7,141,499 | B2 | 11/2006 | Raaijmakers |
| 7,143,897 | B1 | 12/2006 | Guzman et al. |
| 7,144,806 | B1 | 12/2006 | Fair et al. |
| 7,144,809 | B2 | 12/2006 | Elers et al. |
| 7,147,766 | B2 | 12/2006 | Uzoh et al. |
| 7,153,542 | B2 | 12/2006 | Nguyen et al. |
| D535,673 | S | 1/2007 | Conway et al. |
| 7,156,380 | B2 | 1/2007 | Soininen |
| 7,163,393 | B2 | 1/2007 | Adachi et al. |
| 7,163,721 | B2 | 1/2007 | Zhang et al. |
| 7,163,900 | B2 | 1/2007 | Weber |
| 7,168,852 | B2 | 1/2007 | Linnarsson |
| 7,172,497 | B2 | 2/2007 | Basol et al. |
| 7,173,216 | B2 | 2/2007 | Ptak |
| 7,183,229 | B2 | 2/2007 | Yamanaka |
| 7,186,648 | B1 | 3/2007 | Rozbicki |
| 7,192,824 | B2 | 3/2007 | Ahn et al. |
| 7,192,892 | B2 | 3/2007 | Ahn et al. |
| 7,195,479 | B2 | 3/2007 | Beatty et al. |
| 7,195,693 | B2 | 3/2007 | Cowans |
| D541,125 | S | 4/2007 | Gaudron |
| 7,198,447 | B2 | 4/2007 | Morimitsu et al. |
| 7,199,513 | B2 | 4/2007 | Huber et al. |
| 7,201,943 | B2 | 4/2007 | Park et al. |
| 7,202,148 | B2 | 4/2007 | Chen et al. |
| 7,202,512 | B2 | 4/2007 | Chen et al. |
| 7,204,886 | B2 | 4/2007 | Chen et al. |
| 7,204,887 | B2 | 4/2007 | Kawamura et al. |
| 7,205,246 | B2 | 4/2007 | MacNeil et al. |
| 7,205,247 | B2 | 4/2007 | Lee et al. |
| 7,207,763 | B2 | 4/2007 | Lee |
| 7,208,198 | B2 | 4/2007 | Basceri et al. |
| 7,208,389 | B1 | 4/2007 | Tipton et al. |
| 7,210,925 | B2 | 5/2007 | Adachi |
| 7,211,524 | B2 | 5/2007 | Ryu et al. |
| 7,211,525 | B1 | 5/2007 | Shanker |
| 7,214,630 | B1 | 5/2007 | Varadarajan et al. |
| 7,217,617 | B2 | 5/2007 | Basceri |
| 7,223,014 | B2 | 5/2007 | Lojen |
| 7,208,413 | B2 | 6/2007 | Byun et al. |
| 7,229,502 | B2 | 6/2007 | Wang et al. |
| 7,234,476 | B2 | 6/2007 | Arai |
| 7,235,137 | B2 | 6/2007 | Kitayama et al. |
| 7,235,482 | B2 | 6/2007 | Wu |
| 7,235,501 | B2 | 6/2007 | Ahn et al. |
| 7,238,596 | B2 | 7/2007 | Kouvetakis et al. |
| 7,238,616 | B2 | 7/2007 | Agarwal |
| 7,238,653 | B2 | 7/2007 | Lee et al. |

(56) References Cited

U.S. PATENT DOCUMENTS

| | | | |
|---|---|---|---|
| D549,815 | S | 8/2007 | Murphy |
| 7,256,375 | B2 | 8/2007 | Oosterlaken |
| 7,265,061 | B1 | 9/2007 | Cho et al. |
| 7,274,867 | B2 | 9/2007 | Peukert |
| D553,104 | S | 10/2007 | Oohashi et al. |
| 7,279,256 | B2 | 10/2007 | Son |
| 7,290,813 | B2 | 11/2007 | Bonora |
| 7,294,581 | B2 | 11/2007 | Haverkort et al. |
| 7,296,460 | B2 | 11/2007 | Dimeo et al. |
| 7,297,641 | B2 | 11/2007 | Todd et al. |
| 7,298,009 | B2 | 11/2007 | Yan et al. |
| 7,301,623 | B1 | 11/2007 | Madsen et al. |
| D556,704 | S | 12/2007 | Nakamura et al. |
| D557,226 | S | 12/2007 | Uchino et al. |
| D558,021 | S | 12/2007 | Lawrence |
| 7,307,028 | B2 | 12/2007 | Goto et al. |
| 7,307,178 | B2 | 12/2007 | Kiyomori et al. |
| 7,311,977 | B2 | 12/2007 | Yokota et al. |
| 7,312,148 | B2 | 12/2007 | Ramaswamy et al. |
| 7,312,162 | B2 | 12/2007 | Ramaswamy et al. |
| 7,312,494 | B2 | 12/2007 | Ahn et al. |
| D559,993 | S | 1/2008 | Nagakubo et al. |
| D559,994 | S | 1/2008 | Nagakubo et al. |
| 7,320,544 | B2 | 1/2008 | Hsieh |
| 7,323,401 | B2 | 1/2008 | Ramaswamy et al. |
| D562,357 | S | 2/2008 | Hardy |
| 7,326,656 | B2 | 2/2008 | Brask et al. |
| 7,326,657 | B2 | 2/2008 | Xia et al. |
| 7,327,948 | B1 | 2/2008 | Shrinivasan |
| 7,329,947 | B2 | 2/2008 | Adachi et al. |
| 7,335,611 | B2 | 2/2008 | Ramaswamy et al. |
| 7,351,057 | B2 | 4/2008 | Berenbak et al. |
| 7,354,482 | B2 | 4/2008 | Konishi et al. |
| 7,354,847 | B2 | 4/2008 | Chan et al. |
| 7,354,873 | B2 | 4/2008 | Fukazawa et al. |
| 7,356,762 | B2 | 4/2008 | van Driel |
| 7,357,138 | B2 | 4/2008 | Ji et al. |
| 7,361,447 | B2 | 4/2008 | Jung |
| 7,375,035 | B2 | 5/2008 | Heden et al. |
| 7,376,520 | B2 | 5/2008 | Wong |
| 7,378,618 | B1 | 5/2008 | Sorabji et al. |
| 7,379,785 | B2 | 5/2008 | Higashi et al. |
| D571,383 | S | 6/2008 | Ota et al. |
| D571,831 | S | 6/2008 | Ota et al. |
| 7,381,644 | B1 | 6/2008 | Soubramonium et al. |
| 7,387,685 | B2 | 6/2008 | Choi et al. |
| 7,393,207 | B2 | 7/2008 | Imai |
| 7,393,418 | B2 | 7/2008 | Yokogawa |
| 7,393,736 | B2 | 7/2008 | Ahn et al. |
| 7,393,765 | B2 | 7/2008 | Hanawa et al. |
| 7,396,491 | B2 | 7/2008 | Marking et al. |
| 7,399,388 | B2 | 7/2008 | Moghadam et al. |
| 7,399,570 | B2 | 7/2008 | Lee et al. |
| 7,402,534 | B2 | 7/2008 | Mahajani |
| 7,405,166 | B2 | 7/2008 | Liang et al. |
| 7,405,454 | B2 | 7/2008 | Ahn et al. |
| D575,713 | S | 8/2008 | Ratcliffe |
| 7,408,225 | B2 | 8/2008 | Shinriki et al. |
| 7,410,290 | B2 | 8/2008 | Tanaka |
| 7,410,666 | B2 | 8/2008 | Elers |
| 7,411,352 | B2 | 8/2008 | Madocks |
| 7,414,281 | B1 | 8/2008 | Fastow |
| D576,001 | S | 9/2008 | Brunderman |
| 7,422,635 | B2 | 9/2008 | Zheng et al. |
| 7,422,636 | B2 | 9/2008 | Ishizaka |
| 7,422,653 | B2 | 9/2008 | Blahnik et al. |
| 7,422,775 | B2 | 9/2008 | Ramaswamy et al. |
| 7,425,224 | B2 | 9/2008 | Nguyen |
| 7,427,571 | B2 | 9/2008 | Lindeboom et al. |
| 7,429,532 | B2 | 9/2008 | Ramaswamy et al. |
| 7,431,966 | B2 | 10/2008 | Derderian et al. |
| 7,432,476 | B2 | 10/2008 | Morita et al. |
| 7,437,060 | B2 | 10/2008 | Wang et al. |
| 7,442,275 | B2 | 10/2008 | Cowans |
| 7,456,429 | B2 | 11/2008 | Levy |
| D583,395 | S | 12/2008 | Ueda |
| 7,467,632 | B2 | 12/2008 | Lee et al. |
| 7,473,655 | B2 | 1/2009 | Wang et al. |
| 7,475,588 | B2 | 1/2009 | Dimeo et al. |
| 7,476,291 | B2 | 1/2009 | Wang et al. |
| 7,479,198 | B2 | 1/2009 | Guffrey |
| 7,482,247 | B1 | 1/2009 | Papasouliotis |
| 7,482,283 | B2 | 1/2009 | Yamasaki et al. |
| D585,968 | S | 2/2009 | Elkins et al. |
| 7,489,389 | B2 | 2/2009 | Shibazaki et al. |
| 7,494,882 | B2 | 2/2009 | Vitale |
| 7,497,614 | B2 | 3/2009 | Gaff |
| 7,498,242 | B2 | 3/2009 | Kumar et al. |
| 7,501,292 | B2 | 3/2009 | Matsushita et al. |
| 7,501,355 | B2 | 3/2009 | Bhatia et al. |
| 7,503,980 | B2 | 3/2009 | Kida et al. |
| 7,504,344 | B2 | 3/2009 | Matsuki et al. |
| D590,933 | S | 4/2009 | Vansell |
| 7,514,058 | B1 | 4/2009 | Hitzman et al. |
| 7,514,375 | B1 | 4/2009 | Shanker et al. |
| D593,585 | S | 6/2009 | Ota et al. |
| D593,969 | S | 6/2009 | Li |
| 7,541,297 | B2 | 6/2009 | Mallick et al. |
| 7,544,398 | B1 | 6/2009 | Chang et al. |
| 7,547,363 | B2 | 6/2009 | Tomiyasu et al. |
| 7,547,633 | B2 | 6/2009 | Ranish et al. |
| 7,550,396 | B2 | 6/2009 | Frohberg et al. |
| D596,476 | S | 7/2009 | Welch |
| 7,561,982 | B2 | 7/2009 | Rund et al. |
| 7,563,715 | B2 | 7/2009 | Haukka et al. |
| 7,566,891 | B2 | 7/2009 | Rocha-Alvarez et al. |
| 7,569,193 | B2 | 8/2009 | Ferron et al. |
| 7,575,968 | B2 | 8/2009 | Sadaka et al. |
| 7,579,285 | B2 | 8/2009 | Zimmerman et al. |
| 7,579,785 | B2 | 8/2009 | Shinmen et al. |
| D600,223 | S | 9/2009 | Aggarwal |
| 7,582,555 | B1 | 9/2009 | Lang |
| 7,582,575 | B2 | 9/2009 | Fukazawa et al. |
| 7,589,003 | B2 | 9/2009 | Kouvetakis et al. |
| 7,589,028 | B1 | 9/2009 | Cho et al. |
| 7,589,029 | B2 | 9/2009 | Derderian et al. |
| 7,591,601 | B2 | 9/2009 | Matsuoka et al. |
| 7,591,907 | B2 | 9/2009 | Chen et al. |
| D602,575 | S | 10/2009 | Breda |
| 7,598,513 | B2 | 10/2009 | Kouvetakis et al. |
| 7,601,223 | B2 | 10/2009 | Lindfors et al. |
| 7,601,225 | B2 | 10/2009 | Tuominen et al. |
| 7,601,652 | B2 | 10/2009 | Singh et al. |
| 7,611,640 | B1 | 11/2009 | Howald et al. |
| 7,611,751 | B2 | 11/2009 | Elers |
| 7,611,980 | B2 | 11/2009 | Wells et al. |
| 7,618,226 | B2 | 11/2009 | Takizawa |
| 7,621,672 | B2 | 11/2009 | Ripley |
| 7,622,369 | B1 | 11/2009 | Lee et al. |
| 7,622,378 | B2 | 11/2009 | Liu et al. |
| 7,623,940 | B2 | 11/2009 | Huskamp et al. |
| D606,952 | S | 12/2009 | Lee et al. |
| 7,625,820 | B1 | 12/2009 | Papasouliotis |
| 7,629,277 | B2 | 12/2009 | Ghatnagar |
| 7,632,549 | B2 | 12/2009 | Goundar |
| 7,638,951 | B2 | 12/2009 | DeVincentis et al. |
| 7,640,142 | B2 | 12/2009 | Tachikawa et al. |
| 7,645,341 | B2 | 1/2010 | Kennedy et al. |
| 7,645,484 | B2 | 1/2010 | Ishizaka |
| 7,648,895 | B2 | 1/2010 | Kurokawa et al. |
| 7,648,927 | B2 | 1/2010 | Singh et al. |
| 7,651,269 | B2 | 1/2010 | Comendant |
| 7,651,583 | B2 | 1/2010 | Kent et al. |
| 7,651,955 | B2 | 1/2010 | Ranish et al. |
| 7,651,959 | B2 | 1/2010 | Fukazawa et al. |
| 7,651,961 | B2 | 1/2010 | Clark |
| D609,652 | S | 2/2010 | Nagasaka et al. |
| D609,655 | S | 2/2010 | Sugimoto |
| 7,661,299 | B2 | 2/2010 | Kusunoki |
| 7,662,689 | B2 | 2/2010 | Boyanov et al. |
| 7,670,432 | B2 | 3/2010 | Li |
| 7,674,726 | B2 | 3/2010 | Hasper et al. |
| 7,678,197 | B2 | 3/2010 | Maki |
| 7,678,715 | B2 | 3/2010 | Mungekar et al. |

(56) References Cited

U.S. PATENT DOCUMENTS 7,682,454 B2 3/2010 Sneh
7,682,657 B2 3/2010 Sherman
D613,829 S 4/2010 Griffin et al.
D614,153 S 4/2010 Fondurulia et al.
D614,258 S 4/2010 Kojima
D614,267 S 4/2010 Breda
D614,268 S 4/2010 Breda
D614,593 S 4/2010 Lee et al.
7,690,881 B2 4/2010 Yamagishi
7,691,205 B2 4/2010 Ikedo
7,692,171 B2 4/2010 Kaszuba et al.
7,695,808 B2 4/2010 Tuma
D616,390 S 5/2010 Sato
D616,394 S 5/2010 Sato
7,712,435 B2 5/2010 Yoshizaki et al.
7,713,874 B2 5/2010 Milligan
7,716,993 B2 5/2010 Ozawa et al.
7,718,930 B2 5/2010 Kawasaki et al.
7,720,560 B2 5/2010 Menser et al.
7,723,648 B2 5/2010 Tsukamoto et al.
7,725,012 B2 5/2010 Aggarwal et al.
7,727,864 B2 6/2010 Elers
7,727,880 B1 6/2010 Chattopadhyay et al.
7,732,343 B2 6/2010 Niroomand et al.
7,736,437 B2 6/2010 Cadwell et al.
7,736,528 B2 6/2010 Okita et al.
7,736,600 B2 6/2010 Clark et al.
7,737,035 B1 6/2010 Lind et al.
7,740,437 B2 6/2010 de Ridder et al.
7,740,705 B2 6/2010 Li
7,745,346 B2 6/2010 Hausmann et al.
7,748,760 B2 7/2010 Kushida
7,749,563 B2 7/2010 Zheng et al.
7,753,584 B2 7/2010 Gambino et al.
7,754,621 B2 7/2010 Putjkonen
7,758,698 B2 7/2010 Bang et al.
7,763,869 B2 7/2010 Matsushita et al.
7,767,262 B2 8/2010 Clark
7,771,796 B2 8/2010 Kohno et al.
7,780,440 B2 8/2010 Shibagaki et al.
7,780,789 B2 8/2010 Wu et al.
7,781,352 B2 8/2010 Fukazawa et al.
7,789,559 B2 9/2010 Waser et al.
7,789,965 B2 9/2010 Matsushita et al.
7,790,633 B1 9/2010 Tarafdar et al.
7,794,546 B2 9/2010 Li
7,798,096 B2 9/2010 Mahajani et al.
7,799,300 B2 9/2010 Lindfors et al.
7,799,706 B2 9/2010 Yeom et al.
7,803,722 B2 9/2010 Liang
D625,977 S 10/2010 Watson et al.
7,795,160 B2 10/2010 Wang et al.
7,806,587 B2 10/2010 Kobayashi
7,807,566 B2 10/2010 Tsuji et al.
7,807,578 B2 10/2010 Bencher et al.
7,816,278 B2 10/2010 Reed et al.
7,824,492 B2 11/2010 Tois et al.
7,825,040 B1 11/2010 Fukazawa et al.
7,829,460 B2 11/2010 Streck et al.
7,833,348 B2 11/2010 Wada et al.
7,833,353 B2 11/2010 Furukawahara et al.
7,838,084 B2 11/2010 Derderian et al.
7,842,518 B2 11/2010 Miyajima
7,842,622 B1 11/2010 Lee et al.
D629,874 S 12/2010 Hermans
7,850,449 B2 12/2010 Yang et al.
7,851,019 B2 12/2010 Tuominen et al.
7,851,232 B2 12/2010 van Schravendijk et al.
7,858,519 B2 12/2010 Liu et al.
7,858,533 B2 12/2010 Liu et al.
7,858,898 B2 12/2010 Bailey et al.
7,865,070 B2 1/2011 Nakamura
7,871,198 B2 1/2011 Rempe et al.
7,874,726 B2 1/2011 Jacobs et al.
7,884,918 B2 2/2011 Hattori
7,888,233 B1 2/2011 Gauri
7,894,474 B1 2/2011 Bell
D633,452 S 3/2011 Namiki et al.
D634,329 S 3/2011 Wastrom
D634,719 S 3/2011 Yasuda et al.
7,897,215 B1 3/2011 Fair et al.
7,897,217 B2 3/2011 Faguet
7,902,009 B2 3/2011 Simonelli et al.
7,902,582 B2 3/2011 Forbes et al.
7,906,174 B1 3/2011 Wu et al.
7,910,288 B2 3/2011 Abatchev et al.
7,910,452 B2 3/2011 Roh et al.
7,910,494 B2 3/2011 Dip et al.
7,915,139 B1 3/2011 Lang
7,915,667 B2 3/2011 Knoefler et al.
7,919,142 B2 4/2011 Yeom et al.
7,919,416 B2 4/2011 Lee et al.
7,923,382 B2 4/2011 Huotari et al.
7,925,378 B2 4/2011 Gilchrist et al.
7,935,940 B1 5/2011 Smargiassi
7,939,447 B2 5/2011 Bauer et al.
7,942,969 B2 5/2011 Riker et al.
7,946,762 B2 5/2011 Yednak
7,951,262 B2 5/2011 Koshiishi et al.
7,955,516 B2 6/2011 Chandrachood et al.
7,955,646 B2 6/2011 Cruse et al.
7,955,650 B2 6/2011 Tsuji
7,957,708 B2 6/2011 Karschnia et al.
7,963,736 B2 6/2011 Takizawa et al.
7,967,913 B2 6/2011 Hua et al.
7,972,980 B2 7/2011 Lee et al.
7,977,256 B2 7/2011 Liu et al.
7,981,751 B2 7/2011 Zhu et al.
D643,055 S 8/2011 Takahashi
7,989,365 B2 8/2011 Park et al.
7,989,736 B2 8/2011 Park et al.
7,992,318 B2 8/2011 Kawaji
7,993,457 B1 8/2011 Krotov et al.
7,994,070 B1 8/2011 Dip et al.
7,994,721 B2 8/2011 Espiau et al.
7,997,795 B2 8/2011 Schwagerman et al.
7,998,875 B2 8/2011 DeYoung
8,003,174 B2 8/2011 Fukazawa
8,003,919 B2 8/2011 Goto et al.
8,004,198 B2 8/2011 Bakre et al.
8,020,315 B2 9/2011 Nishimura
8,030,129 B2 10/2011 Jeong
8,033,771 B1 10/2011 Gage et al.
8,038,835 B2 10/2011 Hayashi et al.
8,041,197 B2 10/2011 Kasai et al.
8,041,450 B2 10/2011 Takizawa et al.
8,043,972 B1 10/2011 Liu et al.
8,046,193 B2 10/2011 Yetter et al.
8,047,711 B2 11/2011 Ploechinger
8,048,783 B2 11/2011 Chung et al.
8,051,799 B2 11/2011 Itagaki et al.
8,052,794 B2 11/2011 Sumakeris et al.
8,055,378 B2 11/2011 Numakura
8,060,252 B2 11/2011 Gage et al.
8,083,853 B2 11/2011 Choi et al.
RE43,023 E 12/2011 Nakashima et al.
D649,986 S 12/2011 Fujikata et al.
D651,291 S 12/2011 Liebson et al.
8,071,451 B2 12/2011 Berry
8,071,452 B2 12/2011 Raisanen
8,072,578 B2 12/2011 Yasuda et al.
8,076,230 B2 12/2011 Wei
8,076,237 B2 12/2011 Uzoh
8,076,250 B1 12/2011 Rajagopalan
8,076,251 B2 12/2011 Akae et al.
8,078,310 B2 12/2011 Nishimoto et al.
8,082,946 B2 12/2011 Laverdiere et al.
8,084,104 B2 12/2011 Shinriki et al.
8,084,372 B2 12/2011 You et al.
D652,896 S 1/2012 Gether
8,092,604 B2 1/2012 Tomiyasu et al.
8,092,606 B2 1/2012 Park et al.
8,100,583 B2 1/2012 Aggarwal
D653,734 S 2/2012 Sisk

(56) References Cited

U.S. PATENT DOCUMENTS

D654,882 S 2/2012 Honma et al.
D654,884 S 2/2012 Honma
D655,055 S 2/2012 Toll
8,110,099 B2 2/2012 Hersey et al.
8,114,734 B2 2/2012 Yang et al.
8,119,466 B2 2/2012 Avouris
8,119,527 B1 2/2012 Chadrashekar et al.
D655,260 S 3/2012 Honma et al.
D655,261 S 3/2012 Honma et al.
D655,599 S 3/2012 Durham
8,128,333 B2 3/2012 Aburatani
8,129,290 B2 3/2012 Balseanu et al.
8,137,462 B2 3/2012 Fondurulia et al.
8,137,465 B1 3/2012 Shrinivasan et al.
8,138,104 B2 3/2012 Balseanu et al.
8,138,676 B2 3/2012 Mills
8,142,862 B2 3/2012 Lee et al.
8,143,174 B2 3/2012 Xia et al.
8,147,242 B2 4/2012 Shibagaki et al.
8,152,922 B2 4/2012 Schmidt et al.
8,158,512 B2 4/2012 Ji et al.
8,172,947 B2 5/2012 Shibata et al.
8,173,554 B2 5/2012 Lee et al.
8,174,400 B2 5/2012 Park et al.
8,178,436 B2 5/2012 King et al.
8,187,679 B2 5/2012 Dickey et al.
8,187,951 B1 5/2012 Wang
8,192,901 B2 6/2012 Kageyama
8,196,234 B2 6/2012 Glunk
8,197,915 B2 6/2012 Oka et al.
8,198,168 B2 6/2012 Tanioku
8,202,575 B2 6/2012 Monsma et al.
8,206,506 B2 6/2012 Kadkhodayan et al.
8,216,380 B2 7/2012 White et al.
8,227,032 B2 7/2012 Dussarrat et al.
8,231,799 B2 7/2012 Bera et al.
D665,055 S 8/2012 Yanagisawa et al.
8,241,991 B2 8/2012 Hsieh et al.
8,241,992 B2 8/2012 Clevenger et al.
8,242,028 B1 8/2012 van Schravendijk et al.
8,242,031 B2 8/2012 Mallick et al.
8,246,900 B2 8/2012 Kasai et al.
8,252,114 B2 8/2012 Vukovic
8,252,659 B2 8/2012 Huyghabaert et al.
8,252,691 B2 8/2012 Beynet et al.
8,253,204 B2 8/2012 Lee et al.
8,267,633 B2 9/2012 Obikane
8,272,516 B2 9/2012 Salvador
8,278,176 B2 10/2012 Bauer et al.
8,278,224 B1 10/2012 Mui et al.
8,282,769 B2 10/2012 Iizuka
8,282,847 B2 10/2012 Romano
8,282,992 B2 10/2012 Myo et al.
8,287,648 B2 10/2012 Reed et al.
8,291,857 B2 10/2012 Lam et al.
8,293,016 B2 10/2012 Bahng et al.
8,293,642 B2 10/2012 Kim
8,298,336 B2 10/2012 Wang et al.
8,298,951 B1 10/2012 Nakano
8,307,472 B1 11/2012 Saxon et al.
8,309,173 B2 11/2012 Tuominen et al.
8,318,327 B2 11/2012 O'Donnell
8,318,584 B2 11/2012 Li et al.
8,323,413 B2 12/2012 Son
8,324,699 B2 12/2012 Ichijo et al.
8,328,939 B2 12/2012 Choi et al.
8,329,599 B2 12/2012 Fukazawa et al.
8,333,839 B2 12/2012 Oh
8,334,219 B2 12/2012 Lee et al.
8,338,809 B2 12/2012 Yang et al.
8,349,083 B2 1/2013 Takasuka et al.
D676,943 S 2/2013 Kluss et al.
8,367,528 B2 2/2013 Bauer et al.
8,372,204 B2 2/2013 Nakamura
8,378,464 B2 2/2013 Kato et al.
8,382,370 B2 2/2013 Aggarwal et al.
8,382,939 B2 2/2013 Kutney et al.
8,393,091 B2 3/2013 Kawamoto
8,394,466 B2 3/2013 Hong et al.
8,398,773 B2 3/2013 Jdira et al.
8,402,918 B2 3/2013 Kadkhodayan et al.
8,404,044 B2 3/2013 Arai
8,404,499 B2 3/2013 Moffatt
8,415,258 B2 4/2013 Akae
8,415,259 B2 4/2013 Lee et al.
8,415,587 B2 4/2013 Millman et al.
8,419,959 B2 4/2013 Bettencourt et al.
8,425,682 B2 4/2013 Wang et al.
8,430,620 B1 4/2013 Blank et al.
8,435,894 B2 5/2013 Chandrashekar et al.
8,440,259 B2 5/2013 Chiang et al.
8,443,484 B2 5/2013 Ozaki et al.
8,444,120 B2 5/2013 Gregg et al.
8,445,075 B2 5/2013 Xu et al.
8,450,191 B2 5/2013 Wang
8,454,749 B2 6/2013 Li
8,465,811 B2 6/2013 Ueda
8,465,903 B2 6/2013 Weidman et al.
8,466,411 B2 6/2013 Arai
8,470,187 B2 6/2013 Ha
8,470,718 B2 6/2013 Lee
8,484,846 B2 7/2013 Dhindsa
8,492,170 B2 7/2013 Xie et al.
8,496,377 B2 7/2013 Harr et al.
8,496,756 B2 7/2013 Cruse et al.
8,497,213 B2 7/2013 Yasui et al.
8,501,599 B2 8/2013 Ueno et al.
8,506,162 B2 8/2013 Schick et al.
8,506,713 B2 8/2013 Takagi
8,507,720 B2 8/2013 Shay
8,524,612 B2 9/2013 Li et al.
8,529,701 B2 9/2013 Morita
8,535,767 B1 9/2013 Kimura
8,536,068 B2 9/2013 Weidman et al.
D691,974 S 10/2013 Osada et al.
8,551,892 B2 10/2013 Nakano
8,557,712 B1 10/2013 Antonelli et al.
8,562,272 B2 10/2013 Lenz
8,563,443 B2 10/2013 Fukazawa
8,569,184 B2 10/2013 Oka
D693,200 S 11/2013 Saunders
D693,782 S 11/2013 Mori et al.
8,573,152 B2 11/2013 de la Llera et al.
8,573,154 B2 11/2013 Yorozuya
8,586,484 B2 11/2013 Matsuyama et al.
8,591,659 B1 11/2013 Fang et al.
8,592,005 B2 11/2013 Ueda
D694,790 S 12/2013 Matsumoto et al.
D695,240 S 12/2013 Iida et al.
8,608,885 B2 12/2013 Goto et al.
8,614,047 B2 12/2013 Ayothi et al.
8,616,765 B2 12/2013 Darabnia et al.
8,617,411 B2 12/2013 Singh
D697,038 S 1/2014 Matsumoto et al.
8,623,770 B1 1/2014 Gao et al.
8,633,115 B2 1/2014 Chang et al.
8,637,384 B2 1/2014 Ando et al.
D698,904 S 2/2014 Milligan et al.
8,642,488 B2 2/2014 Liu et al.
8,647,439 B2 2/2014 Sanchez et al.
8,647,722 B2 2/2014 Kobayashi et al.
8,647,993 B1 2/2014 Lavoie et al.
8,651,788 B1 2/2014 Budde
8,664,627 B1 3/2014 Ishikawa et al.
8,667,654 B2 3/2014 Gros-Jean
8,668,957 B2 3/2014 Dussarrat et al.
8,669,185 B2 3/2014 Onizawa
8,679,958 B2 3/2014 Takamure et al.
D702,188 S 4/2014 Jacobs
8,683,943 B2 4/2014 Onodera et al.
8,697,198 B2 4/2014 Lee
8,703,002 B2 4/2014 Matsudo et al.
8,709,162 B2 4/2014 Leung et al.
8,710,580 B2 4/2014 Sakuma et al.

(56) References Cited

U.S. PATENT DOCUMENTS

| | | | |
|---|---|---|---|
| 8,711,338 | B2 | 4/2014 | Liu et al. |
| D705,745 | S | 5/2014 | Kurs et al. |
| D705,762 | S | 5/2014 | Yu |
| 8,664,127 | B2 | 5/2014 | Bhatia et al. |
| 8,720,965 | B2 | 5/2014 | Hino et al. |
| 8,721,791 | B2 | 5/2014 | Choi et al. |
| 8,722,510 | B2 | 5/2014 | Watanabe et al. |
| 8,722,546 | B2 | 5/2014 | Fukazawa et al. |
| 8,726,837 | B2 | 5/2014 | Patalay et al. |
| 8,728,832 | B2 | 5/2014 | Raisanen et al. |
| 8,728,956 | B2 | 5/2014 | Lavoie et al. |
| 8,741,062 | B2 | 6/2014 | Lindfors et al. |
| 8,741,065 | B2 | 6/2014 | Odagiri et al. |
| 8,742,668 | B2 | 6/2014 | Nakano et al. |
| 8,758,512 | B2 | 6/2014 | Lee |
| 8,759,223 | B2 | 6/2014 | Sapre et al. |
| D709,536 | S | 7/2014 | Yoshimura et al. |
| D709,537 | S | 7/2014 | Kuwabara et al. |
| 8,764,085 | B2 | 7/2014 | Urabe |
| 8,771,791 | B2 | 7/2014 | Lee et al. |
| 8,771,807 | B2 | 7/2014 | Xiao et al. |
| 8,779,502 | B2 | 7/2014 | Sakuma et al. |
| 8,784,676 | B2 | 7/2014 | Guha et al. |
| 8,784,950 | B2 | 7/2014 | Fukazawa et al. |
| 8,784,951 | B2 | 7/2014 | Fukazawa et al. |
| 8,785,215 | B2 | 7/2014 | Kobayashi et al. |
| 8,785,311 | B2 | 7/2014 | Miyoshi |
| 8,790,743 | B1 | 7/2014 | Omari |
| 8,790,749 | B2 | 7/2014 | Omori et al. |
| 8,802,201 | B2 | 8/2014 | Raisanen et al. |
| 8,809,170 | B2 | 8/2014 | Bauer |
| D712,358 | S | 9/2014 | Allen et al. |
| D712,359 | S | 9/2014 | Allen et al. |
| 8,820,809 | B2 | 9/2014 | Ando et al. |
| 8,821,640 | B2 | 9/2014 | Cleary et al. |
| 8,821,985 | B2 | 9/2014 | Shao et al. |
| 8,823,672 | B2 | 9/2014 | Kim |
| 8,828,886 | B2 | 9/2014 | Samukawa et al. |
| 8,841,182 | B1 | 9/2014 | Chen et al. |
| 8,845,806 | B2 | 9/2014 | Aida et al. |
| 8,846,502 | B2 | 9/2014 | Haukka et al. |
| D715,410 | S | 10/2014 | Lohmann |
| 8,859,368 | B2 | 10/2014 | Deniz |
| 8,860,955 | B2 | 10/2014 | Rodnick et al. |
| 8,864,202 | B1 | 10/2014 | Schrameyer |
| 8,864,375 | B2 | 10/2014 | Abe et al. |
| D716,742 | S | 11/2014 | Jang et al. |
| 8,876,974 | B2 | 11/2014 | Wan |
| 8,877,300 | B2 | 11/2014 | Lee |
| 8,877,655 | B2 | 11/2014 | Shero et al. |
| 8,882,923 | B2 | 11/2014 | Saido et al. |
| 8,883,270 | B2 | 11/2014 | Shero et al. |
| 8,895,108 | B2 | 11/2014 | Lee |
| 8,895,395 | B1 | 11/2014 | Kerber et al. |
| 8,900,935 | B2 | 12/2014 | Guo et al. |
| 8,900,999 | B1 | 12/2014 | Wu et al. |
| 8,901,016 | B2 | 12/2014 | Jeongseok et al. |
| 8,911,553 | B2 | 12/2014 | Baluja et al. |
| 8,911,826 | B2 | 12/2014 | Adachi et al. |
| 8,912,101 | B2 | 12/2014 | Tsuji et al. |
| D720,838 | S | 1/2015 | Yamagishi et al. |
| 8,927,906 | B2 | 1/2015 | Tadokoro et al. |
| 8,932,802 | B2 | 1/2015 | Wu et al. |
| 8,933,375 | B2 | 1/2015 | Dunn et al. |
| 8,937,800 | B2 | 1/2015 | Lubomirsky et al. |
| 8,940,646 | B1 | 1/2015 | Chandrasekharan |
| D723,153 | S | 2/2015 | Borkholder |
| 8,945,305 | B2 | 2/2015 | Marsh |
| 8,945,306 | B2 | 2/2015 | Tsuda |
| 8,945,339 | B2 | 2/2015 | Kakimoto |
| 8,946,830 | B2 | 2/2015 | Jung et al. |
| 8,956,971 | B2 | 2/2015 | Huakka |
| 8,956,983 | B2 | 2/2015 | Swaminathan |
| D723,330 | S | 3/2015 | York |
| D724,553 | S | 3/2015 | Choi |
| D724,701 | S | 3/2015 | Yamagishi et al. |
| D725,168 | S | 3/2015 | Yamagishi |
| 8,967,608 | B2 | 3/2015 | Mitsumori et al. |
| 8,968,989 | B2 | 3/2015 | Ouattara et al. |
| 8,969,934 | B1 | 3/2015 | Cheng et al. |
| 8,974,868 | B2 | 3/2015 | Ishikawa et al. |
| 8,980,006 | B2 | 3/2015 | Huh et al. |
| 8,986,456 | B2 | 3/2015 | Fondurulia et al. |
| 8,991,214 | B2 | 3/2015 | Hoshino et al. |
| 8,991,887 | B2 | 3/2015 | Shin et al. |
| 8,993,054 | B2 | 3/2015 | Jung et al. |
| 8,993,072 | B2 | 3/2015 | Xiao et al. |
| 8,993,457 | B1 | 3/2015 | Ramkumar et al. |
| D726,365 | S | 4/2015 | Weigensberg |
| D726,884 | S | 4/2015 | Yamagishi et al. |
| 8,999,102 | B2 | 4/2015 | Miyoshi et al. |
| 9,004,744 | B1 | 4/2015 | Kemp |
| 9,005,539 | B2 | 4/2015 | Halpin et al. |
| 9,017,481 | B1 | 4/2015 | Pettinger et al. |
| 9,017,933 | B2 | 4/2015 | Liu et al. |
| 9,018,093 | B2 | 4/2015 | Tsuji et al. |
| 9,018,111 | B2 | 4/2015 | Milligan et al. |
| 9,018,567 | B2 | 4/2015 | de Ridder et al. |
| 9,021,985 | B2 | 5/2015 | Alokozai et al. |
| 9,023,737 | B2 | 5/2015 | Beynet et al. |
| 9,023,738 | B2 | 5/2015 | Kato et al. |
| 9,029,244 | B2 | 5/2015 | Won et al. |
| 9,029,253 | B2 | 5/2015 | Milligan et al. |
| 9,029,272 | B1 | 5/2015 | Nakano |
| D732,145 | S | 6/2015 | Yamagishi |
| D732,644 | S | 6/2015 | Yamagishi et al. |
| D733,257 | S | 6/2015 | Schoenherr et al. |
| D733,261 | S | 6/2015 | Yamagishi et al. |
| D733,262 | S | 6/2015 | Kang |
| 9,057,388 | B2 | 6/2015 | Comeau et al. |
| 9,064,815 | B2 | 6/2015 | Zhang et al. |
| D733,843 | S | 7/2015 | Yamagishi |
| D734,377 | S | 7/2015 | Hirakida |
| 9,076,635 | B2 | 7/2015 | Gross et al. |
| 9,076,726 | B2 | 7/2015 | Kauerauf et al. |
| D735,836 | S | 8/2015 | Yamagishi et al. |
| D736,348 | S | 8/2015 | Tan |
| 9,095,869 | B2 | 8/2015 | Kilpi et al. |
| 9,096,931 | B2 | 8/2015 | Yednak et al. |
| 9,099,423 | B2 | 8/2015 | Weeks et al. |
| 9,099,505 | B2 | 8/2015 | Kusakabe et al. |
| 9,111,972 | B2 | 8/2015 | Takeshita et al. |
| 9,117,657 | B2 | 8/2015 | Nakano et al. |
| 9,117,866 | B2 | 8/2015 | Marquardt et al. |
| D739,222 | S | 9/2015 | Chadbourne |
| 9,123,510 | B2 | 9/2015 | Nakano et al. |
| 9,123,577 | B2 | 9/2015 | Fujimoto et al. |
| 9,127,358 | B2 | 9/2015 | Inoue et al. |
| 9,127,362 | B2 | 9/2015 | Scheible et al. |
| 9,129,897 | B2 | 9/2015 | Pore et al. |
| 9,136,108 | B2 | 9/2015 | Matsushita et al. |
| 9,136,180 | B2 | 9/2015 | Machkaoutsan |
| 9,142,393 | B2 | 9/2015 | Okabe et al. |
| 9,142,437 | B2 | 9/2015 | Fosnight et al. |
| 9,142,764 | B1 | 9/2015 | Wang |
| 9,153,441 | B2 | 10/2015 | Takamure et al. |
| 9,163,310 | B2 | 10/2015 | Lee |
| 9,166,012 | B2 | 10/2015 | Sim et al. |
| 9,169,975 | B2 | 10/2015 | Sarin et al. |
| 9,171,714 | B2 | 10/2015 | Mori |
| 9,171,715 | B2 | 10/2015 | Matero |
| 9,171,716 | B2 | 10/2015 | Fukuda |
| D742,202 | S | 11/2015 | Cyphers et al. |
| D743,357 | S | 11/2015 | Vyne |
| D743,513 | S | 11/2015 | Yamagishi |
| 9,174,178 | B2 | 11/2015 | Berger et al. |
| 9,175,394 | B2 | 11/2015 | Yudovsky et al. |
| 9,177,784 | B2 | 11/2015 | Raisanen et al. |
| 9,184,047 | B2 | 11/2015 | Liu et al. |
| 9,184,054 | B1 | 11/2015 | Huang et al. |
| 9,190,263 | B2 | 11/2015 | Ishikawa et al. |
| 9,190,264 | B2 | 11/2015 | Yuasa et al. |
| 9,196,483 | B1 | 11/2015 | Lee et al. |
| D745,641 | S | 12/2015 | Blum |

(56) References Cited

U.S. PATENT DOCUMENTS 9,202,727 B2 12/2015 Dunn et al.
9,214,333 B1 12/2015 Sims et al.
9,214,340 B2 12/2015 Kurita et al.
9,219,006 B2 12/2015 Chatterjee
9,223,203 B2 12/2015 Farm et al.
9,228,259 B2 1/2016 Haukka et al.
9,240,412 B2 1/2016 Xie et al.
9,245,742 B2 1/2016 Haukka
9,252,024 B2 2/2016 Lam et al.
9,252,238 B1 2/2016 Trevino et al.
9,257,274 B2 2/2016 Kang et al.
9,263,298 B2 2/2016 Matsumoto et al.
9,267,204 B2 2/2016 Honma
9,267,850 B2 2/2016 Aggarwal
D751,176 S 3/2016 Schoenherr et al.
9,275,834 B1 3/2016 Park et al.
9,281,223 B2 3/2016 Hara
9,281,277 B2 3/2016 Baek et al.
9,284,642 B2 3/2016 Nakano
9,287,273 B2 3/2016 Ragnarsson et al.
9,297,705 B2 3/2016 Aggarwal
9,299,557 B2 3/2016 Tolle et al.
9,299,595 B2 3/2016 Dunn et al.
D753,269 S 4/2016 Yamagishi et al.
D753,629 S 4/2016 Plattard
9,305,836 B1 4/2016 Gates et al.
9,309,598 B2 4/2016 Wang et al.
9,309,978 B2 4/2016 Hatch et al.
9,310,684 B2 4/2016 Meyers et al.
9,312,155 B2 4/2016 Mori
9,315,897 B2 4/2016 Byun
9,324,811 B2 4/2016 Weeks
9,324,846 B1 4/2016 Camillo
D756,929 S 5/2016 Harck et al.
9,331,200 B1 5/2016 Wang et al.
9,337,031 B2 5/2016 Kim et al.
9,337,054 B2 5/2016 Hunks et al.
9,337,057 B2 5/2016 Park et al.
9,341,296 B2 5/2016 Yednak
9,343,297 B1 5/2016 Fukazawa et al.
9,343,308 B2 5/2016 Isii
9,343,343 B2 5/2016 Mori
9,343,350 B2 5/2016 Arai
9,349,620 B2 5/2016 Kamata et al.
9,353,440 B2 5/2016 Ge et al.
9,353,441 B2 5/2016 Chung
9,355,876 B2 5/2016 Reuter et al.
9,355,882 B2 5/2016 Wu et al.
D759,137 S 6/2016 Hassan
D759,193 S 6/2016 Gutierrez et al.
9,362,107 B2 6/2016 Thadani et al.
9,362,137 B2 6/2016 Kang et al.
9,362,180 B2 6/2016 Lee et al.
9,365,924 B2 6/2016 Nonaka
9,368,352 B2 6/2016 Takamure et al.
9,370,863 B2 6/2016 Tsuji et al.
9,378,969 B2 6/2016 Hsu et al.
D761,325 S 7/2016 Abed
9,384,987 B2 7/2016 Jung et al.
9,390,909 B2 7/2016 Pasquale et al.
9,394,608 B2 7/2016 Shero et al.
9,396,934 B2 7/2016 Tolle
9,396,956 B1 7/2016 Fukazawa
9,399,228 B2 7/2016 Breiling et al.
D764,196 S 8/2016 Handler et al.
9,404,587 B2 8/2016 Shugrue
9,412,564 B2 8/2016 Milligan
9,412,581 B2 8/2016 Thadani et al.
9,412,582 B2 8/2016 Sasaki et al.
9,418,885 B2 8/2016 Sung et al.
9,425,078 B2 8/2016 Tang et al.
9,428,833 B1 8/2016 Duvall et al.
9,443,725 B2 9/2016 Liu et al.
9,447,498 B2 9/2016 Shiba et al.
9,449,793 B2 9/2016 Shaji et al.
9,449,795 B2 9/2016 Sabri et al.
9,449,843 B1 9/2016 Korolik et al.
9,449,987 B1 9/2016 Miyata et al.
9,455,138 B1 9/2016 Fukazawa
9,455,177 B1 9/2016 Park et al.
9,460,954 B2 10/2016 De Jong et al.
9,464,352 B2 10/2016 Nakano et al.
9,472,410 B2 10/2016 Sadjadi et al.
9,472,432 B1 10/2016 Blank
9,474,163 B2 10/2016 Tolle et al.
9,478,414 B2 10/2016 Kobayashi et al.
9,478,415 B2 10/2016 Kimura
D770,993 S 11/2016 Yoshida et al.
9,484,191 B2 11/2016 Winkler
9,496,225 B1 11/2016 Adusumilli et al.
9,514,927 B2 12/2016 Tolle et al.
9,514,932 B2 12/2016 Mallick et al.
9,520,289 B2 12/2016 Park et al.
9,523,148 B1 12/2016 Pore et al.
D777,546 S 1/2017 Ishii et al.
9,543,180 B2 1/2017 Kamiya
9,556,516 B2 1/2017 Takamure
9,558,931 B2 1/2017 Tang
9,564,312 B2 2/2017 Henri et al.
9,564,314 B2 2/2017 Takamure et al.
9,570,302 B1 2/2017 Chang et al.
9,574,268 B1 2/2017 Dunn et al.
9,576,952 B2 2/2017 Joshi et al.
9,583,333 B2 2/2017 Chatterjee
9,583,345 B2 2/2017 Chen et al.
D782,419 S 3/2017 Willette
9,589,770 B2 3/2017 Winkler
9,605,342 B2 3/2017 Alokozai et al.
9,605,343 B2 3/2017 Winkler
9,605,736 B1 3/2017 Foshage et al.
9,607,837 B1 3/2017 Namba
D783,351 S 4/2017 Fujino et al.
D784,276 S 4/2017 Tiner et al.
9,613,801 B2 4/2017 Carcasi et al.
9,618,846 B2 4/2017 Shamma et al.
9,627,221 B1 4/2017 Zaitsu et al.
D785,766 S 5/2017 Sato
D787,458 S 5/2017 Kim et al.
9,640,416 B2 5/2017 Arai
9,640,448 B2 5/2017 Ikegawa et al.
9,640,542 B2 5/2017 Lee et al.
9,644,266 B2 5/2017 Nasu et al.
9,647,114 B2 5/2017 Margetis
9,653,267 B2 5/2017 Carducci et al.
9,657,845 B2 5/2017 Shugrue
9,659,799 B2 5/2017 Lawson
9,663,857 B2 5/2017 Nakano et al.
9,666,528 B1 5/2017 Bergendahl et al.
D789,888 S 6/2017 Jang et al.
D790,041 S 6/2017 Jang et al.
9,680,268 B1 6/2017 Finona
9,684,234 B2 6/2017 Darling et al.
9,685,320 B2 6/2017 Kang et al.
9,691,668 B2 6/2017 Chang et al.
9,691,771 B2 6/2017 Lansalot-Matras
9,698,031 B2 7/2017 Kobayashi et al.
9,708,707 B2 7/2017 Ditizio et al.
9,708,708 B2 7/2017 Isobe et al.
9,711,345 B2 7/2017 Shiba et al.
D793,352 S 8/2017 Hill
D793,526 S 8/2017 Behdjat
D793,572 S 8/2017 Kozuka et al.
D793,976 S 8/2017 Fukushima et al.
D794,753 S 8/2017 Miller
D795,208 S 8/2017 Sasaki et al.
9,735,024 B2 8/2017 Zaitsu
9,741,546 B2 8/2017 Carducci et al.
9,741,559 B2 8/2017 Shimura et al.
9,745,658 B2 8/2017 Kang et al.
9,748,104 B2 8/2017 Sasaki et al.
9,748,145 B1 8/2017 Kannan et al.
D796,458 S 9/2017 Jang et al.
D796,670 S 9/2017 Dolk et al.
D797,067 S 9/2017 Zhang et al.

(56) References Cited

U.S. PATENT DOCUMENTS

D798,248 S 9/2017 Hanson et al.
9,754,779 B1 9/2017 Ishikawa
9,754,818 B2 9/2017 Shin et al.
9,759,489 B2 9/2017 Kaneko
9,765,432 B2 9/2017 Ge et al.
9,773,818 B2 9/2017 Kimura
D800,782 S 10/2017 Bever et al.
9,778,561 B2 10/2017 Marks et al.
9,780,225 B2 10/2017 Venkatasubramanian et al.
9,786,491 B2 10/2017 Suzuki et al.
9,786,570 B2 10/2017 Kang et al.
9,790,595 B2 10/2017 Jung et al.
9,793,115 B2 10/2017 Tolle
9,793,135 B1 10/2017 Zaitsu et al.
9,793,148 B2 10/2017 Yamagishi et al.
9,798,308 B2 10/2017 Mimura
9,799,736 B1 10/2017 Ebrish et al.
9,803,926 B2 10/2017 Kikuchi et al.
D801,942 S 11/2017 Riker et al.
D802,472 S 11/2017 Sasaki et al.
D802,546 S 11/2017 Jang et al.
D803,802 S 11/2017 Sasaki et al.
9,808,246 B2 11/2017 Shelton et al.
9,812,319 B1 11/2017 Fukazawa et al.
9,812,320 B1 11/2017 Pore et al.
9,812,372 B2 11/2017 Choi et al.
9,820,289 B1 11/2017 Pawar et al.
9,824,881 B2 11/2017 Niskanen et al.
9,824,884 B1 11/2017 Sims et al.
9,824,893 B1 11/2017 Smith et al.
9,837,355 B2 12/2017 Briggs et al.
9,842,835 B1 12/2017 Cheng et al.
9,847,221 B1 12/2017 McLaughlin et al.
9,847,247 B2 12/2017 Huang et al.
9,850,573 B1 12/2017 Sun
D807,494 S 1/2018 Kim et al.
D808,254 S 1/2018 Deleu
9,859,151 B1 1/2018 Zhu
9,865,455 B1 1/2018 Sims et al.
9,865,456 B1 1/2018 Pandey et al.
9,865,815 B2 1/2018 Hausmann
9,868,131 B2 1/2018 Kilpi et al.
9,870,964 B1 1/2018 Yoshino et al.
9,875,891 B2 1/2018 Henri et al.
9,875,893 B2 1/2018 Takamure et al.
9,881,788 B2 1/2018 Kim et al.
D810,705 S 2/2018 Krishnan et al.
9,887,082 B1 2/2018 Pore et al.
9,890,456 B2 2/2018 Tolle et al.
9,891,521 B2 2/2018 Kang et al.
9,892,908 B2 2/2018 Pettinger et al.
9,892,913 B2 2/2018 Margetis et al.
9,895,715 B2 2/2018 Haukka et al.
9,899,291 B2 2/2018 Kato
9,899,405 B2 2/2018 Kim
9,905,420 B2 2/2018 Margetis et al.
9,905,492 B2 2/2018 Tang et al.
9,909,214 B2 3/2018 Suemori
9,909,492 B2 3/2018 Jeswine
9,911,595 B1 3/2018 Smith et al.
9,911,676 B2 3/2018 Tang
9,916,980 B1 3/2018 Knaepen
9,920,451 B2 3/2018 Sivaramakrishnan et al.
9,922,824 B2 3/2018 Okada
9,929,005 B1 3/2018 Shimamoto et al.
9,929,011 B2 3/2018 Hawryluk et al.
9,929,055 B2 3/2018 Dube et al.
9,951,421 B2 4/2018 Lind
9,960,033 B1 5/2018 Nozawa
9,960,072 B2 5/2018 Coomer
9,966,299 B2 5/2018 Tang et al.
9,970,112 B2 5/2018 Koshi et al.
9,984,869 B1 5/2018 Blanquart
D819,580 S 6/2018 Krishnan et al.
9,987,747 B2 6/2018 Hwang et al.
9,991,138 B2 6/2018 Lin et al.
9,996,004 B2 6/2018 Smith et al.
9,997,357 B2 6/2018 Arghavani et al.
9,997,373 B2 6/2018 Hudson
10,032,628 B2 6/2018 Xie et al.
10,014,212 B2 7/2018 Chen et al.
10,017,856 B1 7/2018 Arnepalli et al.
10,018,920 B2 7/2018 Chang et al.
10,023,960 B2 7/2018 Alokozai
10,032,792 B2 7/2018 Kim et al.
D825,505 S 8/2018 Hanson et al.
D825,614 S 8/2018 Bever et al.
10,043,661 B2 8/2018 Kato et al.
10,047,435 B2 8/2018 Haukka et al.
10,053,774 B2 8/2018 Tolle et al.
10,060,473 B2 8/2018 Davey et al.
D827,592 S 9/2018 Ichino et al.
D829,306 S 9/2018 Ikedo et al.
10,083,836 B2 9/2018 Milligan
D830,981 S 10/2018 Jeong et al.
10,087,522 B2 10/2018 Raisanen et al.
10,087,525 B2 10/2018 Schmotzer et al.
10,090,316 B2 10/2018 Ootsuka
10,103,040 B1 10/2018 Oosterlaken et al.
10,106,892 B1 10/2018 Siddiqui et al.
RE47,145 E 11/2018 Hashimoto
D834,686 S 11/2018 Yamada et al.
10,121,671 B2 11/2018 Fu et al.
10,134,617 B2 11/2018 Gurary et al.
10,134,757 B2 11/2018 Chun et al.
RE47,170 E 12/2018 Beynet et al.
10,147,600 B2 12/2018 Takamure et al.
10,167,557 B2 1/2019 Hawkins et al.
10,177,024 B2 1/2019 Gomm et al.
10,177,025 B2 1/2019 Pore
10,179,947 B2 1/2019 Fukazawa
10,186,420 B2 1/2019 Fukazawa
10,190,213 B2 1/2019 Zhu et al.
10,190,214 B2 1/2019 Shon et al.
10,190,701 B2 1/2019 Raj et al.
10,192,734 B2 1/2019 Sanchez et al.
10,193,429 B2 1/2019 Smith et al.
D840,364 S 2/2019 Ichino et al.
10,204,788 B1 2/2019 Ye et al.
10,211,308 B2 2/2019 Zhu et al.
10,229,833 B2 3/2019 Raisanen et al.
10,229,851 B2 3/2019 Briggs et al.
10,229,985 B1 3/2019 Li et al.
10,236,177 B1 3/2019 Kohen et al.
D846,008 S 4/2019 Geldenhuys et al.
10,249,524 B2 4/2019 den Hartog Besselink et al.
10,249,577 B2 4/2019 Lee et al.
10,262,859 B2 4/2019 Margetis et al.
10,269,558 B2 4/2019 Blanquart et al.
10,276,355 B2 4/2019 White et al.
D849,055 S 5/2019 Kneip
D849,662 S 5/2019 Rike
10,283,353 B2 5/2019 Kobayashi et al.
10,287,684 B2 5/2019 Yanai et al.
10,290,508 B1 5/2019 Kubota et al.
10,297,440 B2 5/2019 Yamazaki et al.
RE47,440 E 6/2019 Yudovsky et al.
10,312,055 B2 6/2019 Suzuki
10,312,129 B2 6/2019 Coomer
10,319,588 B2 6/2019 Mattinen et al.
10,322,384 B2 6/2019 Stumpf et al.
10,332,747 B1 6/2019 Watanabe et al.
10,332,963 B1 6/2019 Xie
D855,089 S 7/2019 Hopkins
10,340,125 B2 7/2019 Winkler
10,340,135 B2 7/2019 Blanquart
10,343,920 B2 7/2019 Haukka
10,347,547 B2 7/2019 Varadarajan et al.
10,354,873 B2 7/2019 Ko et al.
10,361,201 B2 7/2019 Xie et al.
10,361,366 B2 7/2019 Hakamata et al.
10,367,080 B2 7/2019 Tang et al.
10,388,513 B1 8/2019 Blanquart
10,395,917 B2 8/2019 Niskanen et al.

(56) References Cited

U.S. PATENT DOCUMENTS

| | | | |
|---|---|---|---|
| 10,395,919 | B2 | 8/2019 | Masaru et al. |
| 10,395,963 | B2 | 8/2019 | Cooke |
| D859,136 | S | 9/2019 | Tenander et al. |
| 10,400,335 | B2 | 9/2019 | Ge et al. |
| 10,410,943 | B2 | 9/2019 | Jiang et al. |
| 10,424,476 | B2 | 9/2019 | Suzuki et al. |
| 10,424,477 | B2 | 9/2019 | Niskanen et al. |
| D864,134 | S | 10/2019 | Watarai et al. |
| 10,428,419 | B2 | 10/2019 | Huotari et al. |
| 10,435,790 | B2 | 10/2019 | Fukazawa et al. |
| D867,867 | S | 11/2019 | Tenander et al. |
| 10,468,244 | B2 | 11/2019 | Li et al. |
| 10,468,251 | B2 | 11/2019 | Ishikawa et al. |
| 10,483,154 | B1 | 11/2019 | Smith et al. |
| 10,510,529 | B2 | 12/2019 | Suzuki et al. |
| 10,510,871 | B1 | 12/2019 | More et al. |
| 10,529,554 | B2 | 1/2020 | Ishikawa et al. |
| D876,504 | S | 2/2020 | Lee et al. |
| 10,590,531 | B1 | 3/2020 | Shirako et al. |
| 10,590,535 | B2 | 3/2020 | Huggare |
| 10,600,637 | B2 | 3/2020 | Suzuki et al. |
| D880,437 | S | 4/2020 | Lee et al. |
| D881,338 | S | 4/2020 | Chen |
| 10,622,196 | B2 | 4/2020 | Nagayama et al. |
| 10,622,236 | B2 | 4/2020 | Kuo et al. |
| 10,648,788 | B2 | 5/2020 | Boyd et al. |
| 10,662,525 | B2 | 5/2020 | Jang et al. |
| 10,704,143 | B1 | 7/2020 | Hisamitsu et al. |
| 10,714,335 | B2 | 7/2020 | Kim et al. |
| 10,731,249 | B2 | 8/2020 | Hatanpää et al. |
| 10,734,497 | B2 | 8/2020 | Zhu et al. |
| 10,741,386 | B2 | 8/2020 | Chen et al. |
| 10,763,139 | B2 | 9/2020 | Shindo |
| 10,770,336 | B2 | 9/2020 | Hill et al. |
| D900,036 | S | 10/2020 | Wuester et al. |
| 10,847,529 | B2 * | 11/2020 | Yoo .................... H01L 21/0228 |
| D903,477 | S | 12/2020 | Goratela et al. |
| D913,980 | S | 3/2021 | Lee et al. |
| D914,620 | S | 3/2021 | Rokkam et al. |
| 10,950,477 | B2 | 3/2021 | Lin et al. |
| 11,018,003 | B2 | 5/2021 | Huang et al. |
| D922,229 | S | 6/2021 | Jun et al. |
| 11,053,584 | B2 | 7/2021 | Hsieh et al. |
| 11,195,845 | B2 * | 12/2021 | Yoo .................. H01L 27/11548 |
| 2001/0000141 | A1 | 4/2001 | Zhou et al. |
| 2001/0001953 | A1 | 5/2001 | Griffiths et al. |
| 2001/0002581 | A1 | 6/2001 | Nishikawa et al. |
| 2001/0003015 | A1 | 6/2001 | Chang et al. |
| 2001/0003191 | A1 | 6/2001 | Kovacs et al. |
| 2001/0003271 | A1 | 6/2001 | Otsuki |
| 2001/0004880 | A1 | 6/2001 | Cho et al. |
| 2001/0006070 | A1 | 7/2001 | Shang |
| 2001/0007244 | A1 | 7/2001 | Matsuse |
| 2001/0007246 | A1 | 7/2001 | Ueda et al. |
| 2001/0007645 | A1 | 7/2001 | Honma |
| 2001/0014267 | A1 | 8/2001 | Yamaga et al. |
| 2001/0014514 | A1 | 8/2001 | Geusic |
| 2001/0015343 | A1 | 8/2001 | Sprey et al. |
| 2001/0016273 | A1 | 8/2001 | Narasimhan et al. |
| 2001/0017103 | A1 | 8/2001 | Takeshita et al. |
| 2001/0018267 | A1 | 8/2001 | Shinriki et al. |
| 2001/0019347 | A1 | 9/2001 | Hauck |
| 2001/0019777 | A1 | 9/2001 | Tanaka et al. |
| 2001/0019900 | A1 | 9/2001 | Hasegawa |
| 2001/0020715 | A1 | 9/2001 | Yamasaki |
| 2001/0021591 | A1 | 9/2001 | Srinivasan et al. |
| 2001/0022215 | A1 | 9/2001 | Donohoe |
| 2001/0024387 | A1 | 9/2001 | Raaijmakers et al. |
| 2001/0027026 | A1 | 10/2001 | Dhindsa et al. |
| 2001/0027585 | A1 | 10/2001 | Lee |
| 2001/0028924 | A1 | 10/2001 | Sherman |
| 2001/0031535 | A1 | 10/2001 | Agnello et al. |
| 2001/0031541 | A1 | 10/2001 | Madan et al. |
| 2001/0034097 | A1 | 10/2001 | Lim et al. |
| 2001/0038783 | A1 | 11/2001 | Nakashima et al. |
| 2001/0039922 | A1 | 11/2001 | Nakahara |
| 2001/0039966 | A1 | 11/2001 | Walpole et al. |
| 2001/0040511 | A1 | 11/2001 | Bushner et al. |
| 2001/0041250 | A1 | 11/2001 | Werkhoven et al. |
| 2001/0042511 | A1 | 11/2001 | Liu et al. |
| 2001/0042514 | A1 | 11/2001 | Mizuno et al. |
| 2001/0042594 | A1 | 11/2001 | Shamouilian et al. |
| 2001/0046765 | A1 | 11/2001 | Cappellani et al. |
| 2001/0047761 | A1 | 12/2001 | Wijck et al. |
| 2001/0048981 | A1 | 12/2001 | Suzuki |
| 2001/0049080 | A1 | 12/2001 | Asano |
| 2001/0049202 | A1 | 12/2001 | Maeda et al. |
| 2001/0052556 | A1 | 12/2001 | Ting et al. |
| 2001/0054381 | A1 | 12/2001 | Umotoy et al. |
| 2001/0054388 | A1 | 12/2001 | Qian |
| 2002/0000195 | A1 | 1/2002 | Bang et al. |
| 2002/0000202 | A1 | 1/2002 | Yuda et al. |
| 2002/0001971 | A1 | 1/2002 | Cho |
| 2002/0001974 | A1 | 1/2002 | Chan |
| 2002/0001976 | A1 | 1/2002 | Danek |
| 2002/0005400 | A1 | 1/2002 | Gat et al. |
| 2002/0005943 | A1 | 1/2002 | Voinalovich |
| 2002/0008270 | A1 | 1/2002 | Marsh |
| 2002/0009119 | A1 | 1/2002 | Matthew et al. |
| 2002/0009560 | A1 | 1/2002 | Ozono |
| 2002/0009861 | A1 | 1/2002 | Narwankar et al. |
| 2002/0011210 | A1 | 1/2002 | Satoh et al. |
| 2002/0011211 | A1 | 1/2002 | Halpin |
| 2002/0011310 | A1 | 1/2002 | Kamarehi et al. |
| 2002/0013792 | A1 | 1/2002 | Imielinski et al. |
| 2002/0014204 | A1 | 2/2002 | Pyo |
| 2002/0014483 | A1 | 2/2002 | Suzuki et al. |
| 2002/0015853 | A1 | 2/2002 | Wataya et al. |
| 2002/0016829 | A1 | 2/2002 | Defosse |
| 2002/0020429 | A1 | 2/2002 | Selbrede et al. |
| 2002/0022347 | A1 | 2/2002 | Park et al. |
| 2002/0023677 | A1 | 2/2002 | Zheng |
| 2002/0025688 | A1 | 2/2002 | Kato |
| 2002/0027945 | A1 | 3/2002 | Hirano et al. |
| 2002/0030047 | A1 | 3/2002 | Shao et al. |
| 2002/0031644 | A1 | 3/2002 | Malofsky et al. |
| 2002/0033183 | A1 | 3/2002 | Sun et al. |
| 2002/0036065 | A1 | 3/2002 | Yamagishi et al. |
| 2002/0041931 | A1 | 4/2002 | Suntola et al. |
| 2002/0043337 | A1 | 4/2002 | Goodman et al. |
| 2002/0045336 | A1 | 4/2002 | Locati et al. |
| 2002/0047705 | A1 | 4/2002 | Tada et al. |
| 2002/0048634 | A1 | 4/2002 | Basceri |
| 2002/0050648 | A1 | 5/2002 | Kishida et al. |
| 2002/0052119 | A1 | 5/2002 | Cleemput |
| 2002/0061716 | A1 | 5/2002 | Korovin et al. |
| 2002/0062633 | A1 | 5/2002 | Denker et al. |
| 2002/0064592 | A1 | 5/2002 | Datta et al. |
| 2002/0064598 | A1 | 5/2002 | Wang et al. |
| 2002/0066532 | A1 | 6/2002 | Shih et al. |
| 2002/0068458 | A1 | 6/2002 | Chiang et al. |
| 2002/0069222 | A1 | 6/2002 | McNeely |
| 2002/0073922 | A1 | 6/2002 | Frankel et al. |
| 2002/0073923 | A1 | 6/2002 | Saito et al. |
| 2002/0076490 | A1 | 6/2002 | Chiang et al. |
| 2002/0076507 | A1 | 6/2002 | Chiang et al. |
| 2002/0076944 | A1 | 6/2002 | Wang et al. |
| 2002/0078893 | A1 | 6/2002 | Van Os et al. |
| 2002/0079056 | A1 | 6/2002 | Kudo et al. |
| 2002/0079714 | A1 | 6/2002 | Soucy et al. |
| 2002/0081826 | A1 | 6/2002 | Rotondaro et al. |
| 2002/0086501 | A1 | 7/2002 | O'Donnell et al. |
| 2002/0088542 | A1 | 7/2002 | Nishikawa et al. |
| 2002/0090735 | A1 | 7/2002 | Kishkovich et al. |
| 2002/0094378 | A1 | 7/2002 | O'Donnell et al. |
| 2002/0094388 | A1 | 7/2002 | Fonash et al. |
| 2002/0096211 | A1 | 7/2002 | Zheng |
| 2002/0098627 | A1 | 7/2002 | Pomarede et al. |
| 2002/0099470 | A1 | 7/2002 | Zinger et al. |
| 2002/0100418 | A1 | 8/2002 | Sandhu et al. |
| 2002/0104481 | A1 | 8/2002 | Chiang et al. |
| 2002/0104751 | A1 | 8/2002 | Drewery et al. |
| 2002/0106909 | A1 | 8/2002 | Kato et al. |
| 2002/0108570 | A1 | 8/2002 | Lindfors |

(56) References Cited

U.S. PATENT DOCUMENTS

| | | | |
|---|---|---|---|
| 2002/0108670 | A1 | 8/2002 | Baker et al. |
| 2002/0108714 | A1 | 8/2002 | Doering et al. |
| 2002/0109115 | A1 | 8/2002 | Cederstav et al. |
| 2002/0110695 | A1 | 8/2002 | Yang et al. |
| 2002/0110991 | A1 | 8/2002 | Li |
| 2002/0112114 | A1 | 8/2002 | Blair et al. |
| 2002/0114886 | A1 | 8/2002 | Chou et al. |
| 2002/0115252 | A1 | 8/2002 | Haukka et al. |
| 2002/0117113 | A1 | 8/2002 | Tsuruno et al. |
| 2002/0117262 | A1 | 8/2002 | Pang et al. |
| 2002/0122885 | A1 | 9/2002 | Ahn |
| 2002/0123200 | A1 | 9/2002 | Yamamoto et al. |
| 2002/0123230 | A1 | 9/2002 | Hubacek |
| 2002/0123237 | A1 | 9/2002 | Nguyen et al. |
| 2002/0124883 | A1 | 9/2002 | Zheng |
| 2002/0124906 | A1 | 9/2002 | Suzuki et al. |
| 2002/0127350 | A1 | 9/2002 | Ishikawa et al. |
| 2002/0127956 | A1 | 9/2002 | Ashjaee et al. |
| 2002/0129768 | A1 | 9/2002 | Carpenter et al. |
| 2002/0132408 | A1 | 9/2002 | Ma et al. |
| 2002/0134511 | A1 | 9/2002 | Ushioda et al. |
| 2002/0136214 | A1 | 9/2002 | Do et al. |
| 2002/0136909 | A1 | 9/2002 | Yang |
| 2002/0139775 | A1 | 10/2002 | Chang |
| 2002/0146512 | A1 | 10/2002 | Rossman |
| 2002/0151327 | A1 | 10/2002 | Levitt |
| 2002/0152244 | A1 | 10/2002 | Dean et al. |
| 2002/0155219 | A1 | 10/2002 | Wang et al. |
| 2002/0155708 | A1 | 10/2002 | Lo et al. |
| 2002/0157611 | A1 | 10/2002 | Bondestam et al. |
| 2002/0160112 | A1 | 10/2002 | Sakai et al. |
| 2002/0164420 | A1 | 11/2002 | Derderian et al. |
| 2002/0164423 | A1 | 11/2002 | Chiang et al. |
| 2002/0168870 | A1 | 11/2002 | Matsuki |
| 2002/0170676 | A1 | 11/2002 | Mitrovic et al. |
| 2002/0172768 | A1 | 11/2002 | Endo et al. |
| 2002/0174106 | A1 | 11/2002 | Martin |
| 2002/0179011 | A1 | 12/2002 | Jonnalagadda et al. |
| 2002/0181612 | A1 | 12/2002 | Warble et al. |
| 2002/0184111 | A1 | 12/2002 | Swanson |
| 2002/0187650 | A1 | 12/2002 | Blalock et al. |
| 2002/0187656 | A1 | 12/2002 | Tan et al. |
| 2002/0188376 | A1 | 12/2002 | Derderian et al. |
| 2002/0192370 | A1 | 12/2002 | Metzner et al. |
| 2002/0197402 | A1 | 12/2002 | Chiang et al. |
| 2002/0197849 | A1 | 12/2002 | Mandal |
| 2003/0000647 | A1 | 1/2003 | Yudovsky et al. |
| 2003/0002562 | A1 | 1/2003 | Yerlikaya et al. |
| 2003/0003607 | A1 | 1/2003 | Kagoshima |
| 2003/0003635 | A1 | 1/2003 | Paranjpe et al. |
| 2003/0003696 | A1 | 1/2003 | Gelatos et al. |
| 2003/0003719 | A1 | 1/2003 | Lim et al. |
| 2003/0008528 | A1 | 1/2003 | Xia et al. |
| 2003/0008602 | A1 | 1/2003 | Ashjaee et al. |
| 2003/0010355 | A1 | 1/2003 | Nowak et al. |
| 2003/0010451 | A1 | 1/2003 | Tzu |
| 2003/0010452 | A1 | 1/2003 | Park et al. |
| 2003/0012632 | A1 | 1/2003 | Saeki |
| 2003/0013314 | A1 | 1/2003 | Ying et al. |
| 2003/0015141 | A1 | 1/2003 | Takagi |
| 2003/0015294 | A1 | 1/2003 | Wang |
| 2003/0015596 | A1 | 1/2003 | Evans |
| 2003/0017265 | A1 | 1/2003 | Basceri et al. |
| 2003/0017266 | A1 | 1/2003 | Basceri et al. |
| 2003/0017268 | A1 | 1/2003 | Hu |
| 2003/0019428 | A1 | 1/2003 | Ku et al. |
| 2003/0019580 | A1 | 1/2003 | Strang |
| 2003/0022468 | A1 | 1/2003 | Shioya et al. |
| 2003/0022523 | A1 | 1/2003 | Irino et al. |
| 2003/0023338 | A1 | 1/2003 | Chin et al. |
| 2003/0024901 | A1 | 2/2003 | Ishikawa |
| 2003/0025146 | A1 | 2/2003 | Narwankar et al. |
| 2003/0026904 | A1 | 2/2003 | Yadav et al. |
| 2003/0027431 | A1 | 2/2003 | Sneh et al. |
| 2003/0029303 | A1 | 2/2003 | Hasegawa et al. |
| 2003/0029381 | A1 | 2/2003 | Nishibayashi |
| 2003/0029475 | A1 | 2/2003 | Hua et al. |
| 2003/0029563 | A1 | 2/2003 | Kaushal et al. |
| 2003/0032297 | A1 | 2/2003 | Lindstrom et al. |
| 2003/0035002 | A1 | 2/2003 | Moles |
| 2003/0035705 | A1 | 2/2003 | Johnson |
| 2003/0036272 | A1 | 2/2003 | Shamouilian et al. |
| 2003/0037800 | A1 | 2/2003 | Bailey et al. |
| 2003/0040120 | A1 | 2/2003 | Allen et al. |
| 2003/0040158 | A1 | 2/2003 | Saitoh |
| 2003/0040196 | A1 | 2/2003 | Lim et al. |
| 2003/0040841 | A1 | 2/2003 | Nasr et al. |
| 2003/0041971 | A1 | 3/2003 | Kido et al. |
| 2003/0042419 | A1 | 3/2003 | Katsumata et al. |
| 2003/0045961 | A1 | 3/2003 | Nakao |
| 2003/0049372 | A1 | 3/2003 | Cook et al. |
| 2003/0049375 | A1 | 3/2003 | Nguyen et al. |
| 2003/0049499 | A1 | 3/2003 | Murakawa et al. |
| 2003/0049571 | A1 | 3/2003 | Hallock et al. |
| 2003/0049580 | A1 | 3/2003 | Goodman |
| 2003/0049937 | A1 | 3/2003 | Suzuki |
| 2003/0054670 | A1 | 3/2003 | Wang et al. |
| 2003/0056726 | A1 | 3/2003 | Holst et al. |
| 2003/0057848 | A1 | 3/2003 | Yuasa et al. |
| 2003/0059535 | A1 | 3/2003 | Luo et al. |
| 2003/0059980 | A1 | 3/2003 | Chen et al. |
| 2003/0062359 | A1 | 4/2003 | Ho et al. |
| 2003/0065413 | A1 | 4/2003 | Liteplo et al. |
| 2003/0066482 | A1 | 4/2003 | Pokharna et al. |
| 2003/0066541 | A1 | 4/2003 | Sun et al. |
| 2003/0066826 | A1 | 4/2003 | Lee et al. |
| 2003/0070617 | A1 | 4/2003 | Kim et al. |
| 2003/0071015 | A1 | 4/2003 | Chinn et al. |
| 2003/0072882 | A1 | 4/2003 | Niinisto et al. |
| 2003/0075107 | A1 | 4/2003 | Miyano et al. |
| 2003/0075925 | A1 | 4/2003 | Lindfors et al. |
| 2003/0077857 | A1 | 4/2003 | Xia et al. |
| 2003/0077883 | A1 | 4/2003 | Ohtake |
| 2003/0082296 | A1 | 5/2003 | Elers et al. |
| 2003/0082307 | A1 | 5/2003 | Chung et al. |
| 2003/0085663 | A1 | 5/2003 | Horsky |
| 2003/0091938 | A1 | 5/2003 | Fairbairn et al. |
| 2003/0094133 | A1 | 5/2003 | Yoshidome et al. |
| 2003/0101938 | A1 | 6/2003 | Ronsse et al. |
| 2003/0109107 | A1 | 6/2003 | Hsieh et al. |
| 2003/0109951 | A1 | 6/2003 | Hsiung et al. |
| 2003/0111012 | A1 | 6/2003 | Takeshima |
| 2003/0111013 | A1 | 6/2003 | Oosterlaken et al. |
| 2003/0111963 | A1 | 6/2003 | Tolmachev et al. |
| 2003/0113995 | A1 | 6/2003 | Xia et al. |
| 2003/0116087 | A1 | 6/2003 | Nguyen |
| 2003/0121608 | A1 | 7/2003 | Chen |
| 2003/0124792 | A1 | 7/2003 | Jeon et al. |
| 2003/0124818 | A1 | 7/2003 | Luo et al. |
| 2003/0124820 | A1 | 7/2003 | Johnsgard et al. |
| 2003/0124842 | A1 | 7/2003 | Hytros et al. |
| 2003/0127049 | A1 | 7/2003 | Han et al. |
| 2003/0132319 | A1 | 7/2003 | Hytros et al. |
| 2003/0133854 | A1 | 7/2003 | Tabata et al. |
| 2003/0134038 | A1 | 7/2003 | Paranjpe |
| 2003/0140851 | A1 | 7/2003 | Janakiraman et al. |
| 2003/0141527 | A1 | 7/2003 | Joo et al. |
| 2003/0141820 | A1 | 7/2003 | White et al. |
| 2003/0143328 | A1 | 7/2003 | Chen |
| 2003/0143846 | A1 | 7/2003 | Sekiya et al. |
| 2003/0145789 | A1 | 8/2003 | Bauch et al. |
| 2003/0149506 | A1 | 8/2003 | Haanstra et al. |
| 2003/0150386 | A1 | 8/2003 | Shimada |
| 2003/0153177 | A1 | 8/2003 | Tepman et al. |
| 2003/0153186 | A1 | 8/2003 | Bar-Gadda |
| 2003/0157345 | A1 | 8/2003 | Beldi et al. |
| 2003/0157432 | A1 | 8/2003 | Rottsegge |
| 2003/0157436 | A1 | 8/2003 | Manger et al. |
| 2003/0159653 | A1 | 8/2003 | Dando et al. |
| 2003/0159656 | A1 | 8/2003 | Tan |
| 2003/0162412 | A1 | 8/2003 | Chung |
| 2003/0168001 | A1 | 9/2003 | Sneh |
| 2003/0168008 | A1 | 9/2003 | Ohmi et al. |
| 2003/0168012 | A1 | 9/2003 | Tamura et al. |

(56) References Cited

U.S. PATENT DOCUMENTS

| | | | |
|---|---|---|---|
| 2003/0168174 | A1 | 9/2003 | Foree |
| 2003/0168699 | A1 | 9/2003 | Honda |
| 2003/0168750 | A1 | 9/2003 | Basceri et al. |
| 2003/0168948 | A1 | 9/2003 | Yamagishi et al. |
| 2003/0170153 | A1 | 9/2003 | Bar-Gadda |
| 2003/0170583 | A1 | 9/2003 | Nakashima |
| 2003/0170945 | A1 | 9/2003 | Igeta et al. |
| 2003/0173030 | A1 | 9/2003 | Ishii et al. |
| 2003/0173490 | A1 | 9/2003 | Lappen |
| 2003/0176074 | A1 | 9/2003 | Paterson et al. |
| 2003/0178145 | A1 | 9/2003 | Anderson et al. |
| 2003/0180458 | A1 | 9/2003 | Sneh |
| 2003/0181065 | A1 | 9/2003 | O'Donnell |
| 2003/0183156 | A1 | 10/2003 | Dando |
| 2003/0183856 | A1 | 10/2003 | Wieczorek et al. |
| 2003/0188682 | A1 | 10/2003 | Tois et al. |
| 2003/0188685 | A1 | 10/2003 | Wang |
| 2003/0190804 | A1 | 10/2003 | Glenn et al. |
| 2003/0192875 | A1 | 10/2003 | Bieker et al. |
| 2003/0198587 | A1 | 10/2003 | Kaloyeros |
| 2003/0200926 | A1 | 10/2003 | Dando et al. |
| 2003/0201541 | A1 | 10/2003 | Kim |
| 2003/0205096 | A1 | 11/2003 | Gehner et al. |
| 2003/0205202 | A1 | 11/2003 | Funaki et al. |
| 2003/0205237 | A1 | 11/2003 | Sakuma |
| 2003/0205327 | A1 | 11/2003 | Howald et al. |
| 2003/0207032 | A1 | 11/2003 | Ahn et al. |
| 2003/0209323 | A1 | 11/2003 | Yokogaki |
| 2003/0209326 | A1 | 11/2003 | Lee et al. |
| 2003/0209746 | A1 | 11/2003 | Horii |
| 2003/0210901 | A1 | 11/2003 | Donald et al. |
| 2003/0211735 | A1 | 11/2003 | Rossman |
| 2003/0213435 | A1 | 11/2003 | Okuda et al. |
| 2003/0213560 | A1 | 11/2003 | Wang et al. |
| 2003/0213562 | A1 | 11/2003 | Gondhalekar et al. |
| 2003/0215963 | A1 | 11/2003 | AmRhein et al. |
| 2003/0217915 | A1 | 11/2003 | Ouellet |
| 2003/0219972 | A1 | 11/2003 | Green |
| 2003/0221780 | A1 | 12/2003 | Lei et al. |
| 2003/0226840 | A1 | 12/2003 | Dalton |
| 2003/0228772 | A1 | 12/2003 | Cowans |
| 2003/0230986 | A1 | 12/2003 | Horsky et al. |
| 2003/0231698 | A1 | 12/2003 | Yamaguchi |
| 2003/0232138 | A1 | 12/2003 | Tuominen et al. |
| 2003/0232491 | A1 | 12/2003 | Yamaguchi |
| 2003/0232497 | A1 | 12/2003 | Xi et al. |
| 2003/0232511 | A1 | 12/2003 | Metzner et al. |
| 2003/0234371 | A1 | 12/2003 | Ziegler |
| 2004/0002224 | A1 | 1/2004 | Chono et al. |
| 2004/0005147 | A1 | 1/2004 | Wang et al. |
| 2004/0005753 | A1 | 1/2004 | Kostamo et al. |
| 2004/0009307 | A1 | 1/2004 | Koh et al. |
| 2004/0009679 | A1 | 1/2004 | Yeo et al. |
| 2004/0010772 | A1 | 1/2004 | McKenna et al. |
| 2004/0011504 | A1 | 1/2004 | Ku et al. |
| 2004/0013577 | A1 | 1/2004 | Ganguli et al. |
| 2004/0013818 | A1 | 1/2004 | Moon et al. |
| 2004/0015300 | A1 | 1/2004 | Ganguli et al. |
| 2004/0016637 | A1 | 1/2004 | Yang |
| 2004/0018304 | A1 | 1/2004 | Chung et al. |
| 2004/0018307 | A1 | 1/2004 | Park et al. |
| 2004/0018694 | A1 | 1/2004 | Lee et al. |
| 2004/0018723 | A1 | 1/2004 | Byun et al. |
| 2004/0018750 | A1 | 1/2004 | Sophie et al. |
| 2004/0023125 | A1 | 2/2004 | Nozawa et al. |
| 2004/0023516 | A1 | 2/2004 | Londergan et al. |
| 2004/0025786 | A1 | 2/2004 | Kontani et al. |
| 2004/0025787 | A1 | 2/2004 | Selbrede et al. |
| 2004/0026372 | A1 | 2/2004 | Takenaka et al. |
| 2004/0029052 | A1 | 2/2004 | Park et al. |
| 2004/0031564 | A1 | 2/2004 | Gottscho et al. |
| 2004/0035358 | A1 | 2/2004 | Basceri et al. |
| 2004/0036129 | A1 | 2/2004 | Forbes et al. |
| 2004/0037339 | A1 | 2/2004 | Watson et al. |
| 2004/0037675 | A1 | 2/2004 | Zinger et al. |
| 2004/0038525 | A1 | 2/2004 | Meng et al. |
| 2004/0043149 | A1 | 3/2004 | Gordon et al. |
| 2004/0043544 | A1 | 3/2004 | Asai et al. |
| 2004/0048439 | A1 | 3/2004 | Soman |
| 2004/0048452 | A1 | 3/2004 | Sugawara et al. |
| 2004/0048492 | A1 | 3/2004 | Ishikawa et al. |
| 2004/0050325 | A1 | 3/2004 | Samoilov |
| 2004/0050496 | A1 | 3/2004 | Iwai et al. |
| 2004/0052972 | A1 | 3/2004 | Schmitt |
| 2004/0056017 | A1 | 3/2004 | Renken |
| 2004/0058517 | A1 | 3/2004 | Nallan et al. |
| 2004/0062081 | A1 | 4/2004 | Drewes |
| 2004/0063289 | A1 | 4/2004 | Ohta |
| 2004/0065255 | A1 | 4/2004 | Yang et al. |
| 2004/0069226 | A1 | 4/2004 | Yoshida et al. |
| 2004/0071897 | A1 | 4/2004 | Verplancken et al. |
| 2004/0077182 | A1 | 4/2004 | Lim et al. |
| 2004/0079286 | A1 | 4/2004 | Lindfors |
| 2004/0079960 | A1 | 4/2004 | Shakuda |
| 2004/0080697 | A1 | 4/2004 | Song |
| 2004/0082171 | A1 | 4/2004 | Shin et al. |
| 2004/0083961 | A1 | 5/2004 | Basceri |
| 2004/0083962 | A1 | 5/2004 | Bang et al. |
| 2004/0083964 | A1 | 5/2004 | Ingle et al. |
| 2004/0083975 | A1 | 5/2004 | Tong et al. |
| 2004/0087141 | A1 | 5/2004 | Ramanathan et al. |
| 2004/0087168 | A1 | 5/2004 | Granneman et al. |
| 2004/0089078 | A1 | 5/2004 | Gehner et al. |
| 2004/0089236 | A1 | 5/2004 | Yokogawa et al. |
| 2004/0092073 | A1 | 5/2004 | Cabral et al. |
| 2004/0092120 | A1 | 5/2004 | Wicker |
| 2004/0093963 | A1 | 5/2004 | Gehner et al. |
| 2004/0094206 | A1 | 5/2004 | Ishida |
| 2004/0094402 | A1 | 5/2004 | Gopalraja |
| 2004/0095074 | A1 | 5/2004 | Ishii et al. |
| 2004/0099213 | A1 | 5/2004 | Adomaitis et al. |
| 2004/0099635 | A1 | 5/2004 | Nishikawa |
| 2004/0101622 | A1 | 5/2004 | Park et al. |
| 2004/0103914 | A1 | 6/2004 | Cheng et al. |
| 2004/0104439 | A1 | 6/2004 | Haukka et al. |
| 2004/0105738 | A1 | 6/2004 | Ahn et al. |
| 2004/0106249 | A1 | 6/2004 | Huotari |
| 2004/0112288 | A1 | 6/2004 | Whitesell |
| 2004/0115936 | A1 | 6/2004 | DePetrillo et al. |
| 2004/0118342 | A1 | 6/2004 | Cheng et al. |
| 2004/0121620 | A1 | 6/2004 | Pomarede et al. |
| 2004/0124131 | A1 | 7/2004 | Aitchison |
| 2004/0124549 | A1 | 7/2004 | Curran |
| 2004/0126213 | A1 | 7/2004 | Pelzmann et al. |
| 2004/0126929 | A1 | 7/2004 | Tang et al. |
| 2004/0126990 | A1 | 7/2004 | Ohta |
| 2004/0127069 | A1 | 7/2004 | Yamazaki et al. |
| 2004/0129211 | A1 | 7/2004 | Blonigan et al. |
| 2004/0129671 | A1 | 7/2004 | Ji et al. |
| 2004/0134429 | A1 | 7/2004 | Yamanaka |
| 2004/0137756 | A1 | 7/2004 | Li et al. |
| 2004/0142577 | A1 | 7/2004 | Sugawara et al. |
| 2004/0144311 | A1 | 7/2004 | Chen |
| 2004/0144323 | A1 | 7/2004 | Kai |
| 2004/0144980 | A1 | 7/2004 | Ahn et al. |
| 2004/0146644 | A1 | 7/2004 | Xia et al. |
| 2004/0151844 | A1 | 8/2004 | Zhang et al. |
| 2004/0151845 | A1 | 8/2004 | Nguyen et al. |
| 2004/0152287 | A1 | 8/2004 | Sherrill et al. |
| 2004/0154746 | A1 | 8/2004 | Park |
| 2004/0159343 | A1 | 8/2004 | Shimbara et al. |
| 2004/0163590 | A1 | 8/2004 | Tran et al. |
| 2004/0168627 | A1 | 9/2004 | Conley et al. |
| 2004/0168742 | A1 | 9/2004 | Kim et al. |
| 2004/0168769 | A1 | 9/2004 | Matsuoka et al. |
| 2004/0169032 | A1 | 9/2004 | Murayama et al. |
| 2004/0185177 | A1 | 9/2004 | Basceri et al. |
| 2004/0187304 | A1 | 9/2004 | Chen et al. |
| 2004/0187777 | A1 | 9/2004 | Okamoto et al. |
| 2004/0187784 | A1 | 9/2004 | Sferlazzo |
| 2004/0187790 | A1 | 9/2004 | Bader |
| 2004/0187928 | A1 | 9/2004 | Ambrosina |
| 2004/0198069 | A1 | 10/2004 | Metzner et al. |
| 2004/0200499 | A1 | 10/2004 | Harvey et al. |

(56) References Cited

U.S. PATENT DOCUMENTS

| | | | |
|---|---|---|---|
| 2004/0202786 A1 | 10/2004 | Wongsenakhum et al. |
| 2004/0203251 A1 | 10/2004 | Kawaguchi et al. |
| 2004/0206305 A1 | 10/2004 | Choi et al. |
| 2004/0208228 A1 | 10/2004 | Hashikura et al. |
| 2004/0209477 A1 | 10/2004 | Buxbaum et al. |
| 2004/0211357 A1 | 10/2004 | Gadgil |
| 2004/0212947 A1 | 10/2004 | Nguyen |
| 2004/0213921 A1 | 10/2004 | Leu |
| 2004/0214399 A1 | 10/2004 | Ahn et al. |
| 2004/0214445 A1 | 10/2004 | Shimizu et al. |
| 2004/0217217 A1 | 11/2004 | Han et al. |
| 2004/0219793 A1 | 11/2004 | Hishiya et al. |
| 2004/0220699 A1 | 11/2004 | Heden et al. |
| 2004/0221807 A1 | 11/2004 | Verghese et al. |
| 2004/0221808 A1 | 11/2004 | Kawano |
| 2004/0223893 A1 | 11/2004 | Tabata et al. |
| 2004/0224478 A1 | 11/2004 | Chudzik et al. |
| 2004/0226507 A1 | 11/2004 | Carpenter et al. |
| 2004/0226515 A1 | 11/2004 | Yendler et al. |
| 2004/0228968 A1 | 11/2004 | Basceri |
| 2004/0231600 A1 | 11/2004 | Lee |
| 2004/0231799 A1 | 11/2004 | Lee et al. |
| 2004/0238523 A1 | 12/2004 | Kuibira et al. |
| 2004/0241322 A1 | 12/2004 | Basceri et al. |
| 2004/0241341 A1 | 12/2004 | Lin |
| 2004/0241998 A1 | 12/2004 | Hanson |
| 2004/0245091 A1 | 12/2004 | Karim et al. |
| 2004/0247779 A1 | 12/2004 | Selvamanickam et al. |
| 2004/0250600 A1 | 12/2004 | Bevers et al. |
| 2004/0253790 A1 | 12/2004 | Ootsuka |
| 2004/0253867 A1 | 12/2004 | Matsumoto |
| 2004/0261492 A1 | 12/2004 | Zarkar et al. |
| 2004/0261706 A1 | 12/2004 | Lindfors et al. |
| 2004/0261712 A1 | 12/2004 | Hayashi et al. |
| 2004/0261946 A1 | 12/2004 | Endoh et al. |
| 2004/0266011 A1 | 12/2004 | Lee et al. |
| 2005/0000428 A1 | 1/2005 | Shero et al. |
| 2005/0001062 A1 | 1/2005 | McCracken et al. |
| 2005/0003089 A1 | 1/2005 | Won et al. |
| 2005/0003600 A1 | 1/2005 | Kasai et al. |
| 2005/0003662 A1 | 1/2005 | Jurisch et al. |
| 2005/0006682 A1 | 1/2005 | Bae et al. |
| 2005/0008799 A1 | 1/2005 | Tomiyasu et al. |
| 2005/0009325 A1 | 1/2005 | Chung et al. |
| 2005/0016452 A1 | 1/2005 | Ryu et al. |
| 2005/0016470 A1 | 1/2005 | Kang et al. |
| 2005/0016956 A1 | 1/2005 | Liu et al. |
| 2005/0017272 A1 | 1/2005 | Yamashita et al. |
| 2005/0019026 A1 | 1/2005 | Wang et al. |
| 2005/0019494 A1 | 1/2005 | Moghadam et al. |
| 2005/0019960 A1 | 1/2005 | Lee et al. |
| 2005/0020071 A1 | 1/2005 | Sonobe et al. |
| 2005/0023231 A1 | 2/2005 | Huang et al. |
| 2005/0023624 A1 | 2/2005 | Ahn et al. |
| 2005/0026402 A1 | 2/2005 | Jurgensen |
| 2005/0033075 A1 | 2/2005 | Chi et al. |
| 2005/0034664 A1 | 2/2005 | Koh et al. |
| 2005/0034674 A1 | 2/2005 | Ono |
| 2005/0037154 A1 | 2/2005 | Koh et al. |
| 2005/0037578 A1 | 2/2005 | Chen et al. |
| 2005/0037610 A1 | 2/2005 | Cha |
| 2005/0037619 A1 | 2/2005 | Granneman et al. |
| 2005/0040144 A1 | 2/2005 | Sellers |
| 2005/0042778 A1 | 2/2005 | Peukert |
| 2005/0046825 A1 | 3/2005 | Powell et al. |
| 2005/0048797 A1 | 3/2005 | Fukazawa |
| 2005/0051093 A1 | 3/2005 | Makino et al. |
| 2005/0051100 A1 | 3/2005 | Chiang et al. |
| 2005/0051854 A1 | 3/2005 | Cabral et al. |
| 2005/0054175 A1 | 3/2005 | Bauer |
| 2005/0054198 A1 | 3/2005 | Um |
| 2005/0054228 A1 | 3/2005 | March |
| 2005/0056218 A1 | 3/2005 | Sun et al. |
| 2005/0056780 A1 | 3/2005 | Miller et al. |
| 2005/0059261 A1 | 3/2005 | Basceri et al. |
| 2005/0059262 A1 | 3/2005 | Yin et al. |
| 2005/0059264 A1 | 3/2005 | Cheung |
| 2005/0061964 A1 | 3/2005 | Nagano et al. |
| 2005/0062773 A1 | 3/2005 | Fouet |
| 2005/0063451 A1 | 3/2005 | Abe et al. |
| 2005/0064207 A1 | 3/2005 | Senzaki et al. |
| 2005/0064719 A1 | 3/2005 | Liu |
| 2005/0066893 A1 | 3/2005 | Soininen |
| 2005/0069651 A1 | 3/2005 | Miyoshi |
| 2005/0070123 A1 | 3/2005 | Hirano |
| 2005/0070128 A1 | 3/2005 | Xia et al. |
| 2005/0070729 A1 | 3/2005 | Kiyomori et al. |
| 2005/0072357 A1 | 4/2005 | Shero et al. |
| 2005/0074576 A1 | 4/2005 | Chaiken et al. |
| 2005/0074983 A1 | 4/2005 | Shinriki et al. |
| 2005/0079124 A1 | 4/2005 | Sanderson |
| 2005/0081786 A1 | 4/2005 | Kubista et al. |
| 2005/0085090 A1 | 4/2005 | Mui et al. |
| 2005/0090123 A1 | 4/2005 | Nishimura et al. |
| 2005/0092247 A1 | 5/2005 | Schmidt |
| 2005/0092249 A1 | 5/2005 | Kilpela et al. |
| 2005/0092439 A1 | 5/2005 | Keeton et al. |
| 2005/0092733 A1 | 5/2005 | Ito et al. |
| 2005/0095770 A1 | 5/2005 | Kumagai et al. |
| 2005/0095779 A1 | 5/2005 | Park et al. |
| 2005/0095859 A1 | 5/2005 | Chen et al. |
| 2005/0098107 A1 | 5/2005 | Du Bois et al. |
| 2005/0100669 A1 | 5/2005 | Kools et al. |
| 2005/0101154 A1 | 5/2005 | Huang |
| 2005/0101843 A1 | 5/2005 | Quinn et al. |
| 2005/0104112 A1 | 5/2005 | Haukka et al. |
| 2005/0106762 A1 | 5/2005 | Chakrapani et al. |
| 2005/0106893 A1 | 5/2005 | Wilk |
| 2005/0107627 A1 | 5/2005 | Dussarrat et al. |
| 2005/0109461 A1 | 5/2005 | Sun |
| 2005/0110069 A1 | 5/2005 | Kil et al. |
| 2005/0112282 A1 | 5/2005 | Gordon et al. |
| 2005/0115946 A1 | 6/2005 | Shim et al. |
| 2005/0118804 A1 | 6/2005 | Byun et al. |
| 2005/0118837 A1 | 6/2005 | Todd |
| 2005/0120805 A1 | 6/2005 | Lane |
| 2005/0120962 A1 | 6/2005 | Ushioda et al. |
| 2005/0121145 A1 | 6/2005 | Du Bois et al. |
| 2005/0123690 A1 | 6/2005 | Derderian et al. |
| 2005/0130427 A1 | 6/2005 | Seok-Jun |
| 2005/0132957 A1 | 6/2005 | El-Raghy |
| 2005/0133160 A1 | 6/2005 | Kennedy et al. |
| 2005/0133161 A1 | 6/2005 | Carpenter et al. |
| 2005/0133166 A1 | 6/2005 | Satitpunwaycha et al. |
| 2005/0136188 A1 | 6/2005 | Chang |
| 2005/0136657 A1 | 6/2005 | Yokoi et al. |
| 2005/0139160 A1 | 6/2005 | Lei et al. |
| 2005/0141591 A1 | 6/2005 | Sakano |
| 2005/0142361 A1 | 6/2005 | Nakanishi |
| 2005/0145338 A1 | 7/2005 | Park et al. |
| 2005/0148162 A1 | 7/2005 | Chen et al. |
| 2005/0150601 A1 | 7/2005 | Srivastava |
| 2005/0151184 A1 | 7/2005 | Lee et al. |
| 2005/0153571 A1 | 7/2005 | Senzaki |
| 2005/0153573 A1 | 7/2005 | Okudaira et al. |
| 2005/0160987 A1 | 7/2005 | Kasai et al. |
| 2005/0161434 A1 | 7/2005 | Sugawara et al. |
| 2005/0164469 A1 | 7/2005 | Haupt |
| 2005/0170306 A1 | 8/2005 | Oosterlaken et al. |
| 2005/0172895 A1 | 8/2005 | Kijima et al. |
| 2005/0173003 A1 | 8/2005 | Laverdiere et al. |
| 2005/0175789 A1 | 8/2005 | Helms |
| 2005/0178333 A1 | 8/2005 | Loke et al. |
| 2005/0181535 A1 | 8/2005 | Yun et al. |
| 2005/0181555 A1 | 8/2005 | Haukka et al. |
| 2005/0183827 A1 | 8/2005 | White et al. |
| 2005/0186688 A1 | 8/2005 | Basceri |
| 2005/0187647 A1 | 8/2005 | Wang et al. |
| 2005/0191828 A1 | 9/2005 | Al-Bayati et al. |
| 2005/0193948 A1 | 9/2005 | Oohirabaru et al. |
| 2005/0193952 A1 | 9/2005 | Goodman et al. |
| 2005/0199013 A1 | 9/2005 | Vandroux et al. |
| 2005/0199342 A1 | 9/2005 | Shajii et al. |
| 2005/0201908 A1 | 9/2005 | Nakamura et al. |

(56) References Cited

U.S. PATENT DOCUMENTS

2005/0208217 A1 9/2005 Shinriki et al.
2005/0208219 A1 9/2005 Basceri
2005/0208718 A1 9/2005 Lim et al.
2005/0211167 A1 9/2005 Gunji
2005/0211384 A1 9/2005 Hayashi
2005/0212119 A1 9/2005 Shero
2005/0214457 A1 9/2005 Schmitt et al.
2005/0214458 A1 9/2005 Meiere
2005/0208778 A1 10/2005 Li
2005/0218462 A1 10/2005 Ahn et al.
2005/0221021 A1 10/2005 Strang
2005/0221618 A1 10/2005 AmRhein et al.
2005/0223982 A1 10/2005 Park et al.
2005/0223994 A1 10/2005 Blomiley et al.
2005/0227502 A1 10/2005 Schmitt et al.
2005/0229848 A1 10/2005 Shinriki
2005/0229849 A1 10/2005 Silvetti et al.
2005/0229972 A1 10/2005 Hoshi et al.
2005/0233477 A1 10/2005 Yamazaki et al.
2005/0238807 A1 10/2005 Lin et al.
2005/0241176 A1 11/2005 Shero et al.
2005/0241763 A1 11/2005 Huang et al.
2005/0241765 A1 11/2005 Dhindsa et al.
2005/0245058 A1 11/2005 Lee et al.
2005/0249876 A1 11/2005 Kawahara et al.
2005/0250340 A1 11/2005 Chen et al.
2005/0251990 A1 11/2005 Choi
2005/0252447 A1 11/2005 Zhao et al.
2005/0252449 A1 11/2005 Nguyen et al.
2005/0252455 A1 11/2005 Moriya et al.
2005/0253061 A1 11/2005 Cameron et al.
2005/0255257 A1 11/2005 Choi et al.
2005/0255327 A1 11/2005 Chaney et al.
2005/0258280 A1 11/2005 Goto et al.
2005/0260347 A1 11/2005 Narwankar et al.
2005/0260837 A1 11/2005 Walther et al.
2005/0260850 A1 11/2005 Loke
2005/0263072 A1 12/2005 Balasubramanian et al.
2005/0263075 A1 12/2005 Wang et al.
2005/0263719 A1 12/2005 Ohdaira et al.
2005/0263932 A1 12/2005 Heugel
2005/0268856 A1 12/2005 Miller et al.
2005/0271812 A1 12/2005 Myo et al.
2005/0271813 A1 12/2005 Kher et al.
2005/0272247 A1 12/2005 Ikeda et al.
2005/0274323 A1 12/2005 Seidel et al.
2005/0276928 A1 12/2005 Okumura et al.
2005/0277271 A1 12/2005 Beintner
2005/0282101 A1 12/2005 Adachi
2005/0282350 A1 12/2005 Chou et al.
2005/0284573 A1 12/2005 Egley et al.
2005/0284991 A1 12/2005 Saez
2005/0285097 A1 12/2005 Shang et al.
2005/0285208 A1 12/2005 Ren et al.
2005/0287725 A1 12/2005 Kitagawa
2005/0287771 A1 12/2005 Seamons et al.
2006/0000411 A1 1/2006 Seo
2006/0006538 A1 1/2006 Allman et al.
2006/0008997 A1 1/2006 Jang et al.
2006/0009044 A1 1/2006 Igeta et al.
2006/0013674 A1 1/2006 Elliott et al.
2006/0013946 A1 1/2006 Park et al.
2006/0014384 A1 1/2006 Lee et al.
2006/0014397 A1 1/2006 Seamons et al.
2006/0016783 A1 1/2006 Wu et al.
2006/0019033 A1 1/2006 Muthukrislman et al.
2006/0019495 A1 1/2006 Marcadal et al.
2006/0019502 A1 1/2006 Park et al.
2006/0021572 A1 2/2006 Wolden
2006/0021573 A1 2/2006 Monsma et al.
2006/0021703 A1 2/2006 Umotoy et al.
2006/0024439 A2 2/2006 Tuominen et al.
2006/0026314 A1 2/2006 Franchuk et al.
2006/0032443 A1 2/2006 Hasebe et al.
2006/0040054 A1 2/2006 Pearlstein et al.
2006/0040508 A1 2/2006 Ji
2006/0046518 A1 3/2006 Hill et al.
2006/0048710 A1 3/2006 Horiguchi et al.
2006/0051505 A1 3/2006 Kortshagen et al.
2006/0051520 A1 3/2006 Behle et al.
2006/0051925 A1 3/2006 Ahn et al.
2006/0057799 A1 3/2006 Horiguchi et al.
2006/0057828 A1 3/2006 Omura
2006/0057858 A1 3/2006 Chung et al.
2006/0060930 A1 3/2006 Metz et al.
2006/0062910 A1 3/2006 Meiere
2006/0063346 A1 3/2006 Lee et al.
2006/0068097 A1 3/2006 Yamasaki et al.
2006/0068104 A1 3/2006 Ishizaka
2006/0068121 A1 3/2006 Lee et al.
2006/0068125 A1 3/2006 Radhakrishnan
2006/0081558 A1 4/2006 Collins et al.
2006/0087638 A1 4/2006 Hirayanagi
2006/0090702 A1 5/2006 Koo et al.
2006/0093756 A1 5/2006 Rajagopalan et al.
2006/0094236 A1 5/2006 Elkins et al.
2006/0096540 A1 5/2006 Choi
2006/0097220 A1 5/2006 Kim et al.
2006/0097305 A1 5/2006 Lee
2006/0099782 A1 5/2006 Ritenour
2006/0102968 A1 5/2006 Bojarczuk et al.
2006/0105566 A1 5/2006 Waldfried et al.
2006/0107898 A1 5/2006 Blomberg
2006/0108221 A1 5/2006 Goodwin et al.
2006/0108331 A1 5/2006 Nozawa et al.
2006/0110930 A1 5/2006 Senzaki
2006/0110934 A1 5/2006 Fukuchi
2006/0113038 A1 6/2006 Gondhalekar et al.
2006/0113675 A1 6/2006 Chang et al.
2006/0113806 A1 6/2006 Tsuji et al.
2006/0115589 A1 6/2006 Vukovic
2006/0118240 A1 6/2006 Holber et al.
2006/0118241 A1 6/2006 Ohmi et al.
2006/0125099 A1 6/2006 Gordon et al.
2006/0127067 A1 6/2006 Wintenberger et al.
2006/0128142 A1 6/2006 Whelan et al.
2006/0128168 A1 6/2006 Ahn et al.
2006/0130751 A1 6/2006 Volfovski et al.
2006/0130767 A1 6/2006 Herchen
2006/0133955 A1 6/2006 Peters
2006/0137608 A1 6/2006 Choi et al.
2006/0137609 A1 6/2006 Puchacz et al.
2006/0141155 A1 6/2006 Gordon et al.
2006/0141758 A1 6/2006 Naumann et al.
2006/0144820 A1 7/2006 Sawin et al.
2006/0147626 A1 7/2006 Blomberg
2006/0148151 A1 7/2006 Murthy et al.
2006/0148180 A1 7/2006 Ahn et al.
2006/0151117 A1 7/2006 Kasanami et al.
2006/0154424 A1 7/2006 Yang et al.
2006/0156979 A1 7/2006 Thakur et al.
2006/0156981 A1 7/2006 Fondurulia
2006/0162658 A1 7/2006 Weidman
2006/0162661 A1 7/2006 Jung et al.
2006/0162863 A1 7/2006 Kim et al.
2006/0163612 A1 7/2006 Kouvetakis et al.
2006/0163683 A1 7/2006 Roth et al.
2006/0165892 A1 7/2006 Weidman
2006/0166428 A1 7/2006 Kamioka
2006/0172531 A1 8/2006 Lin et al.
2006/0175669 A1 8/2006 Kim et al.
2006/0176928 A1 8/2006 Nakamura et al.
2006/0177855 A1 8/2006 Utermohlen
2006/0182885 A1 8/2006 Lei et al.
2006/0185589 A1 8/2006 Zehavi et al.
2006/0188360 A1 8/2006 Bonora et al.
2006/0191555 A1 8/2006 Yoshida et al.
2006/0193979 A1 8/2006 Meiere et al.
2006/0193980 A1 8/2006 Hasegawa
2006/0196418 A1 9/2006 Lindfors et al.
2006/0196420 A1 9/2006 Ushakov et al.
2006/0196421 A1 9/2006 Ronsse et al.
2006/0199357 A1 9/2006 Wan et al.
2006/0205194 A1 9/2006 Bauer

(56) References Cited

U.S. PATENT DOCUMENTS

2006/0205223 A1 9/2006 Smayling
2006/0205231 A1 9/2006 Chou et al.
2006/0208215 A1 9/2006 Metzner et al.
2006/0211224 A1 9/2006 Matsuda
2006/0211243 A1 9/2006 Ishizaka et al.
2006/0211259 A1 9/2006 Maes
2006/0213437 A1 9/2006 Ishizaka et al.
2006/0213439 A1 9/2006 Ishizaka
2006/0213441 A1 9/2006 Kobrin et al.
2006/0216942 A1 9/2006 Kim et al.
2006/0219169 A1 10/2006 Chen et al.
2006/0219361 A1 10/2006 Wang et al.
2006/0219363 A1 10/2006 Matsumoto et al.
2006/0223301 A1 10/2006 Vanhaelemeersch et al.
2006/0223337 A1 10/2006 Ahn et al.
2006/0226117 A1 10/2006 Bertram et al.
2006/0228496 A1 10/2006 Choi
2006/0228863 A1 10/2006 Zhang et al.
2006/0228888 A1 10/2006 Lee et al.
2006/0228898 A1 10/2006 Wajda et al.
2006/0236934 A1 10/2006 Choi et al.
2006/0240187 A1 10/2006 Weidman
2006/0240574 A1 10/2006 Yoshie
2006/0240662 A1 10/2006 Conley et al.
2006/0247404 A1 11/2006 Todd
2006/0249175 A1 11/2006 Nowak et al.
2006/0249253 A1 11/2006 Dando
2006/0251827 A1 11/2006 Nowak
2006/0252228 A1 11/2006 Jeng
2006/0252244 A1 11/2006 Vaartstra et al.
2006/0252351 A1 11/2006 Kundracik
2006/0254514 A1 11/2006 Kang et al.
2006/0257563 A1 11/2006 Doh et al.
2006/0257584 A1 11/2006 Derderian et al.
2006/0258078 A1 11/2006 Lee et al.
2006/0258173 A1 11/2006 Xiao et al.
2006/0260545 A1 11/2006 Ramaswamy et al.
2006/0263522 A1 11/2006 Byun
2006/0263540 A1 11/2006 Ramaswamy et al.
2006/0264060 A1 11/2006 Ramaswamy et al.
2006/0264066 A1 11/2006 Bartholomew
2006/0266289 A1 11/2006 Verghese et al.
2006/0269690 A1 11/2006 Watanabe et al.
2006/0269692 A1 11/2006 Balseanu
2006/0275710 A1 12/2006 Yamazaki et al.
2006/0275933 A1 12/2006 Du Bois et al.
2006/0278524 A1 12/2006 Stowell
2006/0283629 A1 12/2006 Kikuchi et al.
2006/0286774 A1 12/2006 Singh et al.
2006/0286775 A1 12/2006 Singh et al.
2006/0286817 A1 12/2006 Kato et al.
2006/0286818 A1 12/2006 Wang et al.
2006/0286819 A1 12/2006 Seutter
2006/0291982 A1 12/2006 Tanaka
2006/0292310 A1 12/2006 Le et al.
2006/0292845 A1 12/2006 Chiang et al.
2007/0004204 A1 1/2007 Fukazawa et al.
2007/0006806 A1 1/2007 Imai
2007/0010072 A1 1/2007 Bailey et al.
2007/0012402 A1 1/2007 Sneh
2007/0014919 A1 1/2007 Hamalainen et al.
2007/0020160 A1 1/2007 Berkman et al.
2007/0020167 A1 1/2007 Han et al.
2007/0020830 A1 1/2007 Speranza
2007/0020953 A1 1/2007 Tsai et al.
2007/0022954 A1 2/2007 Iizuka et al.
2007/0026148 A1 2/2007 Arai et al.
2007/0026162 A1 2/2007 Wei et al.
2007/0026540 A1 2/2007 Nooten et al.
2007/0026654 A1 2/2007 Huotari et al.
2007/0028842 A1 2/2007 Inagawa et al.
2007/0031598 A1 2/2007 Okuyama et al.
2007/0031599 A1 2/2007 Gschwandtner et al.
2007/0032004 A1 2/2007 Ramaswamy et al.
2007/0032045 A1 2/2007 Kasahara et al.
2007/0032054 A1 2/2007 Ramaswamy et al.
2007/0032082 A1 2/2007 Ramaswamy et al.
2007/0032095 A1 2/2007 Ramaswamy et al.
2007/0034477 A1 2/2007 Inui
2007/0037343 A1 2/2007 Colombo et al.
2007/0037412 A1 2/2007 Dip et al.
2007/0042117 A1 2/2007 Kupurao et al.
2007/0042581 A1 2/2007 Sano et al.
2007/0044716 A1 3/2007 Tetsuka et al.
2007/0045244 A1 3/2007 Lee et al.
2007/0047384 A1 3/2007 McLaughlin et al.
2007/0048953 A1 3/2007 Gealy et al.
2007/0049053 A1 3/2007 Mahajani
2007/0051299 A1 3/2007 Ong et al.
2007/0051312 A1 3/2007 Sneh
2007/0051471 A1 3/2007 Kawaguchi et al.
2007/0054049 A1 3/2007 Lindfors et al.
2007/0054499 A1 3/2007 Jang
2007/0056843 A1 3/2007 Ye et al.
2007/0056850 A1 3/2007 Ye et al.
2007/0059948 A1 3/2007 Metzner et al.
2007/0062439 A1 3/2007 Wada et al.
2007/0062453 A1 3/2007 Ishikawa
2007/0062646 A1 3/2007 Ogawa et al.
2007/0065578 A1 3/2007 McDougall
2007/0065597 A1 3/2007 Kaido et al.
2007/0066010 A1 3/2007 Ando
2007/0066038 A1 3/2007 Sadjadi et al.
2007/0066079 A1 3/2007 Kolster et al.
2007/0066084 A1 3/2007 Wajda et al.
2007/0074665 A1 4/2007 Chacin et al.
2007/0077355 A1 4/2007 Chacin et al.
2007/0082132 A1 4/2007 Shinriki
2007/0082500 A1 4/2007 Norman et al.
2007/0082508 A1 4/2007 Chiang et al.
2007/0084405 A1 4/2007 Kim
2007/0087296 A1 4/2007 Kim et al.
2007/0087515 A1 4/2007 Yieh et al.
2007/0087579 A1 4/2007 Kitayama et al.
2007/0089670 A1 4/2007 Ikedo
2007/0092696 A1 4/2007 Tsukatani et al.
2007/0095283 A1 5/2007 Galewski
2007/0095286 A1 5/2007 Baek et al.
2007/0096194 A1 5/2007 Streck et al.
2007/0098527 A1 5/2007 Hall et al.
2007/0107845 A1 5/2007 Ishizawa et al.
2007/0111030 A1 5/2007 Nakano et al.
2007/0111470 A1 5/2007 Smythe
2007/0111545 A1 5/2007 Lee et al.
2007/0113788 A1 5/2007 Nozawa et al.
2007/0116872 A1 5/2007 Li et al.
2007/0116873 A1 5/2007 Li et al.
2007/0116887 A1 5/2007 Faguet
2007/0116888 A1 5/2007 Faguet
2007/0119370 A1 5/2007 Ma et al.
2007/0120275 A1 5/2007 Liu
2007/0123037 A1 5/2007 Lee et al.
2007/0123060 A1 5/2007 Rahtu
2007/0123189 A1 5/2007 Saito et al.
2007/0125762 A1 6/2007 Cui et al.
2007/0128538 A1 6/2007 Fairbairn et al.
2007/0128570 A1 6/2007 Goto et al.
2007/0128858 A1 6/2007 Haukka et al.
2007/0128876 A1 6/2007 Fukiage
2007/0128888 A1 6/2007 Goto et al.
2007/0129621 A1 6/2007 Kellogg et al.
2007/0131168 A1 6/2007 Gomi et al.
2007/0134821 A1 6/2007 Thakur et al.
2007/0134919 A1 6/2007 Gunji et al.
2007/0134942 A1 6/2007 Ahn et al.
2007/0137794 A1 6/2007 Qiu et al.
2007/0144442 A1 6/2007 Migita
2007/0146621 A1 6/2007 Yeom
2007/0148347 A1 6/2007 Hatanpaa et al.
2007/0148350 A1 6/2007 Rahtu
2007/0148990 A1 6/2007 Deboer et al.
2007/0153625 A1 6/2007 Lundgren et al.
2007/0155138 A1 7/2007 Tomasini et al.
2007/0157466 A1 7/2007 Kida et al.

(56) References Cited

U.S. PATENT DOCUMENTS

2007/0157683 A1 7/2007 Li
2007/0158026 A1 7/2007 Amikura
2007/0163440 A1 7/2007 Kim et al.
2007/0163490 A1 7/2007 Habel et al.
2007/0163625 A1 7/2007 Lee
2007/0163996 A1 7/2007 Horiguchi
2007/0166457 A1 7/2007 Yamoto et al.
2007/0166459 A1 7/2007 Chang et al.
2007/0166966 A1 7/2007 Todd et al.
2007/0166999 A1 7/2007 Vaarstra
2007/0170372 A1 7/2007 Horsky
2007/0173071 A1 7/2007 Afzali-Ardakani et al.
2007/0175393 A1 8/2007 Nishimura et al.
2007/0175397 A1 8/2007 Tomiyasu et al.
2007/0178235 A1 8/2007 Yamada et al.
2007/0181066 A1 8/2007 Cadwell et al.
2007/0184179 A1 8/2007 Waghray et al.
2007/0186849 A1 8/2007 Furuya
2007/0186952 A1 8/2007 Honda et al.
2007/0187362 A1 8/2007 Nakagawa et al.
2007/0187363 A1 8/2007 Oka et al.
2007/0190266 A1 8/2007 Fu et al.
2007/0190362 A1 8/2007 Weidman
2007/0190744 A1 8/2007 Hiraiwa et al.
2007/0190782 A1 8/2007 Park
2007/0199510 A1 8/2007 Weiner et al.
2007/0202678 A1 8/2007 Plombon et al.
2007/0205788 A1 9/2007 Natsuhara et al.
2007/0207275 A1 9/2007 Nowak et al.
2007/0209588 A1 9/2007 Li et al.
2007/0209590 A1 9/2007 Li
2007/0210890 A1 9/2007 Hsu et al.
2007/0212484 A1 9/2007 Li
2007/0212811 A1 9/2007 Hanawa et al.
2007/0212827 A1 9/2007 Girotra et al.
2007/0215048 A1 9/2007 Suzuki et al.
2007/0215278 A1 9/2007 Furuse et al.
2007/0215580 A1 9/2007 Koshiishi et al.
2007/0218200 A1 9/2007 Suzuki et al.
2007/0218705 A1 9/2007 Matsuki et al.
2007/0222131 A1 9/2007 Fukumoto et al.
2007/0224777 A1 9/2007 Hamelin
2007/0224833 A1 9/2007 Morisada et al.
2007/0227665 A1 10/2007 Matsumoto et al.
2007/0231488 A1 10/2007 Von Kaenel
2007/0232031 A1 10/2007 Singh et al.
2007/0232071 A1 10/2007 Balseanu et al.
2007/0232501 A1 10/2007 Tonomura
2007/0234955 A1 10/2007 Suzuki et al.
2007/0237697 A1 10/2007 Clark
2007/0237698 A1 10/2007 Clark
2007/0237699 A1 10/2007 Clark
2007/0238305 A1 10/2007 Delgadino et al.
2007/0241688 A1 10/2007 DeVancentis et al.
2007/0243317 A1 10/2007 Du Bois et al.
2007/0247075 A1 10/2007 Kim et al.
2007/0248767 A1 10/2007 Okura
2007/0248832 A1 10/2007 Maeda et al.
2007/0249131 A1 10/2007 Allen et al.
2007/0251444 A1 11/2007 Gros-Jean et al.
2007/0251456 A1 11/2007 Herchen et al.
2007/0252233 A1 11/2007 Yamazaki et al.
2007/0252244 A1 11/2007 Srividya et al.
2007/0252532 A1 11/2007 DeVancentis et al.
2007/0254414 A1 11/2007 Miyanami
2007/0258506 A1 11/2007 Schwagerman et al.
2007/0258855 A1 11/2007 Turcot et al.
2007/0259778 A1 11/2007 Spencer et al.
2007/0261868 A1 11/2007 Gross
2007/0264427 A1 11/2007 Shinriki et al.
2007/0264793 A1 11/2007 Oh et al.
2007/0264807 A1 11/2007 Leone et al.
2007/0266932 A1 11/2007 Hiramatsu
2007/0266945 A1 11/2007 Shuto et al.
2007/0269983 A1 11/2007 Sneh
2007/0275166 A1 11/2007 Thridandam et al.
2007/0277735 A1 12/2007 Mokhesi et al.
2007/0281082 A1 12/2007 Mokhesi et al.
2007/0281105 A1 12/2007 Mokhesi et al.
2007/0281106 A1 12/2007 Lubomirsky et al.
2007/0281496 A1 12/2007 Ingle et al.
2007/0286957 A1 12/2007 Suzuki et al.
2007/0289534 A1 12/2007 Lubomirsky et al.
2007/0292974 A1 12/2007 Mizuno et al.
2007/0295602 A1 12/2007 Tiller et al.
2007/0298362 A1 12/2007 Rocha-Alvarez et al.
2007/0298565 A1 12/2007 Nieh et al.
2008/0003425 A1 1/2008 Spencer et al.
2008/0003824 A1 1/2008 Padhi et al.
2008/0003838 A1 1/2008 Haukka et al.
2008/0006208 A1 1/2008 Ueno et al.
2008/0018004 A1 1/2008 Steidl
2008/0020591 A1 1/2008 Balseanu et al.
2008/0020593 A1 1/2008 Wang et al.
2008/0023436 A1 1/2008 Gros-Jean et al.
2008/0026162 A1 1/2008 Dickey et al.
2008/0026574 A1 1/2008 Brcka
2008/0026597 A1 1/2008 Munro et al.
2008/0029790 A1 2/2008 Ahn et al.
2008/0031708 A1 2/2008 Bonora et al.
2008/0032514 A1 2/2008 Sano et al.
2008/0035055 A1 2/2008 Dip et al.
2008/0035306 A1 2/2008 White et al.
2008/0035607 A1 2/2008 O'Hara et al.
2008/0036354 A1 2/2008 Letz et al.
2008/0038485 A1 2/2008 Fukazawa et al.
2008/0038934 A1 2/2008 Vrtis et al.
2008/0042165 A1 2/2008 Sugizaki
2008/0042192 A1 2/2008 Park et al.
2008/0043803 A1 2/2008 Bandoh
2008/0044932 A1 2/2008 Samoilov et al.
2008/0044938 A1 2/2008 England et al.
2008/0050536 A1 2/2008 Aing et al.
2008/0050538 A1 2/2008 Hirata
2008/0054332 A1 3/2008 Kim et al.
2008/0054813 A1 3/2008 Espiau et al.
2008/0056860 A1 3/2008 Natume
2008/0057659 A1 3/2008 Forbes et al.
2008/0061667 A1 3/2008 Gaertner et al.
2008/0063798 A1 3/2008 Kher et al.
2008/0066778 A1 3/2008 Matsushita et al.
2008/0067146 A1 3/2008 Onishi et al.
2008/0069951 A1 3/2008 Chacin et al.
2008/0069955 A1 3/2008 Hong et al.
2008/0072821 A1 3/2008 Dalton et al.
2008/0075562 A1 3/2008 Maria et al.
2008/0075838 A1 3/2008 Inoue et al.
2008/0075881 A1 3/2008 Won et al.
2008/0076070 A1 3/2008 Koh et al.
2008/0076266 A1 3/2008 Fukazawa et al.
2008/0076281 A1 3/2008 Ciancanelli et al.
2008/0081104 A1 4/2008 Hasebe et al.
2008/0081113 A1 4/2008 Clark
2008/0081121 A1 4/2008 Morita et al.
2008/0083710 A1 4/2008 Chen et al.
2008/0083948 A1 4/2008 Lin et al.
2008/0085226 A1 4/2008 Fondurulia et al.
2008/0085610 A1 4/2008 Wang et al.
2008/0087218 A1 4/2008 Shimada et al.
2008/0087642 A1 4/2008 Sawin et al.
2008/0087890 A1 4/2008 Ahn et al.
2008/0092815 A1 4/2008 Chen et al.
2008/0092821 A1 4/2008 Otsuka et al.
2008/0099147 A1 5/2008 Myo et al.
2008/0102203 A1 5/2008 Wu
2008/0102205 A1 5/2008 Barry et al.
2008/0102208 A1 5/2008 Wu et al.
2008/0102603 A1 5/2008 Kobayashi et al.
2008/0102630 A1 5/2008 Saito
2008/0105276 A1 5/2008 Yeh et al.
2008/0110401 A1 5/2008 Fujikawa et al.
2008/0110568 A1 5/2008 Son et al.
2008/0113094 A1 5/2008 Casper
2008/0113096 A1 5/2008 Mahajani

(56) References Cited

U.S. PATENT DOCUMENTS

2008/0113097 A1 5/2008 Mahajani et al.
2008/0118334 A1 5/2008 Bonora
2008/0121177 A1 5/2008 Bang et al.
2008/0121626 A1 5/2008 Thomas et al.
2008/0121962 A1 5/2008 Forbes et al.
2008/0124197 A1 5/2008 van der Meulen et al.
2008/0124908 A1 5/2008 Forbes et al.
2008/0124945 A1 5/2008 Miya et al.
2008/0124946 A1 5/2008 Xiao et al.
2008/0128726 A1 6/2008 Sakata et al.
2008/0129209 A1 6/2008 Deakins et al.
2008/0132046 A1 6/2008 Walther
2008/0133154 A1 6/2008 Krauss et al.
2008/0134887 A1 6/2008 Sherer
2008/0135516 A1 6/2008 Yokogawa et al.
2008/0135936 A1 6/2008 Nakajima
2008/0142046 A1 6/2008 Johnson et al.
2008/0142483 A1 6/2008 Hua
2008/0146033 A1 6/2008 Park
2008/0149031 A1 6/2008 Chu et al.
2008/0149593 A1 6/2008 Bai et al.
2008/0152463 A1 6/2008 Chidambaram et al.
2008/0153308 A1 6/2008 Ogawa et al.
2008/0153311 A1 6/2008 Padhi et al.
2008/0156769 A1 7/2008 Weiner et al.
2008/0157157 A1 7/2008 Tonomura
2008/0157212 A1 7/2008 Lavoie et al.
2008/0157365 A1 7/2008 Ott et al.
2008/0173237 A1 7/2008 Collins
2008/0173238 A1 7/2008 Nakashima et al.
2008/0173240 A1 7/2008 Furukawahara
2008/0173326 A1 7/2008 Gu et al.
2008/0176335 A1 7/2008 Alberti et al.
2008/0176375 A1 7/2008 Erben et al.
2008/0176412 A1 7/2008 Komeda
2008/0178608 A1 7/2008 Tandou et al.
2008/0178805 A1 7/2008 Paterson et al.
2008/0179104 A1 7/2008 Zhang
2008/0179291 A1 7/2008 Collins et al.
2008/0179715 A1 7/2008 Coppa
2008/0182075 A1 7/2008 Chopra
2008/0182390 A1 7/2008 Lemmi et al.
2008/0182411 A1 7/2008 Elers
2008/0191193 A1 8/2008 Li et al.
2008/0193643 A1 8/2008 Dip
2008/0194088 A1 8/2008 Srinivasan et al.
2008/0194105 A1 8/2008 Dominguez et al.
2008/0194113 A1 8/2008 Kim et al.
2008/0194169 A1 8/2008 Sterling et al.
2008/0199977 A1 8/2008 Weigel et al.
2008/0202416 A1 8/2008 Provencher
2008/0202689 A1 8/2008 Kim
2008/0203487 A1 8/2008 Hohage et al.
2008/0205483 A1 8/2008 Rempe et al.
2008/0210162 A1 9/2008 Yonebayashi
2008/0210278 A1 9/2008 Orii et al.
2008/0211423 A1 9/2008 Shinmen et al.
2008/0211526 A1 9/2008 Shinma
2008/0213696 A1 9/2008 Meeus et al.
2008/0214003 A1 9/2008 Xia et al.
2008/0216077 A1 9/2008 Emani et al.
2008/0216742 A1 9/2008 Takebayashi
2008/0216958 A1 9/2008 Goto et al.
2008/0220619 A1 9/2008 Matsushita et al.
2008/0223130 A1 9/2008 Snell et al.
2008/0223725 A1 9/2008 Han et al.
2008/0224240 A1 9/2008 Ahn et al.
2008/0228306 A1 9/2008 Yetter et al.
2008/0229811 A1 9/2008 Zhao et al.
2008/0230352 A1 9/2008 Hirata
2008/0230371 A1 9/2008 McHugh
2008/0233288 A1 9/2008 Clark
2008/0237572 A1 10/2008 Chui et al.
2008/0237604 A1 10/2008 Alshareef et al.
2008/0241052 A1 10/2008 Hooper et al.
2008/0241384 A1 10/2008 Jeong
2008/0241387 A1 10/2008 Keto
2008/0242116 A1 10/2008 Clark
2008/0246101 A1 10/2008 Li et al.
2008/0248310 A1 10/2008 Kim et al.
2008/0248597 A1 10/2008 Qin et al.
2008/0257102 A1 10/2008 Packer
2008/0257494 A1 10/2008 Hayashi et al.
2008/0260345 A1 10/2008 Mertesdorf et al.
2008/0260963 A1 10/2008 Yoon et al.
2008/0261405 A1 10/2008 Yang et al.
2008/0261413 A1 10/2008 Mahajani
2008/0264337 A1 10/2008 Sano et al.
2008/0264443 A1 10/2008 Shrinivasan et al.
2008/0267598 A1 10/2008 Nakamura
2008/0268171 A1 10/2008 Ma et al.
2008/0268635 A1 10/2008 Yu et al.
2008/0272424 A1 11/2008 Kim et al.
2008/0274369 A1 11/2008 Lee et al.
2008/0276864 A1 11/2008 Koelmel et al.
2008/0277647 A1 11/2008 Kouvetakis et al.
2008/0277656 A1 11/2008 Park et al.
2008/0277715 A1 11/2008 Ohmi et al.
2008/0282970 A1 11/2008 Heys et al.
2008/0283962 A1 11/2008 Dyer
2008/0286463 A1 11/2008 Tiner et al.
2008/0289574 A1 11/2008 Jacobs et al.
2008/0289650 A1 11/2008 Arena
2008/0289767 A1 11/2008 Tandou et al.
2008/0291964 A1 11/2008 Shrimpling
2008/0293198 A1 11/2008 Kojima et al.
2008/0295872 A1 12/2008 Riker et al.
2008/0298945 A1 12/2008 Cox
2008/0299326 A1 12/2008 Fukazawa
2008/0299758 A1 12/2008 Harada et al.
2008/0302303 A1 12/2008 Choi et al.
2008/0303744 A1 12/2008 Hirayama et al.
2008/0305014 A1 12/2008 Honda
2008/0305246 A1 12/2008 Choi et al.
2008/0305443 A1 12/2008 Nakamura
2008/0314319 A1 12/2008 Hamano et al.
2008/0314892 A1 12/2008 Graham
2008/0315292 A1 12/2008 Ji et al.
2008/0317972 A1 12/2008 Hendriks
2009/0000550 A1 1/2009 Tran et al.
2009/0000551 A1 1/2009 Choi et al.
2009/0000769 A1 1/2009 Lin et al.
2009/0004875 A1 1/2009 Shen et al.
2009/0011145 A1 1/2009 Yun
2009/0011150 A1 1/2009 Jeon et al.
2009/0011608 A1 1/2009 Nabatame
2009/0014879 A1 1/2009 Park et al.
2009/0017227 A1 1/2009 Fu et al.
2009/0017631 A1 1/2009 Bencher
2009/0017733 A1 1/2009 Takahashi et al.
2009/0020072 A1 1/2009 Mizunaga et al.
2009/0023229 A1 1/2009 Matsushita
2009/0029503 A1 1/2009 Arai
2009/0029528 A1 1/2009 Sanchez et al.
2009/0029564 A1 1/2009 Yamashita et al.
2009/0031954 A1 2/2009 Nishikido et al.
2009/0033907 A1 2/2009 Watson
2009/0035463 A1 2/2009 Dip
2009/0035584 A1 2/2009 Tran et al.
2009/0035927 A1 2/2009 Olsen et al.
2009/0035946 A1 2/2009 Pierreux et al.
2009/0035947 A1 2/2009 Horii
2009/0036292 A1 2/2009 Sun et al.
2009/0039475 A1 2/2009 Shioya
2009/0041952 A1 2/2009 Yoon et al.
2009/0041984 A1 2/2009 Mayers et al.
2009/0042344 A1 2/2009 Ye et al.
2009/0042408 A1 2/2009 Maeda
2009/0045749 A1 2/2009 Ganachev et al.
2009/0045829 A1 2/2009 Awazu
2009/0047426 A1 2/2009 Park et al.
2009/0047433 A1 2/2009 Kim et al.
2009/0047447 A1 2/2009 Sawin et al.
2009/0050621 A1 2/2009 Awazu

(56) References Cited

U.S. PATENT DOCUMENTS

2009/0052498 A1 2/2009 Halpin et al.
2009/0053023 A1 2/2009 Wakabayashi
2009/0053900 A1 2/2009 Nozawa et al.
2009/0053906 A1 2/2009 Miya et al.
2009/0056112 A1 3/2009 Kobayashi
2009/0056629 A1 3/2009 Katz et al.
2009/0057269 A1 3/2009 Katz et al.
2009/0060480 A1 3/2009 Herchen
2009/0061083 A1 3/2009 Chiang et al.
2009/0061644 A1 3/2009 Chiang et al.
2009/0061647 A1 3/2009 Mallick et al.
2009/0075490 A1 3/2009 Dussarrat
2009/0075491 A1 3/2009 Liu et al.
2009/0080136 A1 3/2009 Nagayama et al.
2009/0081879 A1 3/2009 Sukekawa et al.
2009/0084317 A1 4/2009 Wu
2009/0085156 A1 4/2009 Dewey et al.
2009/0087585 A1 4/2009 Lee et al.
2009/0087964 A1 4/2009 Maeda et al.
2009/0087967 A1 4/2009 Todd
2009/0090382 A1 4/2009 Morisada
2009/0093080 A1 4/2009 Choi et al.
2009/0093094 A1 4/2009 Ye et al.
2009/0093100 A1 4/2009 Xia et al.
2009/0095221 A1 4/2009 Tam et al.
2009/0104351 A1 4/2009 Kakegawa
2009/0104594 A1 4/2009 Webb
2009/0104789 A1 4/2009 Mallick et al.
2009/0107404 A1 4/2009 Ogliari et al.
2009/0108308 A1 4/2009 Yang et al.
2009/0112458 A1 4/2009 Nakai
2009/0115064 A1 5/2009 Sandhu et al.
2009/0116936 A1 5/2009 Mambayashi et al.
2009/0117717 A1 5/2009 Tomasini et al.
2009/0117723 A1 5/2009 Kim et al.
2009/0117746 A1 5/2009 Masuda
2009/0120580 A1 5/2009 Kagoshima et al.
2009/0122293 A1 5/2009 Shibazaki
2009/0122458 A1 5/2009 Lischer et al.
2009/0124131 A1 5/2009 Breunsbach et al.
2009/0130331 A1 5/2009 Asai
2009/0130859 A1 5/2009 Itatani et al.
2009/0136665 A1 5/2009 Choi et al.
2009/0136668 A1 5/2009 Gregg et al.
2009/0136683 A1 5/2009 Fukasawa et al.
2009/0137055 A1 5/2009 Bognar
2009/0139657 A1 6/2009 Lee et al.
2009/0142905 A1 6/2009 Yamazaki
2009/0142933 A1 6/2009 Yajima et al.
2009/0142935 A1 6/2009 Fukazawa et al.
2009/0146322 A1 6/2009 Weling et al.
2009/0147819 A1 6/2009 Goodman et al.
2009/0155488 A1 6/2009 Nakano et al.
2009/0156015 A1 6/2009 Park et al.
2009/0156017 A1 6/2009 Fukazawa et al.
2009/0159000 A1 6/2009 Aggarwal et al.
2009/0159002 A1 6/2009 Bera et al.
2009/0159424 A1 6/2009 Liu et al.
2009/0162647 A1 6/2009 Sun et al.
2009/0162996 A1 6/2009 Ramaswarmy et al.
2009/0163038 A1 6/2009 Miyoshi
2009/0165715 A1 7/2009 Oh
2009/0165721 A1 7/2009 Pitney et al.
2009/0165722 A1 7/2009 Ha
2009/0166616 A1 7/2009 Uchiyama
2009/0176018 A1 7/2009 Zou et al.
2009/0179365 A1 7/2009 Lerner et al.
2009/0183520 A1 7/2009 Yukimoto
2009/0186479 A1 7/2009 Okabe et al.
2009/0186571 A1 7/2009 Haro
2009/0194233 A1 8/2009 Tamura et al.
2009/0197015 A1 8/2009 Kudela et al.
2009/0197411 A1 8/2009 Dussarrat et al.
2009/0200494 A1 8/2009 Hatem
2009/0200547 A1 8/2009 Griffin et al.
2009/0204403 A1 8/2009 Hollander et al.
2009/0206056 A1 8/2009 Xu
2009/0209081 A1 8/2009 Matero
2009/0211523 A1 8/2009 Kuppurao et al.
2009/0211525 A1 8/2009 Sarigiannis et al.
2009/0214825 A1 8/2009 Sun et al.
2009/0217871 A1 9/2009 Kim et al.
2009/0221149 A1 9/2009 Hammond et al.
2009/0221151 A1 9/2009 Honda et al.
2009/0223441 A1 9/2009 Arena et al.
2009/0227094 A1 9/2009 Bateman
2009/0230211 A1 9/2009 Kobayashi et al.
2009/0232985 A1 9/2009 Dussarrat et al.
2009/0236014 A1 9/2009 Wilson
2009/0236276 A1 9/2009 Kurth et al.
2009/0236315 A1 9/2009 Willwerth et al.
2009/0239386 A1 9/2009 Suzaki et al.
2009/0242130 A1 10/2009 Tian et al.
2009/0242957 A1 10/2009 Ma et al.
2009/0246374 A1 10/2009 Vukovic
2009/0246399 A1 10/2009 Goundar
2009/0246971 A1 10/2009 Reid et al.
2009/0250004 A1 10/2009 Yamada et al.
2009/0250955 A1 10/2009 Aoki
2009/0255901 A1 10/2009 Okita
2009/0256127 A1 10/2009 Feist et al.
2009/0261331 A1 10/2009 Yang et al.
2009/0266296 A1 10/2009 Tachibana et al.
2009/0267135 A1 10/2009 Tanaka et al.
2009/0267225 A1 10/2009 Eguchi
2009/0269506 A1 10/2009 Okura et al.
2009/0269507 A1 10/2009 Yu et al.
2009/0269941 A1 10/2009 Raisanen
2009/0275205 A1 11/2009 Kiehlbauch et al.
2009/0275210 A1 11/2009 Shanker et al.
2009/0277510 A1 11/2009 Shikata
2009/0277874 A1 11/2009 Rui et al.
2009/0280248 A1 11/2009 Goodman et al.
2009/0283041 A1 11/2009 Tomiyasu et al.
2009/0283217 A1 11/2009 Lubomirsky et al.
2009/0284156 A1 11/2009 Banna et al.
2009/0286400 A1 11/2009 Heo et al.
2009/0286402 A1 11/2009 Xia et al.
2009/0286405 A1 11/2009 Okesaku et al.
2009/0289300 A1 11/2009 Sasaki et al.
2009/0291208 A1 11/2009 Gordon et al.
2009/0291566 A1 11/2009 Ueno et al.
2009/0297696 A1 12/2009 Pore et al.
2009/0297710 A1 12/2009 Lindfors
2009/0297731 A1 12/2009 Goundar
2009/0298257 A1 12/2009 Lee et al.
2009/0302002 A1 12/2009 Collins et al.
2009/0302434 A1 12/2009 Pallem et al.
2009/0304558 A1 12/2009 Patton
2009/0308315 A1 12/2009 de Ridder
2009/0308425 A1 12/2009 Yednak
2009/0311857 A1 12/2009 Todd et al.
2009/0314208 A1 12/2009 Zhou et al.
2009/0314309 A1 12/2009 Sankarakrishnan et al.
2009/0315093 A1 12/2009 Li et al.
2009/0317214 A1 12/2009 Hsiao et al.
2009/0320754 A1 12/2009 Oya
2009/0320881 A1 12/2009 Aitchison
2009/0324971 A1 12/2009 De Vries et al.
2009/0324989 A1 12/2009 Witz et al.
2009/0325391 A1 12/2009 De Vusser et al.
2009/0325469 A1 12/2009 Koo et al.
2010/0000608 A1 1/2010 Goto et al.
2010/0001409 A1 1/2010 Humbert et al.
2010/0003406 A1 1/2010 Lam et al.
2010/0006031 A1 1/2010 Choi et al.
2010/0006923 A1 1/2010 Fujitsuka
2010/0008656 A1 1/2010 Sorabji et al.
2010/0012036 A1 1/2010 Silva et al.
2010/0012153 A1 1/2010 Shigemoto et al.
2010/0014479 A1 1/2010 Kim
2010/0015813 A1 1/2010 McGinnis et al.
2010/0018460 A1 1/2010 Singh et al.
2010/0018913 A1 1/2010 Blum

(56) References Cited

U.S. PATENT DOCUMENTS

| | | | |
|---|---|---|---|
| 2010/0022097 | A1 | 1/2010 | Yamoto et al. |
| 2010/0024727 | A1 | 2/2010 | Kim et al. |
| 2010/0024872 | A1 | 2/2010 | Kishimoto |
| 2010/0025766 | A1 | 2/2010 | Nuttinck et al. |
| 2010/0025796 | A1 | 2/2010 | Dabiran |
| 2010/0031884 | A1 | 2/2010 | Aggarwal et al. |
| 2010/0032587 | A1 | 2/2010 | Hosch et al. |
| 2010/0032842 | A1 | 2/2010 | Herdt et al. |
| 2010/0034719 | A1 | 2/2010 | Dussarrat et al. |
| 2010/0038687 | A1 | 2/2010 | Klaus et al. |
| 2010/0040441 | A1 | 2/2010 | Obikane |
| 2010/0041179 | A1 | 2/2010 | Lee |
| 2010/0041243 | A1 | 2/2010 | Cheng et al. |
| 2010/0046321 | A1 | 2/2010 | McLaughlin et al. |
| 2010/0050943 | A1 | 3/2010 | Kato et al. |
| 2010/0051584 | A1 | 3/2010 | Okita et al. |
| 2010/0051597 | A1 | 3/2010 | Morita et al. |
| 2010/0055312 | A1 | 3/2010 | Kato et al. |
| 2010/0055316 | A1 | 3/2010 | Honma |
| 2010/0055318 | A1 | 3/2010 | Volf et al. |
| 2010/0055442 | A1 | 3/2010 | Kellock |
| 2010/0055898 | A1 | 3/2010 | Chang et al. |
| 2010/0058984 | A1 | 3/2010 | Marubayashi |
| 2010/0065758 | A1 | 3/2010 | Liu et al. |
| 2010/0068009 | A1 | 3/2010 | Kimma |
| 2010/0068383 | A1 | 3/2010 | Kato et al. |
| 2010/0068414 | A1 | 3/2010 | Takahashi et al. |
| 2010/0068891 | A1 | 3/2010 | Hatanaka et al. |
| 2010/0075037 | A1 | 3/2010 | Marsh et al. |
| 2010/0075488 | A1 | 3/2010 | Collins et al. |
| 2010/0075507 | A1 | 3/2010 | Chang et al. |
| 2010/0078601 | A1 | 4/2010 | Pallem et al. |
| 2010/0078746 | A1 | 4/2010 | Jung |
| 2010/0081094 | A1 | 4/2010 | Hasebe et al. |
| 2010/0081293 | A1 | 4/2010 | Mallick et al. |
| 2010/0086703 | A1 | 4/2010 | Mangum et al. |
| 2010/0087069 | A1 | 4/2010 | Miya et al. |
| 2010/0089320 | A1 | 4/2010 | Kim |
| 2010/0089870 | A1 | 4/2010 | Hiroshima et al. |
| 2010/0090149 | A1 | 4/2010 | Thompson et al. |
| 2010/0092679 | A1 | 4/2010 | Lee et al. |
| 2010/0092696 | A1 | 4/2010 | Shinriki |
| 2010/0093187 | A1 | 4/2010 | Lee et al. |
| 2010/0094430 | A1 | 4/2010 | Kmmdieck |
| 2010/0098862 | A1 | 4/2010 | Xu et al. |
| 2010/0101728 | A1 | 4/2010 | Iwasaki |
| 2010/0102417 | A1 | 4/2010 | Ganguli et al. |
| 2010/0105936 | A1 | 4/2010 | Tada et al. |
| 2010/0111648 | A1 | 5/2010 | Tamura et al. |
| 2010/0112496 | A1 | 5/2010 | Nakajima et al. |
| 2010/0116207 | A1 | 5/2010 | Givens |
| 2010/0116208 | A1 | 5/2010 | Sangam |
| 2010/0116209 | A1 | 5/2010 | Kato |
| 2010/0119439 | A1 | 5/2010 | Shindou |
| 2010/0119727 | A1 | 5/2010 | Takagi |
| 2010/0119844 | A1 | 5/2010 | Sun et al. |
| 2010/0120261 | A1 | 5/2010 | Kim et al. |
| 2010/0121100 | A1 | 5/2010 | Shay |
| 2010/0124610 | A1 | 5/2010 | Aikawa et al. |
| 2010/0124618 | A1 | 5/2010 | Kobayashi et al. |
| 2010/0124621 | A1 | 5/2010 | Kobayashi et al. |
| 2010/0126415 | A1 | 5/2010 | Ishino et al. |
| 2010/0126539 | A1 | 5/2010 | Lee et al. |
| 2010/0126605 | A1 | 5/2010 | Stones |
| 2010/0126666 | A1 | 5/2010 | Tandou et al. |
| 2010/0129548 | A1 | 5/2010 | Sneh |
| 2010/0129670 | A1 | 5/2010 | Sun et al. |
| 2010/0129990 | A1 | 5/2010 | Nishizawa et al. |
| 2010/0130015 | A1 | 5/2010 | Nakajima et al. |
| 2010/0130017 | A1 | 5/2010 | Luo et al. |
| 2010/0130105 | A1 | 5/2010 | Lee |
| 2010/0133255 | A1 | 6/2010 | Bahng et al. |
| 2010/0134023 | A1 | 6/2010 | Mills |
| 2010/0136216 | A1 | 6/2010 | Tsuei et al. |
| 2010/0140221 | A1 | 6/2010 | Kikuchi et al. |
| 2010/0140684 | A1 | 6/2010 | Ozawa |
| 2010/0143609 | A1 | 6/2010 | Fukazawa et al. |
| 2010/0144150 | A1 | 6/2010 | Sills et al. |
| 2010/0144162 | A1 | 6/2010 | Lee et al. |
| 2010/0144968 | A1 | 6/2010 | Lee et al. |
| 2010/0145547 | A1 | 6/2010 | Darabnia et al. |
| 2010/0147396 | A1 | 6/2010 | Yamagishi et al. |
| 2010/0151206 | A1 | 6/2010 | Wu et al. |
| 2010/0159638 | A1 | 6/2010 | Jeong |
| 2010/0159707 | A1 | 6/2010 | Huang et al. |
| 2010/0162752 | A1 | 7/2010 | Tabata et al. |
| 2010/0162956 | A1 | 7/2010 | Murakami et al. |
| 2010/0163187 | A1 | 7/2010 | Yokogawa et al. |
| 2010/0163524 | A1 | 7/2010 | Arai |
| 2010/0163937 | A1 | 7/2010 | Clendenning |
| 2010/0166630 | A1 | 7/2010 | Gu et al. |
| 2010/0168404 | A1 | 7/2010 | Girolami et al. |
| 2010/0170441 | A1 | 7/2010 | Won et al. |
| 2010/0170868 | A1 | 7/2010 | Lin et al. |
| 2010/0173432 | A1 | 7/2010 | White et al. |
| 2010/0178137 | A1 | 7/2010 | Chintalapati et al. |
| 2010/0178423 | A1 | 7/2010 | Shimizu et al. |
| 2010/0180819 | A1 | 7/2010 | Hatanaka et al. |
| 2010/0183825 | A1 | 7/2010 | Becker et al. |
| 2010/0184302 | A1 | 7/2010 | Lee et al. |
| 2010/0186669 | A1 | 7/2010 | Shin et al. |
| 2010/0189923 | A1 | 7/2010 | Goundar et al. |
| 2010/0193501 | A1 | 8/2010 | Zucker et al. |
| 2010/0193955 | A1 | 8/2010 | Milligan et al. |
| 2010/0195392 | A1 | 8/2010 | Freeman |
| 2010/0195690 | A1 | 8/2010 | Moench et al. |
| 2010/0197107 | A1 | 8/2010 | Matsuzaki |
| 2010/0202860 | A1 | 8/2010 | Reed |
| 2010/0203242 | A1 | 8/2010 | Borden |
| 2010/0206767 | A1 | 8/2010 | Odashima et al. |
| 2010/0209598 | A1 | 8/2010 | Xu et al. |
| 2010/0210108 | A1 | 8/2010 | Ishizaka et al. |
| 2010/0219757 | A1 | 9/2010 | Benzerrouk et al. |
| 2010/0221452 | A1 | 9/2010 | Kang |
| 2010/0224130 | A1 | 9/2010 | Smith et al. |
| 2010/0227458 | A1 | 9/2010 | Chung et al. |
| 2010/0229795 | A1 | 9/2010 | Tanabe |
| 2010/0229965 | A1 | 9/2010 | Kashima et al. |
| 2010/0230051 | A1 | 9/2010 | Iizuka |
| 2010/0230863 | A1 | 9/2010 | Moench et al. |
| 2010/0233885 | A1 | 9/2010 | Kushibiki et al. |
| 2010/0233886 | A1 | 9/2010 | Yang et al. |
| 2010/0236691 | A1 | 9/2010 | Yamazaki |
| 2010/0243166 | A1 | 9/2010 | Hayashi et al. |
| 2010/0244688 | A1 | 9/2010 | Braun et al. |
| 2010/0248465 | A1 | 9/2010 | Yi et al. |
| 2010/0252434 | A1 | 10/2010 | Roy |
| 2010/0255196 | A1 | 10/2010 | Geisler et al. |
| 2010/0255198 | A1 | 10/2010 | Cleary et al. |
| 2010/0255218 | A1 | 10/2010 | Oka et al. |
| 2010/0255625 | A1 | 10/2010 | De Vries |
| 2010/0255658 | A1 | 10/2010 | Aggarwal |
| 2010/0258809 | A1 | 10/2010 | Muller |
| 2010/0259152 | A1 | 10/2010 | Yasuda et al. |
| 2010/0266765 | A1 | 10/2010 | White et al. |
| 2010/0267224 | A1 | 10/2010 | Choi et al. |
| 2010/0267248 | A1 | 10/2010 | Ma |
| 2010/0270675 | A1 | 10/2010 | Harada |
| 2010/0246630 | A1 | 11/2010 | Kaszynski et al. |
| 2010/0275846 | A1 | 11/2010 | Kitagawa |
| 2010/0279008 | A1 | 11/2010 | Takagi |
| 2010/0279512 | A1 | 11/2010 | Udea et al. |
| 2010/0282163 | A1 | 11/2010 | Aggarwal et al. |
| 2010/0282170 | A1 | 11/2010 | Nishizawa |
| 2010/0282645 | A1 | 11/2010 | Wang |
| 2010/0285237 | A1 | 11/2010 | Ditizio et al. |
| 2010/0285319 | A1 | 11/2010 | Kwak et al. |
| 2010/0294199 | A1 | 11/2010 | Tran et al. |
| 2010/0297391 | A1 | 11/2010 | Kley |
| 2010/0301752 | A1 | 12/2010 | Bakre et al. |
| 2010/0304047 | A1 | 12/2010 | Yang et al. |
| 2010/0307415 | A1 | 12/2010 | Shero et al. |
| 2010/0317177 | A1 | 12/2010 | Huang et al. |
| 2010/0317198 | A1 | 12/2010 | Antonelli |

(56) References Cited

U.S. PATENT DOCUMENTS

2010/0322604 A1 12/2010 Fondurulia et al.
2010/0322822 A1 12/2010 Fritchie et al.
2010/0326358 A1 12/2010 Choi
2011/0000619 A1 1/2011 Suh
2011/0003087 A1 1/2011 Soininen et al.
2011/0003450 A1 1/2011 Lee et al.
2011/0005684 A1 1/2011 Hayami et al.
2011/0006402 A1 1/2011 Zhou
2011/0006406 A1 1/2011 Urbanowicz et al.
2011/0008950 A1 1/2011 Xu
2011/0014359 A1 1/2011 Hashim
2011/0014795 A1 1/2011 Lee
2011/0017139 A1 1/2011 Chiang et al.
2011/0021033 A1 1/2011 Ikeuchi et al.
2011/0027725 A1 2/2011 Tsutsumi et al.
2011/0027999 A1 2/2011 Sparks et al.
2011/0031562 A1 2/2011 Lin et al.
2011/0034039 A1 2/2011 Liang et al.
2011/0039419 A1 2/2011 Date et al.
2011/0041764 A1 2/2011 Webb et al.
2011/0042200 A1 2/2011 Wilby
2011/0045610 A1 2/2011 van Schravendijk et al.
2011/0045676 A1 2/2011 Park et al.
2011/0046314 A1 2/2011 Klipp et al.
2011/0048642 A1 3/2011 Mihara et al.
2011/0048769 A1 3/2011 Fujiwara
2011/0049100 A1 3/2011 Han et al.
2011/0052833 A1 3/2011 Hanawa et al.
2011/0053383 A1 3/2011 Shero et al.
2011/0056513 A1 3/2011 Hornbach et al.
2011/0056626 A1 3/2011 Brown et al.
2011/0057248 A1 3/2011 Ma et al.
2011/0061810 A1 3/2011 Ganguly et al.
2011/0065289 A1 3/2011 Asai
2011/0067522 A1 3/2011 Lai
2011/0070380 A1 3/2011 Shero et al.
2011/0070740 A1 3/2011 Bettencourt et al.
2011/0076401 A1 3/2011 Chao et al.
2011/0081519 A1 4/2011 Dillingh
2011/0083496 A1 4/2011 Lin et al.
2011/0086516 A1 4/2011 Lee et al.
2011/0089166 A1 4/2011 Hunter et al.
2011/0089419 A1 4/2011 Yamazaki et al.
2011/0089469 A1 4/2011 Merckling
2011/0091650 A1 4/2011 Noguchi et al.
2011/0092077 A1 4/2011 Xu et al.
2011/0097901 A1 4/2011 Banna et al.
2011/0098841 A1 4/2011 Tsuda
2011/0100489 A1 5/2011 Orito et al.
2011/0104395 A1 5/2011 Kumagai et al.
2011/0107512 A1 5/2011 Gilbert
2011/0108194 A1 5/2011 Yoshioka et al.
2011/0108424 A1 5/2011 Puget et al.
2011/0108741 A1 5/2011 Ingram
2011/0108929 A1 5/2011 Meng
2011/0114261 A1 5/2011 Matsumoto et al.
2011/0114601 A1 5/2011 Lubomirsky et al.
2011/0115378 A1 5/2011 Lubomirsky et al.
2011/0117490 A1 5/2011 Bae et al.
2011/0117492 A1 5/2011 Yamada et al.
2011/0117728 A1 5/2011 Su et al.
2011/0117732 A1 5/2011 Bauer et al.
2011/0117737 A1 5/2011 Agarwala et al.
2011/0117749 A1 5/2011 Sheu
2011/0121503 A1 5/2011 Burrows et al.
2011/0121736 A1 5/2011 Hirayama et al.
2011/0124196 A1 5/2011 Lee
2011/0127702 A1 6/2011 Gautam et al.
2011/0132542 A1 6/2011 Iizuka
2011/0135842 A1 6/2011 Faguet et al.
2011/0139272 A1 6/2011 Matsumoto et al.
2011/0139748 A1 6/2011 Donnelly et al.
2011/0140172 A1 6/2011 Chu
2011/0140173 A1 6/2011 Ramdani
2011/0143032 A1 6/2011 Vrtis et al.
2011/0143461 A1 6/2011 Fish et al.
2011/0155264 A1 6/2011 Minami et al.
2011/0155322 A1 6/2011 Himori et al.
2011/0159200 A1 6/2011 Kogure
2011/0159202 A1 6/2011 Matsushita
2011/0159673 A1 6/2011 Hanawa et al.
2011/0159680 A1 6/2011 Yoo
2011/0168330 A1 7/2011 Sakaue et al.
2011/0171380 A1 7/2011 Higashi et al.
2011/0171775 A1 7/2011 Yamamoto et al.
2011/0175011 A1 7/2011 Ehme et al.
2011/0177648 A1 7/2011 Tanner et al.
2011/0180233 A1 7/2011 Bera et al.
2011/0183079 A1 7/2011 Jackson et al.
2011/0183269 A1 7/2011 Zhu
2011/0183527 A1 7/2011 Cho
2011/0185969 A1 8/2011 Yang
2011/0186984 A1 8/2011 Saito et al.
2011/0192820 A1 8/2011 Yeom et al.
2011/0195574 A1 8/2011 Blasco et al.
2011/0198034 A1 8/2011 Sun et al.
2011/0198417 A1 8/2011 Detmar et al.
2011/0198736 A1 8/2011 Shero et al.
2011/0204025 A1 8/2011 Tahara
2011/0207332 A1 8/2011 Liu et al.
2011/0210468 A1 9/2011 Shannon et al.
2011/0212625 A1 9/2011 Toyoda et al.
2011/0217838 A1 9/2011 Hsieh et al.
2011/0220874 A1 9/2011 Hanrath
2011/0223334 A1 9/2011 Yudovsky et al.
2011/0226421 A1 9/2011 Hayashi
2011/0232678 A1 9/2011 Shih et al.
2011/0236201 A1 9/2011 Shende
2011/0236594 A1 9/2011 Haverkamp et al.
2011/0236600 A1 9/2011 Fox et al.
2011/0237040 A1 9/2011 Ng et al.
2011/0237082 A1 9/2011 Nakajima et al.
2011/0239936 A1 10/2011 Suzaki et al.
2011/0239940 A1 10/2011 Benvenuti et al.
2011/0244673 A1 10/2011 Cho et al.
2011/0253044 A1 10/2011 Tam et al.
2011/0254052 A1 10/2011 Kouvetakis
2011/0256675 A1 10/2011 Avouris
2011/0256692 A1 10/2011 Tam et al.
2011/0256724 A1 10/2011 Chandrasekharan et al.
2011/0256726 A1 10/2011 Lavoie et al.
2011/0256727 A1 10/2011 Beynet et al.
2011/0256734 A1 10/2011 Hausmann et al.
2011/0259519 A1 10/2011 Kenworthy et al.
2011/0262642 A1 10/2011 Xiao et al.
2011/0263107 A1 10/2011 Chung et al.
2011/0263115 A1 10/2011 Ganguli et al.
2011/0264250 A1 10/2011 Nishimura et al.
2011/0265549 A1 11/2011 Cruse et al.
2011/0265715 A1 11/2011 Keller
2011/0265725 A1 11/2011 Tsuji
2011/0265951 A1 11/2011 Xu et al.
2011/0266611 A1 11/2011 Kim et al.
2011/0269314 A1 11/2011 Lee et al.
2011/0275018 A1 11/2011 Matteo et al.
2011/0275166 A1 11/2011 Shero et al.
2011/0277690 A1 11/2011 Rozenzon et al.
2011/0281417 A1 11/2011 Gordon et al.
2011/0283933 A1 11/2011 Makarov et al.
2011/0286819 A1 11/2011 Shibata et al.
2011/0291243 A1 12/2011 Seamons
2011/0294075 A1 12/2011 Chen et al.
2011/0294288 A1 12/2011 Lee et al.
2011/0297088 A1 12/2011 Song et al.
2011/0298062 A1 12/2011 Ganguli et al.
2011/0300720 A1 12/2011 Fu
2011/0305102 A1 12/2011 Berger et al.
2011/0305856 A1 12/2011 Bonn
2011/0308453 A1 12/2011 Su et al.
2011/0308460 A1 12/2011 Hong et al.
2011/0312191 A1 12/2011 Ohkura et al.
2011/0318142 A1 12/2011 Gage et al.
2011/0318888 A1 12/2011 Komatsu et al.
2011/0318935 A1 12/2011 Oyabu et al.

(56) References Cited

U.S. PATENT DOCUMENTS

| | | | |
|---|---|---|---|
| 2012/0001172 | A1 | 1/2012 | Shang et al. |
| 2012/0003500 | A1 | 1/2012 | Yoshida et al. |
| 2012/0003599 | A1 | 1/2012 | Patalay et al. |
| 2012/0003726 | A1 | 1/2012 | Jones et al. |
| 2012/0003831 | A1 | 1/2012 | Kang et al. |
| 2012/0006489 | A1 | 1/2012 | Okita |
| 2012/0009802 | A1 | 1/2012 | Lavoie |
| 2012/0012556 | A1 | 1/2012 | Matsumoto et al. |
| 2012/0021252 | A1 | 1/2012 | Lee |
| 2012/0024223 | A1 | 2/2012 | Torres et al. |
| 2012/0024227 | A1 | 2/2012 | Takasuka et al. |
| 2012/0024231 | A1 | 2/2012 | Horino |
| 2012/0024478 | A1 | 2/2012 | Huang et al. |
| 2012/0024479 | A1 | 2/2012 | Palagashvili et al. |
| 2012/0027547 | A1 | 2/2012 | Jager et al. |
| 2012/0028454 | A1 | 2/2012 | Swaminathan et al. |
| 2012/0028469 | A1 | 2/2012 | Onizawa et al. |
| 2012/0031333 | A1 | 2/2012 | Kurita et al. |
| 2012/0031500 | A1 | 2/2012 | Hirose et al. |
| 2012/0032311 | A1 | 2/2012 | Gates |
| 2012/0033695 | A1 | 2/2012 | Hayashi et al. |
| 2012/0034793 | A1 | 2/2012 | Narushima et al. |
| 2012/0036732 | A1 | 2/2012 | Varadarajan |
| 2012/0040097 | A1 | 2/2012 | Volf et al. |
| 2012/0040528 | A1 | 2/2012 | Kim et al. |
| 2012/0043556 | A1 | 2/2012 | Dube et al. |
| 2012/0043617 | A1 | 2/2012 | Nakagawa et al. |
| 2012/0046421 | A1 | 2/2012 | Darling et al. |
| 2012/0052681 | A1 | 3/2012 | Marsh |
| 2012/0055401 | A1 | 3/2012 | Tozawa |
| 2012/0058270 | A1 | 3/2012 | Winter et al. |
| 2012/0058630 | A1 | 3/2012 | Quinn |
| 2012/0064690 | A1 | 3/2012 | Hirota et al. |
| 2012/0064726 | A1 | 3/2012 | Nozawa et al. |
| 2012/0064764 | A1 | 3/2012 | Islam |
| 2012/0068242 | A1 | 3/2012 | Shin et al. |
| 2012/0070136 | A1 | 3/2012 | Koelmel et al. |
| 2012/0070997 | A1 | 3/2012 | Larson |
| 2012/0073400 | A1 | 3/2012 | Wang |
| 2012/0074533 | A1 | 3/2012 | Aoyama |
| 2012/0077349 | A1 | 3/2012 | Li et al. |
| 2012/0077350 | A1 | 3/2012 | Miya et al. |
| 2012/0080756 | A1 | 4/2012 | Suzuki |
| 2012/0083134 | A1 | 4/2012 | Wu et al. |
| 2012/0088031 | A1 | 4/2012 | Neel |
| 2012/0088369 | A1 | 4/2012 | Weidman et al. |
| 2012/0090704 | A1 | 4/2012 | Laverdiere et al. |
| 2012/0091522 | A1 | 4/2012 | Ozaki et al. |
| 2012/0094010 | A1 | 4/2012 | Sugiura et al. |
| 2012/0094468 | A1 | 4/2012 | Bhatia et al. |
| 2012/0098107 | A1 | 4/2012 | Raisanen et al. |
| 2012/0100464 | A1 | 4/2012 | Kageyama |
| 2012/0103264 | A1 | 5/2012 | Choi et al. |
| 2012/0103522 | A1 | 5/2012 | Hohenwarter |
| 2012/0103939 | A1 | 5/2012 | Wu et al. |
| 2012/0104514 | A1 | 5/2012 | Park et al. |
| 2012/0107607 | A1 | 5/2012 | Takaki et al. |
| 2012/0108039 | A1 | 5/2012 | Zajaji |
| 2012/0108048 | A1 | 5/2012 | Lim et al. |
| 2012/0111271 | A1 | 5/2012 | Begarney et al. |
| 2012/0114877 | A1 | 5/2012 | Lee |
| 2012/0115250 | A1 | 5/2012 | Ariga et al. |
| 2012/0115257 | A1 | 5/2012 | Matsuyam et al. |
| 2012/0119337 | A1 | 5/2012 | Sasaki et al. |
| 2012/0121823 | A1 | 5/2012 | Chhabra |
| 2012/0122275 | A1 | 5/2012 | Koo et al. |
| 2012/0122302 | A1 | 5/2012 | Weisman et al. |
| 2012/0122319 | A1 | 5/2012 | Shimizu |
| 2012/0125258 | A1 | 5/2012 | Lee |
| 2012/0126300 | A1 | 5/2012 | Park et al. |
| 2012/0128897 | A1 | 5/2012 | Xiao et al. |
| 2012/0135145 | A1 | 5/2012 | Je et al. |
| 2012/0139009 | A1 | 6/2012 | Ning et al. |
| 2012/0145078 | A1 | 6/2012 | Huang et al. |
| 2012/0146113 | A1 | 6/2012 | Suzuki et al. |
| 2012/0149207 | A1 | 6/2012 | Graff |
| 2012/0149213 | A1 | 6/2012 | Nittala |
| 2012/0156108 | A1 | 6/2012 | Fondurulia et al. |
| 2012/0156890 | A1 | 6/2012 | Yim et al. |
| 2012/0160172 | A1 | 6/2012 | Wamura et al. |
| 2012/0160809 | A1 | 6/2012 | Ishibashi et al. |
| 2012/0161126 | A1 | 6/2012 | Yamazaki |
| 2012/0161405 | A1 | 6/2012 | Mohn |
| 2012/0164327 | A1 | 6/2012 | Sato |
| 2012/0164837 | A1 | 6/2012 | Tan et al. |
| 2012/0164842 | A1 | 6/2012 | Watanabe |
| 2012/0164846 | A1 | 6/2012 | Ha et al. |
| 2012/0170170 | A1 | 7/2012 | Gros-Jean |
| 2012/0171391 | A1 | 7/2012 | Won |
| 2012/0171874 | A1 | 7/2012 | Thridandam et al. |
| 2012/0175518 | A1 | 7/2012 | Godet et al. |
| 2012/0175751 | A1 | 7/2012 | Gatineau et al. |
| 2012/0177845 | A1 | 7/2012 | Odedra et al. |
| 2012/0180719 | A1 | 7/2012 | Inoue et al. |
| 2012/0180954 | A1 | 7/2012 | Yang et al. |
| 2012/0183689 | A1 | 7/2012 | Suzuki et al. |
| 2012/0186521 | A1 | 7/2012 | Iwasaki et al. |
| 2012/0186573 | A1 | 7/2012 | Jdira et al. |
| 2012/0187083 | A1 | 7/2012 | Hashizume |
| 2012/0187305 | A1 | 7/2012 | Elam et al. |
| 2012/0187375 | A1 | 7/2012 | Guo et al. |
| 2012/0190178 | A1 | 7/2012 | Wang et al. |
| 2012/0190185 | A1 | 7/2012 | Rogers |
| 2012/0190208 | A1 | 7/2012 | Ozu et al. |
| 2012/0196048 | A1 | 8/2012 | Ueda |
| 2012/0196242 | A1 | 8/2012 | Volfovski et al. |
| 2012/0196450 | A1 | 8/2012 | Balseanu et al. |
| 2012/0202358 | A1 | 8/2012 | Gealy et al. |
| 2012/0206033 | A1 | 8/2012 | Matsuyama |
| 2012/0207456 | A1 | 8/2012 | Kim et al. |
| 2012/0212121 | A1 | 8/2012 | Lin |
| 2012/0213947 | A1 | 8/2012 | Lee |
| 2012/0214318 | A1 | 8/2012 | Fukazawa et al. |
| 2012/0216743 | A1 | 8/2012 | Itoh et al. |
| 2012/0219735 | A1 | 8/2012 | Bakker et al. |
| 2012/0219824 | A1 | 8/2012 | Prolier |
| 2012/0220139 | A1 | 8/2012 | Lee et al. |
| 2012/0222813 | A1 | 9/2012 | Pal et al. |
| 2012/0222815 | A1 | 9/2012 | Sabri et al. |
| 2012/0225192 | A1 | 9/2012 | Yudovsky et al. |
| 2012/0225561 | A1 | 9/2012 | Watanabe |
| 2012/0231611 | A1 | 9/2012 | Gatineau et al. |
| 2012/0231771 | A1 | 9/2012 | Marcus |
| 2012/0232340 | A1 | 9/2012 | Levy et al. |
| 2012/0238074 | A1 | 9/2012 | Santhanam et al. |
| 2012/0240858 | A1 | 9/2012 | Taniyama et al. |
| 2012/0241089 | A1 | 9/2012 | Dielmann et al. |
| 2012/0241411 | A1 | 9/2012 | Darling et al. |
| 2012/0244703 | A1 | 9/2012 | Nakayama et al. |
| 2012/0247386 | A1 | 10/2012 | Sanchez et al. |
| 2012/0252229 | A1 | 10/2012 | Timans et al. |
| 2012/0258257 | A1 | 10/2012 | Nguyen et al. |
| 2012/0263875 | A1 | 10/2012 | Brenninger et al. |
| 2012/0263876 | A1 | 10/2012 | Haukka et al. |
| 2012/0263887 | A1 | 10/2012 | Papasouliotis et al. |
| 2012/0264051 | A1 | 10/2012 | Angelov et al. |
| 2012/0264305 | A1 | 10/2012 | Nakano |
| 2012/0267048 | A1 | 10/2012 | Moyama et al. |
| 2012/0269962 | A1 | 10/2012 | Blomberg et al. |
| 2012/0269967 | A1 | 10/2012 | Yudovsky et al. |
| 2012/0270339 | A1 | 10/2012 | Xie et al. |
| 2012/0270384 | A1 | 10/2012 | Sanchez et al. |
| 2012/0270393 | A1 | 10/2012 | Pore et al. |
| 2012/0270407 | A1 | 10/2012 | Werner et al. |
| 2012/0273052 | A1 | 11/2012 | Ye et al. |
| 2012/0273162 | A1 | 11/2012 | Mahadeswaraswamy |
| 2012/0276306 | A1 | 11/2012 | Ueda |
| 2012/0288625 | A1 | 11/2012 | Furuya et al. |
| 2012/0289053 | A1 | 11/2012 | Holland et al. |
| 2012/0289056 | A1 | 11/2012 | Bergman et al. |
| 2012/0289057 | A1 | 11/2012 | DeDontney |
| 2012/0295427 | A1 | 11/2012 | Bauer |
| 2012/0295449 | A1 | 11/2012 | Fukazawa |
| 2012/0302055 | A1 | 11/2012 | Pore et al. |

(56) References Cited

U.S. PATENT DOCUMENTS

2012/0303313 A1 11/2012 Moroi et al.
2012/0304935 A1 12/2012 Oosterlaken et al.
2012/0305026 A1 12/2012 Nomura et al.
2012/0305196 A1 12/2012 Mori et al.
2012/0305987 A1 12/2012 Hirler et al.
2012/0307588 A1 12/2012 Hanada et al.
2012/0309181 A1 12/2012 Machkaoutsan et al.
2012/0310440 A1 12/2012 Darabnia et al.
2012/0315113 A1 12/2012 Hiroki
2012/0315404 A1 12/2012 Li et al.
2012/0318334 A1 12/2012 Bedell et al.
2012/0318457 A1 12/2012 Nguyen et al.
2012/0318773 A1 12/2012 Wu et al.
2012/0319279 A1 12/2012 Isobayashi
2012/0320491 A1 12/2012 Doh et al.
2012/0321786 A1 12/2012 Satitpunwaycha et al.
2012/0322252 A1 12/2012 Son et al.
2012/0325148 A1 12/2012 Yamagishi et al.
2012/0328780 A1 12/2012 Yamagishi et al.
2012/0329208 A1 12/2012 Pore et al.
2013/0002121 A1 1/2013 Ma
2013/0005122 A1 1/2013 Schwarzenbach et al.
2013/0005147 A1 1/2013 Angyal et al.
2013/0008607 A1 1/2013 Matsumoto et al.
2013/0011630 A1 1/2013 Sullivan et al.
2013/0011983 A1 1/2013 Tsai
2013/0011984 A1 1/2013 Wang et al.
2013/0012003 A1 1/2013 Haukka et al.
2013/0012034 A1 1/2013 Ahn et al.
2013/0014697 A1 1/2013 Kanayama
2013/0014896 A1 1/2013 Shoji et al.
2013/0017503 A1 1/2013 De Ridder et al.
2013/0019944 A1 1/2013 Hekmatshoar-Tabai et al.
2013/0019945 A1 1/2013 Hekmatshoar-Tabai et al.
2013/0019960 A1 1/2013 Choi et al.
2013/0020246 A1 1/2013 Hoots et al.
2013/0023120 A1 1/2013 Yaehashi et al.
2013/0023124 A1 1/2013 Nemani et al.
2013/0023129 A1 1/2013 Reed
2013/0025538 A1 1/2013 Collins et al.
2013/0025786 A1 1/2013 Davidkovich et al.
2013/0026451 A1 1/2013 Bangsaruntip et al.
2013/0032085 A1 2/2013 Hanawa et al.
2013/0037532 A1 2/2013 Volfovski et al.
2013/0037858 A1 2/2013 Hong et al.
2013/0037886 A1 2/2013 Tsai et al.
2013/0040447 A1 2/2013 Swaminathan et al.
2013/0040481 A1 2/2013 Vallely et al.
2013/0042811 A1 2/2013 Shanker et al.
2013/0048606 A1 2/2013 Mao et al.
2013/0052585 A1 2/2013 Ayothi et al.
2013/0052836 A1 2/2013 Hirose et al.
2013/0059078 A1 3/2013 Gatineau et al.
2013/0059415 A1 3/2013 Kato et al.
2013/0061755 A1 3/2013 Frederick
2013/0062753 A1 3/2013 Nguyen et al.
2013/0062839 A1 3/2013 Tschinderle et al.
2013/0064973 A1 3/2013 Chen et al.
2013/0065189 A1 3/2013 Yoshii et al.
2013/0068391 A1 3/2013 Mazzocco et al.
2013/0068727 A1 3/2013 Okita
2013/0068970 A1 3/2013 Matsushita
2013/0069052 A1 3/2013 Sandhu
2013/0070456 A1 3/2013 Jang et al.
2013/0075746 A1 3/2013 Mallikarjunaswamy et al.
2013/0075788 A1 3/2013 Tomabechi
2013/0078376 A1 3/2013 Higashino et al.
2013/0078392 A1 3/2013 Xiao et al.
2013/0081702 A1 4/2013 Mohammed et al.
2013/0082274 A1 4/2013 Yang
2013/0084156 A1 4/2013 Shimamoto
2013/0084408 A1 4/2013 Nakao et al.
2013/0084711 A1 4/2013 Liang et al.
2013/0084714 A1 4/2013 Oka et al.
2013/0085618 A1 4/2013 Ding
2013/0089667 A1 4/2013 Lai et al.
2013/0089716 A1 4/2013 Krishnamurthy et al.
2013/0089988 A1 4/2013 Wang et al.
2013/0092085 A1 4/2013 Lee
2013/0093048 A1 4/2013 Chang et al.
2013/0093321 A1 4/2013 Yoshikawa et al.
2013/0095664 A1 4/2013 Matero et al.
2013/0095973 A1 4/2013 Kroneberger et al.
2013/0099318 A1 4/2013 Adam et al.
2013/0104988 A1 5/2013 Yednak et al.
2013/0104992 A1 5/2013 Yednak et al.
2013/0107415 A1 5/2013 Banna et al.
2013/0109172 A1 5/2013 Collins et al.
2013/0109192 A1 5/2013 Hawkins et al.
2013/0112251 A1 5/2013 Hang et al.
2013/0113085 A1 5/2013 Michaelson et al.
2013/0115383 A1 5/2013 Lu et al.
2013/0115763 A1 5/2013 Takamure et al.
2013/0115768 A1 5/2013 Pore et al.
2013/0118405 A1 5/2013 Ho et al.
2013/0118895 A1 5/2013 Roozeboom et al.
2013/0119018 A1 5/2013 Kanarik et al.
2013/0122712 A1 5/2013 Kim et al.
2013/0122722 A1 5/2013 Cissell et al.
2013/0126515 A1 5/2013 Shero et al.
2013/0129577 A1 5/2013 Halpin et al.
2013/0130490 A1 5/2013 Lee et al.
2013/0134148 A1 5/2013 Tachikawa
2013/0137279 A1 5/2013 Yamamoto et al.
2013/0143401 A1 6/2013 Yu et al.
2013/0143415 A1 6/2013 Yudovsky et al.
2013/0145587 A1 6/2013 Adhiprakasha
2013/0145984 A1 6/2013 Zhang et al.
2013/0147050 A1 6/2013 Bonner, III et al.
2013/0149874 A1 6/2013 Hirose et al.
2013/0152933 A1 6/2013 Lischer et al.
2013/0157409 A1 6/2013 Vaidya
2013/0157521 A1 6/2013 Aldrich et al.
2013/0160709 A1 6/2013 White et al.
2013/0161629 A1 6/2013 Han et al.
2013/0162142 A1 6/2013 Nishino et al.
2013/0164458 A1 6/2013 Soininen et al.
2013/0168353 A1 7/2013 Okita et al.
2013/0168354 A1 7/2013 Kanarik
2013/0171818 A1 7/2013 Kim et al.
2013/0175596 A1 7/2013 Cheng et al.
2013/0177706 A1 7/2013 Baluja et al.
2013/0180448 A1 7/2013 Sakaue et al.
2013/0183814 A1 7/2013 Huang et al.
2013/0186340 A1 7/2013 Omori et al.
2013/0189635 A1 7/2013 Lim et al.
2013/0189854 A1 7/2013 Hausmann et al.
2013/0196502 A1 8/2013 Haukka et al.
2013/0196507 A1 8/2013 Ma et al.
2013/0200518 A1 8/2013 Ahmed et al.
2013/0202387 A1 8/2013 Hiroki
2013/0203258 A1 8/2013 Chen et al.
2013/0203266 A1 8/2013 Hintze
2013/0203267 A1 8/2013 Pomarede et al.
2013/0206066 A1 8/2013 Han et al.
2013/0209940 A1 8/2013 Sakamoto et al.
2013/0210241 A1 8/2013 Lavoie et al.
2013/0213300 A1 8/2013 Sung et al.
2013/0214232 A1 8/2013 Tendulkar et al.
2013/0216710 A1 8/2013 Masuda et al.
2013/0217239 A1 8/2013 Mallick et al.
2013/0217240 A1 8/2013 Mallick et al.
2013/0217241 A1 8/2013 Underwood et al.
2013/0217243 A1 8/2013 Underwood et al.
2013/0219853 A1 8/2013 Little et al.
2013/0220550 A1 8/2013 Koo et al.
2013/0224964 A1 8/2013 Fukazawa
2013/0228225 A1 9/2013 Leeser
2013/0228902 A1 9/2013 Tomizawa et al.
2013/0230814 A1 9/2013 Dunn et al.
2013/0230987 A1 9/2013 Draeger et al.
2013/0234203 A1 9/2013 Tsai et al.
2013/0242287 A1 9/2013 Schlezinger
2013/0247937 A1 9/2013 Nunomura et al.

(56) References Cited

U.S. PATENT DOCUMENTS

2013/0256265 A1 10/2013 Darling et al.
2013/0256838 A1 10/2013 Sanchez et al.
2013/0256962 A1 10/2013 Ranish
2013/0260371 A1 10/2013 Holt
2013/0264659 A1 10/2013 Jung
2013/0267045 A1 10/2013 Lee et al.
2013/0269609 A1 10/2013 Leeser
2013/0269612 A1 10/2013 Cheng et al.
2013/0270600 A1 10/2013 Helander et al.
2013/0270676 A1 10/2013 Lindert et al.
2013/0273330 A1 10/2013 Wang et al.
2013/0276978 A1 10/2013 Bluck et al.
2013/0280891 A1 10/2013 Kim et al.
2013/0285155 A1 10/2013 Glass
2013/0287526 A1 10/2013 Bluck et al.
2013/0288427 A1 10/2013 Hung et al.
2013/0288471 A1 10/2013 Chi
2013/0288480 A1 10/2013 Sanchez et al.
2013/0288485 A1 10/2013 Liang et al.
2013/0292047 A1 11/2013 Tian et al.
2013/0292676 A1 11/2013 Milligan et al.
2013/0292807 A1 11/2013 Raisanen et al.
2013/0295779 A1 11/2013 Chandra et al.
2013/0299944 A1 11/2013 Lai et al.
2013/0302520 A1 11/2013 Wang et al.
2013/0302999 A1 11/2013 Won et al.
2013/0303803 A1 11/2013 Doerr et al.
2013/0309876 A1 11/2013 Ogawa
2013/0312663 A1 11/2013 Khosla et al.
2013/0313656 A1 11/2013 Tong
2013/0319290 A1 12/2013 Xiao et al.
2013/0320429 A1 12/2013 Thomas
2013/0323435 A1 12/2013 Xiao et al.
2013/0323859 A1 12/2013 Chen et al.
2013/0323935 A1 12/2013 Suzuki et al.
2013/0330165 A1 12/2013 Wimplinger
2013/0330911 A1 12/2013 Huang et al.
2013/0330933 A1 12/2013 Fukazawa et al.
2013/0333619 A1 12/2013 Omari
2013/0337172 A1 12/2013 Lee
2013/0337583 A1 12/2013 Kobayashi et al.
2013/0337639 A1 12/2013 Ivanstov et al.
2013/0337653 A1 12/2013 Kovalgin et al.
2013/0340619 A1 12/2013 Tammera
2013/0340678 A1 12/2013 Wamura et al.
2013/0344248 A1 12/2013 Clark
2014/0000843 A1 1/2014 Dunn et al.
2014/0001520 A1 1/2014 Glass
2014/0004274 A1 1/2014 Thompson
2014/0007808 A1 1/2014 Okabe et al.
2014/0014642 A1 1/2014 Elliot et al.
2014/0014644 A1 1/2014 Akiba et al.
2014/0015108 A1 1/2014 Kim et al.
2014/0015186 A1 1/2014 Wessel et al.
2014/0017408 A1 1/2014 Gandikota et al.
2014/0017414 A1 1/2014 Fukazawa et al.
2014/0017908 A1 1/2014 Beynet et al.
2014/0020619 A1 1/2014 Vincent et al.
2014/0020764 A1 1/2014 Woelk et al.
2014/0020839 A1 1/2014 Kenney et al.
2014/0023794 A1 1/2014 Mahajani et al.
2014/0024223 A1 1/2014 Kilpi et al.
2014/0027884 A1 1/2014 Tang et al.
2014/0030447 A1 1/2014 Lee
2014/0033978 A1 2/2014 Adachi et al.
2014/0034240 A1 2/2014 Kim et al.
2014/0034632 A1 2/2014 Pan et al.
2014/0036274 A1 2/2014 Marquardt et al.
2014/0045324 A1 2/2014 Brabant et al.
2014/0045342 A1 2/2014 Mallick et al.
2014/0047705 A1 2/2014 Singh
2014/0048765 A1 2/2014 Ma et al.
2014/0053866 A1 2/2014 Baluja et al.
2014/0056679 A1 2/2014 Yamabe et al.
2014/0056770 A1 2/2014 Bedard et al.
2014/0057187 A1 2/2014 Suzuki et al.
2014/0057454 A1 2/2014 Subramonium
2014/0058179 A1 2/2014 Stevens et al.
2014/0060147 A1 3/2014 Sarin et al.
2014/0060572 A1 3/2014 Yasumuro et al.
2014/0061770 A1 3/2014 Lee
2014/0062304 A1 3/2014 Nakano et al.
2014/0065841 A1 3/2014 Matero
2014/0067110 A1 3/2014 Lawson et al.
2014/0072710 A1 3/2014 Valle
2014/0072726 A1 3/2014 Kim
2014/0072925 A1 3/2014 Kaneko
2014/0073082 A1 3/2014 Song
2014/0073143 A1 3/2014 Alokozai et al.
2014/0076861 A1 3/2014 Cornelius et al.
2014/0077240 A1 3/2014 Roucka et al.
2014/0080314 A1 3/2014 Sasajima et al.
2014/0084341 A1 3/2014 Weeks
2014/0087490 A1 3/2014 Kahlon
2014/0087544 A1 3/2014 Tolle
2014/0087564 A1 3/2014 Shimizu et al.
2014/0094027 A1 4/2014 Azumo et al.
2014/0096716 A1 4/2014 Chung et al.
2014/0097468 A1 4/2014 Okita
2014/0099794 A1 4/2014 Ingle et al.
2014/0099798 A1 4/2014 Tsuji
2014/0103145 A1 4/2014 White et al.
2014/0106574 A1 4/2014 Kang et al.
2014/0110798 A1 4/2014 Cai
2014/0113457 A1 4/2014 Sims
2014/0116335 A1 5/2014 Tsuji et al.
2014/0117380 A1 5/2014 Loboda et al.
2014/0120312 A1 5/2014 He et al.
2014/0120487 A1 5/2014 Kaneko
2014/0120678 A1 5/2014 Shinriki et al.
2014/0120723 A1 5/2014 Fu et al.
2014/0120738 A1 5/2014 Jung
2014/0120750 A1 5/2014 Johnson
2014/0127422 A1 5/2014 Shao et al.
2014/0127907 A1 5/2014 Yang
2014/0130687 A1 5/2014 Shibusawa et al.
2014/0138779 A1 5/2014 Xie et al.
2014/0141165 A1 5/2014 Sato et al.
2014/0141625 A1 5/2014 Fukazawa et al.
2014/0141674 A1 5/2014 Galbreath et al.
2014/0144375 A1 5/2014 Kim et al.
2014/0144500 A1 5/2014 Cao et al.
2014/0145332 A1 5/2014 Ryan et al.
2014/0147587 A1 5/2014 Endo et al.
2014/0148924 A1 5/2014 Brak et al.
2014/0158154 A1 6/2014 Kondo et al.
2014/0158786 A1 6/2014 Santo
2014/0159170 A1 6/2014 Raisanen et al.
2014/0162401 A1 6/2014 Kawano et al.
2014/0167187 A1 6/2014 Kuo et al.
2014/0170320 A1 6/2014 Yamamoto et al.
2014/0170335 A1 6/2014 Shao et al.
2014/0174354 A1 6/2014 Arai
2014/0174357 A1 6/2014 Kim et al.
2014/0174927 A1 6/2014 Bashir et al.
2014/0175054 A1 6/2014 Carlson et al.
2014/0179091 A1 6/2014 Clark
2014/0179092 A1 6/2014 Kim
2014/0182053 A1 7/2014 Huang
2014/0182689 A1 7/2014 Shareef et al.
2014/0187022 A1 7/2014 Falster et al.
2014/0187045 A1 7/2014 Hua et al.
2014/0190581 A1 7/2014 Nagase et al.
2014/0191389 A1 7/2014 Lee et al.
2014/0193983 A1 7/2014 Lavoie
2014/0202382 A1 7/2014 Kim et al.
2014/0202386 A1 7/2014 Taga
2014/0202388 A1 7/2014 Um et al.
2014/0209976 A1 7/2014 Yang et al.
2014/0213061 A1 7/2014 Huang et al.
2014/0217065 A1 8/2014 Winkler et al.
2014/0220247 A1 8/2014 Haukka et al.
2014/0225065 A1 8/2014 Rachmady et al.
2014/0227072 A1 8/2014 Lee et al.

(56) References Cited

U.S. PATENT DOCUMENTS

2014/0227444 A1 8/2014 Winter et al.
2014/0227861 A1 8/2014 Wu et al.
2014/0227881 A1 8/2014 Lubomirsky et al.
2014/0231922 A1 8/2014 Kim et al.
2014/0234466 A1 8/2014 Gao et al.
2014/0234550 A1 8/2014 Winter et al.
2014/0234992 A1 8/2014 Kubota et al.
2014/0238607 A1 8/2014 Nozawa et al.
2014/0238608 A1 8/2014 Sabri et al.
2014/0242298 A1 8/2014 Lansalot-Matras et al.
2014/0242806 A1 8/2014 Knapp et al.
2014/0242808 A1 8/2014 Akiyama et al.
2014/0245948 A1 9/2014 Nguyen et al.
2014/0251788 A1 9/2014 Ge et al.
2014/0251953 A1 9/2014 Winkler et al.
2014/0251954 A1 9/2014 Winkler et al.
2014/0252134 A1 9/2014 Chen
2014/0252479 A1 9/2014 Utomo et al.
2014/0252710 A1 9/2014 Cuvalci et al.
2014/0256160 A1 9/2014 Wada et al.
2014/0260684 A1 9/2014 Christmann
2014/0262028 A1 9/2014 Kelekar
2014/0262034 A1 9/2014 Ishibashi et al.
2014/0262193 A1 9/2014 Im et al.
2014/0263172 A1 9/2014 Xie et al.
2014/0263272 A1 9/2014 Duan et al.
2014/0264297 A1 9/2014 Kumar et al.
2014/0264444 A1 9/2014 Guo et al.
2014/0264902 A1 9/2014 Ting et al.
2014/0265090 A1 9/2014 Hou
2014/0265832 A1 9/2014 Kenney et al.
2014/0271081 A1 9/2014 Lavitsky et al.
2014/0272194 A1 9/2014 Xiao et al.
2014/0272341 A1 9/2014 Duan et al.
2014/0273428 A1 9/2014 Shero
2014/0273477 A1 9/2014 Niskanen
2014/0273497 A1 9/2014 Payne et al.
2014/0273510 A1 9/2014 Chen et al.
2014/0273528 A1 9/2014 Niskanen
2014/0273530 A1 9/2014 Nguyen
2014/0273531 A1 9/2014 Niskanen
2014/0283747 A1 9/2014 Kasai et al.
2014/0287164 A1 9/2014 Xiao et al.
2014/0287595 A1 9/2014 Shimamoto et al.
2014/0290573 A1 10/2014 Okabe et al.
2014/0290578 A1 10/2014 Wamura et al.
2014/0306250 A1 10/2014 Gardner et al.
2014/0308108 A1 10/2014 Fosnight et al.
2014/0312767 A1 10/2014 Tian et al.
2014/0322862 A1 10/2014 Xie et al.
2014/0322885 A1 10/2014 Xie et al.
2014/0327117 A1 11/2014 Bencher et al.
2014/0339981 A1 11/2014 Komatsu et al.
2014/0346142 A1 11/2014 Chapuis et al.
2014/0346600 A1 11/2014 Cheng et al.
2014/0346650 A1 11/2014 Raisanen et al.
2014/0349033 A1 11/2014 Nonaka et al.
2014/0349068 A1 11/2014 Inglis et al.
2014/0357090 A1 12/2014 Knaepen et al.
2014/0360430 A1 12/2014 Armour et al.
2014/0363980 A1 12/2014 Kawamata et al.
2014/0363983 A1 12/2014 Nakano et al.
2014/0363985 A1 12/2014 Jang et al.
2014/0366804 A1 12/2014 Pak et al.
2014/0367043 A1 12/2014 Bishara et al.
2014/0367642 A1 12/2014 Guo
2014/0377960 A1 12/2014 Koiwa
2015/0004316 A1 1/2015 Thompson et al.
2015/0004317 A1 1/2015 Dussarrat et al.
2015/0004318 A1 1/2015 Alasaarela et al.
2015/0004798 A1 1/2015 Chandrasekharan et al.
2015/0004806 A1 1/2015 Ndiege et al.
2015/0007770 A1 1/2015 Chandrasekharan et al.
2015/0010381 A1 1/2015 Cai
2015/0011095 A1 1/2015 Chandrasekharan et al.
2015/0014632 A1 1/2015 Kim et al.
2015/0014823 A1 1/2015 Mallikarjunan et al.
2015/0017794 A1 1/2015 Takamure
2015/0021599 A1 1/2015 Ridgeway
2015/0024567 A1 1/2015 Tsai et al.
2015/0024609 A1 1/2015 Milligan et al.
2015/0030766 A1 1/2015 Lind et al.
2015/0030782 A1 1/2015 Ivanov et al.
2015/0031218 A1 1/2015 Karakawa
2015/0041431 A1 2/2015 Zafiropoulo et al.
2015/0048485 A1 2/2015 Tolle
2015/0056815 A1 2/2015 Fernandez
2015/0056821 A1 2/2015 Ishikawa et al.
2015/0061078 A1 3/2015 Abel et al.
2015/0064923 A1 3/2015 Matsumoto et al.
2015/0069354 A1 3/2015 Helander et al.
2015/0072509 A1 3/2015 Chi et al.
2015/0078874 A1 3/2015 Sansoni
2015/0079311 A1 3/2015 Nakano
2015/0086316 A1 3/2015 Greenberg
2015/0086716 A1 3/2015 Park et al.
2015/0087139 A1 3/2015 O'Neill et al.
2015/0087154 A1 3/2015 Guha et al.
2015/0091057 A1 4/2015 Xie et al.
2015/0091134 A1 4/2015 Amaratunga et al.
2015/0094470 A1 4/2015 Sanchez et al.
2015/0096973 A1 4/2015 Dunn et al.
2015/0099065 A1 4/2015 Canizares et al.
2015/0099072 A1 4/2015 Takamure et al.
2015/0099123 A1 4/2015 Barbee et al.
2015/0099342 A1 4/2015 Tsai
2015/0099374 A1 4/2015 Kakimoto et al.
2015/0099375 A1 4/2015 Haripin et al.
2015/0102466 A1 4/2015 Colinge
2015/0104574 A1 4/2015 Lee et al.
2015/0104575 A1 4/2015 Takoudis et al.
2015/0110147 A1 4/2015 Mizuno
2015/0110968 A1 4/2015 Lavoie et al.
2015/0111374 A1 4/2015 Bao
2015/0111395 A1 4/2015 Hashimoto et al.
2015/0114295 A1 4/2015 Kim et al.
2015/0118009 A1 4/2015 Hsieh et al.
2015/0118846 A1 4/2015 Isii et al.
2015/0118863 A1 4/2015 Rathod et al.
2015/0122180 A1 5/2015 Chang et al.
2015/0125628 A1 5/2015 Kim et al.
2015/0126036 A1 5/2015 Zhao
2015/0132212 A1 5/2015 Winkler et al.
2015/0132953 A1 5/2015 Nowling et al.
2015/0137315 A1 5/2015 Chen et al.
2015/0140210 A1 5/2015 Jung et al.
2015/0144060 A1 5/2015 Park
2015/0147482 A1 5/2015 Kang et al.
2015/0147483 A1 5/2015 Fukazawa
2015/0147488 A1 5/2015 Choi et al.
2015/0147875 A1 5/2015 Takamure et al.
2015/0147877 A1 5/2015 Jung
2015/0152547 A1 6/2015 Nakamura et al.
2015/0152553 A1 6/2015 Popp et al.
2015/0155140 A1 6/2015 Lee et al.
2015/0155177 A1 6/2015 Zhang et al.
2015/0155370 A1 6/2015 Tsai et al.
2015/0162168 A1 6/2015 Oehrlien
2015/0162185 A1 6/2015 Pore
2015/0162214 A1 6/2015 Thompson
2015/0167159 A1 6/2015 Halpin et al.
2015/0167161 A1 6/2015 Canizares et al.
2015/0167162 A1 6/2015 Barik et al.
2015/0167165 A1 6/2015 Lindfors
2015/0167705 A1 6/2015 Lee et al.
2015/0170907 A1 6/2015 Haukka et al.
2015/0170914 A1 6/2015 Haukka et al.
2015/0170945 A1 6/2015 Segawa et al.
2015/0170947 A1 6/2015 Bluck
2015/0170954 A1 6/2015 Agarwal
2015/0170975 A1 6/2015 Blatchford et al.
2015/0171177 A1 6/2015 Cheng et al.
2015/0174768 A1 6/2015 Rodnick
2015/0175467 A1 6/2015 Denifl et al.

(56) References Cited

U.S. PATENT DOCUMENTS

2015/0176124 A1 6/2015 Greer et al.
2015/0176126 A1 6/2015 Ge et al.
2015/0179415 A1 6/2015 Sasaki et al.
2015/0179501 A1 6/2015 Jhaveri et al.
2015/0179564 A1 6/2015 Lee et al.
2015/0179640 A1 6/2015 Kim et al.
2015/0184287 A1 7/2015 Tsung et al.
2015/0184291 A1 7/2015 Alokozai et al.
2015/0187559 A1 7/2015 Sano
2015/0187568 A1 7/2015 Pettinger et al.
2015/0187611 A1 7/2015 Sato
2015/0187908 A1 7/2015 Zhang et al.
2015/0203961 A1 7/2015 Ha et al.
2015/0203967 A1 7/2015 Dhas et al.
2015/0211124 A1 7/2015 Nozawa et al.
2015/0211125 A1 7/2015 Yoshikawa et al.
2015/0217330 A1 8/2015 Haukka
2015/0217456 A1 8/2015 Tsuji et al.
2015/0218695 A1 8/2015 Odedra
2015/0218698 A1 8/2015 Yoon et al.
2015/0218700 A1 8/2015 Nguyen et al.
2015/0221479 A1 8/2015 Chen et al.
2015/0221480 A1 8/2015 Duan et al.
2015/0221519 A1 8/2015 Marks et al.
2015/0225850 A1 8/2015 Arora et al.
2015/0228513 A1 8/2015 Parkhe et al.
2015/0228572 A1 8/2015 Yang et al.
2015/0228645 A1 8/2015 Chuang et al.
2015/0228749 A1 8/2015 Ando et al.
2015/0240357 A1 8/2015 Tachibana et al.
2015/0240359 A1 8/2015 Jdira et al.
2015/0240360 A1 8/2015 Leeser
2015/0241787 A1 8/2015 Yaegashi
2015/0243522 A1 8/2015 Kitagaito et al.
2015/0243542 A1 8/2015 Yoshihara et al.
2015/0243545 A1 8/2015 Tang
2015/0243563 A1 8/2015 Lee et al.
2015/0243658 A1 8/2015 Joshi et al.
2015/0247259 A1 9/2015 Hekmatshoar-Tabari et al.
2015/0249013 A1 9/2015 Arghavani et al.
2015/0255319 A1 9/2015 Kikuchi et al.
2015/0255324 A1 9/2015 Li et al.
2015/0255385 A1 9/2015 Lee et al.
2015/0259790 A1 9/2015 Newman
2015/0259801 A1 9/2015 Matsumoto et al.
2015/0262828 A1 9/2015 Brand et al.
2015/0263033 A1 9/2015 Aoyama
2015/0267294 A1 9/2015 Itatani
2015/0267295 A1 9/2015 Hill et al.
2015/0267297 A1 9/2015 Shiba
2015/0267298 A1 9/2015 Saitou et al.
2015/0267299 A1 9/2015 Hawkins et al.
2015/0267301 A1 9/2015 Hill et al.
2015/0270140 A1 9/2015 Gupta et al.
2015/0270146 A1 9/2015 Yoshihara et al.
2015/0275355 A1 10/2015 Mallikarjunan et al.
2015/0275357 A1 10/2015 Kamakura et al.
2015/0279665 A1 10/2015 Zafiropoulo
2015/0279681 A1 10/2015 Knoops
2015/0279682 A1 10/2015 Nakatani et al.
2015/0279708 A1 10/2015 Kobayashi et al.
2015/0279956 A1 10/2015 Ozaki et al.
2015/0280051 A1 10/2015 Xu
2015/0284848 A1 10/2015 Nakano et al.
2015/0287591 A1 10/2015 Pore et al.
2015/0287612 A1 10/2015 Luere et al.
2015/0287626 A1 10/2015 Arai
2015/0287710 A1 10/2015 Yun et al.
2015/0291830 A1 10/2015 Galbreath et al.
2015/0292088 A1 10/2015 Canizares
2015/0299848 A1 10/2015 Haukka et al.
2015/0307982 A1 10/2015 Firouzdor et al.
2015/0307989 A1 10/2015 Lindfors
2015/0308586 A1 10/2015 Shugrue et al.
2015/0311043 A1 10/2015 Sun et al.
2015/0311151 A1 10/2015 Chi et al.
2015/0303056 A1 11/2015 Varadarajan et al.
2015/0315704 A1 11/2015 Nakano et al.
2015/0322569 A1 11/2015 Kilpi et al.
2015/0325432 A1 11/2015 Ishizaka
2015/0332921 A1 11/2015 Lee et al.
2015/0340247 A1 11/2015 Balakrishnan et al.
2015/0340266 A1 11/2015 Ngo et al.
2015/0340500 A1 11/2015 Brunco
2015/0340609 A1 11/2015 Banno et al.
2015/0343559 A1 12/2015 Morikazu et al.
2015/0343741 A1 12/2015 Shibata et al.
2015/0345018 A1 12/2015 Detavernier et al.
2015/0345022 A1 12/2015 Yudovsky et al.
2015/0348755 A1 12/2015 Han et al.
2015/0349073 A1 12/2015 Kang
2015/0353478 A1 12/2015 Hoshino et al.
2015/0354060 A1 12/2015 Yabe et al.
2015/0361550 A1 12/2015 Yabe et al.
2015/0361553 A1 12/2015 Murakawa
2015/0364347 A1 12/2015 Nguyen et al.
2015/0364371 A1 12/2015 Yen
2015/0364747 A1 12/2015 Elam et al.
2015/0367253 A1 12/2015 Kanyal et al.
2015/0368798 A1 12/2015 Kwong
2015/0371864 A1 12/2015 Hsu et al.
2015/0372056 A1 12/2015 Seong et al.
2015/0376211 A1 12/2015 Girard
2015/0376785 A1 12/2015 Knaapen et al.
2015/0380296 A1 12/2015 Antonelli et al.
2016/0002776 A1 1/2016 Nal et al.
2016/0002786 A1 1/2016 Gatineau et al.
2016/0005571 A1 1/2016 Della Rosa et al.
2016/0005595 A1 1/2016 Liu et al.
2016/0005596 A1 1/2016 Behera et al.
2016/0005839 A1 1/2016 Yieh et al.
2016/0010208 A1 1/2016 Huang et al.
2016/0013022 A1 1/2016 Ayoub
2016/0013024 A1 1/2016 Milligan et al.
2016/0013086 A1 1/2016 Yang et al.
2016/0017493 A1 1/2016 Dhas
2016/0020071 A1 1/2016 Khaja et al.
2016/0020092 A1 1/2016 Kang et al.
2016/0024655 A1 1/2016 Yudovsky et al.
2016/0024656 A1 1/2016 White et al.
2016/0032453 A1 2/2016 Qian et al.
2016/0035542 A1 2/2016 Hausmann
2016/0035566 A1 2/2016 LaVoie
2016/0035596 A1 2/2016 Kamiya
2016/0042954 A1 2/2016 Sung et al.
2016/0051964 A1 2/2016 Tolle et al.
2016/0056074 A1 2/2016 Na
2016/0056156 A1 2/2016 Ghani et al.
2016/0060752 A1 3/2016 Jacques et al.
2016/0064208 A1 3/2016 Zafiropoulo et al.
2016/0064231 A1 3/2016 Agarwal et al.
2016/0069613 A1 3/2016 Colgan et al.
2016/0071750 A1 3/2016 de Ridder et al.
2016/0076949 A1 3/2016 Sabah et al.
2016/0079054 A1 3/2016 Chen et al.
2016/0085003 A1 3/2016 Jaiswal
2016/0086811 A1 3/2016 Mackedanz et al.
2016/0087028 A1 3/2016 Hirota et al.
2016/0097123 A1 4/2016 Shugrue et al.
2016/0099150 A1 4/2016 Tsai
2016/0099166 A1 4/2016 Yudovsky
2016/0099250 A1 4/2016 Rabkin et al.
2016/0102214 A1 4/2016 Dietz et al.
2016/0111272 A1 4/2016 Girard
2016/0111304 A1 4/2016 Takahashi et al.
2016/0111438 A1 4/2016 Tsutsumi et al.
2016/0115590 A1 4/2016 Haukka et al.
2016/0118224 A1 4/2016 Kohno et al.
2016/0133307 A1 5/2016 Lee et al.
2016/0133504 A1 5/2016 Chu et al.
2016/0133628 A1 5/2016 Xie
2016/0141172 A1 5/2016 Kang
2016/0145738 A1 5/2016 Liu et al.
2016/0148800 A1 5/2016 Henri et al.

(56) References Cited

U.S. PATENT DOCUMENTS

| | | | |
|---|---|---|---|
| 2016/0148801 | A1 | 5/2016 | Yabe et al. |
| 2016/0148806 | A1 | 5/2016 | Henri et al. |
| 2016/0148811 | A1 | 5/2016 | Nakatani et al. |
| 2016/0148821 | A1 | 5/2016 | Singh |
| 2016/0152649 | A1 | 6/2016 | Gordon |
| 2016/0153088 | A1 | 6/2016 | Tsuji et al. |
| 2016/0155629 | A1 | 6/2016 | Hawryluk et al. |
| 2016/0163556 | A1 | 6/2016 | Briggs et al. |
| 2016/0163558 | A1 | 6/2016 | Hudson et al. |
| 2016/0163561 | A1 | 6/2016 | Hudson et al. |
| 2016/0163711 | A1 | 6/2016 | Arndt et al. |
| 2016/0163972 | A1 | 6/2016 | Swaminathan et al. |
| 2016/0168699 | A1 | 6/2016 | Fukazawa et al. |
| 2016/0168704 | A1 | 6/2016 | Choi et al. |
| 2016/0169766 | A1 | 6/2016 | Ishibashi et al. |
| 2016/0172189 | A1 | 6/2016 | Tapily |
| 2016/0172296 | A1 | 6/2016 | Lim et al. |
| 2016/0175805 | A1 | 6/2016 | Catchpole et al. |
| 2016/0177448 | A1 | 6/2016 | Ikeda |
| 2016/0181117 | A1 | 6/2016 | Arghavani et al. |
| 2016/0181128 | A1 | 6/2016 | Mori |
| 2016/0181368 | A1 | 6/2016 | Weeks |
| 2016/0190137 | A1 | 6/2016 | Tsai et al. |
| 2016/0195331 | A1 | 7/2016 | Hyon et al. |
| 2016/0196969 | A1 | 7/2016 | Berry et al. |
| 2016/0196970 | A1 | 7/2016 | Takamure et al. |
| 2016/0203995 | A1 | 7/2016 | Kanarik et al. |
| 2016/0204005 | A1 | 7/2016 | Oki et al. |
| 2016/0204436 | A1 | 7/2016 | Barker et al. |
| 2016/0211135 | A1 | 7/2016 | Noda et al. |
| 2016/0211147 | A1 | 7/2016 | Fukazawa |
| 2016/0211166 | A1 | 7/2016 | Yan et al. |
| 2016/0215387 | A1 | 7/2016 | Liu et al. |
| 2016/0217857 | A1 | 7/2016 | Paudel |
| 2016/0218028 | A1 | 7/2016 | Schaller et al. |
| 2016/0222504 | A1 | 8/2016 | Haukka et al. |
| 2016/0222509 | A1 | 8/2016 | Honma |
| 2016/0222516 | A1 | 8/2016 | Ikeda et al. |
| 2016/0225588 | A1 | 8/2016 | Shaikh et al. |
| 2016/0225607 | A1 | 8/2016 | Yamamoto et al. |
| 2016/0225632 | A1 | 8/2016 | Shaikh et al. |
| 2016/0237559 | A1 | 8/2016 | Tsuji |
| 2016/0245704 | A1 | 8/2016 | Osaka et al. |
| 2016/0256187 | A1 | 9/2016 | Shelton et al. |
| 2016/0268102 | A1 | 9/2016 | White |
| 2016/0268107 | A1 | 9/2016 | White |
| 2016/0273095 | A1 | 9/2016 | Lin et al. |
| 2016/0273101 | A1 | 9/2016 | Komori et al. |
| 2016/0273106 | A1 | 9/2016 | Kanjolia et al. |
| 2016/0273128 | A1 | 9/2016 | Kang |
| 2016/0276148 | A1 | 9/2016 | Qian et al. |
| 2016/0276212 | A1 | 9/2016 | Horikoshi |
| 2016/0279629 | A1 | 9/2016 | Michishita et al. |
| 2016/0281223 | A1 | 9/2016 | Sowa et al. |
| 2016/0281230 | A1 | 9/2016 | Varadarajan et al. |
| 2016/0284517 | A1 | 9/2016 | Saido |
| 2016/0284542 | A1 | 9/2016 | Noda et al. |
| 2016/0289828 | A1 | 10/2016 | Shero et al. |
| 2016/0293398 | A1 | 10/2016 | Danek et al. |
| 2016/0293609 | A1 | 10/2016 | Jha et al. |
| 2016/0305015 | A1 | 10/2016 | Nakamura et al. |
| 2016/0307739 | A1 | 10/2016 | Lee et al. |
| 2016/0307740 | A1 | 10/2016 | Kim et al. |
| 2016/0307766 | A1 | 10/2016 | Jongbloed et al. |
| 2016/0312360 | A1 | 10/2016 | Rasheed et al. |
| 2016/0314960 | A1 | 10/2016 | Cheng et al. |
| 2016/0314962 | A1 | 10/2016 | Higashino et al. |
| 2016/0314964 | A1 | 10/2016 | Tang et al. |
| 2016/0314967 | A1 | 10/2016 | Tolle |
| 2016/0315168 | A1 | 10/2016 | Dussarrat et al. |
| 2016/0334709 | A1 | 11/2016 | Huli et al. |
| 2016/0336178 | A1 | 11/2016 | Swaminathan et al. |
| 2016/0336392 | A1 | 11/2016 | Tominaga et al. |
| 2016/0343612 | A1 | 11/2016 | Wang et al. |
| 2016/0345384 | A1 | 11/2016 | Zhang et al. |
| 2016/0351413 | A1 | 12/2016 | Schmidt et al. |
| 2016/0351747 | A1 | 12/2016 | Forrest et al. |
| 2016/0358772 | A1 | 12/2016 | Xie |
| 2016/0362783 | A1 | 12/2016 | Tolle et al. |
| 2016/0362813 | A1 | 12/2016 | Bao et al. |
| 2016/0365280 | A1 | 12/2016 | Brink et al. |
| 2016/0365414 | A1 | 12/2016 | Peng et al. |
| 2016/0372321 | A1 | 12/2016 | Krishnan et al. |
| 2016/0372365 | A1 | 12/2016 | Tang et al. |
| 2016/0372744 | A1 | 12/2016 | Essaki et al. |
| 2016/0376700 | A1 | 12/2016 | Haukka |
| 2016/0376701 | A1 | 12/2016 | Takewaki et al. |
| 2016/0376704 | A1 | 12/2016 | Raisanen |
| 2016/0379826 | A9 | 12/2016 | Arghavani et al. |
| 2016/0379851 | A1 | 12/2016 | Swaminathan et al. |
| 2016/0381732 | A1 | 12/2016 | Moench et al. |
| 2017/0009347 | A1 | 1/2017 | Jang et al. |
| 2017/0009367 | A1 | 1/2017 | Harris et al. |
| 2017/0011889 | A1 | 1/2017 | Winkler et al. |
| 2017/0011926 | A1 | 1/2017 | Harada et al. |
| 2017/0011950 | A1 | 1/2017 | Schmotzer |
| 2017/0018477 | A1 | 1/2017 | Kato |
| 2017/0018570 | A1 | 1/2017 | Lue et al. |
| 2017/0022612 | A1 | 1/2017 | Lei et al. |
| 2017/0025280 | A1 | 1/2017 | Milligan |
| 2017/0025291 | A1 | 1/2017 | Lin |
| 2017/0029945 | A1 | 2/2017 | Kamakura |
| 2017/0032942 | A1 | 2/2017 | Walfried |
| 2017/0032943 | A1 | 2/2017 | Spaulding et al. |
| 2017/0032992 | A1 | 2/2017 | Hoechbauer |
| 2017/0033004 | A1 | 2/2017 | Siew et al. |
| 2017/0037513 | A1 | 2/2017 | Haukka |
| 2017/0040146 | A1 | 2/2017 | Huang et al. |
| 2017/0040164 | A1 | 2/2017 | Wang et al. |
| 2017/0040198 | A1 | 2/2017 | Lin et al. |
| 2017/0040206 | A1 | 2/2017 | Schmotzer et al. |
| 2017/0044664 | A1 | 2/2017 | Dussarrat et al. |
| 2017/0044665 | A1 | 2/2017 | Shon et al. |
| 2017/0044666 | A1 | 2/2017 | Jang et al. |
| 2017/0047446 | A1 | 2/2017 | Margetis et al. |
| 2017/0051402 | A1 | 2/2017 | Mori |
| 2017/0051405 | A1 | 2/2017 | Fukazawa et al. |
| 2017/0051406 | A1 | 2/2017 | Mori et al. |
| 2017/0051408 | A1 | 2/2017 | Kosuke et al. |
| 2017/0053811 | A1 | 2/2017 | Fung et al. |
| 2017/0058402 | A1 | 3/2017 | Wenxu et al. |
| 2017/0062204 | A1 | 3/2017 | Suzuki et al. |
| 2017/0062209 | A1 | 3/2017 | Shiba |
| 2017/0062210 | A1 | 3/2017 | Visser et al. |
| 2017/0062218 | A1 | 3/2017 | Duan et al. |
| 2017/0062224 | A1 | 3/2017 | Fu et al. |
| 2017/0062258 | A1 | 3/2017 | Bluck |
| 2017/0069725 | A1 | 3/2017 | Bhimarasetti et al. |
| 2017/0091320 | A1 | 3/2017 | Psota et al. |
| 2017/0092469 | A1 | 3/2017 | Kurita et al. |
| 2017/0092531 | A1 | 3/2017 | Coomer |
| 2017/0092535 | A1 | 3/2017 | Kimihiko et al. |
| 2017/0092847 | A1 | 3/2017 | Kim et al. |
| 2017/0100742 | A1 | 4/2017 | Pore et al. |
| 2017/0102612 | A1 | 4/2017 | Meyers et al. |
| 2017/0103907 | A1 | 4/2017 | Chu et al. |
| 2017/0104061 | A1 | 4/2017 | Peng et al. |
| 2017/0107621 | A1 | 4/2017 | Suemori |
| 2017/0110313 | A1 | 4/2017 | Tang et al. |
| 2017/0110601 | A1 | 4/2017 | Blomberg et al. |
| 2017/0114460 | A1 | 4/2017 | Kim et al. |
| 2017/0114464 | A1 | 4/2017 | Iriuda et al. |
| 2017/0114465 | A1 | 4/2017 | Kalutarage et al. |
| 2017/0117141 | A1 | 4/2017 | Zhu et al. |
| 2017/0117202 | A1 | 4/2017 | Tang et al. |
| 2017/0117203 | A1 | 4/2017 | Tang et al. |
| 2017/0117222 | A1 | 4/2017 | Kim et al. |
| 2017/0121845 | A1 | 5/2017 | Grutzmacher et al. |
| 2017/0130332 | A1 | 5/2017 | Stumpf |
| 2017/0136578 | A1 | 5/2017 | Yoshimura |
| 2017/0140924 | A1 | 5/2017 | Suzuki et al. |
| 2017/0140925 | A1 | 5/2017 | Suzuki et al. |
| 2017/0145564 | A1 | 5/2017 | Bertuch et al. |
| 2017/0146909 | A1 | 5/2017 | Smith et al. |

(56) References Cited

U.S. PATENT DOCUMENTS

2017/0148918 A1 5/2017 Ye et al.
2017/0152968 A1 6/2017 Raj et al.
2017/0154757 A1 6/2017 Winkler et al.
2017/0154770 A1 6/2017 Margetis et al.
2017/0154895 A1 6/2017 Huo
2017/0159177 A1 6/2017 Monsma et al.
2017/0165624 A1 6/2017 Ravoin et al.
2017/0167023 A1 6/2017 Praia et al.
2017/0170033 A1 6/2017 Okabe et al.
2017/0173696 A1 6/2017 Sheinman
2017/0175290 A1 6/2017 Chen et al.
2017/0178899 A1 6/2017 Kabansky et al.
2017/0178939 A1 6/2017 Omori
2017/0178942 A1 6/2017 Sakata et al.
2017/0179036 A1 6/2017 Chen et al.
2017/0186621 A1 6/2017 Zaitsu
2017/0186754 A1 6/2017 Blomberg et al.
2017/0191159 A1 7/2017 Polyak et al.
2017/0191164 A1 7/2017 Alokozai et al.
2017/0191685 A1 7/2017 Ronne et al.
2017/0191861 A1 7/2017 Rondano et al.
2017/0196562 A1 7/2017 Shelton
2017/0200622 A1 7/2017 Shiokawa et al.
2017/0204516 A1 7/2017 Nguyen et al.
2017/0213960 A1 7/2017 de Araujo et al.
2017/0216762 A1 8/2017 Shugrue et al.
2017/0218515 A1 8/2017 Shin et al.
2017/0222008 A1 8/2017 Hsu et al.
2017/0226636 A1 8/2017 Xiao
2017/0232457 A1 8/2017 Toshiki et al.
2017/0233868 A1 8/2017 Donoso et al.
2017/0243734 A1 8/2017 Ishikawa et al.
2017/0250068 A1 8/2017 Ishikawa et al.
2017/0250075 A1 8/2017 Caymax et al.
2017/0253968 A1 9/2017 Yahata
2017/0256393 A1 9/2017 Kim et al.
2017/0256417 A1 9/2017 Chou
2017/0256429 A1 9/2017 Lawson et al.
2017/0260649 A1 9/2017 Coomer
2017/0263437 A1 9/2017 Li et al.
2017/0263438 A1 9/2017 Li et al.
2017/0267527 A1 9/2017 Kim et al.
2017/0267531 A1 9/2017 Huakka
2017/0271143 A1 9/2017 Fukiage et al.
2017/0271191 A1 9/2017 Yoo et al.
2017/0271256 A1 9/2017 Inatsuka
2017/0271501 A1 9/2017 Avci et al.
2017/0278705 A1 9/2017 Murakami et al.
2017/0278707 A1 9/2017 Margetis et al.
2017/0283312 A1 10/2017 Lee et al.
2017/0283313 A1 10/2017 Lee et al.
2017/0287681 A1 10/2017 Nitadori et al.
2017/0287744 A1 10/2017 Kobayashi et al.
2017/0294318 A1 10/2017 Yoshida et al.
2017/0294339 A1 10/2017 Tapily
2017/0294499 A1 10/2017 Lu et al.
2017/0301519 A1 10/2017 Naim et al.
2017/0301542 A1 10/2017 Maes et al.
2017/0303382 A1 10/2017 Smith et al.
2017/0306478 A1 10/2017 Raisanen et al.
2017/0306479 A1 10/2017 Raisanen et al.
2017/0306480 A1 10/2017 Zhu et al.
2017/0306494 A1 10/2017 Lin et al.
2017/0309490 A1 10/2017 Ogawa
2017/0309528 A1 10/2017 Bansal et al.
2017/0314125 A1 11/2017 Fenwick et al.
2017/0316933 A1 11/2017 Xie et al.
2017/0316940 A1 11/2017 Ishikawa et al.
2017/0317194 A1 11/2017 Tang et al.
2017/0323783 A1 11/2017 Sanchez et al.
2017/0323784 A1 11/2017 Faguet et al.
2017/0338111 A1 11/2017 Takamure et al.
2017/0338133 A1 11/2017 Tan et al.
2017/0338134 A1 11/2017 Tan et al.
2017/0338192 A1 11/2017 Lee et al.
2017/0342559 A1 11/2017 Fukazawa et al.
2017/0343896 A1 11/2017 Darling et al.
2017/0345674 A1 11/2017 Ranjan et al.
2017/0350688 A1 12/2017 Boyd et al.
2017/0358445 A1 12/2017 O'Shaugnessy et al.
2017/0358482 A1 12/2017 Chen et al.
2017/0358670 A1 12/2017 Kub et al.
2017/0362710 A1 12/2017 Ge et al.
2017/0365467 A1 12/2017 Shimamoto et al.
2017/0369993 A1 12/2017 Sun
2017/0372884 A1 12/2017 Margetis et al.
2017/0372919 A1 12/2017 Manna et al.
2017/0373188 A1 12/2017 Mochizuki et al.
2018/0005814 A1 1/2018 Kumar et al.
2018/0010243 A1 1/2018 Lee et al.
2018/0010247 A1 1/2018 Niskanen
2018/0011052 A1 1/2018 Andersson et al.
2018/0012792 A1 1/2018 Zhu
2018/0019165 A1 1/2018 Baum et al.
2018/0025890 A1 1/2018 Choi et al.
2018/0025907 A1 1/2018 Kalutarage et al.
2018/0025939 A1 1/2018 Kovalgin et al.
2018/0033614 A1 2/2018 Chandra et al.
2018/0033616 A1 2/2018 Masaru
2018/0033625 A1 2/2018 Yoo
2018/0033645 A1 2/2018 Saido et al.
2018/0033674 A1 2/2018 Jeong
2018/0033679 A1 2/2018 Pore
2018/0040746 A1 2/2018 Johnson et al.
2018/0044800 A1 2/2018 Hendrix et al.
2018/0047591 A1 2/2018 Ogo
2018/0047621 A1 2/2018 Armini
2018/0047749 A1 2/2018 Kim
2018/0053660 A1 2/2018 Jandl et al.
2018/0053769 A1 2/2018 Kim et al.
2018/0057931 A1 3/2018 Cha et al.
2018/0057934 A1 3/2018 Cooper et al.
2018/0057937 A1 3/2018 Lee et al.
2018/0061628 A1 3/2018 Ou et al.
2018/0061851 A1 3/2018 Ootsuka
2018/0068844 A1 3/2018 Chen et al.
2018/0068862 A1 3/2018 Terakura et al.
2018/0068950 A1 3/2018 Bruley et al.
2018/0069019 A1 3/2018 Kim et al.
2018/0076021 A1 3/2018 Fukushima et al.
2018/0083435 A1 3/2018 Redler
2018/0087152 A1 3/2018 Yoshida
2018/0087154 A1 3/2018 Pore et al.
2018/0087156 A1 3/2018 Kohei et al.
2018/0090583 A1 3/2018 Choi et al.
2018/0094350 A1 4/2018 Verghese et al.
2018/0094351 A1 4/2018 Verghese et al.
2018/0096821 A1 4/2018 Lubomirsky
2018/0096844 A1 4/2018 Dutartre et al.
2018/0097076 A1 4/2018 Cheng et al.
2018/0102276 A1 4/2018 Zhu et al.
2018/0105701 A1 4/2018 Larsson et al.
2018/0105930 A1 4/2018 Kang et al.
2018/0108587 A1 4/2018 Jiang
2018/0114680 A1 4/2018 Kim et al.
2018/0119283 A1 5/2018 Fukazawa
2018/0122642 A1 5/2018 Raisanen
2018/0122709 A1 5/2018 Xie
2018/0122959 A1 5/2018 Calka et al.
2018/0126379 A1 5/2018 Ramsey et al.
2018/0127876 A1 5/2018 Tolle et al.
2018/0130652 A1 5/2018 Pettinger et al.
2018/0130701 A1 5/2018 Chun
2018/0135172 A1 5/2018 Nogami et al.
2018/0135173 A1 5/2018 Kim et al.
2018/0135179 A1 5/2018 Toshiyuki et al.
2018/0138036 A1 5/2018 Baldesseroni et al.
2018/0142353 A1 5/2018 Tetsuya et al.
2018/0142357 A1 5/2018 Yoshikazu
2018/0148832 A1 5/2018 Chatterjee et al.
2018/0151346 A1 5/2018 Blanquart
2018/0151358 A1 5/2018 Margetis et al.
2018/0151588 A1 5/2018 Tsutsumi et al.
2018/0155832 A1 6/2018 Hamalainen et al.

(56) References Cited

U.S. PATENT DOCUMENTS

2018/0155836 A1 6/2018 Arai et al.
2018/0158688 A1 6/2018 Chen
2018/0158716 A1 6/2018 Konkola et al.
2018/0163305 A1 6/2018 Batzer et al.
2018/0166258 A1 6/2018 Kim et al.
2018/0166315 A1 6/2018 Coomer
2018/0171472 A1 6/2018 Yamada et al.
2018/0171475 A1 6/2018 Maes et al.
2018/0171477 A1 6/2018 Kim et al.
2018/0172172 A1 6/2018 Oehler et al.
2018/0173109 A1 6/2018 Gronheid et al.
2018/0174801 A1 6/2018 Chen et al.
2018/0174826 A1 6/2018 Raaijmakers et al.
2018/0179625 A1 6/2018 Takagi et al.
2018/0180509 A1 6/2018 Sawachi et al.
2018/0182613 A1 6/2018 Blanquart et al.
2018/0182618 A1 6/2018 Blanquart et al.
2018/0187303 A1 7/2018 Gatineau et al.
2018/0189923 A1 7/2018 Zhong et al.
2018/0190496 A1 7/2018 Ashihara et al.
2018/0195174 A1 7/2018 Kim et al.
2018/0204733 A1 7/2018 Sherpa et al.
2018/0209042 A1 7/2018 Wu et al.
2018/0211834 A1 7/2018 Takamure et al.
2018/0223047 A1 8/2018 Xiao et al.
2018/0223429 A1 8/2018 Fukazawa et al.
2018/0230595 A1 8/2018 Suda et al.
2018/0233372 A1 8/2018 Vayrynen et al.
2018/0245215 A1 8/2018 Lei et al.
2018/0246101 A1 8/2018 Sasisekharan et al.
2018/0254211 A1 9/2018 Kosakai et al.
2018/0258532 A1 9/2018 Kato et al.
2018/0265294 A1 9/2018 Hayashi
2018/0265972 A1 9/2018 Firouzdor et al.
2018/0265973 A1 9/2018 Firouzdor et al.
2018/0269057 A1 9/2018 Lei et al.
2018/0274098 A1 9/2018 Takagi et al.
2018/0277338 A1 9/2018 Fukada et al.
2018/0277423 A1 9/2018 Lottes
2018/0286638 A1 10/2018 Susa
2018/0286663 A1 10/2018 Kobayashi et al.
2018/0286668 A1 10/2018 Baum et al.
2018/0286672 A1 10/2018 Van Aerde et al.
2018/0286675 A1 10/2018 Blomberg et al.
2018/0286711 A1 10/2018 Oosterlaken et al.
2018/0294187 A1 10/2018 Thombare et al.
2018/0301460 A1* 10/2018 Yoo .................... H01L 21/0234
2018/0305247 A1 10/2018 Feng et al.
2018/0308686 A1 10/2018 Xie et al.
2018/0308701 A1 10/2018 Na et al.
2018/0312966 A1 11/2018 Chan et al.
2018/0315597 A1 11/2018 Varadarajan et al.
2018/0315838 A1 11/2018 Morrow et al.
2018/0323055 A1 11/2018 Woodruff et al.
2018/0323056 A1 11/2018 Woodruff et al.
2018/0323059 A1 11/2018 Bhargava et al.
2018/0325414 A1 11/2018 Marashdeh et al.
2018/0327892 A1 11/2018 Wu et al.
2018/0327898 A1 11/2018 Wu et al.
2018/0327899 A1 11/2018 Wu et al.
2018/0331117 A1 11/2018 Titus et al.
2018/0337087 A1 11/2018 Sandhu et al.
2018/0350587 A1 12/2018 Jia et al.
2018/0350588 A1 12/2018 Raisanen et al.
2018/0350620 A1 12/2018 Zaitsu et al.
2018/0350653 A1 12/2018 Jeong et al.
2018/0355480 A1 12/2018 Kondo
2018/0355484 A1 12/2018 Lansalot-Matras et al.
2018/0358222 A1 12/2018 Venkatasubramanian et al.
2018/0363131 A1 12/2018 Lee et al.
2018/0363139 A1 12/2018 Rajavelu et al.
2018/0366314 A1 12/2018 Niskanen et al.
2018/0371610 A1 12/2018 Banerjee et al.
2019/0003050 A1 1/2019 Dezelah et al.
2019/0003052 A1 1/2019 Shero et al.
2019/0006797 A1 1/2019 Paynter et al.
2019/0013199 A1 1/2019 Bhargava et al.
2019/0019670 A1 1/2019 Lin et al.
2019/0019714 A1 1/2019 Kosakai et al.
2019/0027573 A1 1/2019 Zhu et al.
2019/0027583 A1 1/2019 Margetis et al.
2019/0027584 A1 1/2019 Margetis et al.
2019/0027605 A1 1/2019 Tolle et al.
2019/0032209 A1 1/2019 Huggare
2019/0032998 A1 1/2019 Jdira et al.
2019/0035605 A1 1/2019 Suzuki
2019/0035647 A1 1/2019 Lee et al.
2019/0035698 A1 1/2019 Tanaka
2019/0035810 A1 1/2019 Chun et al.
2019/0040529 A1 2/2019 Verbaas et al.
2019/0046947 A1 2/2019 Strohm et al.
2019/0051544 A1 2/2019 Verbaas
2019/0051548 A1 2/2019 den Hartog Besselink et al.
2019/0051555 A1 2/2019 Hill et al.
2019/0057857 A1 2/2019 Ishikawa et al.
2019/0057858 A1 2/2019 Hausmann et al.
2019/0058043 A1 2/2019 Dewey et al.
2019/0062907 A1 2/2019 Kim et al.
2019/0062917 A1 2/2019 Sung et al.
2019/0066978 A1 2/2019 Um et al.
2019/0066997 A1 2/2019 Klaver et al.
2019/0067003 A1 2/2019 Zope et al.
2019/0067004 A1 2/2019 Kohen et al.
2019/0067014 A1 2/2019 Shrestha et al.
2019/0067016 A1 2/2019 Zhu et al.
2019/0067085 A1 2/2019 Kweskin
2019/0067094 A1 2/2019 Zope et al.
2019/0067095 A1 2/2019 Zhu et al.
2019/0078206 A1 3/2019 Wu et al.
2019/0080903 A1 3/2019 Abel et al.
2019/0081072 A1 3/2019 Chun et al.
2019/0085451 A1 3/2019 Lei et al.
2019/0086807 A1 3/2019 Kachel et al.
2019/0088555 A1 3/2019 Xie et al.
2019/0089143 A1 3/2019 Malone et al.
2019/0093221 A1 3/2019 Jdira et al.
2019/0096708 A1 3/2019 Sharma
2019/0106788 A1 4/2019 Hawkins et al.
2019/0109002 A1 4/2019 Mattinen et al.
2019/0109009 A1 4/2019 Longrie et al.
2019/0109043 A1 4/2019 Wang et al.
2019/0112711 A1 4/2019 Lyons et al.
2019/0115206 A1 4/2019 Kim et al.
2019/0115237 A1 4/2019 den Hartog Besselink et al.
2019/0115451 A1 4/2019 Lee et al.
2019/0131124 A1 5/2019 Kohen et al.
2019/0140067 A1 5/2019 Zhu et al.
2019/0148177 A1 5/2019 Yin et al.
2019/0148224 A1 5/2019 Kuroda et al.
2019/0148398 A1 5/2019 Kim
2019/0148556 A1 5/2019 Wang et al.
2019/0153593 A1 5/2019 Zhu et al.
2019/0157054 A1 5/2019 White et al.
2019/0157067 A1 5/2019 Bhuyan et al.
2019/0163056 A1 5/2019 Maes et al.
2019/0164763 A1 5/2019 Raisanen et al.
2019/0172701 A1 6/2019 Jia et al.
2019/0172714 A1 6/2019 Bobek et al.
2019/0176435 A1 6/2019 Bellman et al.
2019/0181002 A1 6/2019 Iijima et al.
2019/0185999 A1 6/2019 Shanbhag et al.
2019/0189447 A1 6/2019 Kamp et al.
2019/0198297 A1 6/2019 Aramaki et al.
2019/0198359 A1 6/2019 Kamimura et al.
2019/0198571 A1 6/2019 Xu et al.
2019/0204029 A1 7/2019 Tanabe
2019/0211450 A1 7/2019 Adachi et al.
2019/0217277 A1 7/2019 Jeon et al.
2019/0221433 A1 7/2019 Raisanen et al.
2019/0229008 A1 7/2019 Rokkam et al.
2019/0233446 A1 8/2019 MacDonald et al.
2019/0233940 A1 8/2019 Guo et al.
2019/0237325 A1 8/2019 Wang et al.
2019/0237327 A1 8/2019 Kohen et al.

(56) References Cited

U.S. PATENT DOCUMENTS

2019/0244803 A1 8/2019 Suzuki
2019/0249300 A1 8/2019 Hatanpaa et al.
2019/0249303 A1 8/2019 Kuroda et al.
2019/0252195 A1 8/2019 Haukka
2019/0252196 A1 8/2019 Vayrynen et al.
2019/0259611 A1 8/2019 Nakano et al.
2019/0259612 A1 8/2019 Nozawa et al.
2019/0264324 A1 8/2019 Shugrue et al.
2019/0271078 A1 9/2019 Raisanen et al.
2019/0272981 A1 9/2019 Xu et al.
2019/0272993 A1 9/2019 Mattinen et al.
2019/0273133 A1 9/2019 Agrawal et al.
2019/0276934 A1 9/2019 Verghese et al.
2019/0287769 A1 9/2019 Blomberg et al.
2019/0295837 A1 9/2019 Pore et al.
2019/0301014 A1 10/2019 Pierreux et al.
2019/0304776 A1 10/2019 Choi
2019/0304780 A1 10/2019 Kohen et al.
2019/0304790 A1 10/2019 Mousa et al.
2019/0304821 A1 10/2019 Pierreux et al.
2019/0311894 A1 10/2019 Girard et al.
2019/0311897 A1 10/2019 Kang et al.
2019/0311940 A1 10/2019 Choi et al.
2019/0318910 A1 10/2019 Mori
2019/0318923 A1 10/2019 Blanquart et al.
2019/0319100 A1 10/2019 Chen et al.
2019/0322812 A1 10/2019 Wojtecki et al.
2019/0330740 A1 10/2019 Klaver
2019/0333753 A1 10/2019 Ueda et al.
2019/0333761 A1 10/2019 Tois et al.
2019/0338418 A1 11/2019 Goradia et al.
2019/0346300 A1 11/2019 Kim et al.
2019/0348261 A1 11/2019 Lin et al.
2019/0348273 A1 11/2019 Tang et al.
2019/0348515 A1 11/2019 Li et al.
2019/0362970 A1 11/2019 Wang et al.
2019/0362989 A1 11/2019 Reuter et al.
2019/0363006 A1 11/2019 Min
2019/0363015 A1 11/2019 Cheng et al.
2019/0368040 A1 12/2019 Kachel et al.
2019/0368041 A1 12/2019 Sreeram et al.
2019/0371594 A1 12/2019 Niskanen et al.
2019/0371640 A1 12/2019 Raisanen et al.
2019/0375638 A1 12/2019 Haukka
2019/0376180 A1 12/2019 Niskanen
2019/0378711 A1 12/2019 Suzuki et al.
2019/0378916 A1 12/2019 Tang et al.
2019/0385907 A1 12/2019 Gottheim et al.
2019/0390338 A1 12/2019 Raisanen et al.
2019/0390343 A1 12/2019 Min et al.
2019/0393304 A1 12/2019 Guillom et al.
2019/0393308 A1 12/2019 Lo et al.
2020/0002811 A1 1/2020 Sreeram et al.
2020/0002812 A1 1/2020 Lee et al.
2020/0012081 A1 1/2020 Komai
2020/0013612 A1 1/2020 Blanquart et al.
2020/0013613 A1 1/2020 Blanquart
2020/0013626 A1 1/2020 Longrie et al.
2020/0013629 A1 1/2020 de Roest et al.
2020/0018421 A1 1/2020 Shugrue
2020/0035489 A1 1/2020 Huang et al.
2020/0040458 A1 2/2020 Ma et al.
2020/0048768 A1 2/2020 Wiegers et al.
2020/0052056 A1 2/2020 Park et al.
2020/0052089 A1 2/2020 Yu et al.
2020/0056282 A1 2/2020 Raisanen et al.
2020/0056286 A1 2/2020 Shero et al.
2020/0058469 A1 2/2020 Ranjan et al.
2020/0063262 A1 2/2020 Katou et al.
2020/0064737 A1 2/2020 de Roest
2020/0066512 A1 2/2020 Tois et al.
2020/0066552 A1 2/2020 Susa
2020/0080200 A1 3/2020 Um et al.
2020/0083054 A1 3/2020 Väyrynen et al.
2020/0083375 A1 3/2020 Tolle et al.
2020/0083469 A1 3/2020 Lhullier
2020/0102649 A1 4/2020 Reed
2020/0102653 A1 4/2020 Muralidhar et al.
2020/0105579 A1 4/2020 Zhu
2020/0105594 A1 4/2020 Cheng et al.
2020/0105895 A1 4/2020 Tang et al.
2020/0109472 A1 4/2020 Um et al.
2020/0111669 A1 4/2020 Zaitsu et al.
2020/0111690 A1 4/2020 Oosterlaken
2020/0118811 A1 4/2020 Utsuno et al.
2020/0118815 A1 4/2020 Fukazawa et al.
2020/0118817 A1 4/2020 Blomberg et al.
2020/0119038 A1 4/2020 Hopkins et al.
2020/0126771 A1 4/2020 Roh et al.
2020/0126840 A1 4/2020 Roh et al.
2020/0131634 A1 4/2020 Gao et al.
2020/0135512 A1 4/2020 Oosterlaken et al.
2020/0135915 A1 4/2020 Savant et al.
2020/0140995 A1 5/2020 Blanquart et al.
2020/0141003 A1 5/2020 Lee et al.
2020/0144058 A1 5/2020 Kohen
2020/0152473 A1 5/2020 Tapily et al.
2020/0152750 A1 5/2020 Morrow et al.
2020/0161129 A1 5/2020 Mattinen et al.
2020/0161438 A1 5/2020 Tang et al.
2020/0168485 A1 5/2020 Fluit
2020/0279758 A1 5/2020 Sharma
2020/0173020 A1 6/2020 Huggare
2020/0176244 A1 6/2020 Lee et al.
2020/0176246 A1 6/2020 Huotari et al.
2020/0181770 A1 6/2020 Longrie et al.
2020/0185249 A1 6/2020 Rice et al.
2020/0185257 A1 6/2020 Nishiwaki
2020/0194253 A1 6/2020 Banerjee et al.
2020/0194268 A1 6/2020 Sharma
2020/0203157 A1 6/2020 Su
2020/0224309 A1 7/2020 Sreeram et al.
2020/0224311 A1 7/2020 Niskanen et al.
2020/0227243 A1 7/2020 Kim et al.
2020/0227250 A1 7/2020 Pore et al.
2020/0227325 A1 7/2020 Xie et al.
2020/0232096 A1 7/2020 Hatanpää et al.
2020/0234989 A1 7/2020 Jeong
2020/0251328 A1 8/2020 Zaitsu et al.
2020/0258766 A1 8/2020 Garssen et al.
2020/0266057 A1 8/2020 Lee et al.
2020/0266097 A1 8/2020 Liu et al.
2020/0266098 A1 8/2020 Pore et al.
2020/0266208 A1 8/2020 Kim et al.
2020/0270749 A1 8/2020 Li et al.
2020/0270752 A1 8/2020 Pierreux et al.
2020/0273728 A1 8/2020 Benjaminson et al.
2020/0273729 A1 8/2020 Verbaas et al.
2020/0279721 A1 9/2020 White et al.
2020/0283893 A1 9/2020 Byun et al.
2020/0283894 A1 9/2020 Lehn et al.
2020/0284467 A1 9/2020 Lindeboom et al.
2020/0286725 A1 9/2020 Sharma et al.
2020/0286726 A1 9/2020 Shero et al.
2020/0294789 A1 9/2020 Woodruff et al.
2020/0303180 A1 9/2020 Kim et al.
2020/0303196 A1 9/2020 Chen et al.
2020/0309455 A1 10/2020 Fluit
2020/0312652 A1 10/2020 Kang et al.
2020/0312681 A1 10/2020 Tanaka et al.
2020/0318237 A1 10/2020 Fukazawa
2020/0321209 A1 10/2020 Ishikawa et al.
2020/0332416 A1 10/2020 Fluit
2020/0340113 A1 10/2020 Hatanpää et al.
2020/0340138 A1 10/2020 Tolle et al.
2020/0343134 A1 10/2020 Kovalgin et al.
2020/0343358 A1 10/2020 Zhu et al.
2020/0350193 A1 11/2020 Garssen
2020/0354836 A1 11/2020 Yednak et al.
2020/0355296 A1 11/2020 Shugrue et al.
2020/0357631 A1 11/2020 Ueda
2020/0365391 A1 11/2020 Blanquart et al.
2020/0365433 A1 11/2020 de Ridder et al.
2020/0365434 A1 11/2020 de Ridder

(56) References Cited

U.S. PATENT DOCUMENTS

| | | | |
|---|---|---|---|
| 2020/0365444 | A1 | 11/2020 | Hill et al. |
| 2020/0373152 | A1 | 11/2020 | Blanquart |
| 2020/0385861 | A1 | 12/2020 | Deye et al. |
| 2020/0385867 | A1 | 12/2020 | Kim et al. |
| 2020/0385868 | A1 | 12/2020 | Kim et al. |
| 2020/0395199 | A1 | 12/2020 | Miyama |
| 2020/0395209 | A1 | 12/2020 | Yoshimoto et al. |
| 2020/0395444 | A1 | 12/2020 | Lo et al. |
| 2020/0402846 | A1 | 12/2020 | Collins et al. |
| 2021/0002762 | A1 | 1/2021 | Jun et al. |
| 2021/0005449 | A1 | 1/2021 | Blanquart et al. |
| 2021/0005450 | A1 | 1/2021 | Mattinen et al. |
| 2021/0005723 | A1 | 1/2021 | Tang et al. |
| 2021/0013010 | A1 | 1/2021 | Yoshikawa et al. |
| 2021/0013034 | A1 | 1/2021 | Wu et al. |
| 2021/0013037 | A1 | 1/2021 | Sun et al. |
| 2021/0013042 | A1 | 1/2021 | Väyrynen et al. |
| 2021/0013085 | A1 | 1/2021 | Roh et al. |
| 2021/0020429 | A1 | 1/2021 | Khazaka et al. |
| 2021/0020431 | A1 | 1/2021 | Blanquart et al. |
| 2021/0020432 | A1 | 1/2021 | Blanquart |
| 2021/0020467 | A1 | 1/2021 | Sekiguchi |
| 2021/0020470 | A1 | 1/2021 | Lee |
| 2021/0028021 | A1 | 1/2021 | Mousa et al. |
| 2021/0017648 | A1 | 2/2021 | Kubota et al. |
| 2021/0032754 | A1 | 2/2021 | White et al. |
| 2021/0033977 | A1 | 2/2021 | Raaijmakers et al. |
| 2021/0035785 | A1 | 2/2021 | Jeong et al. |
| 2021/0035786 | A1 | 2/2021 | Jeong et al. |
| 2021/0035802 | A1 | 2/2021 | Tolle et al. |
| 2021/0035824 | A1 | 2/2021 | de Ridder |
| 2021/0035839 | A1 | 2/2021 | de Ridder |
| 2021/0035840 | A1 | 2/2021 | de Ridder et al. |
| 2021/0035841 | A1 | 2/2021 | Fluit |
| 2021/0035842 | A1 | 2/2021 | de Ridder |
| 2021/0035854 | A1 | 2/2021 | Yoo et al. |
| 2021/0035988 | A1* | 2/2021 | Yoo .................. H01L 27/11548 |
| 2021/0040613 | A1 | 2/2021 | White et al. |
| 2021/0040615 | A1 | 2/2021 | White et al. |
| 2021/0043444 | A1 | 2/2021 | Blanquart |
| 2021/0050231 | A1 | 2/2021 | Oosterlaken |
| 2021/0054500 | A1 | 2/2021 | Zope et al. |
| 2021/0054504 | A1 | 2/2021 | Wang et al. |
| 2021/0057214 | A1 | 2/2021 | Kengoyama et al. |
| 2021/0057223 | A1 | 2/2021 | Stevens et al. |
| 2021/0057275 | A1 | 2/2021 | Pierreux et al. |
| 2021/0057570 | A1 | 2/2021 | Lin et al. |
| 2021/0066075 | A1 | 3/2021 | Zhang et al. |
| 2021/0066079 | A1 | 3/2021 | Lima et al. |
| 2021/0066080 | A1 | 3/2021 | Mattinen et al. |
| 2021/0066083 | A1 | 3/2021 | Haukka |
| 2021/0066084 | A1 | 3/2021 | Raisanen et al. |
| 2021/0070783 | A1 | 3/2021 | Odedra et al. |
| 2021/0071296 | A1 | 3/2021 | Watarai et al. |
| 2021/0071298 | A1 | 3/2021 | Maes et al. |
| 2021/0074527 | A1 | 3/2021 | Lee et al. |
| 2021/0082692 | A1 | 3/2021 | Kikuchi |
| 2021/0090878 | A1 | 3/2021 | Kang et al. |
| 2021/0095372 | A1 | 4/2021 | Minjauw et al. |
| 2021/0102289 | A1 | 4/2021 | Tsuji et al. |
| 2021/0102290 | A1 | 4/2021 | Acosta et al. |
| 2021/0102292 | A1 | 4/2021 | Lin et al. |
| 2021/0104384 | A1 | 4/2021 | Parkhe |
| 2021/0104399 | A1 | 4/2021 | Kuroda et al. |
| 2021/0108328 | A1 | 4/2021 | Yanagisawa |
| 2021/0111025 | A1 | 4/2021 | Zyulkov et al. |
| 2021/0111053 | A1 | 4/2021 | De Ridder |
| 2021/0118667 | A1 | 4/2021 | Fukazawa et al. |
| 2021/0118679 | A1 | 4/2021 | Lima et al. |
| 2021/0118687 | A1 | 4/2021 | Wang et al. |
| 2021/0125827 | A1 | 4/2021 | Khazaka et al. |
| 2021/0125832 | A1 | 4/2021 | Bhatnagar |
| 2021/0134588 | A1 | 5/2021 | Kohen et al. |
| 2021/0134959 | A1 | 5/2021 | Lima et al. |
| 2021/0140043 | A1 | 5/2021 | Thombare et al. |
| 2021/0143003 | A1 | 5/2021 | Fukuda et al. |
| 2021/0151315 | A1 | 5/2021 | Pierreux et al. |
| 2021/0151348 | A1 | 5/2021 | Utsuno et al. |
| 2021/0151352 | A1 | 5/2021 | Zope et al. |
| 2021/0156024 | A1 | 5/2021 | Roh et al. |
| 2021/0156030 | A1 | 5/2021 | Shugrue |
| 2021/0159077 | A1 | 5/2021 | Longrie et al. |
| 2021/0166910 | A1 | 6/2021 | Kim et al. |
| 2021/0166924 | A1 | 6/2021 | Moon et al. |
| 2021/0166925 | A1 | 6/2021 | Moon et al. |
| 2021/0166940 | A1 | 6/2021 | Nozawa |
| 2021/0172064 | A1 | 6/2021 | Moon |
| 2021/0175052 | A1 | 6/2021 | Takahashi et al. |
| 2021/0180184 | A1 | 6/2021 | Verni et al. |
| 2021/0180188 | A1 | 6/2021 | Kim et al. |
| 2021/0180189 | A1 | 6/2021 | Shugrue et al. |
| 2021/0193458 | A1 | 6/2021 | Salmi et al. |
| 2021/0205758 | A1 | 7/2021 | Kimtee et al. |
| 2021/0207269 | A1 | 7/2021 | Huang et al. |
| 2021/0207270 | A1 | 7/2021 | de Ridder et al. |
| 2021/0210373 | A1 | 7/2021 | Singu et al. |
| 2021/0214842 | A1 | 7/2021 | Yoon et al. |
| 2021/0225615 | A1 | 7/2021 | Yoshida |
| 2021/0225622 | A1 | 7/2021 | Shoji |
| 2021/0225642 | A1 | 7/2021 | Utsuno et al. |
| 2021/0225643 | A1 | 7/2021 | Kuroda et al. |
| 2021/0230744 | A1 | 7/2021 | Kimtee et al. |
| 2021/0230746 | A1 | 7/2021 | Shiba |
| 2021/0233772 | A1 | 7/2021 | Zhu et al. |
| 2021/0238736 | A1 | 8/2021 | Butail et al. |
| 2021/0238742 | A1 | 8/2021 | Susa et al. |
| 2021/0239614 | A1 | 8/2021 | Muralidhar et al. |
| 2021/0242011 | A1 | 8/2021 | Shero et al. |
| 2021/0246556 | A1 | 8/2021 | Mori |
| 2021/0247693 | A1 | 8/2021 | Maes et al. |
| 2021/0249303 | A1 | 8/2021 | Blanquart |
| 2021/0254216 | A1 | 8/2021 | Mori et al. |
| 2021/0254238 | A1 | 8/2021 | Khazaka et al. |
| 2021/0257213 | A1 | 8/2021 | Kikuchi et al. |
| 2021/0257509 | A1 | 8/2021 | Nishiwaki |
| 2021/0265134 | A1 | 8/2021 | Singh et al. |
| 2021/0265158 | A1 | 8/2021 | Kaneko |
| 2021/0268554 | A1 | 9/2021 | Mori |
| 2021/0269914 | A1 | 9/2021 | Väyrynen et al. |
| 2021/0272821 | A1 | 9/2021 | Oosterlaken |
| 2021/0273109 | A1 | 9/2021 | Yamazaki et al. |
| 2021/0280448 | A1 | 9/2021 | Ganguli et al. |
| 2021/0285102 | A1 | 9/2021 | Yoon et al. |
| 2021/0287878 | A1 | 9/2021 | Um et al. |
| 2021/0287912 | A1 | 9/2021 | Shiba et al. |
| 2021/0287928 | A1 | 9/2021 | Kim et al. |
| 2021/0288476 | A1 | 9/2021 | Wei |
| 2021/0292902 | A1 | 9/2021 | Kajbafvala et al. |
| 2021/0296130 | A1 | 9/2021 | Longrie et al. |
| 2021/0296144 | A1 | 9/2021 | Lin et al. |
| 2021/0310125 | A1 | 10/2021 | Ma et al. |
| 2021/0313150 | A1 | 10/2021 | Kang et al. |
| 2021/0313167 | A1 | 10/2021 | Pore et al. |
| 2021/0313170 | A1 | 10/2021 | Suzuki |
| 2021/0313178 | A1 | 10/2021 | Nakano |
| 2021/0313182 | A1 | 10/2021 | Zhu et al. |
| 2021/0317576 | A1 | 10/2021 | Väyrynen et al. |
| 2021/0319982 | A1 | 10/2021 | Kim et al. |
| 2021/0320003 | A1 | 10/2021 | Sugiura et al. |
| 2021/0320010 | A1 | 10/2021 | Wang et al. |
| 2021/0320020 | A1 | 10/2021 | Oosterlaken et al. |
| 2021/0324510 | A1 | 10/2021 | Kuwano et al. |
| 2021/0324518 | A1 | 10/2021 | de Ridder |
| 2021/0327704 | A1 | 10/2021 | Kajbafvala et al. |
| 2021/0327714 | A1 | 10/2021 | Lee et al. |
| 2021/0327715 | A1 | 10/2021 | Xie et al. |
| 2021/0328036 | A1 | 10/2021 | Li et al. |
| 2021/0041284 | A1 | 11/2021 | Yednak |

FOREIGN PATENT DOCUMENTS

| | | |
|---|---|---|
| CN | 2588350 | 11/2003 |
| CN | 1563483 | 1/2005 |
| CN | 1655362 | 8/2005 |

(56) References Cited

FOREIGN PATENT DOCUMENTS

| | | |
|---|---|---|
| CN | 1664987 | 9/2005 |
| CN | 1825535 | 8/2006 |
| CN | 101047143 | 10/2007 |
| CN | 101142012 | 3/2008 |
| CN | 101609858 | 12/2009 |
| CN | 101681873 | 3/2010 |
| CN | 101308794 | 9/2010 |
| CN | 102094183 | 6/2011 |
| CN | 102383106 | 3/2012 |
| CN | 103014846 | 4/2013 |
| CN | 102539019 | 9/2013 |
| CN | 103515222 | 1/2014 |
| CN | 102373440 | 7/2014 |
| CN | 203721699 | 7/2014 |
| CN | 104244620 | 12/2014 |
| CN | 104307264 | 1/2015 |
| CN | 104498895 | 4/2015 |
| CN | 104517892 | 4/2015 |
| CN | 204629865 | 9/2015 |
| CN | 105253917 | 1/2016 |
| CN | 205448240 | 8/2016 |
| CN | 104342637 | 2/2017 |
| CN | 206145834 | 5/2017 |
| CN | 104233226 | 6/2017 |
| CN | 106895521 | 6/2017 |
| CN | 104201108 | 11/2017 |
| CN | 104630735 | 12/2017 |
| CN | 107675144 | 2/2018 |
| CN | 108389798 | 8/2018 |
| CN | 106011785 | 10/2018 |
| CN | 108910843 | 11/2018 |
| CN | 109000352 | 12/2018 |
| DE | 8902307 | 8/1989 |
| DE | 3836696 | 12/1989 |
| DE | 3626724 | 6/1994 |
| DE | 10133013 | 1/2003 |
| DE | 102008052750 | 6/2009 |
| EP | 0058571 | 8/1982 |
| EP | 0499004 | 8/1992 |
| EP | 0634785 | 1/1995 |
| EP | 0550058 | 11/1998 |
| EP | 0887632 | 12/1998 |
| EP | 678909 | 7/1999 |
| EP | 1061567 | 12/2000 |
| EP | 1889817 | 2/2008 |
| EP | 2036600 | 3/2009 |
| EP | 2426233 | 7/2012 |
| FR | 686869 | 7/1930 |
| FR | 1408266 | 8/1965 |
| FR | 2233614 | 1/1975 |
| FR | 2517790 | 6/1983 |
| FR | 2610007 | 8/1990 |
| FR | 2708624 | 2/1995 |
| GB | 400010 | 10/1933 |
| GB | 752-277 | 7/1956 |
| GB | 1186889 | 6/1966 |
| GB | 1514921 | 6/1978 |
| GB | 2051875 | 1/1981 |
| JP | 58-19462 | 4/1983 |
| JP | S5979545 | 5/1984 |
| JP | S59127847 | 7/1984 |
| JP | 59-211779 | 11/1984 |
| JP | S60110133 | 6/1985 |
| JP | 61038863 | 2/1986 |
| JP | S62237236 | 10/1987 |
| JP | S63136532 | 6/1988 |
| JP | H0165766 | 6/1989 |
| JP | H01185176 | 7/1989 |
| JP | H01-296613 | 11/1989 |
| JP | H01-307229 | 12/1989 |
| JP | H01313954 | 12/1989 |
| JP | H02-93071 | 4/1990 |
| JP | H02-185038 | 7/1990 |
| JP | H02-217469 | 8/1990 |
| JP | H03-044472 | 2/1991 |
| JP | H03-155625 | 7/1991 |
| JP | H03211753 | 9/1991 |
| JP | H03-248427 | 11/1991 |
| JP | H04-29313 | 1/1992 |
| JP | H04-115531 | 4/1992 |
| JP | H05-6880 | 1/1993 |
| JP | H05-23079 | 3/1993 |
| JP | H05-118928 | 5/1993 |
| JP | H05-171446 | 7/1993 |
| JP | H05-291142 | 11/1993 |
| JP | H06-053210 | 2/1994 |
| JP | H06-84888 | 3/1994 |
| JP | H06-140399 | 5/1994 |
| JP | H06-16433 | 6/1994 |
| JP | 6204231 | 7/1994 |
| JP | H06-319177 | 11/1994 |
| JP | H06-338497 | 12/1994 |
| JP | H07-29836 | 1/1995 |
| JP | H07-297271 | 1/1995 |
| JP | H07-066267 | 3/1995 |
| JP | H07-74162 | 3/1995 |
| JP | H07-109576 | 4/1995 |
| JP | H07-034936 | 8/1995 |
| JP | H07-225214 | 8/1995 |
| JP | 7-272694 | 10/1995 |
| JP | H07-283149 | 10/1995 |
| JP | H07-209093 | 11/1995 |
| JP | H08-181135 | 7/1996 |
| JP | H08-335558 | 12/1996 |
| JP | H09-064149 | 3/1997 |
| JP | 9-89676 | 4/1997 |
| JP | H09-148322 | 6/1997 |
| JP | H10-41096 | 2/1998 |
| JP | H10-50635 | 2/1998 |
| JP | H10-50800 | 2/1998 |
| JP | H10-064696 | 3/1998 |
| JP | H10-153494 | 6/1998 |
| JP | H10-227703 | 8/1998 |
| JP | H10-0261620 | 9/1998 |
| JP | H11-097163 | 4/1999 |
| JP | H11-118615 | 4/1999 |
| JP | H11-183264 | 7/1999 |
| JP | H11-183265 | 7/1999 |
| JP | H11-195688 | 7/1999 |
| JP | H11-287715 | 10/1999 |
| JP | 2000068355 | 3/2000 |
| JP | 2000182949 | 6/2000 |
| JP | 2000269163 | 9/2000 |
| JP | 2001015698 | 1/2001 |
| JP | 2001023872 | 1/2001 |
| JP | 2001207265 | 7/2001 |
| JP | 2001207268 | 7/2001 |
| JP | 2001210602 | 8/2001 |
| JP | 2001220677 | 8/2001 |
| JP | 2001257199 | 9/2001 |
| JP | 2001287180 | 10/2001 |
| JP | 2002118066 | 4/2002 |
| JP | 2002164342 | 6/2002 |
| JP | 2002170781 | 6/2002 |
| JP | 2002237375 | 8/2002 |
| JP | 2003035574 | 2/2003 |
| JP | 2003053688 | 2/2003 |
| JP | 2003133300 | 5/2003 |
| JP | 2003153706 | 5/2003 |
| JP | 2003303814 | 10/2003 |
| JP | 2004014952 | 1/2004 |
| JP | 2004023043 | 1/2004 |
| JP | 2004088077 | 3/2004 |
| JP | 2004091848 | 3/2004 |
| JP | 2004113270 | 4/2004 |
| JP | 2004128019 | 4/2004 |
| JP | 2004134553 | 4/2004 |
| JP | 2004163293 | 6/2004 |
| JP | 2004244298 | 9/2004 |
| JP | 2004244661 | 9/2004 |
| JP | 2005033221 | 9/2004 |
| JP | 2004294638 | 10/2004 |
| JP | 3589954 | 11/2004 |
| JP | 2004310019 | 11/2004 |

(56) References Cited

FOREIGN PATENT DOCUMENTS

| | | |
|---|---|---|
| JP | 2005033221 | 2/2005 |
| JP | 2005079254 | 3/2005 |
| JP | 2005507030 | 3/2005 |
| JP | 2005172489 | 6/2005 |
| JP | 3725100 | 12/2005 |
| JP | 2006028572 | 2/2006 |
| JP | 2006049352 | 2/2006 |
| JP | 2006059931 | 3/2006 |
| JP | 2006090762 | 4/2006 |
| JP | 2006124831 | 5/2006 |
| JP | 2006124832 | 5/2006 |
| JP | 2006153706 | 6/2006 |
| JP | 2006186271 | 7/2006 |
| JP | 2006188729 | 7/2006 |
| JP | 2006278058 | 10/2006 |
| JP | 2006319261 | 11/2006 |
| JP | 2007027777 | 2/2007 |
| JP | 2007287902 | 11/2007 |
| JP | 3140111 | 3/2008 |
| JP | 2008060304 | 3/2008 |
| JP | 2008066159 | 3/2008 |
| JP | 2008085129 | 4/2008 |
| JP | 2008089320 | 4/2008 |
| JP | 2008172083 | 7/2008 |
| JP | 2008198629 | 8/2008 |
| JP | 2008202107 | 9/2008 |
| JP | 2009016815 | 1/2009 |
| JP | 2009088421 | 4/2009 |
| JP | 2009099938 | 5/2009 |
| JP | 2009194248 | 8/2009 |
| JP | 2009239082 | 10/2009 |
| JP | 2009251216 | 10/2009 |
| JP | 2009252851 | 10/2009 |
| JP | 2010067940 | 3/2010 |
| JP | 2010097834 | 4/2010 |
| JP | 2010205967 | 9/2010 |
| JP | 2010251444 | 10/2010 |
| JP | 2010255218 | 11/2010 |
| JP | 2011049592 | 3/2011 |
| JP | 2011162830 | 8/2011 |
| JP | 2011181681 | 9/2011 |
| JP | 2009010412 | 2/2012 |
| JP | 2012146939 | 8/2012 |
| JP | 2012164736 | 8/2012 |
| JP | 2012195513 | 10/2012 |
| JP | 2013026479 | 2/2013 |
| JP | 2013196822 | 9/2013 |
| JP | 2013235912 | 11/2013 |
| JP | D1422467 | 8/2014 |
| JP | 2014222693 | 11/2014 |
| JP | 2015021175 | 2/2015 |
| JP | 2015115461 | 6/2015 |
| JP | 2016098406 | 5/2016 |
| JP | 2010123843 | 6/2016 |
| JP | 2016174158 | 9/2016 |
| JP | 2017183242 | 10/2017 |
| JP | 2017220011 | 12/2017 |
| JP | 6519897 | 5/2019 |
| KR | 1998-0026850 | 7/1998 |
| KR | 20000000946 | 1/2000 |
| KR | 10-0253664 | 4/2000 |
| KR | 10-2000-0031098 | 6/2000 |
| KR | 10-2000-0045257 | 7/2000 |
| KR | 10-0273261 | 12/2000 |
| KR | 100273261 | 12/2000 |
| KR | 10-0295043 | 4/2001 |
| KR | 10-2002-0027695 | 4/2002 |
| KR | 10-2002-0064028 | 8/2002 |
| KR | 2002-0086763 | 11/2002 |
| KR | 10-0377095 | 3/2003 |
| KR | 2003-0092305 | 12/2003 |
| KR | 10-2005-0054122 | 6/2005 |
| KR | 10-0547248 | 1/2006 |
| KR | 10-0593960 | 6/2006 |
| KR | 10-2006-0129566 | 12/2006 |
| KR | 10-0688484 | 2/2007 |
| KR | 20070041701 | 4/2007 |
| KR | 10-2007-0079797 | 8/2007 |
| KR | 10-2007-0084683 | 8/2007 |
| KR | 10-2007-0117817 | 12/2007 |
| KR | 2008-0058620 | 6/2008 |
| KR | 10-2009-0039936 | 4/2009 |
| KR | 10-2009-0055443 | 6/2009 |
| KR | 10-2009-0056475 | 6/2009 |
| KR | 10-2009-0086790 | 8/2009 |
| KR | 10-2009-0105977 | 10/2009 |
| KR | 10-0936694 | 1/2010 |
| KR | 10-2010-0015073 | 2/2010 |
| KR | 10-2010-0020834 | 2/2010 |
| KR | 10-2010-0032812 | 3/2010 |
| KR | 10-2010-0077442 | 7/2010 |
| KR | 10-2010-0079920 | 7/2010 |
| KR | 10-2010-0122701 | 11/2010 |
| KR | 10-2010-0132779 | 12/2010 |
| KR | 10-2011-0058534 | 6/2011 |
| KR | 10-1114219 | 3/2012 |
| KR | 10-2012-0111060 | 10/2012 |
| KR | 10-2013-0007806 | 1/2013 |
| KR | 10-2013-0067600 | 6/2013 |
| KR | 10-2013-0129149 | 11/2013 |
| KR | 10-1347962 | 1/2014 |
| KR | 10-1491726 | 2/2015 |
| KR | 10-1535573 | 7/2015 |
| KR | 101758892 | 7/2017 |
| KR | 10-2019-0032077 | 3/2019 |
| NL | 8600255 | 9/1987 |
| NL | 8701549 | 2/1989 |
| RU | 1786406 | 1/1993 |
| SU | 494614 | 2/1976 |
| SU | 1408319 | 7/1988 |
| TW | 538327 | 6/2003 |
| TW | 540093 | 7/2003 |
| TW | M292692 | 6/2006 |
| TW | 200731357 | 8/2007 |
| TW | 200903625 | 1/2009 |
| TW | 201213596 | 4/2012 |
| TW | 201234453 | 8/2012 |
| TW | 201247690 | 12/2012 |
| TW | M446412 | 2/2013 |
| TW | 201330086 | 7/2013 |
| TW | D162593 | 8/2014 |
| TW | D164568 | 12/2014 |
| TW | 201531587 | 8/2015 |
| TW | M512254 | 11/2015 |
| TW | I514509 | 12/2015 |
| TW | 201613231 | 4/2016 |
| TW | M553518 | 12/2017 |
| TW | D196097 | 2/2019 |
| WO | 1987001508 | 3/1987 |
| WO | 1990004045 | 4/1990 |
| WO | 1991004522 | 4/1991 |
| WO | 1991006975 | 5/1991 |
| WO | 1992000477 | 1/1992 |
| WO | 1994027315 | 11/1994 |
| WO | 1996017107 | 6/1996 |
| WO | 1997003223 | 1/1997 |
| WO | 1998032893 | 7/1998 |
| WO | 1999023690 | 5/1999 |
| WO | DM/048579 | 7/1999 |
| WO | 2004008491 | 7/2002 |
| WO | 2004007800 | 1/2004 |
| WO | 2004008827 | 1/2004 |
| WO | 2004010467 | 1/2004 |
| WO | 2004106584 | 12/2004 |
| WO | 2005112082 | 11/2005 |
| WO | 2006035281 | 4/2006 |
| WO | 2006054854 | 5/2006 |
| WO | 2006056091 | 6/2006 |
| WO | 2006078666 | 7/2006 |
| WO | 2006080782 | 8/2006 |
| WO | 2006097525 | 9/2006 |
| WO | 2006101857 | 9/2006 |
| WO | 2006114781 | 11/2006 |
| WO | 2007024720 | 3/2007 |

(56) References Cited

FOREIGN PATENT DOCUMENTS

| | | |
|---|---|---|
| WO | 2007027165 | 3/2007 |
| WO | 2007076195 | 7/2007 |
| WO | 2007088940 | 8/2007 |
| WO | 2007117718 | 10/2007 |
| WO | 2007131051 | 11/2007 |
| WO | 2007140376 | 12/2007 |
| WO | 2008045972 | 4/2008 |
| WO | 2008091900 | 7/2008 |
| WO | 2008121463 | 10/2008 |
| WO | 2008147731 | 12/2008 |
| WO | 2009028619 | 3/2009 |
| WO | 2009029532 | 3/2009 |
| WO | 2009039251 | 3/2009 |
| WO | 2009099776 | 8/2009 |
| WO | 2009154889 | 12/2009 |
| WO | 2009154896 | 12/2009 |
| WO | 2010039363 | 4/2010 |
| WO | 2010077533 | 7/2010 |
| WO | 2010100702 | 9/2010 |
| WO | 2010110558 | 9/2010 |
| WO | 2010118051 | 10/2010 |
| WO | 2010129428 | 11/2010 |
| WO | 2010129430 | 11/2010 |
| WO | 2010129431 | 11/2010 |
| WO | 2011019950 | 2/2011 |
| WO | 2011149640 | 12/2011 |
| WO | 2012056592 | 5/2012 |
| WO | 2012077590 | 6/2012 |
| WO | 2013043330 | 3/2013 |
| WO | 2013078065 | 5/2013 |
| WO | 2013078066 | 5/2013 |
| WO | 2013177269 | 11/2013 |
| WO | 2014107290 | 7/2014 |
| WO | 2015026230 | 2/2015 |
| WO | 2015107009 | 7/2015 |
| WO | 2015112728 | 7/2015 |
| WO | 2015127614 | 9/2015 |
| WO | 2016019795 | 2/2016 |
| WO | 2018109553 | 6/2016 |
| WO | 2018109554 | 6/2016 |
| WO | 2017108713 | 6/2017 |
| WO | 2017108714 | 6/2017 |
| WO | 2017125401 | 7/2017 |
| WO | 2017212546 | 12/2017 |
| WO | 2018003072 | 1/2018 |
| WO | 2018008088 | 1/2018 |
| WO | 2018013778 | 1/2018 |
| WO | 2018020316 | 2/2018 |
| WO | 2018020318 | 2/2018 |
| WO | 2018020320 | 2/2018 |
| WO | 2018020327 | 2/2018 |
| WO | 2018105349 | 6/2018 |
| WO | 2018109551 | 6/2018 |
| WO | 2018109552 | 6/2018 |
| WO | 2018178771 | 10/2018 |
| WO | 2019030565 | 2/2019 |
| WO | 2019103610 | 5/2019 |
| WO | 2019103613 | 5/2019 |
| WO | 2019142055 | 7/2019 |
| WO | 2019158960 | 8/2019 |
| WO | 2019214578 | 11/2019 |
| WO | 2019217749 | 11/2019 |
| WO | 2019229537 | 12/2019 |
| WO | 2020002995 | 1/2020 |
| WO | 2020003000 | 1/2020 |
| WO | 2020118100 | 6/2020 |
| WO | 2021072042 | 4/2021 |

OTHER PUBLICATIONS

CNIPA; Office Action dated Aug. 1, 2013 in Application No. 201080015699.9.
CNIPA; Office Action dated Jan. 21, 2014 in Application No. 201080015699.9.
CNIPA; Office Action dated Jul. 25, 2014 in Application No. 201080015699.9.
CNIPA; Office Action dated Jan. 12, 2015 in Application No. 201080015699.9.
CNIPA; Notice of Allowance dated May 8, 2015 in Application No. 201080015699.9.
CNIPA; Office Action dated Dec. 10, 2013 in Application No. 201080020267.7.
CNIPA; Notice of Allowance dated Aug. 22, 2014 in Application No. 201080020267.7.
CNIPA; Office Action dated Jan. 21, 2013 in Application No. 201080020268.1.
CNIPA; Office Action dated Sep. 26, 2013 in Application No. 201080020268.1.
CNIPA; Office Action dated Apr. 3, 2014 in Application No. 201080020268.1.
CNIPA; Office Action dated Sep. 23, 2014 in Application No. 201080020268.1.
CNIPA; Office Action dated Apr. 7, 2015 in Application No. 201080020268.1.
CNIPA; Notice of Allowance dated Oct. 16, 2015 in Application No. 201080020268.1.
CNIPA; Office Action dated May 24, 2013 in Application No. 201080036764.6.
CNIPA; Office Action dated Jan. 2, 2014 in Application No. 201080036764.6.
CNIPA; Office Action dated Jul. 1, 2014 in Application No. 201080036764.6.
CNIPA; Notice of Allowance dated Oct. 24, 2014 in Application No. 201080036764.6.
CNIPA; Office Action dated Feb. 8, 2014 in Application No. 201110155056.0.
CNIPA; Office Action dated Sep. 16, 2014 in Application No. 201110155056.0.
CNIPA; Office Action dated Feb. 9, 2015 in Application No. 201110155056.0.
CNIPA; Notice of Allowance dated Aug. 26, 2015 in Application No. 201110155056.0.
CNIPA; Office Action dated Dec. 4, 2015 in Application No. 201210201995.9.
CNIPA; Office Action dated Jul. 14, 2016 in Application No. 201210201995.9.
CNIPA; Office Action dated Jan. 20, 2017 in Application No. 201210201995.9.
CNIPA; Notice of Allowance dated Apr. 13, 2017 in Application No. 201210201995.9.
CNIPA; Office Action dated Dec. 24, 2015 in Application No. 201280057466.4.
CNIPA; Notice of Allowance dated Jun. 16, 2016 in Application No. 201280057466.4.
CNIPA; Office Action dated Dec. 4, 2015 in Application No. 201280057542.1.
CNIPA; Office Action dated May 16, 2016 in Application No. 201280057542.1.
CNIPA; Office Action dated Sep. 9, 2016 in Application No. 201280057542.1.
CNIPA; Notice of Allowance dated Jan. 3, 2017 in Application No. 201280057542.1.
CNIPA; Office Action dated Dec. 5, 2016 in Application No. 201310412808.6.
CNIPA; Notice of Allowance dated Jul. 20, 2017 in Application No. 201310412808.6.
CNIPA; Office Action dated Feb. 5, 2018 in Application No. 201410331047.6.
CNIPA; Office Action dated Dec. 14, 2018 in Application No. 201410331047.6.
CNIPA; Notice of Allowance dated Jun. 14, 2019 in Application No. 201410331047.6.
CNIPA; Office Action dated Oct. 19, 2018 in Application No. 201510765170.3.
CNIPA; Office Action dated Jun. 28, 2019 in Application No. 201510765170.3.

(56) References Cited

OTHER PUBLICATIONS

CNIPA; Notice of Allowance dated Sep. 30, 2019 in Application No. 201510765170.3.
CNIPA; Office Action dated Oct. 31, 2018 in Application No. 201510765406.3.
CNIPA; Office Action dated Jun. 28, 2019 in Application No. 201510765406.3.
CNIPA; Notice of Allowance dated Dec. 27, 2019 in Application No. 201510765406.3.
CNIPA; Office Action dated Jan. 21, 2020 in Application No. 201610028064.1.
CNIPA; Notice of Allowance dated May 22, 2020 in Application No. 201610028064.1.
CNIPA; Office Action dated Mar. 26, 2020 in Application No. 201610131743.1.
CNIPA; Office Action dated Oct. 16, 2020 in Application No. 201610131743.1.
CNIPA; Office Action dated Mar. 30, 2021 in Application No. 201610131743.1.
CNIPA; Office Action dated Mar. 14, 2019 in Application No. 201610141027.1.
CNIPA; Notice of Allowance dated Sep. 3, 2019 in Application No. 201610141027.1.
CNIPA; Office Action dated Jul. 23, 2019 in Application No. 201610897958.4.
CNIPA; Office Action dated Feb. 28, 2020 in Application No. 201610897958.4.
CNIPA; Office Action dated Jun. 16, 2020 in Application No. 201610897958.4.
CNIPA; Office Action dated Nov. 4, 2019 in Application No. 201610898822.5.
CNIPA; Office Action dated Jul. 3, 2020 in Application No. 201610898822.5.
CNIPA; Notice of Allowance dated Oct. 9, 2020 in Application No. 201610898822.5.
CNIPA; Office Action dated May 18, 2020 in Application No. 201610982040.X.
CNIPA; Notice of Allowance dated Dec. 21, 2020 in Application No. 201610982040.X.
CNIPA; Office Action dated May 29, 2020 in Application No. 201710131319.1.
CNIPA; Office Action dated Mar. 1, 2021 in Application No. 201710131319.1.
CNIPA; Office Action dated Jun. 1, 2020 in Application No. 201710173292.2.
CNIPA; Notice of Allowance dated Nov. 4, 2020 in Application No. 201710173292.2.
CNIPA; Office Action dated Dec. 20, 2018 in Application No. 201710738549.4.
CNIPA; Office Action dated Nov. 20, 2020 in Application No. 201710762817.6.
CNIPA; Notice of Allowance dated Mar. 30, 2021 in Application No. 201710762817.6.
CNIPA; Office Action dated Jan. 28, 2021 in Application No. 201711057557.9.
CNIPA; Office Action dated Jan. 26, 2021 in Application No. 201711057929.8.
CNIPA; Office Action dated Jun. 20, 2019 in Application No. 201711120632.1.
CNIPA; Office Action dated Apr. 19, 2021 in Application No. 201711328250.8.
CNIPA; Notice of Allowance dated May 25, 2017 in Application No. 201730010308.9.
CNIPA; Office Action dated Aug. 31, 2020 in Application No. 201780044761.9.
CNIPA; Notice of Allowance dated Apr. 7, 2021 in Application No. 201780044761.9.
CNIPA; Office Action dated Jan. 29, 2021 in Application No. 201780076230.8.
CNIPA; Office Action dated Jan. 27, 2021 in Application No. 201780076321.1.
CNIPA; Office Action dated Nov. 11, 2019 in Application No. 201810379112.0.
CNIPA; Office Action dated Apr. 27, 2020 in Application No. 201810379112.0.
CNIPA; Office Action dated Apr. 27, 2020 in Application No. 201810836604.8.
CNIPA; Office Action dated Jul. 30, 2020 in Application No. 201810836604.8.
CNIPA; Office Action dated Apr. 22, 2020 in Application No. 201810994464.7.
CNIPA; Notice of Allowance dated Oct. 24, 2018 in Application No. 201830060972.9.
CNIPA; Notice of Allowance dated Nov. 1, 2018 in Application No. 201830397219.9.
CNIPA; Office Action dated Mar. 24, 2021 in Application No. 201880048547.5.
CNIPA; Office Action dated Dec. 22, 2020 in Application No. 201910378791.4.
CNIPA; Notice of Allowance dated May 14, 2020 in Application No. 201930615780.4.
CNIPA; Notice of Allowance dated Apr. 27, 2020 in Application No. 201930660355.7.
CNIPA; Notice of Allowance dated Dec. 28, 2020 in Application No. 201930704935.1.
CNIPA; Notice of Allowance dated Jun. 2, 2020 in Application No. 202030048819.1.
CNIPA; Notice of Allowance dated May 15, 2020 in Application No. 202030048854.3.
CNIPA; Notice of Allowance dated May 15, 2020 in Application No. 202030053560.X.
CNIPA; Notice of Allowance dated Aug. 7, 2020 in Application No. 202030053609.1.
CNIPA; Notice of Allowance dated May 20, 2020 in Application No. 202030053634.X.
CNIPA; Notice of Allowance dated Dec. 10, 2020 in Application No. 202030352604.9.
CNIPA; Office Action dated Jan. 25, 2021 in Application No. 202030579755.8.
CNIPA; Notice of Allowance dated Apr. 7, 2021 in Application No. 202030579755.8.
EPO; Office Action dated Jul. 29, 2008 in Application No. 00902194.0.
EPO; Supplementary European Search Report and Opinion dated Nov. 9, 2012 in Application No. 08798519.8.
EPO; Office Action dated Jul. 18, 2016 in Application No. 08798519.8.
EPO; Extended European Search Report dated Dec. 9, 2016 in Application No. 09767208.3.
EPO; Office Action dated Aug. 10, 2018 in Application No. 09767208.3.
EPO; Notice of Allowance dated Aug. 1, 2019 in Application No. 09767208.3.
EPO; Office Action dated Jun. 27, 2003 in Application No. 97929595.3.
EPO; Office Action dated Feb. 18, 2004 in Application No. 97929595.3.
EPO; Notice of Allowance dated Apr. 29, 2004 in Application No. 97929595.3.
EPO; Supplementary European Search Report and Opinion dated Jan. 5, 2017 in Application No. 09836647.9.
EPO; Office Action dated Feb. 28, 2018 in Application No. 09836647.9.
EPO; Office Action dated Jan. 11, 2019 in Application No. 09836647.9.
EPO; Notice of Allowance dated Oct. 16, 2019 in Application No. 09836647.9.
EPO; Notice of Allowance dated Jan. 10, 2001 in Application No. 98911263.6.
EPO; Office Action dated Jun. 6, 2001 in Application No. 98911277.6.

(56) References Cited

OTHER PUBLICATIONS

EPO; Office Action dated Jun. 27, 2003 in Application No. 98967122.7.
EPO; Notice of Allowance dated Feb. 23, 2004 in Application No. 98967122.7.
EPO; Office Action dated Sep. 22, 2003 in Application No. 99946447.2.
EPO; Office Action dated Nov. 25, 2003 in Application No. 99946447.2.
EPO; Office Action dated Mar. 30, 2004 in Application No. 99946447.2.
EPO; Office Action dated Jul. 19, 2004 in Application No. 99946447.2.
EPO; Notice of Allowance dated Sep. 22, 2004 in Application No. 99946447.2.
EPO; Supplementary European Search Report dated May 27, 2002 in Application No. 99973123.
EPO; Notice of Allowance dated Jun. 11, 2004 in Application No. 99973123.
EPO; Extended European Search Report dated Apr. 28, 2014 in Application No. 11162225.4.
EPO; Notice of Allowance dated Feb. 3, 2015 in Application No. 11162225.4.
EPO; Extended European Search Report dated Nov. 29, 2019 in Application No. 19188826.2.
EPO; Extended European Search Report dated Mar. 3, 2020 in Application No. 19205558.0.
EPO; Extended European Search Report dated Apr. 6, 2021 in Application No. 21150514.4.
IPOS; Notice of Allowance dated Aug. 14, 2017 in Application No. 10201401237.
JPO; Office Action dated Aug. 10, 2009 in Application No. 2003029767.
JPO; Office Action dated Apr. 13, 2010 in Application No. 2003029767.
JPO; Notice of Allowance dated Jun. 24, 2010 in Application No. 2003029767.
JPO; Office Action dated Oct. 30, 2008 in Application No. 2004558313.
JPO; Office Action dated Feb. 19, 2009 in Application No. 2004558313.
JPO; Notice of Allowance dated Jun. 30, 2009 in Application No. 2004558313.
JPO; Office Action dated Mar. 16, 2012 in Application No. 2009-532567.
JPO; Notice of Allowance dated Jul. 23, 2012 in Application No. 2009-532567.
JPO; Notice of Allowance dated Mar. 29, 2013 in Application No. 2010-509478.
JPO; Office Action dated Dec. 20, 2011 in Application No. 2010-522075.
JPO; Office Action dated Apr. 11, 2012 in Application No. 2010-522075.
JPO; Office Action dated May 15, 2013 in Application No. 2010058415.
JPO; Office Action dated Oct. 30, 2013 in Application No. 2010058415.
JPO; Office Action dated Aug. 7, 2014 in Application No. 2010058415.
JPO; Notice of Allowance dated Dec. 18, 2014 in Application No. 2010058415.
JPO; Office Action dated Aug. 22, 2013 in Application No. 2010-153754.
JPO; Office Action dated Oct. 30, 2013 in Application No. 2010-193285.
JPO; Office Action dated Aug. 26, 2015 in Application No. 2011-284831.
JPO; Notice of Allowance dated Mar. 3, 2016 in Application No. 2011-284831.
JPO; Office Action dated May 31, 2012 in Application No. 2011-514650.
JPO; Office Action dated Sep. 11, 2012 in Application No. 2011-514650.
JPO; Notice of Allowance dated Dec. 10, 2012 in Application No. 2011-514650.
JPO; Office Action dated Dec. 10, 2014 in Application No. 2011090067.
JPO; Notice of Allowance dated Apr. 28, 2015 in Application No. 2011090067.
JPO; Office Action dated Jul. 14, 2016 in Application No. 2012-153698.
JPO; Notice of Allowance dated Oct. 21, 2016 in Application No. 2012-153698.
JPO; Office Action dated Dec. 20, 2013 in Application No. 2012-504786.
JPO; Office Action dated Jan. 25, 2014 in Application No. 2012-504786.
JPO; Office Action dated Dec. 1, 2014 in Application No. 2012-504786.
JPO; Notice of Allowance dated Jun. 12, 2015 in Application No. 2012504786.
JPO; Office Action dated Mar. 11, 2013 in Application No. 2012-509857.
JPO; Notice of Allowance dated Jun. 29, 2013 in Application No. 2012-509857.
JPO; Office Action dated May 19, 2017 in Application No. 2013-160173.
JPO; Notice of Allowance dated Aug. 23, 2017 in Application No. 2013-160173.
JPO; Office Action dated Aug. 14, 2017 in Application No. 2013-178344.
JPO; Office Action dated Jan. 23, 2018 in Application No. 2013-178344.
JPO; Notice of Allowance dated Jul. 24, 2018 in Application No. 2013-178344.
JPO; Office Action dated Apr. 3, 2018 in Application No. 2014-120675.
JPO; Notice of Allowance dated Jun. 6, 2018 in Application No. 2014-120675.
JPO; Office Action dated Mar. 28, 2018 in Application No. 2014-188835.
JPO; Notice of Allowance dated Jun. 6, 2018 in Application No. 2014-188835.
JPO; Office Action dated Apr. 12, 2018 in Application No. 2014-205548.
JPO; Notice of Allowance dated Dec. 19, 2019 in Application No. 2014205548.
JPO; Notice of Allowance dated May 14, 2018 in Application No. 2014-216540.
JPO; Office Action dated Jul. 20, 2018 in Application No. 2015-034774.
JPO; Office Action dated Jun. 27, 2019 in Application No. 2015034774.
JPO; Notice of Allowance dated Nov. 20, 2019 in Application No. 2015034774.
JPO; Office Action dated Jan. 30, 2019 in Application No. 2015052198.
JPO; Notice of Allowance dated Apr. 5, 2019 in Application No. 2015052198.
JPO; Office Action dated Aug. 29, 2019 in Application No. 2016001928.
JPO; Notice of Allowance dated Dec. 17, 2019 in Application No. 2016001928.
JPO; Office Action dated Jun. 1, 2020 in Application No. 2016-206625.
JPO; Notice of Allowance dated Nov. 27, 2020 in Application No. 2016-206625.
JPO; Office Action dated Aug. 28, 2020 in Application No. 2017-139817.
JPO; Office Action dated Jan. 26, 2021 in Application No. 2017-139817.
JPO; Notice of Allowance dated Apr. 6, 2021 in Application No. 2017-139817.
JPO; Office Action dated Mar. 31, 2021 in Application No. 2018-024655.
JPO; Notice of Allowance dated Jul. 1, 2020 in Application No. 2019-025168.
JPO; Office Action dated Aug. 24, 2020 in Application No. 2019-119908.
JPO; Notice of Allowance dated Mar. 17, 2021 in Application No. 2020-010953.
JPO; Office Action dated Jun. 29, 2020 in Application No. 2020-502653.

(56) References Cited

OTHER PUBLICATIONS

JPO; Notice of Allowance dated Nov. 26, 2020 in Application No. 2020-502653.
KIPO; Office Action dated Dec. 10, 2015 in Application No. 10-2010-0028336.
KIPO; Office Action dated Jun. 29, 2016 in Application No. 10-2010-0028336.
KIPO; Notice of Allowance dated Sep. 29, 2016 in Application No. 10-2010-0028336.
KIPO; Office Action dated Mar. 3, 2016 in Application No. 10-2010-0067768.
KIPO; Office Action dated Aug. 1, 2016 in Application No. 10-2010-0067768.
KIPO; Notice of Allowance dated Dec. 1, 2016 in Application No. 10-2010-0067768.
KIPO; Office Action dated May 2, 2016 in Application No. 10-2010-0082446.
KIPO; Office Action dated Sep. 19, 2016 in Application No. 10-2010-0082446.
KIPO; Notice of Allowance dated Mar. 7, 2017 in Application No. 10-2010-0082446.
KIPO; Office Action dated Mar. 13, 2017 in Application No. 20110034612.
KIPO; Office Action dated Jul. 20, 2017 in Application No. 20110034612.
KIPO; Notice of Allowance dated Sep. 1, 2017 in Application No. 20110034612.
KIPO; Office Action dated Nov. 24, 2017 in Application No. 10-2011-0036449.
KIPO; Office Action dated May 23, 2017 in Application No. 10-2011-0036449.
KIPO; Office Action dated Apr. 2, 2018 in Application No. 10-2011-0036449.
KIPO; Notice of Allowance dated Oct. 24, 2018 in Application No. 10-2011-0036449.
KIPO; Office Action dated Sep. 4, 2017 in Application No. 10-2011-0087600.
KIPO; Notice of Allowance dated Jan. 11, 2018 in Application No. 10-2011-0087600.
KIPO; Office Action dated Oct. 23, 2017 in Application No. 10-2011-0142924.
KIPO; Notice of Allowance dated Mar. 14, 2018 in Application No. 10-2011-0142924.
KIPO; Office Action dated Dec. 11, 2015 in Application No. 10-2011-7023416.
KIPO; Office Action dated Mar. 13, 2016 in Application No. 10-2011-7023416.
KIPO; Notice of Allowance dated Jun. 2, 0216 in Application No. 10-2011-7023416.
KIPO; Office Action dated Oct. 30, 2017 in Application No. 10-2012-0041878.
KIPO; Notice of Allowance dated Feb. 28, 2018 in Application No. 10-2012-0041878.
KIPO; Office Action dated Mar. 21, 2018 in Application No. 10-2012-0042518.
KIPO; Notice of Allowance dated May 30, 2018 in Application No. 10-2012-0042518.
KIPO; Office Action dated Mar. 21, 2018 in Application No. 10-2012-0064526.
KIPO; Office Action dated Sep. 18, 2018 in Application No. 10-2012-0064526.
KIPO; Office Action dated Dec. 13, 2018 in Application No. 10-2012-0064526.
KIPO; Office Action dated Jan. 12, 2019 in Application No. 10-2012-0064526.
KIPO; Notice of Allowance dated Jul. 5, 2019 in Application No. 10-2012-0064526.
KIPO; Office Action dated Mar. 30, 2018 in Application No. 10-2012-0076564.
KIPO; Office Action dated Sep. 27, 2018 in Application No. 10-2012-0076564.
KIPO; Office Action dated Mar. 27, 2019 in Application No. 10-2012-0076564.
KIPO; Decision of Intellectual Property Trial and Appeal Board dated Jun. 23, 2020 in Application No. 10-2012-0076564.
KIPO; Office Action dated Apr. 30, 2018 in Application No. 10-2012-0103114.
KIPO; Notice of Allowance dated Nov. 22, 2018 in Application No. 10-2012-0103114.
KIPO; Office Action dated Oct. 24, 2016 in Application No. 10-2012-7004062.
KIPO; Office Action dated Jul. 24, 2017 in Application No. 10-2012-7004062.
KIPO; Decision of Intellectual Property Trial and Appeal Board dated May 13, 2019 in Application No. 10-2012-7004062.
KIPO; Office Action dated May 30, 2019 in Application No. 10-2012-7004062.
KIPO; Notice of Allowance dated Sep. 27, 2019 in Application No. 10-2012-7004062.
KIPO; Office Action dated Apr. 24, 2019 in Application No. 10-2013-0036823.
KIPO; Notice of Allowance dated Aug. 29, 2019 in Application No. 10-2013-0036823.
KIPO; Office Action dated Aug. 27, 2019 in Application No. 10-2013-0049598.
KIPO; Office Action dated Feb. 28, 2020 in Application No. 10-2013-0049598.
KIPO; Notice of Allowance dated Sep. 25, 2020 in Application No. 10-2013-0049598.
KIPO; Office Action dated May 31, 2019 in Application No. 10-2013-0050740.
KIPO; Office Action dated Nov. 27, 2019 in Application No. 10-2013-0050740.
KIPO; Notice of Allowance dated Apr. 23, 2020 in Application No. 10-2013-0050740.
KIPO; Office Action dated Mar. 27, 2019 in Application No. 10-2013-0084459.
KIPO; Notice of Allowance dated Oct. 30, 2019 in Application No. 10-2013-0084459.
KIPO; Office Action dated Apr. 30, 2019 in Application No. 10-2013-0088450.
KIPO; Office Action dated Nov. 29, 2019 in Application No. 10-2013-0088450.
KIPO; Notice of Allowance dated Jan. 13, 2020 in Application No. 10-2013-0088450.
KIPO; Office Action dated Aug. 27, 2019 in Application No. 10-2013-0089998.
KIPO; Notice of Allowance dated Feb. 27, 2020 in Application No. 10-2013-0089998.
KIPO; Office Action dated Dec. 4, 2019 in Application No. 10-2013-0098575.
KIPO; Office Action dated Jun. 19, 2020 in Application No. 10-2013-0098575.
KIPO; Notice of Allowance dated Aug. 13, 2020 in Application No. 10-2013-0098575.
KIPO; Office Action dated Apr. 19, 2019 in Application No. 10-2013-0101944.
KIPO; Notice of Allowance dated Oct. 8, 2019 in Application No. 10-2013-0101944.
KIPO; Office Action dated Nov. 12, 2019 in Application No. 10-2013-0102026.
KIPO; Notice of Allowance dated May 14, 2020 in Application No. 10-2013-0102026.
KIPO; Office Action dated Aug. 15, 2019 in Application No. 10-2013-0109390.
KIPO; Notice of Allowance dated Oct. 21, 2019 in Application No. 10-2013-0109390.
KIPO; Office Action dated Oct. 7, 2019 in Application No. 10-2013-0114079.
KIPO; Notice of Allowance dated Mar. 4, 2020 in Application No. 10-2013-0114079.

(56) References Cited

OTHER PUBLICATIONS

KIPO; Office Action dated May 21, 2019 in Application No. 10-2013-0121554.
KIPO; Notice of Allowance dated Oct. 28, 2019 in Application No. 10-2013-0121554.
KIPO; Office Action dated Mar. 30, 2020 in Application No. 10-2014-0011764.
KIPO; Notice of Allowance dated Oct. 27, 2020 in Application No. 10-2014-0011764.
KIPO; Office Action dated Jul. 21, 2020 in Application No. 10-2014-0011765.
KIPO; Office Action dated Jan. 25, 2021 in Application No. 10-2014-0011765.
KIPO; Office Action dated Mar. 23, 2021 in Application No. 10-2014-0011765.
KIPO; Office Action dated Feb. 3, 2020 in Application No. 10-2014-0021615.
KIPO; Notice of Allowance dated Sep. 8, 2020 in Application No. 10-2014-0021615.
KIPO; Office Action dated Oct. 26, 2020 in Application No. 10-2014-0027217.
KIPO; Office Action dated Apr. 27, 2021 in Application No. 10-2014-0027217.
KIPO; Office Action dated Feb. 15, 2020 in Application No. 10-2014-0027305.
KIPO; Notice of Allowance dated Oct. 12, 2020 in Application No. 10-2014-0027305.
KIPO; Office Action dated Jul. 9, 2020 in Application No. 10-2014-0060120.
KIPO; Notice of Allowance dated Jan. 4, 2021 in Application No. 10-2014-0060120.
KIPO; Office Action dated Aug. 18, 2020 in Application No. 10-2014-0071653.
KIPO; Notice of Allowance dated Jan. 4, 2021 in Application No. 10-2014-0071653.
KIPO; Office Action dated May 21, 2020 in Application No. 10-2014-0086902.
KIPO; Notice of Allowance dated Oct. 19, 2020 in Application No. 10-2014-0086902.
KIPO; Office Action dated May 21, 2020 in Application No. 10-2014-0091092.
KIPO; Notice of Allowance dated Sep. 27, 2020 in Application No. 10-2014-0091092.
KIPO; Office Action dated Mar. 11, 2020 in Application No. 10-2014-0103853.
KIPO; Office Action dated Oct. 5, 2020 in Application No. 10-2014-0103853.
KIPO; Notice of Allowance dated Apr. 15, 2021 in Application No. 10-2014-0103853.
KIPO; Office Action dated Nov. 29, 2020 in Application No. 10-2014-0105478.
KIPO; Office Action dated Feb. 17, 2021 in Application No. 10-2014-0122903.
KIPO; Office Action dated Oct. 7, 2020 in Application No. 10-2014-0128626.
KIPO; Notice of Allowance dated Mar. 25, 2021 in Application No. 10-2014-0128626.
KIPO; Office Action dated Apr. 20, 2021 in Application No. 10-2014-0136089.
KIPO; Office Action dated Jan. 25, 2021 in Application No. 10-2014-0145220.
KIPO; Office Action dated Mar. 19, 2021 in Application No. 10-2014-0156196.
KIPO; Office Action dated Mar. 29, 2021 in Application No. 10-2014-0165685.
KIPO; Office Action dated Jan. 22, 2019 in Application No. 10-2014-7017110.
KIPO; Notice of Allowance dated Aug. 26, 2019 in Application No. 10-2014-7017110.
KIPO; Office Action dated Sep. 28, 2017 in Application No. 10-2014-7017112.
KIPO; Notice of Allowance dated Feb. 23, 2018 in Application No. 10-2014-7017112.
KIPO; Office Action dated Jan. 6, 2021 in Application No. 10-2015-0025314.
KIPO; Office Action dated Apr. 5, 2021 in Application No. 10-2015-0031720.
KIPO; Office Action dated Apr. 19, 2021 in Application No. 10-2015-0035094.
KIPO; Office Action dated Nov. 9, 2016 in Application No. 10-2016-7023913.
KIPO; Notice of Allowance dated May 30, 2017 in Application No. 10-2016-7023913.
KIPO; Office Action dated Mar. 8, 2021 in Application No. 10-2017-0054647.
KIPO; Office Action dated Mar. 10, 2021 in Application No. 10-2017-0055703.
KIPO; Office Action dated Jul. 21, 2020 in Application No. 10-2017-0087308.
KIPO; Notice of Allowance dated Oct. 26, 2020 in Application No. 10-2017-0087308.
KIPO; Notice of Allowance dated Feb. 27, 2018 in Application No. 10-2017-0175442.
KIPO; Office Action dated Sep. 28, 2017 in Application No. 10-2017-7023740.
KIPO; Final Office Action dated Jun. 17, 2019 in Application No. 10-2017-7023740.
KIPO; Notice of Allowance dated Jul. 19, 2018 in Application No. 20187013945.
KIPO; Office Action dated Jun. 30, 2020 in Application No. 10-2019-0044213.
KIPO; Office Action dated Dec. 23, 2020 in Application No. 10-2019-0044213.
KIPO; Notice of Allowance dated Nov. 29, 2019 in Application No. 10-2019-0127773.
KIPO; Offie Action dated Apr. 22, 2020 in Application No. 10-2020-0009462.
KIPO; Notice of Allowance dated Oct. 28, 2020 in Application No. 10-2020-0009462.
KIPO; Office Action dated Nov. 14, 2020 in Application No. 10-2020-0101096.
KIPO; Notice of Allowance dated May 24, 2021 in Application No. 10-2020-0101096.
KIPO; Office Action dated Feb. 12, 2020 in Application No. 10-2020-7000992.
KIPO; Notice of Allowance dated Jul. 20, 2020 in Application No. 10-2020-7000992.
KIPO; Office Action dated Sep. 15, 2017 in Application No. 30-2017-0001320.
KIPO; Notice of Allowance dated Jan. 19, 2018 in Application No. 30-2017-0001320.
KIPO; Notice of Allowance dated Jul. 10, 2018 in Application No. 30-2017-0052872.
KIPO; Office Action dated Jul. 11, 2018 in Application No. 30-2018-0006016.
KIPO; Notice of Allowance dated Oct. 16, 2018 in Application No. 30-2018-0006016.
KIPO; Office Action dated Jan. 30, 2019 in Application No. 30-2018-0033442.
KIPO; Notice of Allowance dated Apr. 1, 2019 in Application No. 30-2018-0033442.
KIPO; Notice of Allowance dated Oct. 20, 2020 in Application No. 30-2019-0054013 M001.
KIPO; Notice of Allowance dated Oct. 20, 2020 in Application No. 30-2019-0054013 M002.
KIPO; Notice of Allowance dated Oct. 20, 2020 in Application No. 30-2019-0054642.
KIPO; Notice of Allowance dated Oct. 22, 2020 in Application No. 30-2019-0058076.
KIPO; Notice of Allowance dated Oct. 22, 2020 in Application No. 30-2019-0058566 (M001).

(56) References Cited

OTHER PUBLICATIONS

KIPO; Notice of Allowance dated Oct. 22, 2020 in Application No. 30-2019-0058566 (M002).
KIPO; Notice of Allowance dated Dec. 1, 2020 in Application No. 30-2019-0061607.
KIPO; Notice of Allowance dated Apr. 1, 2021 in Application No. 30-2020-0030139 (M001).
KIPO; Notice of Allowance dated Apr. 1, 2021 in Application No. 30-2020-0030139 (M002).
KIPO; Notice of Allowance dated Jan. 26, 2021 in Application No. 30-2020-0005953 (M001).
KIPO; Notice of Allowance dated Jan. 26, 2021 in Application No. 30-2020-0005953 (M002).
KIPO; Notice of Allowance dated Dec. 23, 2020 in Application No. 30-2020-0006059.
KIPO; Notice of Allowance dated Dec. 25, 2020 in Application No. 30-2020-0006223.
KIPO; Notice of Allowance dated Feb. 1, 2021 in Application No. 30-2020-0006385.
KIPO; Notice of Allowance dated Feb. 1, 2021 in Application No. 30-2020-0006391.
TIPO; Office Action dated Aug. 30, 2013 in Application No. 97132391.
TIPO; Office Action dated Dec. 20, 2013 in Application No. 98117513.
TIPO; Notice of Allowance dated Jun. 12, 2014 in Application No. 98117513.
TIPO; Office Action dated Jul. 4, 2014 in Application No. 99110511.
TIPO; Notice of Allowance dated Feb. 24, 2016 in Application No. 99110511.
TIPO; Office Action dated Aug. 27, 2014 in Application No. 99114329.
TIPO; Notice of Allowance dated Jan. 28, 2015 in Application No. 99114329.
TIPO; Office Action dated Dec. 26, 2014 in Application No. 99114330.
TIPO; Notice of Allowance dated Apr. 28, 2015 in Application No. 99114330.
TIPO; Office Action dated Aug. 14, 2014 in Application No. 99114331.
TIPO; Notice of Allowance dated Oct. 16, 2015 in Application No. 99114331.
TIPO; Office Action dated Dec. 19, 2014 in Application No. 99127063.
TIPO; Notice of Allowance dated Mar. 14, 2016 in Application No. 99127063.
TIPO; Notice of Allowance dated Oct. 2, 2015 in Application No. 100130472.
TIPO; Office Action dated Feb. 19, 2016 in Application No. 100113130.
TIPO; Notice of Allowance dated Jun. 29, 2016 in Applicaton No. 100113130.
TIPO; Notice of Allowance dated Nov. 2, 2016 in Application No. 101142581.
TIPO; Office Action dated Apr. 28, 2016 in Application No. 101142582.
TIPO; Notice of Allowance dated Aug. 19, 2016 in Application No. 101142582.
TIPO; Office Action dated Aug. 1, 2016 in Application No. 101124745.
TIPO; Notice of Allowance dated Oct. 19, 2016 in Application No. 101124745.
TIPO; Office Action dated Sep. 19, 2016 in Application No. 102113028.
TIPO; Notice of Allowance dated Feb. 13, 2017 in Application No. 102113028.
TIPO; Office Action dated Aug. 2016 in Application No. 102115605.
TIPO; Office Action dated Feb. 24, 2017 in Application No. 102115605.
TIPO; Notice of Allowance dated Dec. 26, 2017 in Application No. 102115605.
TIPO; Office Action dated Nov. 15, 2016 in Application No. 102125191.
TIPO; Office Action dated Jun. 20, 2017 in Application No. 102125191.
TIPO; Notice of Allowance dated Feb. 20, 2020 in Application No. 102125191.
TIPO; Office Action dated Dec. 6, 2016 in Application No. 102126071.
TIPO; Office Action dated May 17, 2018 in Application No. 102126071.
TIPO; Notice of Allowance dated Aug. 24, 2018 in Application No. 102126071.
TIPO; Office Action dated Feb. 10, 2017 in Application No. 102127065.
TIPO; Notice of Allowance dated Jul. 18, 2017 in Application No. 102127065.
TIPO; Office Action dated Nov. 3, 2016 in Application No. 102129262.
TIPO; Notice of Allowance dated Mar. 3, 2017 in Application No. 102129262.
TIPO; Office Action dated Dec. 29, 2016 in Application No. 102129397.
TIPO; Notice of Allowance dated Aug. 29, 2017 in Application No. 102129397.
TIPO; Office Action dated Nov. 3, 2016 in Application No. 102131839.
TIPO; Notice of Allowance dated Jan. 26, 2017 in Application No. 102131839.
TIPO; Office Action dated Dec. 2, 2016 in Application No. 102136496.
TIPO; Office Action dated Jan. 10, 2018 in Application No. 102136496.
TIPO; Office Action dated Aug. 16, 2019 in Application No. 102136496.
TIPO; Notice of Allowance dated Jan. 7, 2020 in Application No. 102136496.
TIPO; Office Action dated Nov. 11, 2016 in Application No. 102132952.
TIPO; Notice of Allowance dated Apr. 19, 2017 in Application No. 102132952.
TIPO; Office Action dated Jul. 17, 2017 in Application No. 103101400.
TIPO; Notice of Allowance dated Jan. 24, 2018 in Application No. 103101400.
TIPO; Office Action dated Feb. 23, 2017 in Application No. 103102563.
TIPO; Notice of Allowance dated Nov. 30, 2017 in Application No. 103102563.
TIPO; Office Action dated Mar. 3, 2017 in Application No. 103105251.
TIPO; Notice of Allowance dated Oct. 20, 2017 in Application No. 103105251.
TIPO; Office Action dated Nov. 1, 2017 in Application No. 103106021.
TIPO; Notice of Allowance dated Apr. 10, 2018 in Application No. 103106021.
TIPO; Office Action dated Oct. 31, 2017 in Application No. 103106022.
TIPO; Notice of Allowance dated Apr. 10, 2018 in Application No. 103106022.
TIPO; Office Action dated Jul. 5, 2017 in Application No. 103117477.
TIPO; Notice of Allowance dated Jan. 22, 2018 in Application No. 103117477.
TIPO; Office Action dated Nov. 22, 2017 in Application No. 103117478.
TIPO; Notice of Allowance dated Mar. 13, 2018 in Application No. 103117478.
TIPO; Office Action dated May 19, 2017 in Application No. 103120478.
TIPO; Notice of Allowance dated Sep. 25, 2017 in Application No. 103120478.
TIPO; Office Action dated Sep. 20, 2018 in Application No. 103123439.
TIPO; Notice of Allowance dated Jul. 10, 2019 in Application No. 103123439.
TIPO; Office Action dated Nov. 8, 2017 in Application No. 103124509.
TIPO; Notice of Allowance dated Apr. 25, 2018 in Application No. 103124509.
TIPO; Office Action dated Nov. 20, 2017 in Application No. 103127588.
TIPO; Notice of Allowance dated Jun. 19, 2018 in Application No. 103127588.

(56) References Cited

OTHER PUBLICATIONS

TIPO; Office Action dated Sep. 19, 2017 in Application No. 103127734.
TIPO; Notice of Allowance dated Dec. 11, 2017 in Application No. 103127734.
TIPO; Office Action dated Sep. 26, 2018 in Application No. 103132230.
TIPO; Notice of Allowance dated Jan. 29, 2019 in Application No. 103132230.
TIPO; Office Action dated Nov. 22, 2017 in Application No. 103134537.
TIPO; Notice of Allowance dated Apr. 19, 2018 in Application No. 103134537.
TIPO; Office Action dated Aug. 24, 2017 in Application No. 103136251.
TIPO; Notice of Allowance dated Oct. 17, 2017 in Application No. 103136251.
TIPO; Office Action dated Feb. 26, 2018 in Application No. 103138510.
TIPO; Notice of Allowance dated Jun. 13, 2018 in Application No. 103138510.
TIPO; Office Action dated May 21, 2018 in Application No. 103139014.
TIPO; Notice of Allowance dated Sep. 11, 2018 in Application No. 103139014.
TIPO; Office Action dated Jun. 22, 2018 in Application No. 104105533.
TIPO; Office Action dated Feb. 22, 2019 in Application No. 104105533.
TIPO; Notice of Allowance dated Sep. 27, 2019 in Application No. 104105533.
TIPO; Office Action dated Nov. 19, 2018 in Application No. 104105965.
TIPO; Notice of Allowance dated Sep. 23, 2019 in Application No. 104105965.
TIPO; Office Action dated Jul. 9, 2018 in Application No. 104107876.
TIPO; Notice of Allowance dated May 9, 2019 in Application No. 104107876.
TIPO; Office Action dated Aug. 7, 2018 Application No. 104107888.
TIPO; Notice of Allowance dated Apr. 26, 2019 in Application No. 104107888.
TIPO; Office Action dated May 6, 2019 in Application No. 104108277.
TIPO; Office Action dated Jan. 17, 2020 in Application No. 104108277.
TIPO; Office Action dated Jul. 9, 2018 in Application No. 104110326.
TIPO; Notice of Allowance dated May 8, 2019 in Application No. 104110326.
TIPO; Office Action dated Jun. 13, 2018 in Application No. 104111910.
TIPO; Notice of Allowance dated Sep. 18, 2018 in Application No. 104111910.
TIPO; Office Action dated Apr. 29, 2019 in Application No. 104122889.
TIPO; Notice of Allowance dated Oct. 4, 2019 in Application No. 104122889.
TIPO; Office Action dated Jan. 30, 2019 in Application No. 104122890.
TIPO; Notice of Allowance dated Jul. 19, 2019 in Application No. 104122890.
TIPO; Office Action dated Jul. 11, 2018 in Application No. 104124377.
TIPO; Notice of Allowance dated Jun. 19, 2019 in Application No. 104124377.
TIPO; Office Action dated Jan. 7, 2019 in Application No. 104132991.
TIPO; Notice of Allowance dated Apr. 12, 2019 in Application No. 104132991.
TIPO; Office Action dated Apr. 25, 2019 in Application No. 104141679.
TIPO; Notice of Allowance dated Nov. 27, 2019 in Application No. 104141679.
TIPO; Office Action dated Apr. 25, 2019 in Application No. 105101536.
TIPO; Office Action dated Dec. 13, 2019 in Application No. 105101536.
TIPO; Notice of Allowance dated May 4, 2020 in Application No. 105101536.
TIPO; Office Action dated Nov. 6, 2019 in Application No. 105101537.
TIPO; Notice of Allowance dated Jul. 1, 2020 in Application No. 105101537.
TIPO; Notice of Allowance dated May 7, 2019 in Application No. 105104453.
TIPO; Office Action dated Dec. 13, 2019 in Application No. 105111990.
TIPO; Notice of Allowance dated Sep. 4, 2020 in Application No. 105111990.
TIPO; Office Action dated Jul. 5, 2019 in Application No. 105112363.
TIPO; Notice of Allowance dated Dec. 10, 2019 in Application No. 105112363.
TIPO; Office Action dated Oct. 1, 2019 in Application No. 105114105.
TIPO; Notice of Allowance dated Jan. 15, 2020 in Application No. 105114105.
TIPO; Office Action dated Sep. 9, 2019 in Application No. 105115513.
TIPO; Notice of Allowance dated Feb. 10, 2020 in Application No. 105115513.
TIPO; Office Action dated Oct. 3, 2019 in Application No. 105119533.
TIPO; Notice of Allowance dated Mar. 13, 2020 in Application No. 105119533.
TIPO; Office Action dated Jan. 20, 2020 in Application No. 105122394.
TIPO; Office Action dated Sep. 7, 2020 in Application No. 105122394.
TIPO; Notice of Allowance dated May 13, 2021 in Application No. 105122394.
TIPO; Office Action dated Jan. 17, 2020 in Application No. 105122586.
TIPO; Notice of Allowance dated Aug. 31, 2020 in Application No. 105122586.
TIPO; Office Action dated Oct. 28, 2019 in Application No. 105122715.
TIPO; Notice of Allowance dated Feb. 13, 2020 in Application No. 105122715.
TIPO; Office Action dated Apr. 14, 2020 in Application No. 105129977.
TIPO; Office Action dated Sep. 18, 2020 in Application No. 105129977.
TIPO; Office Action dated Mar. 17, 2020 in Application No. 105130130.
TIPO; Notice of Allowance dated Sep. 25, 2020 in Application No. 105130130.
TIPO; Office Action in Application No. 105131284.
TIPO; Notice of Allowance dated Mar. 5, 2021 in Application No. 105131284.
TIPO; Office Action dated Aug. 25, 2020 in Application No. 105131896.
TIPO; Office Action dated Dec. 2, 2020 in Application No. 105131896.
TIPO; Office Action dated Feb. 25, 2021 in Application No. 105134275.
TIPO; Office Action dated Sep. 30, 2020 in Application No. 105142668.
TIPO; Notice of Allowance dated Jan. 29, 2021 in Application No. 105142668.
TIPO; Notice of Allowance dated Dec. 5, 2017 in Application No. 105308015.
TIPO; Notice of Allowance dated Apr. 11, 2018 in Application No. 105308015D01.
TIPO; Office Action dated Aug. 11, 2020 in Application No. 106100823.
TIPO; Notice of Allowance dated Mar. 4, 2021 in Application No. 106100823.
TIPO; Office Action dated Jun. 17, 2020 in Application No. 106108152.
TIPO; Notice of Allowance dated Dec. 10, 2020 in Application No. 106108152.
TIPO; Office Action dated Oct. 7, 2020 in Application No. 106108522.
TIPO; Notice of Allowance dated May 6, 2021 in Application No. 106108522.
TIPO; Office Action dated Aug. 21, 2020 in Application No. 106111548.
TIPO; Notice of Allowance dated Jan. 25, 2021 in Application No. 106111548.
TIPO; Office Action dated Oct. 8, 2020 in Application No. 106111693.

(56) References Cited

OTHER PUBLICATIONS

TIPO; Notice of Allowance dated Mar. 4, 2021 in Application No. 106111693.
TIPO; Office Action dated Sep. 30, 2020 in Application No. 106113604.
TIPO; Office Action dated Jan. 6, 2021 in Application No. 106115126.
TIPO; Office Action dated Nov. 6, 2017 in Application No. 106117181.
TIPO; Notice of Allowance dated Jun. 5, 2018 in Application No. 106117181.
TIPO; Office Action dated Sep. 28, 2018 in Application No. 106119537.
TIPO; Office Action dated Jul. 15, 2020 in Application No. 106120365.
TIPO; Office Action dated Nov. 12, 2020 in Application No. 106120365.
TIPO; Office Action dated Nov. 18, 2020 in Application No. 106120902.
TIPO; Office Action dated Feb. 25, 2021 in Application No. 106121797.
TIPO; Office Action dated Dec. 21, 2020 in Application No. 106122231.
TIPO; Office Action dated Apr. 26, 2021 in Application No. 106122231.
TIPO; Office Action dated Oct. 8, 2020 in Application No. 106123203.
TIPO; Office Action dated Dec. 29, 2020 in Application No. 106124126.
TIPO; Office Action dated Apr. 22, 2021 in Application No. 106124126.
TIPO; Office Action dated Dec. 9, 2020 in Application No. 106124128.
TIPO; Office Action dated Apr. 22, 2021 in Application No. 106124128.
TIPO; Office Action dated Jan. 25, 2021 in Application No. 106124129.
TIPO; Office Action dated Dec. 9, 2020 in Application No. 106124130.
TIPO; Notice of Allowance dated Mar. 25, 2021 in Application No. 106124130.
TIPO; Office Action dated Dec. 26, 2018 in Application No. 106127690.
TIPO; Office Action dated Mar. 4, 2021 in Application No. 106127948.
TIPO; Office Action dated Jan. 20, 2021 in Application No. 106129491.
TIPO; Office Action dated Mar. 15, 2021 in Application No. 106129971.
TIPO; Office Action dated Feb. 8, 2021 in Application No. 106133152.
TIPO; Office Action dated Apr. 7, 2021 in Application No. 106135925.
TIPO; Office Action dated Apr. 7, 2021 in Application No. 106136905.
TIPO; Office Action dated Aug. 31, 2018 in Application No. 106138119.
TIPO; Office Action dated Jun. 25, 2018 in Application No. 106138800.
TIPO; Office Action dated Jan. 7, 2019 in Application No. 106138800.
TIPO; Notice of Allowance dated Sep. 20, 2019 in Application No. 106138800.
TIPO; Office Action dated Oct. 3, 2018 in Application No. 106142731.
TIPO; Office Action dated Mar. 29, 2021 in Application No. 106143559.
TIPO; Office Action dated Mar. 31, 2021 in Application No. 106143570.
TIPO; Office Action dated Sep. 28, 2018 in Application No. 107112951.
TIPO; Office Action dated Aug. 27, 2019 in Application No. 107116804.
TIPO; Notice of Allowance dated Jan. 16, 2020 in Application No. 107116804.
TIPO; Office Action dated Nov. 20, 2018 in Application No. 107118271.
TIPO; Office Action dated Jun. 4, 2019 in Application No. 107123992.
TIPO; Office Action dated May 28, 2019 in Application No. 107125586.
TIPO; Office Action dated Jan. 17, 2020 in Application No. 107127688.
TIPO; Notice of Allowance dated Aug. 29, 2018 in Application No. 107300633.
TIPO; Notice of Allowance dated Feb. 21, 2019 in Application No. 107303723.
TIPO; Office Action dated Jun. 28, 2019 in Application No. 108102948.
TIPO; Office Action dated Dec. 24, 2019 in Application No. 108105002.
TIPO; Office Action dated Feb. 3, 2020 in Application No. 108114221.
TIPO; Office Action dated Nov. 13, 2019 in Application No. 108115406.
TIPO; Office Action dated Feb. 21, 2020 in Application No. 108120947.
TIPO; Notice of Allowance dated Mar. 12, 2020 in Application No. 108129100.
TIPO; Office Action dated Jun. 24, 2020 in Application No. 108135004.
TIPO; Office Action dated Jun. 29, 2020 in Application No. 108137226.
TIPO; Office Action dated Jul. 9, 2020 in Application No. 108137227.
TIPO; Office Action dated Aug. 17, 2020 in Application No. 108139018.
TIPO; Office Action dated Jan. 15, 2021 in Application No. 108142842.
TIPO; Office Action dated Jan. 25, 2021 in Application No. 108143562.
TIPO; Notice of Allowance dated Oct. 19, 2020 in Application No. 108306935.
TIPO; Notice of Allowance dated Oct. 19, 2020 in Application No. 108306935D01.
TIPO; Notice of Allowance dated Jul. 15, 2020 in Application No. 108307027.
TIPO; Notice of Allowance dated Oct. 19, 2020 in Application No. 108307027D01.
TIPO; Notice of Allowance dated Sep. 15, 2020 in Application No. 108307301.
TIPO; Notice of Allowance dated Nov. 24, 2020 in Application No. 108307599.
TIPO; Notice of Allowance dated Jan. 11, 2021 in Application No. 108307599D01.
TIPO; Notice of Allowance dated Sep. 25, 2020 in Application No. 108307759.
TIPO; Notice of Allowance dated Jan. 11, 2021 in Application No. 109300591.
TIPO; Notice of Allowance dated Jan. 11, 2021 in Application No. 109300593.
TIPO; Office Action dated Jan. 11, 2021 in Application No. 109300594.
TIPO; Notice of Allowance dated May 18, 2021 in Application No. 109300595.
TIPO; Notice of Allowance dated Mar. 30, 2021 in Application No. 109305460.
USPTO; Non-Final Office Action dated Mar. 28, 2001 in U.S. Appl. No. 09/452,844.
USPTO; Final Office Action dated Sep. 11, 2001 in U.S. Appl. No. 09/452,844.
USPTO; Advisory Action dated Jan. 24, 2002 in U.S. Appl. No. 09/452,844.
USPTO; Non-Final Office Action dated Apr. 9, 2002 in U.S. Appl. No. 09/452,844.
USPTO; Final Office Action dated Sep. 27, 2002 in U.S. Appl. No. 09/452,844.
USPTO; Notice of Allowance dated Jun. 17, 2003 in U.S. Appl. No. 09/452,844.
USPTO; Non-Final Office Action dated Oct. 31, 2003 in U.S. Appl. No. 09/452,844.
USPTO; Notice of Allowance dated Mar. 26, 2004 in U.S. Appl. No. 09/452,844.
USPTO; Non-Final Office Action dated Dec. 10, 2002 in U.S. Appl. No. 09/771,673.
USPTO; Final Office Action dated May 29, 2003 in U.S. Appl. No. 09/771,673.
USPTO; Final Office Action dated Feb. 6, 2004 in U.S. Appl. No. 09/771,673.
USPTO; Advisory Action dated Apr. 20, 2004 in U.S. Appl. No. 09/771,673.
USPTO; Notice of Allowance dated Jul. 29, 2004 in U.S. Appl. No. 09/771,673.
USPTO; Non-Final Office Action dated Jan. 3, 2002 in U.S. Appl. No. 09/807,580.
USPTO; Final Office Action dated Jun. 21, 2002 in U.S. Appl. No. 09/807,580.

(56) References Cited

OTHER PUBLICATIONS

USPTO; Advisory Action dated Aug. 27, 2002 in U.S. Appl. No. 09/807,580.
USPTO; Non-Final Action dated Nov. 27, 2002 in U.S. Appl. No. 09/807,580.
USPTO; Final Office Action dated May 27, 2003 in U.S. Appl. No. 09/807,580.
USPTO; Advisory Action dated Oct. 22, 2003 in U.S. Appl. No. 09/807,580.
USPTO; Examiner's Answer to Appeal Brief dated May 6, 2004 in U.S. Appl. No. 09/807,580.
USPTO; Decision on Appeal dated Feb. 16, 2005 in U.S. Appl. No. 09/807,580.
USPTO; Non-Final Action dated May 19, 2005 in U.S. Appl. No. 09/807,580.
USPTO; Final Action dated Nov. 21, 2005 in U.S. Appl. No. 09/807,580.
USPTO; Notice of Allowance dated Feb. 23, 2006 in U.S. Appl. No. 09/807,580.
USPTO; Notice of Allowance dated Jul. 26, 2005 in U.S. Appl. No. 10/033,058.
USPTO; Non-Final Office Action dated Aug. 25, 2005 in U.S. Appl. No. 10/191,635.
USPTO; Final Office Action dated Apr. 25, 2006 in U.S. Appl. No. 10/191,635.
USPTO; Non-Final Office Action dated Nov. 20, 2006 in U.S. Appl. No. 10/191,635.
USPTO; Notice of Allowance dated May 21, 2007 in U.S. Appl. No. 10/191,635.
USPTO; Notice of Allowance dated Feb. 20, 2008 in U.S. Appl. No. 10/191,635.
USPTO; Non-Final Office Action dated May 13, 2003 in U.S. Appl. No. 10/222,229.
USPTO; Non-Final Office Action dated Oct. 22, 2003 in U.S. Appl. No. 10/222,229.
USPTO; Final Office Action dated Mar. 22, 2004 in U.S. Appl. No. 10/222,229.
USPTO; Advisory Action dated Oct. 7, 2004 in U.S. Appl. No. 10/222,229.
USPTO; Non-Final Office Action dated Dec. 22, 2004 in U.S. Appl. No. 10/222,229.
USPTO; Final Office Action dated Jun. 20, 2005 in U.S. Appl. No. 10/222,229.
USPTO; Advisory Action dated Nov. 16, 2005 in U.S. Appl. No. 10/222,229.
USPTO; Notice of Allowance dated Mar. 8, 2006 in U.S. Appl. No. 10/222,229.
USPTO; Non-Final Office Action dated Feb. 9, 2004 in U.S. Appl. No. 10/603,515.
USPTO; Notice of Allowance dated Jun. 18, 2004 in U.S. Appl. No. 10/603,515.
USPTO; Non-Final Office Action dated Jan. 26, 2005 in U.S. Appl. No. 10/838,510.
USPTO; Notice of Allowance dated Jul. 12, 2005 in U.S. Appl. No. 10/838,510.
USPTO; Non-Final Office Action dated Oct. 17, 2006 in U.S. Appl. No. 10/932,633.
USPTO; Non-Final Office Action dated Apr. 19, 2007 in U.S. Appl. No. 10/932,633.
USPTO; Notice of Allowance dated Sep. 10, 2007 in U.S. Appl. No. 10/932,633.
USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Non-Final Office Action dated Apr. 28, 2010 in U.S. Appl. No. 12/121,085.
USPTO; Notice of Allowance dated Jul. 26, 2010 in U.S. Appl. No. 12/121,085.
USPTO; Notice of Allowance dated Oct. 4, 2010 in U.S. Appl. No. 12/121,085.
USPTO; Non-Final Office Action dated Sep. 13, 2010 in U.S. Appl. No. 12/140,809.
USPTO; Final Office Action dated Dec. 28, 2010 in U.S. Appl. No. 12/140,809.
USPTO; Notice of Allowance dated Mar. 17, 2011 in U.S. Appl. No. 12/140,809.
USPTO; Non-Final Office Action dated Mar. 15, 2011 in U.S. Appl. No. 12/193,924.
USPTO; Foma; Office Action dated Sep. 30, 2011 in U.S. Appl. No. 12/193,924.
USPTO; Non-Final Office Action dated Oct. 24, 2012 in U.S. Appl. No. 12/193,924.
USPTO; Final Office Action dated Apr. 17, 2013 in U.S. Appl. No. 12/193,924.
USPTO; Advisory Action dated Jul. 9, 2013 in U.S. Appl. No. 12/193,924.
USPTO; Non-Final Office Action dated Jul. 28, 2011 in U.S. Appl. No. 12/330,096.
USPTO; Final Office Action dated Jan. 13, 2012 in U.S. Appl. No. 12/330,096.
USPTO; Notice of Allowance dated Mar. 6, 2012 in U.S. Appl. No. 12/330,096.
USPTO; Non-Final Office Action dated Mar. 20, 2012 in U.S. Appl. No. 12/330,096.
USPTO; Notice of Allowance dated Jun. 7, 2012 in U.S. Appl. No. 12/330,096.
USPTO; Non-Final Office Action dated Apr. 1, 2010 in U.S. Appl. No. 12/357,174.
USPTO; Final Office Action dated Sep. 1, 2010 in U.S. Appl. No. 12/357,174.
USPTO; Notice of Allowance dated Dec. 13, 2010 in U.S. Appl. No. 12/357,174.
USPTO; Non-Final Office Action dated Dec. 29, 2010 in U.S. Appl. No. 12/362,023.
USPTO; Non-Final Office Action dated Jul. 26, 2011 in U.S. Appl. No. 12/416,809.
USPTO; Final Office Action dated Dec. 6, 2011 in U.S. Appl. No. 12/416,809.
USPTO; Notice of Allowance dated Apr. 2, 2012 in U.S. Appl. No. 12/416,809.
USPTO; Advisory Action dated Feb. 3, 2012 in U.S. Appl. No. 12/416,809.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Non-Final Office Action dated Aug. 3, 2011 in U.S. Appl. No. 12/436,300.
USPTO; Final Office Action dated Jan. 23, 2012 in U.S. Appl. No. 12/436,300.
USPTO; Advisory Action dated Mar. 6, 2012 in U.S. Appl. No. 12/436,300.
USPTO; Non-Final Office Action dated May 22, 2012 in U.S. Appl. No. 12/436,300.
USPTO; Notice of Allowance dated Nov. 28, 2012 in U.S. Appl. No. 12/436,300.
USPTO; Non-Final Office Action dated Apr. 11, 2012 in U.S. Appl. No. 12/436,306.
USPTO; Final Office Action dated Sep. 26, 2012 in U.S. Appl. No. 12/436,306.
USPTO; Non-Final Office Action dated May 31, 2013 in U.S. Appl. No. 12/436,306.
USPTO; Final Office Action dated Oct. 17, 2013 in U.S. Appl. No. 12/436,306.
USPTO; Non-Final Office Action dated Feb. 4, 2014 in U.S. Appl. No. 12/436,306.
USPTO; Final Office Action dated Jun. 23, 2014 in U.S. Appl. No. 12/436,306.
USPTO; Advisory Action dated Oct. 1, 2014 in U.S. Appl. No. 12/436,306.

(56) References Cited

OTHER PUBLICATIONS

USPTO; Non-Final Office Action dated Feb. 3, 2015 in U.S. Appl. No. 12/436,306.
USPTO; Final Office Action dated May 13, 2015 in U.S. Appl. No. 12/436,306.
USPTO; Non-Final Office Action dated Oct. 14, 2015 in U.S. Appl. No. 12/436,306.
USPTO; Final Office Action dated Dec. 31, 2015 in U.S. Appl. No. 12/436,306.
USPTO; Notice of Allowance dated Feb. 3, 2016 in U.S. Appl. No. 12/436,306.
USPTO; Non-Final Office Action dated Aug. 3, 2011 in U.S. Appl. No. 12/436,315.
USPTO; Notice of Allowance dated Nov. 17, 2011 in U.S. Appl. No. 12/436,315.
USPTO; Notice of Allowance dated Oct. 1, 2010 in U.S. Appl. No. 12/467,017.
USPTO; Non-Final Office Action dated Mar. 18, 2010 in U.S. Appl. No. 12/489,252.
USPTO; Notice of Allowance dated Sep. 2, 2010 in U.S. Appl. No. 12/489,252.
USPTO; Non-Final Office Action dated Dec. 15, 2010 in U.S. Appl. No. 12/553,759.
USPTO; Final Office Action dated May 4, 2011 in U.S. Appl. No. 12/553,759.
USPTO; Advisory Action dated Jul. 13, 2011 in U.S. Appl. No. 12/553,759.
USPTO; Non-Final Office Action dated Sep. 6, 2011 in U.S. Appl. No. 12/553,759.
USPTO; Notice of Allowance dated Jan. 27, 2012 in U.S. Appl. No. 12/553,759.
USPTO; Non-Final Office Action dated Oct. 19, 2012 in U.S. Appl. No. 12/618,355.
USPTO; Final Office Action dated May 8, 2013 in U.S. Appl. No. 12/618,355.
USPTO; Advisory Action dated Jul. 23, 2013 in U.S. Appl. No. 12/618,355.
USPTO; Non-Final Office Action dated Apr. 8, 2015 in U.S. Appl. No. 12/618,355.
USPTO; Final Office Action dated Oct. 22, 2015 in U.S. Appl. No. 12/618,355.
USPTO; Advisory Action dated Mar. 4, 2016 in U.S. Appl. No. 12/618,355.
USPTO; Non-Final Office Action dated Jun. 30, 2016 in U.S. Appl. No. 12/618,355.
USPTO; Final Office Action dated Feb. 10, 2017 in U.S. Appl. No. 12/618,355.
USPTO; Advisory Action dated May 16, 2017 in U.S. Appl. No. 12/618,355.
USPTO; Non-Final Office Action dated Nov. 29, 2017 in U.S. Appl. No. 12/618,355.
USPTO; Final Office Action dated Aug. 10, 2018 in U.S. Appl. No. 12/618,355.
USPTO; Notice of Allowance dated Apr. 4, 2019 in U.S. Appl. No. 12/618,355.
USPTO; Non-Final Office Action dated Feb. 16, 2012 in U.S. Appl. No. 12/618,419.
USPTO; Final Office Action dated Jun. 22, 2012 in U.S. Appl. No. 12/618,419.
USPTO; Non-Final Office Action dated Nov. 27, 2012 in U.S. Appl. No. 12/618,419.
USPTO; Advisory Action dated Aug. 9, 2012 in U.S. Appl. No. 12/618,419.
USPTO; Notice of Allowance dated Apr. 12, 2013 in U.S. Appl. No. 12/618,419.
USPTO; Non-Final Office Action dated Jun. 12, 2013 in U.S. Appl. No. 12/618,419.
USPTO; Notice of Allowance dated Oct. 9, 2013 in U.S. Appl. No. 12/618,419.
USPTO; Non-Final Office Action dated Dec. 6, 2011 in U.S. Appl. No. 12/718,731.
USPTO; Notice of Allowance dated Mar. 16, 2012 in U.S. Appl. No. 12/718,731.
USPTO; Office Action dated Feb. 26, 2013 in U.S. Appl. No. 12/754,223.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Final Office Action dated Jul. 14, 2014 in U.S. Appl. No. 12/754,223.
USPTO; Non-Final Office Action dated Mar. 25, 2015 in U.S. Appl. No. 12/754,223.
USPTO; Final Office Action dated Aug. 12, 2015 in U.S. Appl. No. 12/754,223.
USPTO; Notice of Allowance dated May 23, 2016 in U.S. Appl. No. 12/754,223.
USPTO; Office Action dated Apr. 23, 2013 in U.S. Appl. No. 12/763,037.
USPTO; Final Office Action dated Oct. 21, 2013 in U.S. Appl. No. 12/763,037.
USPTO; Office Action dated Oct. 8, 2014 in U.S. Appl. No. 12/763,037.
USPTO; Notice of Allowance dated Jan. 27, 2015 in U.S. Appl. No. 12/763,037.
USPTO; Non-Final Office Action dated Jan. 24, 2011 in U.S. Appl. No. 12/778,808.
USPTO; Notice of Allowance dated May 9, 2011 in U.S. Appl. No. 12/778,808.
USPTO; Notice of Allowance dated Oct. 12, 2012 in U.S. Appl. No. 12/832,739.
USPTO; Non-Final Office Action dated Oct. 16, 2012 in U.S. Appl. No. 12/847,848.
USPTO; Final Office Action dated Apr. 22, 2013 in U.S. Appl. No. 12/847,848.
USPTO; Advisory Action dated Jul. 1, 2013 in U.S. Appl. No. 12/847,848.
USPTO; Notice of Allowance dated Jan. 16, 2014 in U.S. Appl. No. 12/847,848.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Office Action dated Jun. 3, 2014 in U.S. Appl. No. 12/854,818.
USPTO; Non-Final Office Action dated Jul. 11, 2012 in U.S. Appl. No. 12/875,889.
USPTO; Notice of Allowance dated Jan. 4, 2013 in U.S. Appl. No. 12/875,889.
USPTO; Notice of Allowance dated Jan. 9, 2012 in U.S. Appl. No. 12/901,323.
USPTO; Non-Final Office Action dated Nov. 20, 2013 in U.S. Appl. No. 12/910,607.
USPTO; Final Office Action dated Apr. 28, 2014 in U.S. Appl. No. 12/910,607.
USPTO; Advisory Action dated Jul. 9, 2014 in U.S. Appl. No. 12/910,607.
USPTO; Notice of Allowance dated Aug. 15, 2014 in U.S. Appl. No. 12/910,607.
USPTO; Non-Final Office Action dated Oct. 24, 2012 in U.S. Appl. No. 12/940,906.
USPTO; Final Office Action dated Feb. 13, 2013 in U.S. Appl. No. 12/940,906.
USPTO; Notice of Allowance dated Apr. 23, 2013 in U.S. Appl. No. 12/940,906.
USPTO; Non-Final Office Action dated Dec. 7, 2012 in U.S. Appl. No. 12/953,870.

(56) References Cited

OTHER PUBLICATIONS

USPTO; Final Office Action dated Apr. 22, 2013 in U.S. Appl. No. 12/953,870.
USPTO; Advisory Action dated Jul. 8, 2013 in U.S. Appl. No. 12/953,870.
USPTO; Non-Final Office Action dated Aug. 28, 2013 in U.S. Appl. No. 12/953,870.
USPTO; Final Office Action dated Apr. 17, 2014 in U.S. Appl. No. 12/953,870.
USPTO; Non-Final Office Action dated Sep. 19, 2012 in U.S. Appl. No. 13/016,735.
USPTO; Final Office Action dated Feb. 11, 2013 in U.S. Appl. No. 13/016,735.
USPTO; Notice of Allowance dated Apr. 24, 2013 in U.S. Appl. No. 13/016,735.
USPTO; Non-Final Office Action dated Apr. 4, 2012 in U.S. Appl. No. 13/030,438.
USPTO; Final Office Action dated Aug. 22, 2012 in U.S. Appl. No. 13/030,438.
USPTO; Notice of Allowance dated Oct. 24, 2012 in U.S. Appl. No. 13/030,438.
USPTO; Non-Final Office Action dated Dec. 3, 2012 in U.S. Appl. No. 13/040,013.
USPTO; Notice of Allowance dated May 3, 2013 in U.S. Appl. No. 13/040,013.
USPTO; Non-Final Office Action dated Feb. 15, 2012 in U.S. Appl. No. 13/085,531.
USPTO; Notice of Allowance dated Jul. 12, 2012 in U.S. Appl. No. 13/085,531.
USPTO; Notice of Allowance dated Sep. 13, 2012 in U.S. Appl. No. 13/085,698.
USPTO; Non-Final Office Action dated Mar. 29, 2013 in U.S. Appl. No. 13/094,402.
USPTO; Final Office Action dated Jul. 17, 2013 in U.S. Appl. No. 13/094,402.
USPTO; Notice of Allowance dated Sep. 30, 2013 in U.S. Appl. No. 13/094,402.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Advisory Action dated Jun. 12, 2014 in U.S. Appl. No. 13/102,980.
USPTO; Notice of Allowance dated Jul. 3, 2014 in U.S. Appl. No. 13/102,980.
USPTO; Notice of Allowance dated Sep. 17, 2014 in U.S. Appl. No. 13/102,980.
USPTO; Non-Final Office Action dated Jul. 17, 2014 in U.S. Appl. No. 13/154,271.
USPTO; Final Office Action dated Jan. 2, 2015 in U.S. Appl. No. 13/154,271.
USPTO; Non-Final Office Action dated May 27, 2015 in U.S. Appl. No. 13/154,271.
USPTO; Final Office Action dated Nov. 23, 2015 in U.S. Appl. No. 13/154,271.
USPTO; Notice of Allowance dated Feb. 10, 2016 in U.S. Appl. No. 13/154,271.
USPTO; Non-Final Office Action dated Jun. 27, 2016 in U.S. Appl. No. 13/166,367.
USPTO; Final Office Action dated Dec. 30, 2016 in U.S. Appl. No. 13/166,367.
USPTO; Advisory Action dated Apr. 21, 2017 in U.S. Appl. No. 13/166,367.
USPTO; Notice of Allowance dated Jun. 28, 2017 in U.S. Appl. No. 13/166,367.
USPTO; Non-Final Office Action dated Oct. 27, 2014 in U.S. Appl. No. 13/169,951.
USPTO; Final Office Action dated May 26, 2015 in U.S. Appl. No. 13/169,951.
USPTO; Non-Final Office Action dated Sep. 1, 2015 in U.S. Appl. No. 13/169,951.
USPTO; Final Office Action dated Mar. 3, 2016 in U.S. Appl. No. 13/169,951.
USPTO; Non-Final Office Action dated Jun. 9, 2016 in U.S. Appl. No. 13/169,951.
USPTO; Final Office Action dated Dec. 9, 2016 in U.S. Appl. No. 13/169,951.
USPTO; Advisory Action dated May 13, 2016 in U.S. Appl. No. 13/169,951.
USPTO; Advisory Action dated Feb. 15, 2017 in U.S. Appl. No. 13/169,951.
USPTO; Non-Final Office Action dated Apr. 26, 2017 in U.S. Appl. No. 13/169,951.
USPTO; Final Office Action dated Nov. 2, 2017 in U.S. Appl. No. 13/169,951.
USPTO; Advisory Action dated Feb. 8, 2018 in U.S. Appl. No. 13/169,951.
USPTO; Non-Final Office Action dated Apr. 6, 2018 in U.S. Appl. No. 13/169,951.
USPTO; Final Office Action dated Nov. 2, 2018 in U.S. Appl. No. 13/169,951.
USPTO; Advisory Action dated Feb. 4, 2019 in U.S. Appl. No. 13/169,951.
USPTO; Notice of Allowance dated Apr. 4, 2019 in U.S. Appl. No. 13/169,951.
USPTO; Non-Final Office Action dated Jun. 24, 2014 in U.S. Appl. No. 13/181,407.
USPTO; Final Office Action dated Sep. 24, 2014 in U.S. Appl. No. 13/181,407.
USPTO; Advisory Action dated Dec. 17, 2014 in U.S. Appl. No. 13/181,407.
USPTO; Non-Final Office Action dated Jan. 2, 2015 in U.S. Appl. No. 13/181,407.
USPTO; Final Office Action dated Apr. 8, 2015 in U.S. Appl. No. 13/181,407.
USPTO; Non-Final Office Action dated Jan. 23, 2013 in U.S. Appl. No. 13/184,351.
USPTO; Final Office Action dated Jul. 29, 2013 in U.S. Appl. No. 13/184,351.
USPTO; Advisory Action dated Nov. 7, 2013 in U.S. Appl. No. 13/184,351.
USPTO; Non-Final Office Action dated Jul. 16, 2014 in U.S. Appl. No. 13/184,351.
USPTO; Final Office Action dated Feb. 17, 2015 in U.S. Appl. No. 13/184,351.
USPTO; Advisory Action dated May 18, 2015 in U.S. Appl. No. 13/184,351.
USPTO; Non-Final Office Action dated Aug. 10, 2015 in U.S. Appl. No. 13/184,351.
USPTO; Final Office Action dated Feb. 12, 2016 in U.S. Appl. No. 13/184,351.
USPTO; Non-Final Office Action dated Dec. 15, 2016 in U.S. Appl. No. 13/184,351.
USPTO; Final Office Action dated Jun. 15, 2017 in U.S. Appl. No. 13/184,351.
USPTO; Advisory Action dated Oct. 4, 2017 in U.S. Appl. No. 13/184,351.
USPTO; Non-Final Office Action dated Jul. 26, 2018 in U.S. Appl. No. 13/184,351.
USPTO; Final Office Action dated Dec. 28, 2018 in U.S. Appl. No. 13/184,351.
USPTO; Non-Final Office Action dated Aug. 19, 2019 in U.S. Appl. No. 13/184,351.
USPTO; Notice of Allowance dated Jul. 6, 2020 in U.S. Appl. No. 13/184,351.
USPTO; Non-Final Office Action dated Sep. 17, 2014 in U.S. Appl. No. 13/187,300.
USPTO; Final Office Action dated Apr. 15, 2015 in U.S. Appl. No. 13/187,300.
USPTO; Non-Final Office Action dated Apr. 7, 2016 in U.S. Appl. No. 13/187,300.

(56) References Cited

OTHER PUBLICATIONS

USPTO; Final Office Acton dated Sep. 23, 2016 in U.S. Appl. No. 13/187,300.
USPTO; Non-Final Office Action dated Jan. 30, 2017 in U.S. Appl. No. 13/187,300.
USPTO; Final Office Action dated Aug. 9, 2017 in U.S. Appl. No. 13/187,300.
USPTO; Examiner's Answer to Appeal Brief dated Apr. 20, 2018 in U.S. Appl. No. 13/187,300.
USPTO; Patent Board Decision dated Sep. 23, 2019 in U.S. Appl. No. 13/187,300.
USPTO; Non-Final Office Action dated Oct. 1, 2012 in U.S. Appl. No. 13/191,762.
USPTO; Final Office Action dated Apr. 10, 2013 in U.S. Appl. No. 13/191,762.
USPTO; Notice of Allowance dated Aug. 15, 2013 in U.S. Appl. No. 13/191,762.
USPTO; Non-Final Office Action dated Oct. 22, 2012 in U.S. Appl. No. 13/238,960.
USPTO; Final Office Action dated May 3, 2013 in U.S. Appl. No. 13/238,960.
USPTO; Non-Final Office Action dated Apr. 26, 2013 in U.S. Appl. No. 13/250,721.
USPTO; Notice of Allowance dated Sep. 11, 2013 in U.S. Appl. No. 13/250,721.
USPTO; Non-Final Office Action dated Jul. 2, 2014 in U.S. Appl. No. 13/283,408.
USPTO; Final Office Action dated Jan. 29, 2015 in U.S. Appl. No. 13/283,408.
USPTO; Non-Final Office Action dated Jun. 17, 2015 in U.S. Appl. No. 13/283,408.
USPTO; Final Office Action dated Dec. 18, 2015 in U.S. Appl. No. 13/283,408.
USPTO; Advisory Action dated Mar. 28, 2016 in U.S. Appl. No. 13/283,408.
USPTO; Notice of Allowance dated Mar. 28, 2016 in U.S. Appl. No. 13/283,408.
USPTO; Non-Final Office Action dated Jul. 30, 2014 in U.S. Appl. No. 13/284,642.
USPTO; Notice of Allowance dated Feb. 11, 2015 in U.S. Appl. No. 13/284,642.
USPTO; Non-Final Office Action dated Jan. 28, 2014 in U.S. Appl. No. 13/312,591.
USPTO; Final Office Action dated May 14, 2014 in U.S. Appl. No. 13/312,591.
USPTO; Advisory Action dated Aug. 26, 2014 in U.S. Appl. No. 13/312,591.
USPTO; Non-Final Office Action dated Nov. 26, 2014 in U.S. Appl. No. 13/312,591.
USPTO; Final Office Action dated Mar. 20, 2015 in U.S. Appl. No. 13/312,591.
USPTO; Notice of Allowance dated May 14, 2015 in U.S. Appl. No. 13/312,591.
USPTO; Notice of Allowance dated Jun. 11, 2015 in U.S. Appl. No. 13/312,591.
USPTO; Non-Final Office Action dated Apr. 9, 2014 in U.S. Appl. No. 13/333,420.
USPTO; Notice of Allowance dated Sep. 15, 2014 in U.S. Appl. No. 13/333,420.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Non-Final Office Action dated Oct. 10, 2012 in U.S. Appl. No. 13/406,791.
USPTO; Final Office Action dated Jan. 31, 2013 in U.S. Appl. No. 13/406,791.
USPTO; Advisory Action dated Mar. 27, 2013 in U.S. Appl. No. 13/406,791.
USPTO; Non-Final Office Action dated Apr. 25, 2013 in U.S. Appl. No. 13/406,791.
USPTO; Final Office Action dated Aug. 23, 2013 in U.S. Appl. No. 13/406,791.
USPTO; Advisory Action dated Oct. 29, 2013 in U.S. Appl. No. 13/406,791.
USPTO; Non-Final Office Action dated Dec. 4, 2013 in U.S. Appl. No. 13/406,791.
USPTO; Final Office Action dated Apr. 21, 2014 in U.S. Appl. No. 13/406,791.
USPTO; Non-Final Office Action dated Jan. 14, 2013 in U.S. Appl. No. 13/410,970.
USPTO; Notice of Allowance dated Feb. 14, 2013 in U.S. Appl. No. 13/410,970.
USPTO; Non-Final Office Action dated Feb. 13, 2014 in U.S. Appl. No. 13/411,271.
USPTO; Non-Final Office Action dated Jul. 31, 2014 in U.S. Appl. No. 13/411,271.
USPTO; Advisory Action dated Apr. 22, 2015 in U.S. Appl. No. 13/411,271.
USPTO; Final Office Action dated Jan. 16, 2015 in U.S. Appl. No. 13/411,271.
USPTO; Notice of Allowance dated Oct. 6, 2015 in U.S. Appl. No. 13/411,271.
USPTO; Office Action dated Feb. 4, 2014 in U.S. Appl. No. 13/439,528.
USPTO; Final Office Action dated Jul. 8, 2014 in U.S. Appl. No. 13/439,528.
UPPTO; Notice of Allowance dated Oct. 21, 2014 in U.S. Appl. No. 13/439,528.
USPTO; Non-Final Office Action dated Apr. 11, 2013 in U.S. Appl. No. 13/450,368.
USPTO; Notice of Allowance dated Jul. 17, 2013 in U.S. Appl. No. 13/450,368.
USPTO; Non-Final Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Non-Final Office Action dated Oct. 17, 2013 in U.S. Appl. No. 13/493,897.
USPTO; Notice of Allowance dated Mar. 20, 2014 in U.S. Appl. No. 13/493,897.
USPTO; Non-Final Office Action dated Dec. 20, 2013 in U.S. Appl. No. 13/535,214.
USPTO; Final Office Action dated Jun. 18, 2014 in U.S. Appl. No. 13/535,214.
USPTO; Notice of Allowance dated Oct. 23, 2014 in U.S. Appl. No. 13/535,214.
USPTO; Non-Final Office Action dated Sep. 11, 2013 in U.S. Appl. No. 13/550,419.
USPTO; Final Office Action dated Jan. 27, 2014 in U.S. Appl. No. 13/550,419.
USPTO; Advisory Action dated Mar. 31, 2014 in U.S. Appl. No. 13/550,419.
USPTO; Notice of Allowance dated May 29, 2014 in U.S. Appl. No. 13/550,419.
USPTO; Non-Final Office Action dated Aug. 8, 2014 in U.S. Appl. No. 13/563,066.
USPTO; Final Office Action dated Feb. 12, 2015 in U.S. Appl. No. 13/563,066.
USPTO; Advisory Action dated Apr. 16, 2015 in U.S. Appl. No. 13/563,066.
USPTO; Notice of Allowance dated Jun. 12, 2015 in U.S. Appl. No. 13/563,066.

(56) References Cited

OTHER PUBLICATIONS

USPTO; Notice of Allowance dated Jul. 16, 2015 in U.S. Appl. No. 13/563,066.
USPTO; Non-Final Office Action dated May 28, 2013 in U.S. Appl. No. 13/563,274.
USPTO; Notice of Allowance dated Sep. 27, 2013 in U.S. Appl. No. 13/563,274.
USPTO; Non-Final Office Action dated Nov. 7, 2013 in U.S. Appl. No. 13/565,564.
USPTO; Final Office Action dated Feb. 28, 2014 in U.S. Appl. No. 13/565,564.
USPTO; Advisory Action dated May 5, 2014 in U.S. Appl. No. 13/565,564.
USPTO; Non-Final Office Action dated Jul. 2, 2014 in U.S. Appl. No. 13/565,564.
USPTO; Notice of Allowance dated Nov. 3, 2014 in U.S. Appl. No. 13/565,564.
USPTO; Notice of Allowance dated Sep. 13, 2013 in U.S. Appl. No. 13/566,069.
USPTO; Non-Final Office Action dated Aug. 30, 2013 in U.S. Appl. No. 13/570,067.
USPTO; Notice of Allowance dated Jan. 6, 2014 in U.S. Appl. No. 13/570,067.
USPTO; Non-Final Office Action dated Oct. 15, 2014 in U.S. Appl. No. 13/597,043.
USPTO; Final Office Action dated Mar. 13, 2015 in U.S. Appl. No. 13/597,043.
USPTO; Notice of Allowance dated Aug. 28, 2015 in U.S. Appl. No. 13/597,043.
USPTO; Non-Final Office Action dated Feb. 12, 2015 in U.S. Appl. No. 13/597,108.
USPTO; Final Office Action dated Jun. 1, 2015 in U.S. Appl. No. 13/597,108.
USPTO; Advisory Action dated Sep. 2, 2015 in U.S. Appl. No. 13/597,108.
USPTO; Non-Final Office Action dated Dec. 8, 2015 in U.S. Appl. No. 13/597,108.
USPTO; Final Office Action dated Jun. 2, 2016 in U.S. Appl. No. 13/597,108.
USPTO; Non-Final Office Action dated Sep. 15, 2016 in U.S. Appl. No. 13/597,108.
USPTO; Notice of Allowance dated Mar. 7, 2017 in U.S. Appl. No. 13/597,108.
USPTO; Notice of Allowance dated Mar. 27, 2014 in U.S. Appl. No. 13/604,498.
USPTO; Non-Final Office Action dated Nov. 15, 2013 in U.S. Appl. No. 13/612,538.
USPTO; Non-Final Office Action dated Jul. 10, 2014 in U.S. Appl. No. 13/612,538.
USPTO; Notice of Allowance dated Feb. 25, 2015 in U.S. Appl. No. 13/612,538.
USPTO; Non-Final Office Action dated Apr. 15, 2015 in U.S. Appl. No. 13/646,403.
USPTO; Final Office Action dated Oct. 15, 2015 in U.S. Appl. No. 13/646,403.
USPTO; Notice of Allowance dated Feb. 2, 2016 in U.S. Appl. No. 13/646,403.
USPTO; Non-Final Office Action dated May 15, 2014 in U.S. Appl. No. 13/646,471.
USPTO; Final Office Action dated Aug. 18, 2014 in U.S. Appl. No. 13/646,471.
USPTO; Advisory Action dated Nov. 14, 2014 in U.S. Appl. No. 13/646,471.
USPTO; Non-Final Office Action dated Dec. 16, 2014 in U.S. Appl. No. 13/646,471.
USPTO; Final Office Action dated Apr. 21, 2015 in U.S. Appl. No. 13/646,471.
USPTO; Non-Final Office Action dated Aug. 19, 2015 in U.S. Appl. No. 13/646,471.
USPTO; Final Office Action dated Jan. 22, 2016 in U.S. Appl. No. 13/646,471.
USPTO; Advisory Action dated Apr. 15, 2016 in U.S. Appl. No. 13/646,471.
USPTO; Non-Final Office Action dated Jun. 2, 2016 in U.S. Appl. No. 13/646,471.
USPTO; Final Office Action dated Oct. 20, 2016 in U.S. Appl. No. 13/646,471.
USPTO; Non-Final Office Action dated May 28, 2015 in U.S. Appl. No. 13/651,144.
USPTO; Final Office Action dated Dec. 14, 2017 in U.S. Appl. No. 13/651,144.
USPTO; Final Office Action dated Nov. 19, 2015 in U.S. Appl. No. 13/651,144.
USPTO; Advisory Action dated Feb. 12, 2016 in U.S. Appl. No. 13/651,144.
USPTO; Non-Final Office Action dated May 10, 2016 in U.S. Appl. No. 13/651,144.
USPTO; Final Office Action dated Sep. 20, 2016 in U.S. Appl. No. 13/651,144.
USPTO; Advisory Action dated Dec. 29, 2016 in U.S. Appl. No. 13/651,144.
USPTO; Non-Final Office Action dated May 17, 2017 in U.S. Appl. No. 13/651,144.
USPTO; Non-Final Office Action dated Dec. 14, 2017 in U.S. Appl. No. 13/651,144.
USPTO; Advisory Action dated Apr. 19, 2018 in U.S. Appl. No. 13/651,144.
USPTO; Non-Final Office Action dated Sep. 20, 2018 in U.S. Appl. No. 13/651,144.
USPTO; Final Office Action dated Mar. 15, 2019 in U.S. Appl. No. 13/651,144.
USPTO; Non-Final Office Action dated Sep. 18, 2019 in U.S. Appl. No. 13/651,144.
USPTO; Notice of Allowance dated Feb. 10, 2020 in U.S. Appl. No. 13/651,144.
USPTO; Advisory Action dated Jun. 26, 2015 in U.S. Appl. No. 13/791,246.
USPTO; Non-Final Office Action dated Jun. 18, 2015 in U.S. Appl. No. 13/665,366.
USPTO; Final Office Action dated Mar. 1, 2016 in U.S. Appl. No. 13/665,366.
USPTO; Advisory Action dated May 13, 2016 in U.S. Appl. No. 13/665,366.
USPTO; Non-Final Office Action dated Jun. 17, 2016 in U.S. Appl. No. 13/665,366.
USPTO; Final Office Action dated May 3, 2017 in U.S. Appl. No. 13/665,366.
USPTO; Non-Final Office Action dated Apr. 3, 2015 in U.S. Appl. No. 13/677,133.
USPTO; Notice of Allowance dated Aug. 4, 2015 in U.S. Appl. No. 13/677,133.
USPTO; Notice of Allowance dated Aug. 24, 2015 in U.S. Appl. No. 13/677,133.
USPTO; Office Action dated Jun. 2, 2014 in U.S. Appl. No. 13/677,151.
USPTO; Final Office Action dated Nov. 14, 2014 in U.S. Appl. No. 13/677,151.
USPTO; Notice of Allowance dated Feb. 26, 2015 in U.S. Appl. No. 13/677,151.
USPTO; Notice of Allowance dated Mar. 17, 2015 in U.S. Appl. No. 13/677,151.
USPTO; Non-Final Office Action dated Aug. 20, 2013 in U.S. Appl. No. 13/679,502.
USPTO; Final Office Action dated Feb. 25, 2014 in U.S. Appl. No. 13/679,502.
USPTO; Notice of Allowance dated May 2, 2014 in U.S. Appl. No. 13/679,502.
USPTO; Non-Final Office Action dated Jul. 21, 2015 in U.S. Appl. No. 13/727,324.
USPTO; Final Office Action dated Jan. 22, 2016 in U.S. Appl. No. 13/727,324.

(56) References Cited

OTHER PUBLICATIONS

USPTO; Advisory Action dated Apr. 6, 2016 in U.S. Appl. No. 13/727,324.
USPTO; Non-Final Office Action dated May 25, 2016 in U.S. Appl. No. 13/727,324.
USPTO; Final Office Action dated Dec. 1, 2016 in U.S. Appl. No. 13/727,324.
USPTO; Notice of Allowance dated Mar. 1, 2017 in U.S. Appl. No. 13/727,324.
USPTO; Non-Final Office Action dated Oct. 24, 2013 in U.S. Appl. No. 13/749,878.
USPTO; Non-Final Office Action dated Jun. 18, 2014 in U.S. Appl. No. 13/749,878.
USPTO; Final Office Action dated Dec. 10, 2014 in U.S. Appl. No. 13/749,878.
USPTO; Notice of Allowance dated Mar. 13, 2015 dated in U.S. Appl. No. 13/749,878.
USPTO; Non-Final Office Action dated Sep. 16, 2013 in U.S. Appl. No. 13/760,160.
USPTO; Final Office Action dated Dec. 27, 2013 in U.S. Appl. No. 13/760,160.
USPTO; Non-Final Office Action dated Jun. 4, 2014 in U.S. Appl. No. 13/760,160.
USPTO; Final Office Action dated Sep. 25, 2014 in U.S. Appl. No. 13/760,160.
USPTO; Final Office Action dated Jan. 28, 2015 in U.S. Appl. No. 13/760,160.
USPTO; Final Office Action dated May 12, 2015 in U.S. Appl. No. 13/760,160.
USPTO; Notice of Allowance dated Oct. 21, 2015 in U.S. Appl. No. 13/760,160.
USPTO; Notice of Allowance dated Jan. 20, 2016 in U.S. Appl. No. 13/760,160.
USPTO; Office Action dated Apr. 23, 2014 in U.S. Appl. No. 13/784,362.
USPTO; Notice of Allowance dated Aug. 13, 2014 in U.S. Appl. No. 13/784,362.
USPTO; Non-Final Office Action dated Dec. 19, 2013 in U.S. Appl. No. 13/784,388.
USPTO; Notice of Allowance dated Jun. 4, 2014 in U.S. Appl. No. 13/784,388.
USPTO; Non-Final Office Action dated Sep. 19, 2014 in U.S. Appl. No. 13/791,246.
USPTO; Final Office Action dated Mar. 25, 2015 in U.S. Appl. No. 13/791,246.
USPTO; Non-Final Office Action dated Oct. 26, 2015 in U.S. Appl. No. 13/791,246.
USPTO; Final Office Action dated Apr. 20, 2016 in U.S. Appl. No. 13/791,246.
USPTO; Advisory Action dated Jul. 13, 2016 in U.S. Appl. No. 13/791,246.
USPTO; Non-Final Office Action dated Aug. 11, 2016 in U.S. Appl. No. 13/791,246.
USPTO; Notice of Allowance dated Oct. 19, 2016 in U.S. Appl. No. 13/791,246.
USPTO; Notice of Allowance dated Nov. 25, 2016 in U.S. Appl. No. 13/791,246.
USPTO; Non-Final Office Action dated Nov. 6, 2015 in U.S. Appl. No. 13/791,339.
USPTO; Final Office Action dated Apr. 12, 2016 in U.S. Appl. No. 13/791,339.
USPTO; Advisory Action dated Jul. 14, 2016 in U.S. Appl. No. 13/791,339.
USPTO; Notice of Allowance dated Aug. 24, 2016 in U.S. Appl. No. 13/791,339.
USPTO; Non-Final Office Action dated Mar. 21, 2014 in U.S. Appl. No. 13/799,708.
USPTO; Notice of Allowance dated Oct. 31, 2014 in U.S. Appl. No. 13/799,708.
USPTO; Non-Final Office Action dated Oct. 9, 2014 in U.S. Appl. No. 13/874,708.
USPTO; Notice of Allowance dated Mar. 10, 2015 in U.S. Appl. No. 13/874,708.
USPTO; Notice of Allowance dated Apr. 10, 2014 in U.S. Appl. No. 13/901,341.
USPTO; Notice of Allowance dated Jun. 6, 2014 in U.S. Appl. No. 13/901,341.
USPTO; Non-Final Office Action dated Jan. 2, 2015 in U.S. Appl. No. 13/901,372.
USPTO; Final Office Action dated Apr. 16, 2015 in U.S. Appl. No. 13/901,372.
USPTO; Notice of Allowance dated Aug. 5, 2015 in U.S. Appl. No. 13/901,372.
USPTO; Advisory Action dated Jun. 29, 2015 in U.S. Appl. No. 13/901,372.
USPTO; Non-Final Office Action dated Jul. 8, 2015 in U.S. Appl. No. 13/901,400.
USPTO; Final Office Action dated Jan. 14, 2016 in U.S. Appl. No. 13/901,400.
USPTO; Notice of Allowance dated Apr. 12, 2016 in U.S. Appl. No. 13/901,400.
USPTO; Non-Final Office Action dated Apr. 24, 2014 in U.S. Appl. No. 13/912,666.
USPTO; Final Office Action dated Sep. 25, 2014 in U.S. Appl. No. 13/912,666.
USPTO; Advisory Action dated Dec. 11, 2014 in U.S. Appl. No. 13/912,666.
USPTO; Non-Final Office Action dated Jan. 26, 2015 in U.S. Appl. No. 13/912,666.
USPTO; Notice of Allowance dated Jun. 25, 2015 in U.S. Appl. No. 13/912,666.
USPTO; Non-Final Office Action dated Dec. 16, 2014 in U.S. Appl. No. 13/915,732.
USPTO; Final Office Action dated Apr. 10, 2015 in U.S. Appl. No. 13/915,732.
USPTO; Notice of Allowance dated Jun. 19, 2015 in U.S. Appl. No. 13/915,732.
USPTO; Notice of Allowance dated Mar. 17, 2015 in U.S. Appl. No. 13/923,197.
USPTO; Non-Final Office Action dated Sep. 12, 2014 in U.S. Appl. No. 13/941,134.
USPTO; Notice of Allowance dated Jan. 20, 2015 in U.S. Appl. No. 13/941,134.
USPTO; Non-Final Office Action dated Jul. 30, 2015 in U.S. Appl. No. 13/941,216.
USPTO; Final Office Action dated Mar. 1, 2016 in U.S. Appl. No. 13/941,216.
USPTO; Non-Final Office Action dated Jun. 15, 2016 in U.S. Appl. No. 13/941,216.
USPTO; Notice of Allowance dated Sep. 13, 2016 in U.S. Appl. No. 13/941,216.
USPTO; Notice of Allowance dated Nov. 14, 2016 in U.S. Appl. No. 13/941,216.
USPTO; Non-Final Office Action dated Jan. 14, 2014 in U.S. Appl. No. 13/941,226.
USPTO; Non-Final Office Action dated Jul. 8, 2014 in U.S. Appl. No. 13/941,226.
USPTO; Non-Final Office Action dated Feb. 3, 2015 in U.S. Appl. No. 13/941,226.
USPTO; Final Office Action dated Feb. 12, 2016 in U.S. Appl. No. 13/941,226.
USPTO; Advisory Action dated Jul. 29, 2016 in U.S. Appl. No. 13/941,226.
USPTO; Non-Final Office Action dated Aug. 8, 2017 in U.S. Appl. No. 13/941,226.
USPTO; Notice of Allowance dated Aug. 13, 2018 in U.S. Appl. No. 13/941,226.
USPTO; Notice of Allowance dated Oct. 3, 2018 in U.S. Appl. No. 13/941,226.
USPTO; Non-Final Office Action dated Oct. 30, 2014 in U.S. Appl. No. 13/948,055.

(56) References Cited

OTHER PUBLICATIONS

USPTO; Notice of Allowance dated Feb. 27, 2015 in U.S. Appl. No. 13/948,055.
USPTO; Notice of Allowance dated Mar. 31, 2015 in U.S. Appl. No. 13/948,055.
USPTO; Non-Final Office Action dated Jun. 29, 2015 in U.S. Appl. No. 13/966,782.
USPTO; Final Office Action dated Jan. 4, 2016 in U.S. Appl. No. 13/966,782.
USPTO; Notice of Allowance dated Mar. 21, 2016 in U.S. Appl. No. 13/966,782.
USPTO; Notice of Allowance dated Oct. 7, 2015 in U.S. Appl. No. 13/973,777.
USPTO; Non-Final Office Action dated Feb. 20, 2015 in U.S. Appl. No. 14/018,231.
USPTO; Notice of Allowance dated Jul. 20, 2015 in U.S. Appl. No. 14/018,231.
USPTO; Non-Final Office Action dated Apr. 7, 2015 in U.S. Appl. No. 14/018,345.
USPTO; Final Office Action dated Sep. 14, 2015 in U.S. Appl. No. 14/018,345.
USPTO; Notice of Allowance dated Jan. 14, 2016 in U.S. Appl. No. 14/018,345.
USPTO; Notice of Allowance dated Mar. 17, 2016 in U.S. Appl. No. 14/018,345.
USPTO; Non-Final Office Action dated Mar. 26, 2015 in U.S. Appl. No. 14/031,982.
USPTO; Final Office Action dated Aug. 28, 2015 in U.S. Appl. No. 14/031,982.
USPTO; Notice of Allowance dated Nov. 17, 2015 in U.S. Appl. No. 14/031,982.
USPTO; Non-Final Office Action dated Jan. 2, 2015 in U.S. Appl. No. 14/040,196.
USPTO; Non-Final Office Action dated Apr. 28, 2015 in U.S. Appl. No. 14/040,196.
USPTO; Notice of Allowance dated Sep. 11, 2015 in U.S. Appl. No. 14/040,196.
USPTO; Non-Final Action dated Dec. 3, 2015 in U.S. Appl. No. 14/050,150.
USPTO; Final Office Action dated Jun. 15, 2016 in U.S. Appl. No. 14/050,150.
USPTO; Final Office Action dated Jul. 8, 2016 in U.S. Appl. No. 14/050,150.
USPTO; Notice of Allowance dated Oct. 20, 2016 in U.S. Appl. No. 14/050,150.
USPTO; Non-Final Office Action dated Dec. 15, 2014 in U.S. Appl. No. 14/065,114.
USPTO; Final Office Action dated Jun. 19, 2015 in U.S. Appl. No. 14/065,114.
USPTO; Advisory Action dated Aug. 24, 2015 in U.S. Appl. No. 14/065,114.
USPTO; Non-Final Office Action dated Oct. 7, 2015 in U.S. Appl. No. 14/065,114.
USPTO; Notice of Allowance dated Feb. 22, 2016 in U.S. Appl. No. 14/065,114.
USPTO; Non-Final Office Action dated Nov. 14, 2014 in U.S. Appl. No. 14/069,244.
USPTO; Notice of Allowance dated Mar. 25, 2015 in U.S. Appl. No. 14/069,244.
USPTO; Non-Final Office Action dated Mar. 19, 2015 in U.S. Appl. No. 14/079,302.
USPTO; Final Office Action dated Sep. 1, 2015 in U.S. Appl. No. 14/079,302.
USPTO; Non-Final Office Action dated Dec. 23, 2015 in U.S. Appl. No. 14/079,302.
USPTO; Non-Final Office Action dated Apr. 27, 2016 in U.S. Appl. No. 14/079,302.
USPTO; Final Office Action dated Aug. 22, 2016 in U.S. Appl. No. 14/079,302.
USPTO; Notice of Allowance dated Dec. 14, 2016 in U.S. Appl. No. 14/079,302.
USPTO; Advisory Action dated Nov. 10, 2015 in U.S. Appl. No. 14/079,302.
USPTO; Non-Final Office Action dated Sep. 9, 2015 in U.S. Appl. No. 14/090,750.
USPTO; Final Office Action dated Feb. 11, 2016 in U.S. Appl. No. 14/090,750.
USPTO; Advisory Action dated May 5, 2016 in U.S. Appl. No. 14/090,750.
USPTO; Non-Final Office Action dated Jun. 14, 2016 in U.S. Appl. No. 14/090,750.
USPTO; Advisory Action dated Dec. 21, 2016 in U.S. Appl. No. 14/090,750.
USPTO; Advisory Action dated Jan. 30, 2018 in U.S. Appl. No. 14/090,750.
USPTO; Final Office Action dated Sep. 28, 2016 in U.S. Appl. No. 14/090,750.
USPTO; Non-Final Office Action dated Jun. 23, 2017 in U.S. Appl. No. 14/090,750.
USPTO; Final Office Action dated Nov. 17, 2017 in U.S. Appl. No. 14/090,750.
USPTO; Non-Final Office Action dated Mar. 12, 2018 in U.S. Appl. No. 14/090,750.
USPTO; Notice of Allowance dated Aug. 29, 2018 in U.S. Appl. No. 14/090,750.
USPTO; Non-Final Office Action dated Mar. 19, 2015 in U.S. Appl. No. 14/166,462.
USPTO; Notice of Allowance dated Sep. 3, 2015 in U.S. Appl. No. 14/166,462.
USPTO; Non-Final Office Action dated Nov. 17, 2015 in U.S. Appl. No. 14/172,220.
USPTO; Notice of Allowance dated Apr. 22, 2016 in U.S. Appl. No. 14/172,220.
USPTO; Office Action dated May 29, 2014 in U.S. Appl. No. 14/183,187.
USPTO; Final Office Action dated Nov. 7, 2014 in U.S. Appl. No. 14/183,187.
USPTO; Advisory Action dated Feb. 20, 2015 in U.S. Appl. No. 14/183,187.
USPTO; Non-Final Office Action dated Mar. 16, 2015 in U.S. Appl. No. 14/183,187.
USPTO; Final Office Action dated Jul. 10, 2015 in U.S. Appl. No. 14/183,187.
USPTO; Notice of Allowance dated Aug. 31, 2015 in U.S. Appl. No. 14/183,187.
USPTO; Non-Final Office Action dated Jan. 11, 2016 in U.S. Appl. No. 14/188,760.
USPTO; Final Office Action dated Aug. 25, 2016 in U.S. Appl. No. 14/188,760.
USPTO; Advisory Action dated Jan. 12, 2017 in U.S. Appl. No. 14/188,760.
USPTO; Non-Final Office Action dated Mar. 23, 2017 in U.S. Appl. No. 14/188,760.
USPTO; Final Office Action dated Oct. 5, 2017 in U.S. Appl. No. 14/188,760.
USPTO; Advisory Action dated Jan. 3, 2018 in U.S. Appl. No. 14/188,760.
USPTO; Non-Final Office Action dated Apr. 18, 2018 in U.S. Appl. No. 14/188,760.
USPTO; Final Office Action dated Jan. 25, 2019 in U.S. Appl. No. 14/188,760.
USPTO; Non-Final Office Action dated Aug. 8, 2019 in U.S. Appl. No. 14/188,760.
USPTO; Notice of Allowance dated Feb. 10, 2020 in U.S. Appl. No. 14/188,760.
USPTO; Non-Final Office Action dated Oct. 8, 2015 in U.S. Appl. No. 14/218,374.
USPTO; Final Office Action dated Feb. 23, 2016 in U.S. Appl. No. 14/218,374.
USPTO; Advisory Action dated Apr. 29, 2016 in U.S. Appl. No. 14/218,374.

(56) References Cited

OTHER PUBLICATIONS

USPTO; Notice of Allowance dated Aug. 5, 2016 in U.S. Appl. No. 14/218,374.
USPTO; Non-Final Office Action dated Jul. 15, 2016 in U.S. Appl. No. 14/218,690.
USPTO; Final Office Action dated Nov. 14, 2016 in U.S. Appl. No. 14/218,690.
USPTO; Non-Final Office Action dated Apr. 6, 2017 in U.S. Appl. No. 14/218,690.
USPTO; Final Office Action dated Jul. 20, 2017 in U.S. Appl. No. 14/218,690.
USPTO; Non-Final Office Action dated Jan. 11, 2018 in U.S. Appl. No. 14/218,690.
USPTO; Final Office Action dated May 24, 2018 in U.S. Appl. No. 14/218,690.
USPTO; Notice of Allowance dated Sep. 24, 2018 in U.S. Appl. No. 14/218,690.
USPTO; Non-Final Office Action dated Sep. 22, 2015 in U.S. Appl. No. 14/219,839.
USPTO; Final Office Action dated Mar. 25, 2016 in U.S. Appl. No. 14/219,839.
USPTO; Non-Final Office Action dated Dec. 22, 2016 in U.S. Appl. No. 14/219,839.
USPTO; Advisory Action dated Jun. 30, 2016 in U.S. Appl. No. 14/219,839.
USPTO; Final Office Action dated Jul. 6, 2017 in U.S. Appl. No. 14/219,839.
USPTO; Non-Final Office Action dated Mar. 27, 2018 in U.S. Appl. No. 14/219,839.
USPTO; Final Office Action dated Nov. 1, 2018 in U.S. Appl. No. 14/219,839.
USPTO; Advisory Action dated Jan. 22, 2019 in U.S. Appl. No. 14/219,839.
USPTO; Non-Final Office Action dated Jul. 15, 2019 in U.S. Appl. No. 14/219,839.
USPTO; Final Office Action dated Jan. 27, 2020 in U.S. Appl. No. 14/219,839.
USPTO; Advisory Action dated Apr. 24, 2020 in U.S. Appl. No. 14/219,839.
USPTO; Notice of Allowance dated Feb. 10, 2021 in U.S. Appl. No. 14/219,839.
USPTO; Advisory Action dated Apr. 24, 2020 in U.S. Appl. No. 14/219,879.
USPTO; Non-Final Office Action dated Nov. 25, 2015 in U.S. Appl. No. 14/219,879.
USPTO; Final Office action dated May 19, 2016 in U.S. Appl. No. 14/219,879.
USPTO; Advisory Action dated Aug. 22, 2016 in U.S. Appl. No. 14/219,879.
USPTO; Non-Final Office Action dated Dec. 23, 2016 in U.S. Appl. No. 14/219,879.
USPTO; Final Office action dated Jul. 6, 2017 in U.S. Appl. No. 14/219,879.
USPTO; Advisory Action dated Oct. 5, 2017 in U.S. Appl. No. 14/219,879.
USPTO; Non-Final Office Action dated Apr. 6, 2018 in U.S. Appl. No. 14/219,879.
USPTO; Final Office Action dated Nov. 2, 2018 in U.S. Appl. No. 14/219,879.
USPTO; Advisory Action dated Jan. 22, 2019 in U.S. Appl. No. 14/219,879.
USPTO; Non-Final Office Action dated Jun. 24, 2019 in U.S. Appl. No. 14/219,879.
USPTO; Final Office Action dated Jan. 13, 2020 in U.S. Appl. No. 14/219,879.
USPTO; Non-Final Office Action dated Dec. 1, 2020 in U.S. Appl. No. 14/219,879.
USPTO; Non-Final Office Action dated Sep. 18, 2015 in U.S. Appl. No. 14/244,689.
USPTO; Notice of Allowance dated Feb. 11, 2016 in U.S. Appl. No. 14/244,689.
USPTO; Non-Final Office Action dated Oct. 7, 2015 in U.S. Appl. No. 14/246,969.
USPTO; Final Office Action dated May 4, 2016 in U.S. Appl. No. 14/246,969.
USPTO; Advisory Action dated Aug. 2, 2016 in U.S. Appl. No. 14/246,969.
USPTO; Non-Final Office Action dated Aug. 12, 2016 in U.S. Appl. No. 14/246,969.
USPTO; Notice of Allowance dated Feb. 27, 2017 in U.S. Appl. No. 14/246,969.
USPTO; Non-Final Office Action dated Nov. 20, 2015 in U.S. Appl. No. 14/260,701.
USPTO; Notice of Allowance dated Jun. 2, 2016 in U.S. Appl. No. 14/260,701.
USPTO; Notice of Allowance dated Feb. 23, 2016 in U.S. Appl. No. 14/327,134.
USPTO; Non-Final Office Action dated Aug. 19, 2015 in U.S. Appl. No. 14/268,348.
USPTO; Non-Final Office Action dated Jan. 6, 2016 in U.S. Appl. No. 14/268,348.
USPTO; Final Office Action dated Apr. 29, 2016 in U.S. Appl. No. 14/268,348.
USPTO; Notice of Allowance dated Aug. 19, 2016 in U.S. Appl. No. 14/268,348.
USPTO; Notice of Allowance dated Aug. 30, 2016 in U.S. Appl. No. 14/268,348.
USPTO; Non-Final Office Action dated Oct. 20, 2015 in U.S. Appl. No. 14/281,477.
USPTO; Notice of Allowance dated Mar. 28, 2016 in U.S. Appl. No. 14/281,477.
USPTO; Non-Final Office Action dated Jan. 13, 2017 in U.S. Appl. No. 14/444,744.
USPTO; Final Office Action dated Jul. 10, 2017 in U.S. Appl. No. 14/444,744.
USPTO; Non-Final Office Action dated Nov. 29, 2017 in U.S. Appl. No. 14/444,744.
USPTO; Final Office Action dated Mar. 28, 2018 in U.S. Appl. No. 14/444,744.
USPTO; Non-Final Office Action dated Jul. 27, 2018 in U.S. Appl. No. 14/444,744.
USPTO; Final Office Action dated Feb. 7, 2019 in U.S. Appl. No. 14/444,744.
USPTO; Non-Final Office Action dated Aug. 8, 2019 in U.S. Appl. No. 14/444,744.
USPTO; Final Office Action dated Feb. 20, 2020 in U.S. Appl. No. 14/444,744.
USPTO; Non-Final Office Action dated Apr. 28, 2020 in U.S. Appl. No. 14/444,744.
USPTO; Notice of Allowance dated Sep. 3, 2020 in U.S. Appl. No. 14/444,744.
USPTO; Non-Final Office Action dated May 18, 2016 in U.S. Appl. No. 14/449,838.
USPTO; Notice of Allowance dated Nov. 28, 2016 in U.S. Appl. No. 14/449,838.
USPTO; Non-Final Office Action dated Feb. 12, 2015 in U.S. Appl. No. 14/457,058.
USPTO; Final Office Action dated Jul. 14, 2015 in U.S. Appl. No. 14/457,058.
USPTO; Non-Final Office Action dated Nov. 6, 2015 in U.S. Appl. No. 14/457,058.
USPTO; Advisory Action dated Nov. 6, 2015 in U.S. Appl. No. 14/457,058.
USPTO; Final Office Acton dated Jun. 17, 2016 in U.S. Appl. No. 14/457,058.
USPTO; Advisory Action dated Sep. 21, 2016 in U.S. Appl. No. 14/457,058.
USPTO; Non-Final Office Action dated Oct. 6, 2016 in U.S. Appl. No. 14/457,058.
USPTO; Final Office Acton dated May 4, 2017 in U.S. Appl. No. 14/457,058.

(56) References Cited

OTHER PUBLICATIONS

USPTO; Non-Final Office Action dated Oct. 19, 2017 in U.S. Appl. No. 14/457,058.
USPTO; Final Office Action dated Jun. 14, 2018 in U.S. Appl. No. 14/457,058.
USPTO; Non-Final Office Action dated Jan. 11, 2019 in U.S. Appl. No. 14/457,058.
USPTO; Final Office Action dated Jun. 25, 2019 in U.S. Appl. No. 14/457,058.
USPTO; Non-Final Office Action dated Oct. 31, 2019 in U.S. Appl. No. 14/457,058.
USPTO; Final Office Action dated May 15, 2020 in U.S. Appl. No. 14/457,058.
USPTO; Notice of Allowance dated Aug. 6, 2020 in U.S. Appl. No. 14/457,058.
USPTO; Non-Final Office Action dated Sep. 16, 2016 in U.S. Appl. No. 14/465,252.
USPTO; Final Office Action dated Nov. 1, 2016 in U.S. Appl. No. 14/465,252.
USPTO; Non-Final Office Action dated Mar. 6, 2017 in U.S. Appl. No. 14/465,252.
USPTO; Final Office Action dated Jun. 9, 2017 in U.S. Appl. No. 14/465,252.
USPTO; Notice of Allowance dated Oct. 3, 2017 in U.S. Appl. No. 14/465,252.
USPTO; Non-Final Office Action dated Nov. 24, 2015 in U.S. Appl. No. 14/498,036.
USPTO; Final Office Action dated Apr. 5, 2016 in U.S. Appl. No. 14/498,036.
USPTO; Advisory Action dated Jun. 16, 2016 in U.S. Appl. No. 14/498,036.
USPTO; Notice of Allowance dated Aug. 17, 2016 in U.S. Appl. No. 14/498,036.
USPTO; Non-Final Office Action dated Apr. 10, 2015 in U.S. Appl. No. 14/505,290.
USPTO; Notice of Allowance dated Aug. 21, 2015 in U.S. Appl. No. 14/505,290.
USPTO; Non-Final Office Action dated Dec. 17, 2015 in U.S. Appl. No. 14/508,296.
USPTO; Final Office Action dated May 26, 2016 in U.S. Appl. No. 14/508,296.
USPTO; Advisory Action dated Aug. 17, 2016 in U.S. Appl. No. 14/508,296.
USPTO; Non-Final Office Action dated Sep. 8, 2016 in U.S. Appl. No. 14/508,296.
USPTO; Final Office Action dated Dec. 7, 2016 in U.S. Appl. No. 14/508,296.
USPTO; Notice of Allowance dated Jan. 27, 2017 in U.S. Appl. No. 14/508,296.
USPTO; Non-Final Office Action dated Apr. 6, 2017 in U.S. Appl. No. 14/508,489.
USPTO; Final Office Action dated Oct. 4, 2017 in U.S. Appl. No. 14/508,489.
USPTO; Non-Final Office Action dated May 15, 2018 in U.S. Appl. No. 14/508,489.
USPTO; Final Office Action dated Nov. 28, 2018 in U.S. Appl. No. 14/508,489.
USPTO; Non-Final Office Action dated Apr. 4, 2019 in U.S. Appl. No. 14/508,489.
USPTO; Final Office Action dated Aug. 20, 2019 in U.S. Appl. No. 14/508,489.
USPTO; Advisory Action dated Oct. 28, 2019 in U.S. Appl. No. 14/508,489.
USPTO; Non-Final Office Action dated Mar. 5, 2020 in U.S. Appl. No. 14/508,489.
USPTO; Final Office Action dated Aug. 20, 2020 in U.S. Appl. No. 14/508,489.
USPTO; Notice of Allowance dated Nov. 3, 2020 in U.S. Appl. No. 14/508,489.
USPTO; Non-Final Office Action dated Jan. 16, 2015 in U.S. Appl. No. 14/563,044.
USPTO; Final Office Action dated Jul. 16, 2015 in U.S. Appl. No. 14/563,044.
USPTO; Notice of Allowance dated Oct. 15, 2015 in U.S. Appl. No. 14/563,044.
USPTO; Notice of Allowance dated Dec. 2, 2015 in U.S. Appl. No. 14/563,044.
USPTO; Non-Final Office Action dated May 4, 2016 in U.S. Appl. No. 14/568,647.
USPTO; Final Office Action dated Sep. 29, 2016 in U.S. Appl. No. 14/568,647.
USPTO; Advisory Action dated Dec. 21, 2016 in U.S. Appl. No. 14/568,647.
USPTO; Non-Final Office Action dated Feb. 2, 2017 in U.S. Appl. No. 14/568,647.
USPTO; Final Office Action dated May 19, 2017 in U.S. Appl. No. 14/568,647.
USPTO; Non-Final Office Action dated Sep. 14, 2017 in U.S. Appl. No. 14/568,647.
USPTO; Final Office Action dated Jan. 23, 2018 in U.S. Appl. No. 14/568,647.
USPTO; Advisory Action dated Apr. 12, 2018 in U.S. Appl. No. 14/568,647.
USPTO; Non-Final Office Action dated May 25, 2018 in U.S. Appl. No. 14/568,647.
USPTO; Non-Final Office Action dated Oct. 1, 2015 in U.S. Appl. No. 14/571,126.
USPTO; Final Office Action dated Feb. 22, 2016 in U.S. Appl. No. 14/571,126.
USPTO; Notice of Allowance dated May 18, 2016 in U.S. Appl. No. 14/571,126.
USPTO; Notice of Allowance dated Jun. 2, 2016 in U.S. Appl. No. 14/571,126.
USPTO; Non-Final Office Action dated Nov. 25, 2015 in U.S. Appl. No. 14/598,532.
USPTO; Notice of Allowance dated May 16, 2016 in U.S. Appl. No. 14/598,532.
USPTO; Non-Final Office Action dated Jan. 15, 2016 in U.S. Appl. No. 14/606,364.
USPTO; Final Office Action dated Jun. 14, 2016 in U.S. Appl. No. 14/606,364.
USPTO; Advisory Action dated Aug. 25, 2016 in U.S. Appl. No. 14/606,364.
USPTO; Final Office Action dated Jan. 12, 2017 in U.S. Appl. No. 14/606,364.
USPTO; Non-Final Office Action dated May 10, 2017 in U.S. Appl. No. 14/606,364.
USPTO; Notice of Allowance dated Aug. 16, 2017 in U.S. Appl. No. 14/606,364.
USPTO; Non-Final Office Action dated Mar. 3, 2016 in U.S. Appl. No. 14/622,603.
USPTO; Notice of Allowance dated Aug. 2, 2016 in U.S. Appl. No. 14/622,603.
USPTO; Notice of Allowance dated Feb. 16, 2016 in U.S. Appl. No. 14/634,342.
USPTO; Non-Final Office Action dated Oct. 19, 2017 in U.S. Appl. No. 14/645,234.
USPTO; Non-Final Office Action dated May 16, 2018 in U.S. Appl. No. 14/645,234.
USPTO; Final Office Action dated Aug. 10, 2018 in U.S. Appl. No. 14/645,234.
USPTO; Notice of Allowance dated Aug. 15, 2019 in U.S. Appl. No. 14/645,234.
USPTO; Non-Final Office Action dated Jun. 7, 2017 in U.S. Appl. No. 14/656,588.
USPTO; Final Office Action dated Dec. 26, 2017 in U.S. Appl. No. 14/656,588.
USPTO; Non-Final Office Action dated Apr. 6, 2018 in U.S. Appl. No. 14/656,588.
USPTO; Notice of Allowance dated Nov. 19, 2018 in U.S. Appl. No. 14/656,588.

(56) References Cited

OTHER PUBLICATIONS

USPTO; Non-Final Office Action dated Mar. 21, 2016 in U.S. Appl. No. 14/659,152.
USPTO; Final Office Action dated Jul. 29, 2016 in U.S. Appl. No. 14/659,152.
USPTO; Notice of Allowance dated Nov. 22, 2016 in U.S. Appl. No. 14/659,152.
USPTO; Non-Final Office Action dated Nov. 19, 2015 in U.S. Appl. No. 14/659,437.
USPTO; Final Office Action dated Mar. 17, 2016 in U.S. Appl. No. 14/659,437.
USPTO; Notice of Allowance dated May 31, 2016 in U.S. Appl. No. 14/659,437.
USPTO; Non-Final Office Action dated Sep. 7, 2017 in U.S. Appl. No. 14/660,755.
USPTO; Notice of Allowance dated Oct. 2, 2017 in U.S. Appl. No. 14/660,755.
USPTO; Notice of Allowance dated Mar. 25, 2016 in U.S. Appl. No. 14/693,138.
USPTO; Non-Final Office Action dated Aug. 3, 2017 in U.S. Appl. No. 14/752,712.
USPTO; Final Office Action dated Nov. 29, 2017 in U.S. Appl. No. 14/752,712.
USPTO; Advisory Action dated Feb. 15, 2018 in U.S. Appl. No. 14/752,712.
USPTO; Non-Final Office Action dated Mar. 21, 2018 in U.S. Appl. No. 14/752,712.
USPTO; Final Office Action dated Sep. 5, 2018 in U.S. Appl. No. 14/752,712.
USPTO; Non-Final Office Action dated Dec. 28, 2018 in U.S. Appl. No. 14/752,712.
USPTO; Notice of Allowance dated Jun. 11, 2019 in U.S. Appl. No. 14/752,712.
USPTO; Non-Final Office Action dated Nov. 29, 2017 in U.S. Appl. No. 14/793,323.
USPTO; Final Office Action dated Mar. 29, 2018 in U.S. Appl. No. 14/793,323.
USPTO; Non-Final Office Action dated Aug. 10, 2018 in U.S. Appl. No. 14/793,323.
USPTO; Final Office Action dated Feb. 25, 2019 in U.S. Appl. No. 14/793,323.
UPSTO; Non-Final Office Action dated Jun. 27, 2019 in U.S. Appl. No. 14/793,323.
USPTO; Notice of Allowance dated Nov. 14, 2019 in U.S. Appl. No. 14/793,323.
USPTO; Non-Final Office Action dated Jun. 16, 2017 in U.S. Appl. No. 14/798,136.
USPTO; Notice of Allowance dated Oct. 5, 2017 in U.S. Appl. No. 14/798,136.
USPTO; Non-Final Office Action dated Mar. 30, 2016 in U.S. Appl. No. 14/808,979.
USPTO; Final Office Acton dated Sep. 30, 2016 in U.S. Appl. No. 14/808,979.
USPTO; Non-Final Office Action dated Dec. 20, 2016 in U.S. Appl. No. 14/808,979.
USPTO; Final Office Action dated Jun. 8, 2017 in U.S. Appl. No. 14/808,979.
USPTO; Non-Final Office Action dated Sep. 21, 2017 in U.S. Appl. No. 14/808,979.
USPTO; Final Office Action dated Mar. 14, 2018 in U.S. Appl. No. 14/808,979.
USPTO; Notice of Allowance dated Jun. 27, 2018 in U.S. Appl. No. 14/808,979.
USPTO; Non-Final Office Action dated Feb. 23, 2018 in U.S. Appl. No. 14/817,953.
USPTO; Notice of Allowance dated Jul. 11, 2018 in U.S. Appl. No. 14/817,953.
USPTO; Non-Final Office Action dated Sep. 1, 2016 in U.S. Appl. No. 14/827,177.
USPTO; Notice of Allowance dated Jan. 27, 2017 in U.S. Appl. No. 14/827,177.
USPTO; Non-Final Office Action dated Sep. 9, 2016 in U.S. Appl. No. 14/829,565.
USPTO; Final Office Action dated Feb. 9, 2017 in U.S. Appl. No. 14/829,565.
USPTO; Advisory Action dated Apr. 20, 2017 in U.S. Appl. No. 14/829,565.
USPTO; Non-Final Office Action dated Sep. 19, 2017 in U.S. Appl. No. 14/829,565.
USPTO; Final Office Action dated Mar. 5, 2018 in U.S. Appl. No. 14/829,565.
USPTO; Advisory Action dated Aug. 10, 2018 in U.S. Appl. No. 14/829,565.
USPTO; Non-Final Office Action dated Sep. 6, 2018 in U.S. Appl. No. 14/829,565.
USPTO; Final Office Action dated Apr. 18, 2019 in U.S. Appl. No. 14/829,565.
USPTO; Advisory Action dated Jul. 22, 2019 in U.S. Appl. No. 14/829,565.
USPTO; Non-Final Office Action dated Sep. 19, 2019 in U.S. Appl. No. 14/829,565.
USPTO; Final Office Action dated Mar. 3, 2020 in U.S. Appl. No. 14/829,565.
USPTO; Advisory Action dated Jun. 22, 2020 in U.S. Appl. No. 14/829,565.
USPTO; Non-Final Office Action dated Aug. 3, 2020 in U.S. Appl. No. 14/829,565.
USPTO; Final Office Action dated Feb. 1, 2021 in U.S. Appl. No. 14/829,565.
USPTO; Advisory Action dated Apr. 13, 2021 in U.S. Appl. No. 14/829,565.
USPTO; Non-Final Office Action dated May 12, 2021 in U.S. Appl. No. 14/829,565.
USPTO; Non-Final Office Action dated Apr. 29, 2016 in U.S. Appl. No. 14/835,637.
USPTO; Final Office Action dated Nov. 25, 2016 in U.S. Appl. No. 14/835,637.
USPTO; Advisory Action dated Feb. 14, 2017 in U.S. Appl. No. 14/835,637.
USPTO; Notice of Allowance dated Apr. 25, 2017 in U.S. Appl. No. 14/835,637.
USPTO; Non-Final Office Action dated Jul. 29, 2016 in U.S. Appl. No. 14/884,695.
USPTO; Final Office Action dated Feb. 9, 2017 in U.S. Appl. No. 14/884,695.
USPTO; Advisory Action dated Apr. 20, 2017 in U.S. Appl. No. 14/884,695.
USPTO; Non-Final Office Action dated May 18, 2017 in U.S. Appl. No. 14/884,695.
USPTO; Notice of Allowance dated Oct. 20, 2017 in U.S. Appl. No. 14/884,695.
USPTO; Non-Final Office Action dated May 18, 2017 in U.S. Appl. No. 14/886,571.
USPTO; Final Office Action dated Sep. 21, 2017 in U.S. Appl. No. 14/886,571.
USPTO; Notice of Allowance dated Dec. 6, 2017 in U.S. Appl. No. 14/886,571.
USPTO; Non-Final Office Action dated Dec. 1, 2016 in U.S. Appl. No. 14/919,536.
USPTO; Final Office Action dated Mar. 28, 2017 in U.S. Appl. No. 14/919,536.
USPTO; Non-Final Office Action dated Aug. 29, 2017 in U.S. Appl. No. 14/919,536.
USPTO; Final Office Action dated May 11, 2018 in U.S. Appl. No. 14/919,536.
USPTO; Notice of Allowance dated Oct. 4, 2018 in U.S. Appl. No. 14/919,536.
USPTO; Notice of Allowance dated Nov. 19, 2018 in U.S. Appl. No. 14/919,536.
USPTO; Non-Final Office Action dated May 3, 2016 in U.S. Appl. No. 14/937,053.

(56) References Cited

OTHER PUBLICATIONS

USPTO; Notice of Allowance dated Jul. 26, 2016 in U.S. Appl. No. 14/937,053.
USPTO; Non-Final Office Action dated Dec. 15, 2016 in U.S. Appl. No. 14/938,180.
USPTO; Notice of Allowance dated Nov. 9, 2017 in U.S. Appl. No. 14/938,180.
USPTO; Non-Final Office Action dated Apr. 14, 2017 in U.S. Appl. No. 14/956,115.
USPTO; Final Office Action dated Jul. 21, 2017 in U.S. Appl. No. 14/956,115.
USPTO; Notice of Allowance dated Dec. 14, 2017 in U.S. Appl. No. 14/956,115.
USPTO; Notice of Allowance dated Feb. 3, 2017 in U.S. Appl. No. 14/977,291.
USPTO; Non-Final Office Action dated Aug. 12, 2016 in U.S. Appl. No. 14/981,434.
USPTO; Notice of Allowance dated Nov. 21, 2016 in U.S. Appl. No. 14/981,434.
USPTO; Non-Final Office Action dated Jan. 12, 2017 in U.S. Appl. No. 14/981,468.
USPTO; Notice of Allowance dated Jun. 7, 2017 in U.S. Appl. No. 14/981,468.
USPTO; Non-Final Office Action dated Mar. 22, 2016 in U.S. Appl. No. 14/987,420.
USPTO; Final Office Action dated Jun. 10, 2016 in U.S. Appl. No. 14/987,420.
USPTO; Non-Final Office Action dated Dec. 14, 2016 in U.S. Appl. No. 14/997,683.
USPTO; Final Office Action dated Apr. 14, 2017 in U.S. Appl. No. 14/997,683.
USPTO; Non-Final Office Action dated Sep. 1, 2017 in U.S. Appl. No. 14/997,683.
USPTO; Final Office Action dated Feb. 6, 2018 in U.S. Appl. No. 14/997,683.
USPTO; Advisory Action dated May 2, 2018 in U.S. Appl. No. 14/997,683.
USPTO; Non-Final Office Action dated Jun. 20, 2018 in U.S. Appl. No. 14/997,683.
USPTO; Final Office Action dated Dec. 10, 2018 in U.S. Appl. No. 14/997,683.
USPTO; Notice of Allowance dated Mar. 25, 2019 in U.S. Appl. No. 14/997,683.
USPTO; Non-Final Office Action dated Sep. 23, 2016 in U.S. Appl. No. 15/048,422.
USPTO; Notice of Allowance dated May 4, 2017 in U.S. Appl. No. 15/048,422.
USPTO; Non-Final Office Action dated Aug. 4, 2017 in U.S. Appl. No. 15/050,159.
USPTO; Notice of Allowance dated Feb. 7, 2018 in U.S. Appl. No. 15/050,159.
USPTO; Non-Final Office Action dated Apr. 22, 2016 in U.S. Appl. No. 15/055,122.
USPTO; Notice of Allowance dated Sep. 15, 2016 in U.S. Appl. No. 15/055,122.
USPTO; Non-Final Office Action dated Feb. 20, 2018 in U.S. Appl. No. 15/060,412.
USPTO; Final Office Action dated Oct. 19, 2018 in U.S. Appl. No. 15/060,412.
USPTO; Non-Final Office Action dated Jun. 3, 2019 in U.S. Appl. No. 15/060,412.
USPTO; Final Office Action dated Dec. 26, 2019 in U.S. Appl. No. 15/060,412.
USPTO; Notice of Allowance dated Mar. 5, 2020 in U.S. Appl. No. 15/060,412.
USPTO; Non-Final Office Action dated Aug. 27, 2018 in U.S. Appl. No. 15/067,028.
USPTO; Notice of Allowance dated Dec. 21, 2018 in U.S. Appl. No. 15/067,028.
USPTO; Non-Final Office Action dated Sep. 26, 2018 in U.S. Appl. No. 15/074,813.
USPTO; Notice of Allowance dated Feb. 25, 2019 in U.S. Appl. No. 15/074,813.
USPTO; Non-Final Office Action dated Jan. 9, 2018 in U.S. Appl. No. 15/135,224.
USPTO; Notice of Allowance dated Jun. 29, 2018 in U.S. Appl. No. 15/135,224.
USPTO; Non-Final Office Action dated Jan. 9, 2018 in U.S. Appl. No. 15/135,258.
USPTO; Final Office Action dated Jul. 6, 2018 in U.S. Appl. No. 15/135,258.
USPTO; Non-Final Office Action dated Nov. 23, 2018 in U.S. Appl. No. 15/135,258.
USPTO; Final Office Action dated Mar. 14, 2019 in U.S. Appl. No. 15/135,258.
USPTO; Non-Final Office Action dated Jul. 19, 2019 in U.S. Appl. No. 15/135,258.
USPTO; Final Office Action dated Oct. 24, 2019 in U.S. Appl. No. 15/135,258.
USPTO; Advisory Action dated Jan. 3, 2020 in U.S. Appl. No. 15/135,258.
USPTO; Non-Final Office Action dated Feb. 13, 2020 in U.S. Appl. No. 15/135,258.
USPTO; Final Office Action dated Jun. 1, 2020 in U.S. Appl. No. 15/135,258.
USPTO; Non-Final Office Action dated Jan. 9, 2018 in U.S. Appl. No. 15/135,333.
USPTO; Notice of Allowance dated Aug. 18, 2020 in U.S. Appl. No. 15/135,258.
USPTO; Notice of Allowance dated Sep. 14, 2018 in U.S. Appl. No. 15/135,333.
USPTO; Non-Final Office Action dated Nov. 21, 2016 in U.S. Appl. No. 15/144,481.
USPTO; Final Office Action dated May 26, 2017 in U.S. Appl. No. 15/144,481.
USPTO; Non-Final Office Action dated Sep. 21, 2017 in U.S. Appl. No. 15/144,481.
USPTO; Notice of Allowance dated Mar. 26, 2018 in U.S. Appl. No. 15/144,481.
USPTO; Notice of Allowance dated Apr. 11, 2018 in U.S. Appl. No. 15/144,481.
USPTO; Non-Final Office Action dated Apr. 13, 2017 in U.S. Appl. No. 15/144,506.
USPTO; Final Office Action dated Oct. 10, 2017 in U.S. Appl. No. 15/144,506.
USPTO; Final Office Action dated Jul. 26, 2018 in U.S. Appl. No. 15/144,506.
USPTO; Notice of Allowance dated Mar. 13, 2019 in U.S. Appl. No. 15/144,506.
USPTO; Non-Final Office Action dated Oct. 9, 2018 in U.S. Appl. No. 15/182,504.
USPTO; Final Office Action dated Mar. 28, 2019 in U.S. Appl. No. 15/182,504.
USPTO; Notice of Allowance dated Jul. 17, 2019 in U.S. Appl. No. 15/182,504.
USPTO; Non-Final Office Action dated Nov. 28, 2016 in U.S. Appl. No. 15/203,632.
USPTO; Final Office Action dated Jun. 7, 2017 in U.S. Appl. No. 15/203,632.
USPTO; Advisory Action dated Aug. 23, 2017 in U.S. Appl. No. 15/203,632.
USPTO; Notice of Allowance dated Sep. 20, 2017 in U.S. Appl. No. 15/203,632.
USPTO; Non-Final Office Action dated Nov. 29, 2016 in U.S. Appl. No. 15/203,642.
USPTO; Final Office Action dated Apr. 13, 2017 in U.S. Appl. No. 15/203,642.
USPTO; Advisory Action dated Jun. 22, 2017 in U.S. Appl. No. 15/203,642.
USPTO; Notice of Allowance dated Aug. 7, 2017 in U.S. Appl. No. 15/203,642.

(56) References Cited

OTHER PUBLICATIONS

USPTO; Non-Final Office Action dated Jun. 1, 2017 in U.S. Appl. No. 15/205,827.
USPTO; Final Office Action dated Oct. 16, 2017 in U.S. Appl. No. 15/205,827.
USPTO; Non-Final Office Action dated May 14, 2018 in U.S. Appl. No. 15/205,827.
USPTO; Final Office Action dated Oct. 9, 2018 in U.S. Appl. No. 15/205,827.
USPTO; Non-Final Office Action dated Mar. 28, 2019 in U.S. Appl. No. 15/205,827.
USPTO; Final Office Action dated Aug. 9, 2019 in U.S. Appl. No. 15/205,827.
USPTO; Advisory Action dated Oct. 22, 2019 in U.S. Appl. No. 15/205,827.
USPTO; Notice of Allowance dated Dec. 3, 2019 in U.S. Appl. No. 15/205,827.
USPTO; Non-Final Office Action dated Mar. 31, 2017 in U.S. Appl. No. 15/205,890.
USPTO; Notice of Allowance dated Oct. 16, 2017 in U.S. Appl. No. 15/205,890.
USPTO; Non-Final Office Action dated Jan. 20, 2017 in U.S. Appl. No. 15/210,256.
USPTO; Notice of Allowance dated May 18, 2017 in U.S. Appl. No. 15/210,256.
USPTO; Notice of Allowance dated Jul. 24, 2017 in U.S. Appl. No. 15/210,256.
USPTO; Non Final Office Action dated Apr. 21, 2017 in U.S. Appl. No. 15/222,715.
USPTO; Notice of Allowance dated Jul. 14, 2017 in U.S. Appl. No. 15/222,715.
USPTO; Notice of Allowance dated Sep. 27, 2017 in U.S. Appl. No. 15/222,715.
USPTO; Non-Final Office Action dated Feb. 3, 2017 in U.S. Appl. No. 15/222,738.
USPTO; Notice of Allowance dated May 22, 2017 in U.S. Appl. No. 15/222,738.
USPTO; Notice of Allowance dated Aug. 23, 2017 in U.S. Appl. No. 15/222,738.
USPTO; Non-Final Office Action dated Jan. 17, 2017 in U.S. Appl. No. 15/222,749.
USPTO; Final Office Action dated May 5, 2017 in U.S. Appl. No. 15/222,749.
USPTO; Non-Final Office Action dated Sep. 7, 2017 in U.S. Appl. No. 15/222,749.
USPTO: Final Office Action dated Jun. 4, 2018 in U.S. Appl. No. 15/222,749.
USPTO; Notice of Allowance dated Aug. 30, 2018 in U.S. Appl. No. 15/222,749.
USPTO; Non-Final Office Action dated Jan. 3, 2017 in U.S. Appl. No. 15/222,780.
USPTO; Final Office Action dated May 5, 2017 in U.S. Appl. No. 15/222,780.
USPTO; Non-Final Office Action dated Sep. 7, 2017 in U.S. Appl. No. 15/222,780.
USPTO; Final Office Action dated May 17, 2018 in U.S. Appl. No. 15/222,780.
USPTO; Non-Final Office Action dated Oct. 1, 2018 in U.S. Appl. No. 15/222,780.
USPTO; Notice of Allowance dated Apr. 19, 2019 in U.S. Appl. No. 15/222,780.
USPTO; Notice of Allowance dated Jul. 12, 2018 in U.S. Appl. No. 15/254,605.
USPTO; Non-Final Office Action dated Aug. 28, 2017 in U.S. Appl. No. 15/254,724.
USPTO; Notice of Allowance dated Jan. 17, 2018 in U.S. Appl. No. 15/254,724.
USPTO; Notice of Allowance dated Apr. 2, 2018 in U.S. Appl. No. 15/254,724.
USPTO; Non-Final Office Action dated May 22, 2018 in U.S. Appl. No. 15/262,990.
USPTO; Non-Final Office Action dated Sep. 13, 2018 in U.S. Appl. No. 15/262,990.
USPTO; Non-Final Office Action dated Jan. 30, 2019 in U.S. Appl. No. 15/262,990.
USPTO; Final Office Action dated May 13, 2019 in U.S. Appl. No. 15/262,990.
USPTO; Advisory Action dated Jul. 22, 2019 in U.S. Appl. No. 15/262,990.
USPTO; Non-Final Office Action dated Aug. 5, 2019 in U.S. Appl. No. 15/262,990.
USPTO; Final Office Action dated Nov. 19, 2019 in U.S. Appl. No. 15/262,990.
USPTO; Advisory Action dated Jan. 30, 2020 in U.S. Appl. No. 15/262,990.
USPTO; Non-Final Office Action dated Oct. 6, 2020 in U.S. Appl. No. 15/262,990.
USPTO; Final Office Action dated Feb. 24, 2021 in U.S. Appl. No. 15/262,990.
USPTO; Advisory Action dated Apr. 28, 2021 in U.S. Appl. No. 15/262,990.
USPTO; Non-Final Office Action dated Aug. 3, 2018 in U.S. Appl. No. 15/273,488.
USPTO; Final Office Action dated Jan. 11, 2019 in U.S. Appl. No. 15/273,488.
USPTO; Notice of Allowance dated Apr. 19, 2019 in U.S. Appl. No. 15/273,488.
USTPO; Non-Final Office Action dated Jul. 2, 2018 in U.S. Appl. No. 15/286,503.
USPTO; Final Office Action dated Feb. 7, 2019 in U.S. Appl. No. 15/286,503.
USPTO; Non-Final Office Action dated Jun. 27, 2019 in U.S. Appl. No. 15/286,503.
USPTO; Final Office Action dated Jan. 6, 2020 in U.S. Appl. No. 15/286,503.
USPTO; Advisory Action dated Mar. 31, 2020 in U.S. Appl. No. 15/286,503.
USPTO; Non-Final Office Action dated Apr. 16, 2020 in U.S. Appl. No. 15/286,503.
USPTO; Final Office Action dated Oct. 2, 2020 in U.S. Appl. No. 15/286,503.
USPTO; Non-Final Office Action dated Dec. 24, 2020 in U.S. Appl. No. 15/286,503.
USPTO; Final Office Action dated Mar. 25, 2021 in U.S. Appl. No. 15/286,503.
USPTO; Non-Final Office Action dated Dec. 14, 2018 in U.S. Appl. No. 15/340,512.
USPTO; Notice of Allowance dated May 24, 2019 in U.S. Appl. No. 15/340,512.
USPTO; Non-Final Office Action dated Oct. 23, 2017 in U.S. Appl. No. 15/377,439.
USPTO; Final Office Action dated Apr. 16, 2018 in U.S. Appl. No. 15/377,439.
USPTO; Advisory Action dated Aug. 8, 2018 in U.S. Appl. No. 15/377,439.
USPTO; Non-Final Office Action dated Nov. 14, 2018 in U.S. Appl. No. 15/377,439.
USPTO; Final Office Action dated Jun. 25, 2019 in U.S. Appl. No. 15/377,439.
USPTO; Non-Final Office Action dated Nov. 7, 2019 in U.S. Appl. No. 15/377,439.
USPTO; Final Office Action dated May 13, 2020 in U.S. Appl. No. 15/377,439.
USPTO; Non-Final Office Action dated Sep. 2, 2020 in U.S. Appl. No. 15/377,439.
USPTO; Final Office Action dated Feb. 12, 2021 in U.S. Appl. No. 15/377,439.
USPTO; Advisory Action dated Apr. 30, 2021 in U.S. Appl. No. 15/377,439.
USPTO; Notice of Allowance dated Aug. 8, 2017 in U.S. Appl. No. 15/380,895.

(56) References Cited

OTHER PUBLICATIONS

USPTO; Notice of Allowance dated Oct. 11, 2017 in U.S. Appl. No. 15/380,895.
USPTO; Non-Final Office Action dated May 31, 2019 in U.S. Appl. No. 15/380,909.
USPTO; Final Office Action dated Dec. 12, 2019 in U.S. Appl. No. 15/380,909.
USPTO; Non-Final Office Action dated Jul. 1, 2020 in U.S. Appl. No. 15/380,909.
USPTO; Final Office Action dated Jan. 7, 2021 in U.S. Appl. No. 15/380,909.
USPTO; Non-Final Office Action dated Jan. 4, 2018 in U.S. Appl. No. 15/380,921.
USPTO; Final Office Action dated Jun. 28, 2018 in U.S. Appl. No. 15/380,921.
USPTO; Non-Final Office Action dated Feb. 25, 2019 in U.S. Appl. No. 15/380,921.
USPTO; Final Office Action dated Sep. 18, 2019 in U.S. Appl. No. 15/380,921.
USPTO; Non-Final Office Action dated Jan. 15, 2020 in U.S. Appl. No. 15/380,921.
USPTO; Final Office Action dated Jul. 23, 2020 in U.S. Appl. No. 15/380,921.
USPTO Non-Final Office Action dated Dec. 10, 2020 in U.S. Appl. No. 15/380,921.
USPTO; Non-Final Office Action dated Oct. 3, 2017 in U.S. Appl. No. 15/388,410.
USPTO; Final Office Action dated May 15, 2018 in U.S. Appl. No. 15/388,410.
USPTO; Notice of Allowance dated Nov. 14, 2018 in U.S. Appl. No. 15/388,410.
USPTO; Notice of Allowance dated Dec. 28, 2018 in U.S. Appl. No. 15/388,410.
USPTO; Non-Final Office Action dated Aug. 11, 2017 in U.S. Appl. No. 15/397,237.
USPTO; Notice of Allowance dated Dec. 22, 2017 in U.S. Appl. No. 15/397,237.
USPTO; Non-Final Office Action dated Apr. 12, 2017 in U.S. Appl. No. 15/397,319.
USPTO; Final Office Action dated Jul. 12, 2017 in U.S. Appl. No. 15/397,319.
USPTO; Notice of Allowance dated Dec. 15, 2017 in U.S. Appl. No. 15/397,319.
USPTO; Non-Final Office Action dated Feb. 5, 2019 in U.S. Appl. No. 15/402,993.
USPTO; Final Office Action dated May 21, 2019 in U.S. Appl. No. 15/402,993.
USPTO; Advisory Action dated Jul. 29, 2019 in U.S. Appl. No. 15/402,993.
USPTO; Non-Final Office Action dated Oct. 24, 2019 in U.S. Appl. No. 15/402,993.
USPTO; Final Office Action dated Feb. 19, 2020 in U.S. Appl. No. 15/402,993.
USPTO; Advisory Action dated Apr. 2, 2020 in U.S. Appl. No. 15/402,993.
USPTO; Non-Final Office Action dated May 27, 2020 in U.S. Appl. No. 15/402,993.
USPTO; Final Office Action dated Sep. 8, 2020 in U.S. Appl. No. 15/402,993.
USPTO; Advisory Action dated Nov. 9, 2020 in U.S. Appl. No. 15/402,993.
USPTO; Non-Final Office Action dated Feb. 9, 2021 in U.S. Appl. No. 15/402,993.
USPTO; Final Office Action dated May 21, 2021 in U.S. Appl. No. 15/402,993.
USPTO; Non-Final Office Action dated Sep. 20, 2018 in U.S. Appl. No. 15/410,503.
USPTO; Final Office Action dated Feb. 4, 2019 in U.S. Appl. No. 15/410,503.
USPTO; Non-Final Office Action dated Apr. 25, 2019 in U.S. Appl. No. 15/410,503.
USPTO; Notice of Allowance dated Aug. 14, 2019 in U.S. Appl. No. 15/410,503.
USPTO; Non-Final Office Action dated Aug. 7, 2018 in U.S. Appl. No. 15/428,808.
USPTO; Final Office Action dated Jan. 11, 2019 in U.S. Appl. No. 15/428,808.
USPTO; Notice of Allowance dated Apr. 25, 2019 in U.S. Appl. No. 15/428,808.
USPTO; Non-Final Office Action dated Apr. 6, 2018 in U.S. Appl. No. 15/434,051.
USPTO; Final Office Action dated Aug. 29, 2018 in U.S. Appl. No. 15/434,051.
USPTO; Advisory Action dated Dec. 4, 2018 in U.S. Appl. No. 15/434,051.
USPTO; Non-Final Office Action dated Jan. 25, 2019 in U.S. Appl. No. 15/434,051.
USPTO; Notice of Allowance dated Jun. 3, 2019 in U.S. Appl. No. 15/434,051.
USPTO; Notice of Allowance dated Oct. 6, 2017 in U.S. Appl. No. 15/450,199.
USPTO; Non-Final Office Action dated Dec. 15, 2017 in U.S. Appl. No. 15/466,149.
USPTO; Notice of Allowance dated Apr. 20, 2018 in U.S. Appl. No. 15/466,149.
USPTO; Non-Final Office Action dated Apr. 6, 2018 in U.S. Appl. No. 15/472,750.
USPTO; Notice of Allowance dated Nov. 30, 2018 in U.S. Appl. No. 15/472,750.
USPTO; Non-Final Office Action dated Dec. 6, 2017 in U.S. Appl. No. 15/476,035.
USPTO; Notice of Allowance dated Mar. 21, 2018 in U.S. Appl. No. 15/476,035.
USPTO; Notice of Allowance dated Aug. 14, 2018 in U.S. Appl. No. 15/476,035.
USPTO; Non-Final Office Action dated Oct. 4, 2017 in U.S. Appl. No. 15/489,453.
USPTO; Final Office Action dated Apr. 19, 2018 in U.S. Appl. No. 15/489,453.
USPTO; Non-Final Office Action dated Sep. 10, 2018 in U.S. Appl. No. 15/489,453.
USPTO; Final Office Action dated Feb. 27, 2019 in U.S. Appl. No. 15/489,453.
USPTO; Non-Final Office Action dated Jun. 5, 2019 in U.S. Appl. No. 15/489,453.
USPTO; Notice of Allowance dated Oct. 7, 2019 in U.S. Appl. No. 15/489,453.
USPTO; Notice of Allowance dated Dec. 19, 2017 in U.S. Appl. No. 15/489,660.
USPTO; Final Office Action dated May 1, 2019 in U.S. Appl. No. 15/491,726.
USPTO; Non-Final Office Action dated May 31, 2018 in U.S. Appl. No. 15/491,726.
USPTO; Non-Final Office Action dated Oct. 3, 2019 in U.S. Appl. No. 15/491,726.
USPTO; Final Office Action dated Apr. 17, 2020 in U.S. Appl. No. 15/491,726.
USPTO; Non-Final Office Action dated Sep. 30, 2020 in U.S. Appl. No. 15/491,726.
USPTO; Non-Final Office Action dated Jan. 16, 2018 in U.S. Appl. No. 15/499,647.
USPTO; Notice of Allowance dated May 23, 2018 in U.S. Appl. No. 15/499,647.
USPTO; Non-Final Office Action dated Jun. 21, 2018 in U.S. Appl. No. 15/499,647.
USPTO; Notice of Allowance dated Nov. 1, 2018 in U.S. Appl. No. 15/499,647.
USPTO; Notice of Allowance dated Nov. 15, 2018 in U.S. Appl. No. 15/499,647.
USPTO; Office Action dated Aug. 30, 2018 in U.S. Appl. No. 15/589,849.

(56) References Cited

OTHER PUBLICATIONS

USPTO; Final Office Action dated Mar. 6, 2019 in U.S. Appl. No. 15/589,849.
USPTO; Non-Final Office Action dated Jun. 28, 2019 in U.S. Appl. No. 15/589,849.
USPTO; Final Office Action dated Jan. 8, 2020 in U.S. Appl. No. 15/589,849.
USPTO; Notice of Allowance dated Feb. 28, 2020 in U.S. Appl. No. 15/589,849.
USPTO; Office Action dated May 3, 2018 in U.S. Appl. No. 15/589,861.
USPTO; Non-Final Office Action dated Dec. 21, 2018 in U.S. Appl. No. 15/589,861.
USPTO; Final Office Action dated Jun. 26, 2019 in U.S. Appl. No. 15/589,861.
USPTO; Advisory Action dated Sep. 20, 2019 in U.S. Appl. No. 15/589,861.
USPTO; Non-Final Office Action dated Jan. 13, 2020 in U.S. Appl. No. 15/589,861.
USPTO; Final Office Action dated Jul. 8, 2020 in U.S. Appl. No. 15/589,861.
USPTO; Notice of Allowance dated Oct. 16, 2020 in U.S. Appl. No. 15/589,861.
USPTO; Non-Final Office Action dated Apr. 4, 2018 in U.S. Appl. No. 15/592,730.
USPTO; Final Office Action dated Nov. 16, 2018 in U.S. Appl. No. 15/592,730.
USPTO; Advisory Action dated Mar. 15, 2019 in U.S. Appl. No. 15/592,730.
USPTO; Notice of Allowance dated Aug. 21, 2019 in U.S. Appl. No. 15/592,730.
USPTO; Non-Final Office Action dated Mar. 7, 2019 in U.S. Appl. No. 15/598,169.
USPTO; Final Office Action dated Jun. 25, 2019 in U.S. Appl. No. 15/598,169.
USPTO; Notice of Allowance dated Sep. 11, 2019 in U.S. Appl. No. 15/598,169.
USPTO; Non-Final Office Action dated Mar. 10, 2020 in U.S. Appl. No. 15/611,707.
USPTO; Final Office Action dated Sep. 16, 2020 in U.S. Appl. No. 15/611,707.
USPTO; Advisory Action dated Nov. 20, 2020 in U.S. Appl. No. 15/611,707.
USPTO; Non-Final Office Action dated Feb. 3, 2021 in U.S. Appl. No. 15/611,707.
USPTO; Final Office Action dated Jun. 2, 2021 in U.S. Appl. No. 15/611,707.
USPTO; Ex Parte Quayle Action dated Mar. 21, 2019 in U.S. Appl. No. 15/615,489.
USPTO; Non-Final Office Action dated Sep. 4, 2019 in U.S. Appl. No. 15/615,489.
USPTO; Notice of Allowance dated Feb. 28, 2020 in U.S. Appl. No. 15/615,489.
USPTO; Non-Final Office Action dated Feb. 1, 2019 in U.S. Appl. No. 15/627,189.
USPTO; Notice of Allowance dated May 21, 2019 in U.S. Appl. No. 15/627,189.
USPTO; Non-Final Office Action dated Nov. 9, 2018 in U.S. Appl. No. 15/636,307.
USPTO; Final Office Action dated Mar. 6, 2019 in U.S. Appl. No. 15/636,307.
USPTO; Non-Final Office Action dated Jul. 16, 2019 in U.S. Appl. No. 15/636,307.
USPTO; Final Office Action dated Nov. 12, 2019 in U.S. Appl. No. 15/636,307.
USPTO; Advisory Action dated Jan. 17, 2020 in U.S. Appl. No. 15/636,307.
USPTO; Non-Final Office Action dated Mar. 11, 2020 in U.S. Appl. No. 15/636,307.
USPTO; Final Office Action dated Jun. 16, 2020 in U.S. Appl. No. 15/636,307.
USPTO; Non-Final Office Action dated Sep. 3, 2020 in U.S. Appl. No. 15/636,307.
USPTO; Final Office Action dated Jan. 19, 2021 in U.S. Appl. No. 15/636,307.
USPTO; Advisory Action dated Mar. 25, 2021 in U.S. Appl. No. 15/636,307.
USPTO; Non-Final Office Action dated Apr. 21, 2021 in U.S. Appl. No. 15/636,307.
USPTO; Notice of Allowance dated Jul. 18, 2018 in U.S. Appl. No. 15/640,239.
USPTO; Notice of Allowance dated Aug. 30, 2018 in U.S. Appl. No. 15/640,239.
USPTO; Non-Final Office Action dated Jun. 5, 2018 in U.S. Appl. No. 15/650,686.
USPTO; Final Office Action dated Nov. 20, 2018 in U.S. Appl. No. 15/650,686.
USPTO; Notice of Allowance dated Jun. 24, 2019 in U.S. Appl. No. 15/650,686.
USPTO; Non-Final Office Action dated Sep. 21, 2018 in U.S. Appl. No. 15/659,631.
USPTO; Notice of Allowance dated Feb. 21, 2019 in U.S. Appl. No. 15/659,631.
USPTO; Non-Final Office Action dated Jul. 29, 2019 in U.S. Appl. No. 15/660,797.
USPTO; Notice of Allowance dated Nov. 7, 2019 in U.S. Appl. No. 15/660,797.
USPTO; Non-Final Office Action dated Aug. 9, 2018 in U.S. Appl. No. 15/660,805.
USPTO; Non-Final Office Action dated Mar. 1, 2019 in U.S. Appl. No. 15/660,805.
USPTO; Notice of Allowance dated Aug. 22, 2019 in U.S. Appl. No. 15/660,805.
USPTO; Non-Final Office Action dated Aug. 27, 2018 in U.S. Appl. No. 15/662,107.
USPTO; Notice of Allowance dated Feb. 21, 2019 in U.S. Appl. No. 15/662,107.
USPTO; Non-Final Office Action dated Dec. 4, 2018 in U.S. Appl. No. 15/672,063.
USPTO; Notice of Allowance dated Mar. 20, 2019 in U.S. Appl. No. 15/672,063.
USPTO; Non-Final Office Action dated Oct. 10, 2019 in U.S. Appl. No. 15/672,096.
USPTO; Final Office Action dated Mar. 27, 2020 in U.S. Appl. No. 15/672,096.
USPTO; Notice of Allowance dated May 20, 2020 in U.S. Appl. No. 15/672,096.
USPTO; Notice of Allowance dated Jul. 2, 2020 in U.S. Appl. No. 15/672,096.
USPTO; Non-Final Office Action dated Feb. 8, 2019 in U.S. Appl. No. 15/672,119.
USPTO; Final Office Action dated Jul. 16, 2019 in U.S. Appl. No. 15/672,119.
USPTO; Advisory Action dated Sep. 23, 2019 in U.S. Appl. No. 15/672,119.
USPTO; Notice of Allowance dated Feb. 7, 2020 in U.S. Appl. No. 15/672,119.
USPTO; Non-Final Office Action dated Jul. 27, 2018 in U.S. Appl. No. 15/673,110.
USPTO; Notice of Allowance dated Jan. 9, 2019 in U.S. Appl. No. 15/673,110.
USPTO; Non-Final Office Action dated Apr. 25, 2018 in U.S. Appl. No. 15/673,278.
USPTO; Notice of Allowance dated May 6, 2019 in U.S. Appl. No. 15/673,278.
USPTO; Non-Final Office Action dated Jan. 18, 2018 in U.S. Appl. No. 15/683,701.
USPTO; Notice of Allowance dated Jan. 9, 2019 in U.S. Appl. No. 15/683,701.
USPTO; Final Office Action dated Aug. 24, 2018 in U.S. Appl. No. 15/683,701.

(56) References Cited

OTHER PUBLICATIONS

USPTO; Advisory Action dated Nov. 26, 2018 in U.S. Appl. No. 15/683,701.
USPTO; Non-Final Office Action dated Dec. 18, 2018 in U.S. Appl. No. 15/690,017.
USPTO; Final Office Action dated Jul. 26, 2019 in U.S. Appl. No. 15/690,017.
USPTO; Non-Final Office Action dated Nov. 20, 2019 in U.S. Appl. No. 15/690,017.
USPTO; Final Office Action dated May 27, 2020 in U.S. Appl. No. 15/690,017.
USPTO; Advisory Action dated Aug. 6, 2020 in U.S. Appl. No. 15/690,017.
USPTO; Non-Final Office Action dated Aug. 24, 2020 in U.S. Appl. No. 15/690,017.
USPTO; Final Office Action dated Mar. 10, 2021 in U.S. Appl. No. 15/690,017.
USPTO; Non-Final Office Action dated Aug. 9, 2018 in U.S. Appl. No. 15/691,241.
USPTO; Final Office Action dated Jan. 11, 2019 in U.S. Appl. No. 15/691,241.
USPTO; Non-Final Office Action dated Mar. 19, 2019 in U.S. Appl. No. 15/691,241.
USPTO; Final Office Action dated Jan. 24, 2020 in U.S. Appl. No. 15/691,241.
USPTO; Advisory Action dated Jun. 19, 2020 in U.S. Appl. No. 15/691,241.
USPTO; Non-Final Office Action dated Oct. 6, 2020 in U.S. Appl. No. 15/691,241.
USPTO; Notice of Allowance dated Apr. 16, 2021 in U.S. Appl. No. 15/691,241.
USPTO; Non-Final Office Action dated Dec. 6, 2018 in U.S. Appl. No. 15/705,955.
USPTO; Notice of Allowance dated Apr. 16, 2019 in U.S. Appl. No. 15/705,955.
USPTO; Non-Final Office Action dated Feb. 11, 2019 in U.S. Appl. No. 15/707,786.
USPTO; Final Office Action dated Aug. 12, 2019 in U.S. Appl. No. 15/707,786.
USPTO; Notice of Allowance dated Nov. 7, 2019 in U.S. Appl. No. 15/707,786.
USPTO; Non-Final Office Action dated Jun. 14, 2018 in U.S. Appl. No. 15/711,989.
USPTO; Notice of Allowance dated Dec. 6, 2018 in U.S. Appl. No. 15/711,989.
USPTO; Non-Final Office Action dated May 29, 2018 in U.S. Appl. No. 15/719,208.
USPTO; Final Office Action dated Dec. 13, 2018 in U.S. Appl. No. 15/719,208.
USPTO; Non-Final Office Action dated Jun. 25, 2019 in U.S. Appl. No. 15/719,208.
USPTO; Notice of Allowance dated Jan. 29, 2020 in U.S. Appl. No. 15/719,208.
USPTO; Non-Final Office Action dated Oct. 4, 2018 in U.S. Appl. No. 15/726,222.
USPTO; Notice of Allowance dated Apr. 19, 2019 in U.S. Appl. No. 15/726,222.
USPTO; Non-Final Office Action dated Apr. 19, 2018 in U.S. Appl. No. 15/726,959.
USPTO; Final Office Action dated Nov. 14, 2018 in U.S. Appl. No. 15/726,959.
USPTO; Non-Final Office Action dated Jul. 8, 2019 in U.S. Appl. No. 15/726,959.
USPTO; Final Office Action dated Jan. 7, 2020 in U.S. Appl. No. 15/726,959.
USPTO; Advisory Action dated Mar. 16, 2020 in U.S. Appl. No. 15/726,959.
USPTO; Non-Final Office Action dated Apr. 3, 2020 in U.S. Appl. No. 15/726,959.
USPTO; Final Office Action dated Sep. 24, 2020 in U.S. Appl. No. 15/726,959.
USPTO; Non-Final Office Action dated Jan. 6, 2021 in U.S. Appl. No. 15/726,959.
USPTO; Non-Final Office Action dated Sep. 26, 2019 in U.S. Appl. No. 15/727,432.
USPTO; Notice of Allowance dated Jan. 6, 2020 in U.S. Appl. No. 15/727,432.
USPTO; Non-Final Office Action dated May 17, 2018 in U.S. Appl. No. 15/729,485.
USPTO; Notice of Allowance dated Jan. 23, 2019 in U.S. Appl. No. 15/729,485.
USPTO; Non-Final Office Action dated Nov. 28, 2018 in U.S. Appl. No. 15/795,056.
USPTO; Final Office Action dated Apr. 19, 2019 in U.S. Appl. No. 15/795,056.
USPTO; Final Office Action dated Jul. 31, 2019 in U.S. Appl. No. 15/795,056.
USPTO; Non-Final Office Action dated Nov. 20, 2019 in U.S. Appl. No. 15/795,056.
USPTO; Notice of Allowance dated Mar. 12, 2020 in U.S. Appl. No. 15/795,056.
USPTO; Non-Final Office Action dated Jun. 26, 2018 in U.S. Appl. No. 15/796,593.
USPTO; Final Office Action dated Feb. 21, 2019 in U.S. Appl. No. 15/796,593.
USPTO; Non-Final Office Action dated Jun. 14, 2019 in U.S. Appl. No. 15/796,593.
USPTO; Notice of Allowance dated Dec. 31, 2019 in U.S. Appl. No. 15/796,593.
USPTO; Non-Final Office Action dated Dec. 26, 2017 in U.S. Appl. No. 15/798,120.
USPTO; Notice of Allowance dated Jun. 13, 2018 in U.S. Appl. No. 15/798,120.
USPTO; Non-Final Office Action dated Dec. 21, 2018 in U.S. Appl. No. 15/798,150.
USPTO; Notice of Allowance dated May 14, 2019 in U.S. Appl. No. 15/798,150.
USPTO; Non-Final Office Action dated Aug. 9, 2018 in U.S. Appl. No. 15/798,201.
USPTO; Final Office Action dated Dec. 14, 2018 in U.S. Appl. No. 15/798,201.
UPSTO; Non-Final Office Action dated Oct. 2, 2019 in U.S. Appl. No. 15/798,201.
USPTO; Final Office Action dated Mar. 19, 2020 in U.S. Appl. No. 15/798,201.
USPTO; Advisory Action dated May 26, 2020 in U.S. Appl. No. 15/798,201.
USPTO; Non-Final Office Action dated Jul. 10, 2020 in U.S. Appl. No. 15/798,201.
USPTO; Notice of Allowance dated Oct. 21, 2020 in U.S. Appl. No. 15/798,201.
USPTO; Non-Final Office Action dated Nov. 15, 2019 in U.S. Appl. No. 15/802,154.
USPTO; Final Office Action dated Mar. 11, 2020 in U.S. Appl. No. 15/802,154.
USPTO; Advisory Action dated May 19, 2020 in U.S. Appl. No. 15/802,154.
USPTO; Non-Final Office Action dated Jul. 2, 2020 in U.S. Appl. No. 15/802,154.
USPTO; Notice of Allowance dated Oct. 26, 2020 in U.S. Appl. No. 15/802,154.
USPTO; Non-Final Office Action dated Jul. 2, 2018 in U.S. Appl. No. 15/815,483.
USPTO; Final Office Action dated Mar. 7, 2019 in U.S. Appl. No. 15/815,483.
USPTO; Non-Final Office Action dated Aug. 20, 2019 in U.S. Appl. No. 15/815,483.
USPTO; Final Office Action dated Jan. 13, 2020 in U.S. Appl. No. 15/815,483.
USPTO; Advisory Action dated Mar. 25, 2020 in U.S. Appl. No. 15/815,483.

(56) References Cited

OTHER PUBLICATIONS

USPTO; Non-Final Office Action dated Apr. 24, 2020 in U.S. Appl. No. 15/815,483.
USPTO; Notice of Allowance dated Sep. 30, 2020 in U.S. Appl. No. 15/815,483.
USPTO; Non-Final Office Action dated Sep. 26, 2018 in U.S. Appl. No. 15/832,188.
USPTO; Notice of Allowance dated Dec. 5, 2017 in U.S. Appl. No. 15/832,188.
USPTO; Non-Final Office Action dated Mar. 17, 2020 in U.S. Appl. No. 15/835,328.
USPTO; Final Office Action dated Sep. 17, 2020 in U.S. Appl. No. 15/835,328.
USPTO; Advisory Action dated Dec. 15, 2020 in U.S. Appl. No. 15/835,328.
USPTO; Non-Final Office Action dated Mar. 18, 2021 in U.S. Appl. No. 15/835,328.
USPTO; Non-Final Office Action dated Feb. 20, 2020 in U.S. Appl. No. 15/835,352.
USPTO; Final Office Action dated Aug. 6, 2020 in U.S. Appl. No. 15/835,352.
USPTO; Notice of Allowance dated Jan. 14, 2021 in U.S. Appl. No. 15/835,352.
USPTO; Non-Final Office Action dated Sep. 10, 2018 in U.S. Appl. No. 15/836,547.
USPTO; Non-Final Office Action dated Mar. 13, 2019 in U.S. Appl. No. 15/836,547.
USPTO; Notice of Allowance dated Aug. 16, 2019 in U.S. Appl. No. 15/836,547.
USPTO; Notice of Allowance dated Aug. 17, 2020 in U.S. Appl. No. 15/843,899.
USPTO; Non-Final Office Action dated Jul. 31, 2019 in U.S. Appl. No. 15/860,564.
USPTO; Final Office Action dated Nov. 13, 2019 in U.S. Appl. No. 15/860,564.
USPTO; Advisory Action dated Jan. 21, 2020 in U.S. Appl. No. 15/860,564.
USPTO; Non-Final Office Action dated Mar. 30, 2020 in U.S. Appl. No. 15/860,564.
USPTO; Notice of Allowance dated Jun. 30, 2020 in U.S. Appl. No. 15/860,564.
USPTO; Non-Final Office Action dated Mar. 20, 2020 in U.S. Appl. No. 15/861,418.
USPTO; Final Office Action dated Jun. 11, 2020 in U.S. Appl. No. 15/861,418.
USPTO; Notice of Allowance dated Aug. 19, 2020 in U.S. Appl. No. 15/861,418.
USPTO; Non-Final Office Action dated Jul. 23, 2018 in U.S. Appl. No. 15/863,340.
USPTO; Notice of Allowance dated Dec. 10, 2018 in U.S. Appl. No. 15/863,340.
USPTO; Non-Final Office Action dated Jan. 11, 2019 in U.S. Appl. No. 15/879,209.
USPTO; Non-Final Office Action dated Jan. 22, 2019 in U.S. Appl. No. 15/879,209.
USPTO; Final Office Action dated Aug. 21, 2019 in U.S. Appl. No. 15/879,209.
USPTO; Advisory Action dated Nov. 5, 2019 in U.S. Appl. No. 15/879,209.
USPTO; Notice of Allowance dated Jan. 16, 2020 in U.S. Appl. No. 15/879,209.
USPTO; Non-Final Office Action dated Apr. 17, 2019 in U.S. Appl. No. 15/886,225.
USPTO; Notice of Allowance dated Sep. 23, 2019 in U.S. Appl. No. 15/886,225.
USPTO; Non-Final Office Action dated Nov. 15, 2018 in U.S. Appl. No. 15/890,037.
USPTO; Final Office Action dated May 2, 2019 in U.S. Appl. No. 15/890,037.
USPTO; Non-Final Office Action dated Oct. 24, 2019 in U.S. Appl. No. 15/890,037.
USPTO; Final Office Action dated Feb. 26, 2020 in U.S. Appl. No. 15/890,037.
USPTO; Advisory Action dated Jun. 5, 2020 in U.S. Appl. No. 15/890,037.
USPTO; Non-Final Office Action dated Sep. 2, 2020 in U.S. Appl. No. 15/890,037.
USPTO; Final Office Action dated Jan. 11, 2021 in U.S. Appl. No. 15/890,037.
USPTO; Notice of Allowance dated Mar. 19, 2021 in U.S. Appl. No. 15/890,037.
USPTO; Notice of Allowance dated Feb. 8, 2019 in U.S. Appl. No. 15/892,756.
USPTO; Non-Final Office Action dated Apr. 24, 2019 in U.S. Appl. No. 15/896,986.
USPTO; Final Office Action dated Nov. 19, 2019 in U.S. Appl. No. 15/896,986.
USPTO; Advisory Action dated Feb. 7, 2020 in U.S. Appl. No. 15/896,986.
USPTO; Non-Final Office Action dated Mar. 24, 2020 in U.S. Appl. No. 15/896,986.
USPTO; Final Office Action dated Jun. 15, 2020 in U.S. Appl. No. 15/896,986.
USPTO; Notice of Allowance dated Aug. 26, 2020 in U.S. Appl. No. 15/896,986.
USPTO; Non-Final Office Action dated Sep. 19, 2019 in U.S. Appl. No. 15/897,578.
USPTO; Notice of Allowance dated Mar. 27, 2020 in U.S. Appl. No. 15/897,578.
USPTO; Non-Final Office Action dated May 30, 2019 in U.S. Appl. No. 15/900,425.
USPTO; Notice of Allowance dated Dec. 17, 2019 in U.S. Appl. No. 15/900,425.
USPTO; Non-Final Office Action dated Sep. 9, 2020 in U.S. Appl. No. 15/909,705.
USPTO; Final Office Action dated Apr. 19, 2021 in U.S. Appl. No. 15/909,705.
USPTO; Non-Final Office Action dated Mar. 8, 2019 in U.S. Appl. No. 15/917,224.
USPTO; Final Office Action dated Aug. 28, 2019 in U.S. Appl. No. 15/917,224.
USPTO; Advisory Action dated Nov. 27, 2019 in U.S. Appl. No. 15/917,224.
USPTO; Non-Final Office Action dated May 1, 2020 in U.S. Appl. No. 15/917,224.
USPTO; Final Office Action dated Sep. 24, 2020 in U.S. Appl. No. 15/917,224.
USPTO; Non-Final Office Action dated May 20, 2021 in U.S. Appl. No. 15/917,224.
USPTO; Non-Final Office Action dated Feb. 8, 2019 in U.S. Appl. No. 15/917,262.
USPTO; Final Office Action dated Jun. 14, 2019 in U.S. Appl. No. 15/917,262.
USPTO; Notice of Allowance dated Aug. 30, 2019 in U.S. Appl. No. 15/917,262.
USPTO; Non-Final Office Action dated Dec. 23, 2019 in U.S. Appl. No. 15/923,834.
USPTO; Final Office Action dated Mar. 12, 2020 in U.S. Appl. No. 15/923,834.
USPTO; Advisory Action dated May 15, 2020 in U.S. Appl. No. 15/923,834.
USPTO; Non-Final Office Action dated Jul. 6, 2020 in U.S. Appl. No. 15/923,834.
USPTO; Final Office Action dated Oct. 19, 2020 in U.S. Appl. No. 15/923,834.
USPTO; Advisory Action dated Jan. 8, 2021 in U.S. Appl. No. 15/923,834.
USPTO; Non-Final Office Action dated Feb. 18, 2021 in U.S. Appl. No. 15/923,834.
USPTO; Non-Final Office Action dated May 8, 2019 in U.S. Appl. No. 15/925,532.

(56) References Cited

OTHER PUBLICATIONS

USPTO; Final Office Action dated Nov. 27, 2019 in U.S. Appl. No. 15/925,532.
USPTO; Non-Final Office Action dated May 1, 2020 in U.S. Appl. No. 15/925,532.
USPTO; Final Office Action dated Oct. 15, 2020 in U.S. Appl. No. 15/925,532.
USPTO; Advisory Action dated Dec. 24, 2020 in U.S. Appl. No. 15/925,532.
USPTO; Non-Final Office Action dated Jan. 25, 2021 in U.S. Appl. No. 15/925,532.
USPTO; Non-Final Office Action dated Oct. 6, 2020 in U.S. Appl. No. 15/940,729.
USPTO; Final Office Action dated Feb. 18, 2021 in U.S. Appl. No. 15/940,729.
USPTO; Advisory Action dated Apr. 28, 2021 in U.S. Appl. No. 15/940,729.
USPTO; Non-Final Office Action dated Jul. 22, 2019 in U.S. Appl. No. 15/940,759.
USPTO; Final Office Action dated Feb. 19, 2020 in U.S. Appl. No. 15/940,759.
USPTO; Advisory Action dated Apr. 23, 2020 in U.S. Appl. No. 15/940,759.
USPTO; Non-Final Office Action dated Aug. 3, 2020 in U.S. Appl. No. 15/940,759.
USPTO; Final Office Action dated Jan. 12, 2021 in U.S. Appl. No. 15/940,759.
USPTO; Notice of Allowance dated Apr. 7, 2021 in U.S. Appl. No. 15/940,759.
USPTO; Non-Final Office Action dated Mar. 29, 2019 in U.S. Appl. No. 15/940,801.
USPTO; Notice of Allowance dated Aug. 26, 2019 in U.S. Appl. No. 15/940,801.
USPTO; Non-Final Rejection dated Nov. 29, 2019 in U.S. Appl. No. 15/949,990.
USPTO; Notice of Allowance dated Mar. 12, 2020 in U.S. Appl. No. 15/949,990.
USPTO; Notice of Allowance dated May 31, 2019 in U.S. Appl. No. 15/957,565.
USPTO; Non-Final Office Action dated Jan. 31, 2020 in U.S. Appl. No. 15/962,980.
USPTO; Final Office Action dated Apr. 30, 2020 in U.S. Appl. No. 15/962,980.
USPTO; Advisory Action dated Jul. 2, 2020 in U.S. Appl. No. 15/962,980.
USPTO; Non-Final Office Action dated Sep. 14, 2020 in U.S. Appl. No. 15/962,980.
USPTO; Final Office Action dated Dec. 15, 2020 in U.S. Appl. No. 15/962,980.
USPTO; Advisory Action dated Feb. 22, 2021 in U.S. Appl. No. 15/962,980.
USPTO; Non-Final Office Action dated Oct. 6, 2020 in U.S. Appl. No. 15/967,146.
USPTO; Final Office Action dated Apr. 13, 2021 in U.S. Appl. No. 15/967,146.
USPTO; Advisory Action dated Jun. 2, 2021 in U.S. Appl. No. 15/967,146.
USPTO; Non-Final Office Action dated Apr. 2, 2020 in U.S. Appl. No. 15/974,948.
USPTO; Final Office Action dated Sep. 3, 2020 in U.S. Appl. No. 15/974,948.
USPTO; Advisory Action dated Oct. 27, 2020 in U.S. Appl. No. 15/974,948.
USPTO; Non-Final Office Action dated Feb. 19, 2021 in U.S. Appl. No. 15/974,948.
USPTO; Non-Final Office Action dated May 15, 2020 in U.S. Appl. No. 15/974,988.
USPTO; Notice of Allowance dated Oct. 14, 2020 in U.S. Appl. No. 15/974,988.
USPTO; Non-Final Office Action dated Jan. 16, 2020 in U.S. Appl. No. 15/985,261.
USPTO; Notice of Allowance dated Apr. 3, 2020 in U.S. Appl. No. 15/985,261.
USPTO; Non-Final Office Action dated Apr. 19, 2019 in U.S. Appl. No. 15/985,298.
USPTO; Notice of Allowance dated Aug. 22, 2019 in U.S. Appl. No. 15/985,298.
USPTO; Non-Final Office Action dated Jun. 12, 2020 in U.S. Appl. No. 15/985,539.
USPTO; Final Office Action dated Nov. 25, 2020 in U.S. Appl. No. 15/985,539.
USPTO; Non-Final Office Action dated May 25, 2021 in U.S. Appl. No. 15/985,539.
USPTO; Non-Final Office Action dated Feb. 21, 2019 in U.S. Appl. No. 15/987,755.
USPTO; Notice of Allowance dated Jul. 31, 2019 in U.S. Appl. No. 15/987,755.
USPTO; Non-Final Office Action dated Feb. 20, 2020 in U.S. Appl. No. 15/996,286.
USPTO; Final Office Action dated Jul. 24, 2020 in U.S. Appl. No. 15/996,286.
USPTO; Advisory Action dated Oct. 7, 2020 in U.S. Appl. No. 15/996,286.
USPTO; Non-Final Office Action dated Apr. 5, 2021 in U.S. Appl. No. 15/996,286.
USPTO; Non-Final Office Action dated Apr. 1, 2020 in U.S. Appl. No. 15/997,445.
USPTO; Final Office Action dated Oct. 2, 2020 in U.S. Appl. No. 15/997,445.
USPTO; Notice of Allowance dated Jul. 10, 2020 in U.S. Appl. No. 15/998,775.
USPTO; Non-Final Office Action dated Mar. 3, 2020 in U.S. Appl. No. 16/000,109.
USPTO; Final Office Action dated Sep. 14, 2020 in U.S. Appl. No. 16/000,109.
USPTO; Advisory Action dated Dec. 10, 2020 in U.S. Appl. No. 16/000,109.
USPTO; Non-Final Office Action dated Feb. 4, 2021 in U.S. Appl. No. 16/000,109.
USPTO; Non-Final Office Action dated Jul. 29, 2019 in U.S. Appl. No. 16/000,125.
USPTO; Final Office Action dated Jan. 13, 2020 in U.S. Appl. No. 16/000,125.
USPTO; Advisory Action dated Apr. 3, 2020 in U.S. Appl. No. 16/000,125.
USPTO; Non-Final Office Action dated Jun. 5, 2020 in U.S. Appl. No. 16/000,125.
USPTO; Final Office Action dated Oct. 6, 2020 in U.S. Appl. No. 16/000,125.
USPTO; Advisory Action dated Dec. 15, 2020 in U.S. Appl. No. 16/000,125.
USPTO; Non-Final Office Action dated May 19, 2021 in U.S. Appl. No. 16/000,125.
USPTO; Non-Final Office Action dated Apr. 22, 2020 in U.S. Appl. No. 16/000,156.
USPTO; Final Office Action dated Oct. 22, 2020 in U.S. Appl. No. 16/000,156.
USPTO; Advisory Action dated Dec. 14, 2020 in U.S. Appl. No. 16/000,156.
USPTO; Notice of Allowance dated Feb. 5, 2021 in U.S. Appl. No. 16/000,156.
USPTO; Non-Final Office Action dated May 7, 2020 in U.S. Appl. No. 16/004,041.
USPTO; Final Office Action dated Oct. 15, 2020 in U.S. Appl. No. 16/004,041.
USPTO; Advisory Action dated Dec. 22, 2020 in U.S. Appl. No. 16/004,041.
USPTO; Non-Final Office Action dated Mar. 19, 2021 in U.S. Appl. No. 16/004,041.
USPTO; Non-Final Office Action dated Jul. 16, 2019 in U.S. Appl. No. 16/014,981.

(56) References Cited

OTHER PUBLICATIONS

USPTO; Non-Final Office Action dated Jan. 16, 2020 in U.S. Appl. No. 16/014,981.
USPTO; Notice of Allowance dated Jun. 24, 2020 in U.S. Appl. No. 16/014,981.
USPTO; Non-Final Office Action dated Jan. 24, 2019 in U.S. Appl. No. 16/018,692.
USPTO; Final Office Action dated Aug. 23, 2019 in U.S. Appl. No. 16/018,692.
USPTO; Non-Final Office Action dated Dec. 11, 2019 in U.S. Appl. No. 16/018,692.
USPTO; Notice of Allowance dated Jan. 30, 2020 in U.S. Appl. No. 16/018,692.
USPTO; Non-Final Office Action dated Aug. 7, 2019 in U.S. Appl. No. 16/024,390.
USPTO; Notice of Allowance dated Nov. 26, 2019 in U.S. Appl. No. 16/024,390.
USPTO; Notice of Allowance dated Apr. 9, 2019 in U.S. Appl. No. 16/026,711.
USPTO; Non-Final Office Action dated Mar. 4, 2020 in U.S. Appl. No. 16/036,692.
USPTO; Notice of Allowance dated May 26, 2020 in U.S. Appl. No. 16/036,692.
USPTO; Non-Final Office Action dated Apr. 25, 2019 in U.S. Appl. No. 16/038,024.
USPTO; Final Office Action dated Nov. 29, 2019 in U.S. Appl. No. 16/038,024.
USPTO; Advisory Action dated Feb. 28, 2020 in U.S. Appl. No. 16/038,024.
USPTO; Notice of Allowance dated Mar. 23, 2020 in U.S. Appl. No. 16/038,024.
USPTO; Non-Final Office Action dated Sep. 8, 2020 in U.S. Appl. No. 16/039,817.
USPTO; Non-Final Office Action dated Jul. 25, 2019 in U.S. Appl. No. 16/039,867.
USPTO; Final Office Action dated Jan. 28, 2020 in U.S. Appl. No. 16/039,867.
USPTO; Notice of Allowance dated Apr. 3, 2020 in U.S. Appl. No. 16/039,867.
USPTO; Non-Final Office Action dated Nov. 24, 2020 in U.S. Appl. No. 16/039,938.
USPTO; Final Office Action dated Mar. 23, 2021 in U.S. Appl. No. 16/039,817.
USPTO; Advisory Action dated May 28, 2021 in U.S. Appl. No. 16/039,817.
USPTO; Non-Final Office Action dated Aug. 4, 2020 in U.S. Appl. No. 16/042,791.
USPTO; Final Office Action dated Mar. 8, 2021 in U.S. Appl. No. 16/042,791.
USPTO; Advisory Action dated May 14, 2021 in U.S. Appl. No. 16/042,791.
USPTO; Notice of Allowance dated Jul. 10, 2019 in U.S. Appl. No. 16/046,218.
USPTO; Non-Final Office Action dated Apr. 30, 2020 in U.S. Appl. No. 16/055,532.
USPTO; Final Office Action dated Jul. 30, 2020 in U.S. Appl. No. 16/055,532.
USPTO; Final Office Action dated Nov. 3, 2020 in U.S. Appl. No. 16/055,532.
USPTO; Advisory Action dated Jan. 14, 2021 in U.S. Appl. No. 16/055,532.
USPTO; Notice of Allowance dated Mar. 10, 2021 in U.S. Appl. No. 16/055,532.
USPTO; Non-Final Office Action dated May 27, 2020 in U.S. Appl. No. 16/100,012.
USPTO; Notice of Allowance dated Sep. 14, 2020 in U.S. Appl. No. 16/100,012.
USPTO; Non-Final Office Action dated Feb. 20, 2020 in U.S. Appl. No. 16/105,745.
USPTO; Final Office Action dated Jun. 23, 2020 in U.S. Appl. No. 16/105,745.
USPTO; Advisory Action dated Aug. 25, 2020 in U.S. Appl. No. 16/105,745.
USPTO; Non-Final Office Action dated Nov. 25, 2020 in U.S. Appl. No. 16/105,745.
USPTO; Final Office Action dated Mar. 23, 2021 in U.S. Appl. No. 16/105,745.
USPTO; Non-Final Office Action dated Feb. 24, 2020 in U.S. Appl. No. 16/105,761.
USPTO; Final Office Action dated Apr. 21, 2020 in U.S. Appl. No. 16/105,761.
USPTO; Advisory Action dated Jul. 8, 2020 in U.S. Appl. No. 16/105,761.
USPTO; Non-Final Office Action dated Nov. 25, 2020 in U.S. Appl. No. 16/105,761.
USPTO; Final Office Action dated Mar. 24, 2021 in U.S. Appl. No. 16/105,761.
USPTO; Advisory Action dated May 20, 2021 in U.S. Appl. No. 16/105,761.
USPTO; Non-Final Office Action dated Mar. 19, 2020 in U.S. Appl. No. 16/105,802.
USPTO; Final Office Action dated Jun. 26, 2020 in U.S. Appl. No. 16/105,802.
USPTO; Final Office Action dated Mar. 18, 2021 in U.S. Appl. No. 16/105,802.
USPTO; Advisory Action dated May 27, 2021 in U.S. Appl. No. 16/105,802.
USPTO; Non-Final Office Action dated Sep. 8, 2020 in U.S. Appl. No. 16/108,950.
USPTO; Final Office Action dated Dec. 15, 2020 in U.S. Appl. No. 16/108,950.
USPTO; Advisory Action dated Feb. 17, 2021 in U.S. Appl. No. 16/108,950.
USPTO; Non-Final Office Action dated Apr. 13, 2021 in U.S. Appl. No. 16/108,950.
USPTO; Non-Final Office Action dated Mar. 16, 2020 in U.S. Appl. No. 16/116,708.
USPTO; Final Office Action dated Sep. 2, 2020 in U.S. Appl. No. 16/116,708.
USPTO; Advisory Action dated Nov. 17, 2020 in U.S. Appl. No. 16/116,708.
USPTO; Notice of Allowance dated Mar. 23, 2021 in U.S. Appl. No. 16/116,708.
USPTO; Non-Final Office Action dated Feb. 6, 2020 in U.S. Appl. No. 16/117,530.
USPTO; Final Office Action dated Jan. 6, 2021 in U.S. Appl. No. 16/117,530.
USPTO; Advisory Action dated Mar. 10, 2021 in U.S. Appl. No. 16/117,530.
USPTO; Non-Final Office Action dated Jun. 22, 2020 in U.S. Appl. No. 16/128,282.
USPTO; Final Office Action dated Nov. 19, 2020 in U.S. Appl. No. 16/128,282.
USPTO; Notice of Allowance dated Feb. 12, 2021 in U.S. Appl. No. 16/128,282.
USPTO; Non-Final Office Action dated Apr. 21, 2020 in U.S. Appl. No. 16/130,798.
USPTO; Notice of Allowance dated Aug. 5, 2020 in U.S. Appl. No. 16/130,798.
USPTO; Non-Final Office Action dated Jan. 6, 2020 in U.S. Appl. No. 16/132,142.
USPTO; Final Office Action dated Jun. 5, 2020 in U.S. Appl. No. 16/132,142.
USPTO; Advisory Action dated Aug. 24, 2020 in U.S. Appl. No. 16/132,142.
USPTO; Non-Final Office Action dated Oct. 16, 2020 in U.S. Appl. No. 16/132,142.
USPTO; Notice of Allowance dated Feb. 8, 2021 in U.S. Appl. No. 16/132,142.
USPTO; Non-Final Office Action dated Feb. 28, 2020 in U.S. Appl. No. 16/137,974.

(56) References Cited

OTHER PUBLICATIONS

USPTO; Final Office Action dated Aug. 20, 2020 in U.S. Appl. No. 16/137,974.
USPTO; Notice of Allowance dated Nov. 3, 2020 in U.S. Appl. No. 16/137,974.
USPTO; Non-Final Office Action dated Apr. 2, 2019 in U.S. Appl. No. 16/147,047.
USPTO; Final Office Action dated Sep. 25, 2019 in U.S. Appl. No. 16/147,047.
USPTO; Notice of Allowance dated Jan. 3, 2020 in U.S. Appl. No. 16/147,047.
USPTO; Non-Final Office Action dated Jul. 30, 2020 in U.S. Appl. No. 16/151,074.
USPTO; Final Office Action dated Dec. 14, 2020 in U.S. Appl. No. 16/151,074.
USPTO; Advisory Action dated Feb. 16, 2021 in U.S. Appl. No. 16/151,074.
USPTO; Non-Final Office Action dated Mar. 23, 2021 in U.S. Appl. No. 16/151,074.
USPTO; Non-Final Office Action dated Nov. 5, 2019 in U.S. Appl. No. 16/152,260.
USPTO; Advisory Action dated Sep. 16, 2020 in U.S. Appl. No. 16/152,260.
USPTO; Final Office Action dated Jul. 15, 2020 in U.S. Appl. No. 16/152,260.
USPTO; Non-Final Office Action dated Nov. 9, 2020 in U.S. Appl. No. 16/152,260.
USPTO; Final Office Action dated May 6, 2021 in U.S. Appl. No. 16/152,260.
USPTO; Non-Final Office Action dated Aug. 6, 2019 in U.S. Appl. No. 16/158,077.
USPTO; Final Office Action dated Mar. 2, 2020 in U.S. Appl. No. 16/158,077.
USPTO; Advisory Action dated Jun. 9, 2020 in U.S. Appl. No. 16/158,077.
USPTO; Notice of Allowance dated Jul. 24, 2020 in U.S. Appl. No. 16/158,077.
USPTO; Non-Final Office Action dated Aug. 29, 2019 in U.S. Appl. No. 16/161,744.
USPTO; Final Office Action dated Mar. 17, 2020 in U.S. Appl. No. 16/161,744.
USPTO; Notice of Allowance dated Jun. 19, 2020 in U.S. Appl. No. 16/161,744.
USPTO; Non-Final Office Action dated Jul. 23, 2020 in U.S. Appl. No. 16/167,164.
USPTO; Final Office Action dated Dec. 18, 2020 in U.S. Appl. No. 16/167,164.
USPTO; Notice of Allowance dated Feb. 24, 2021 in U.S. Appl. No. 16/167,164.
USPTO; Non-Final Office Action dated Aug. 16, 2019 in U.S. Appl. No. 16/167,225.
USPTO; Final Office Action dated Dec. 16, 2019 in U.S. Appl. No. 16/167,225.
USPTO; Notice of Allowance dated Mar. 5, 2020 in U.S. Appl. No. 16/167,225.
USPTO; Notice of Allowance dated Apr. 17, 2019 in U.S. Appl. No. 16/171,098.
USPTO; Notice of Allowance dated May 1, 2019 in U.S. Appl. No. 16/171,098.
USPTO; Non-Final Office Action dated Aug. 7, 2020 in U.S. Appl. No. 16/172,535.
USPTO; Final Office Action dated Oct. 16, 2020 in U.S. Appl. No. 16/172,535.
USPTO; Advisory Action dated Dec. 21, 2020 in U.S. Appl. No. 16/172,535.
USPTO; Non-Final Office Action dated Feb. 19, 2021 in U.S. Appl. No. 16/172,535.
USPTO; Final Office Action dated May 27, 2021 in U.S. Appl. No. 16/172,535.
USPTO; Non-Final Office Action dated Nov. 4, 2020 in U.S. Appl. No. 16/176,517.
USPTO; Final Office Action dated Jan. 29, 2021 in U.S. Appl. No. 16/176,517.
USPTO; Advisory Action dated Apr. 5, 2021 in U.S. Appl. No. 16/176,517.
USPTO; Notice of Allowance dated May 13, 2021 in U.S. Appl. No. 16/176,517.
USPTO; Non-Final Office Action dated Oct. 29, 2020 in U.S. Appl. No. 16/183,258.
USPTO; Notice of Allowance dated Feb. 19, 2021 in U.S. Appl. No. 16/183,258.
USPTO; Non-Final Office Action dated Apr. 2, 2019 in U.S. Appl. No. 16/188,690.
USPTO; Final Office Action dated Sep. 26, 2019 in U.S. Appl. No. 16/188,690.
USPTO; Notice of Allowance dated Dec. 16, 2019 in U.S. Appl. No. 16/188,690.
USPTO; Notice of Allowance dated Jul. 28, 2020 in U.S. Appl. No. 16/193,789.
USPTO; Notice of Allowance dated Jul. 7, 2020 in U.S. Appl. No. 16/194,041.
USPTO; Notice of Allowance dated Oct. 3, 2019 in U.S. Appl. No. 16/200,100.
USPTO; Non-Final Office Action dated Dec. 11, 2021 in U.S. Appl. No. 16/202,941.
USPTO; Non-Final Office Action dated May 29, 2020 in U.S. Appl. No. 16/205,899.
USPTO; Final Office Action dated Nov. 27, 2020 in U.S. Appl. No. 16/205,899.
USPTO; Notice of Allowance dated Feb. 10, 2021 in U.S. Appl. No. 16/205,899.
USPTO; Non-Final Office Action dated Mar. 29, 2021 in U.S. Appl. No. 16/206,589.
USPTO; Non-Final Office Action dated Aug. 19, 2019 in U.S. Appl. No. 16/208,062.
USPTO; Notice of Allowance dated Jan. 28, 2020 in U.S. Appl. No. 16/208,062.
USPTO; Non-Final Office Action dated Jul. 15, 2020 in U.S. Appl. No. 16/210,922.
USPTO; Final Office Action dated Dec. 9, 2020 in U.S. Appl. No. 16/210,922.
USPTO; Advisory Action dated Feb. 25, 2021 in U.S. Appl. No. 16/210,922.
USPTO; Non-Final Office Action dated Sep. 16, 2019 in U.S. Appl. No. 16/213,702.
USPTO; Notice of Allowance dated Dec. 9, 2019 in U.S. Appl. No. 16/213,702.
USPTO; Non-Final Office Action dated Jan. 8, 2020 in U.S. Appl. No. 16/219,555.
USPTO; Final Office Action dated Jun. 19, 2020 in U.S. Appl. No. 16/219,555.
USPTO; Advisory Action dated Sep. 11, 2020 in U.S. Appl. No. 16/219,555.
USPTO; Non-Final Office Action dated Sep. 30, 2020 in U.S. Appl. No. 16/219,555.
USPTO; Final Office Action dated Mar. 29, 2021 in U.S. Appl. No. 16/219,555.
USPTO; Non-Final Office Action dated May 2, 2021 in U.S. Appl. No. 16/240,392.
USPTO; Non-Final Office Action dated Feb. 19, 2020 in U.S. Appl. No. 16/242,829.
USPTO; Final Office Action dated Jun. 15, 2020 in U.S. Appl. No. 16/242,829.
USPTO; Advisory Action dated Aug. 11, 2020 in U.S. Appl. No. 16/242,829.
USPTO; Notice of Allowance dated Sep. 23, 2020 in U.S. Appl. No. 16/242,829.
USPTO; Non-Final Office Action dated Sep. 3, 2020 in U.S. Appl. No. 16/242,852.
USPTO; Notice of Allowance dated Dec. 15, 2020 in U.S. Appl. No. 16/242,852.

(56) References Cited

OTHER PUBLICATIONS

USPTO; Non-Final Office Action dated Jan. 30, 2020 in U.S. Appl. No. 16/245,006.
USPTO; Notice of Allowance dated May 29, 2020 in U.S. Appl. No. 16/245,006.
USPTO; Non-Final Office Action dated Sep. 24, 2019 in U.S. Appl. No. 16/251,534.
USPTO; Final Office Action dated Jan. 10, 2020 in U.S. Appl. No. 16/251,534.
USPTO; Advisory Action dated Apr. 3, 2020 in U.S. Appl. No. 16/251,534.
USPTO; Non-Final Office Action dated Apr. 24, 2020 in U.S. Appl. No. 16/251,534.
USPTO; Final Office Action dated Oct. 14, 2020 in U.S. Appl. No. 16/251,534.
USPTO; Advisory Action dated Jan. 26, 2021 in U.S. Appl. No. 16/251,534.
USPTO; Non-Final Office Action dated Feb. 23, 2021 in U.S. Appl. No. 16/251,534.
USPTO; Non-Final Office Action dated May 27, 2020 in U.S. Appl. No. 16/252,567.
USPTO; Final Office Action dated Nov. 18, 2020 in U.S. Appl. No. 16/252,567.
USPTO; Advisory Action dated Jan. 22, 2021 in U.S. Appl. No. 16/252,567.
USPTO; Non-Final Office Action dated Mar. 30, 2021 in U.S. Appl. No. 16/252,567.
USPTO; Non-Final Office Action dated Mar. 4, 2021 in U.S. Appl. No. 16/252,569.
USPTO; Non-Final Office Action dated Apr. 16, 2020 in U.S. Appl. No. 16/255,639.
USPTO; Notice of Allowance dated Aug. 6, 2020 in U.S. Appl. No. 16/255,639.
USPTO; Non-Final Office Action dated Jun. 30, 2020 in U.S. Appl. No. 16/258,187.
USPTO; Notice of Allowance dated Aug. 5, 2020 in U.S. Appl. No. 16/258,187.
USPTO; Non-Final Office Action dated Dec. 18, 2019 in U.S. Appl. No. 16/280,964.
USPTO; Notice of Allowance dated May 21, 2020 in U.S. Appl. No. 16/280,964.
USPTO; Non-Final Office Action dated Jan. 9, 2020 in U.S. Appl. No. 16/317,774.
USPTO; Notice of Allowance dated Apr. 15, 2020 in U.S. Appl. No. 16/317,774.
USPTO; Non-Final Office Action dated Mar. 2, 2020 in U.S. Appl. No. 16/356,394.
USPTO; Final Office Action dated Jun. 30, 2020 in U.S. Appl. No. 16/356,394.
USPTO; Notice of Allowance dated Aug. 31, 2020 in U.S. Appl. No. 16/356,394.
USPTO; Notice of Allowance dated Jun. 13, 2019 in U.S. Appl. No. 16/396,475.
USPTO; Non-Final Office Action dated Aug. 5, 2020 in U.S. Appl. No. 16/397,045.
USPTO; Final Office Action dated Dec. 8, 2020 in U.S. Appl. No. 16/397,045.
USPTO; Advisory Action dated Jan. 27, 2021 in U.S. Appl. No. 16/397,045.
USPTO; Non-Final Office Action dated Apr. 20, 2021 in U.S. Appl. No. 16/397,045.
USPTO; Non-Final Office Action dated Aug. 19, 2020 in U.S. Appl. No. 16/400,814.
USPTO; Final Office Action dated Dec. 14, 2020 in U.S. Appl. No. 16/400,814.
USPTO; Notice of Allowance dated Mar. 10, 2021 in U.S. Appl. No. 16/400,814.
USPTO; Non-Final Office Action dated Dec. 26, 2019 in U.S. Appl. No. 16/417,938.
USPTO; Notice of Allowance dated Mar. 30, 2020 in U.S. Appl. No. 16/417,938.
USPTO; Non-Final Office Action dated May 7, 2021 in U.S. Appl. No. 16/423,824.
USPTO; Non-Final Office Action dated Dec. 31, 2019 in U.S. Appl. No. 16/427,288.
USPTO; Notice of Allowance dated Apr. 16, 2020 in U.S. Appl. No. 16/427,288.
USPTO; Non-Final Office Action dated Jan. 12, 2021 in U.S. Appl. No. 16/453,249.
USPTO; Notice of Allowance dated Apr. 28, 2021 in U.S. Appl. No. 16/453,249.
USPTO; Non-Final Office Action dated May 12, 2020 in U.S. Appl. No. 16/454,063.
USPTO; Notice of Allowance dated Sep. 18, 2020 in U.S. Appl. No. 16/454,063.
USPTO; Non-Final Office Action dated Dec. 31, 2019 in U.S. Appl. No. 16/455,406.
USPTO; Notice of Allowance dated Apr. 17, 2020 in U.S. Appl. No. 16/455,406.
USPTO; Non-Final Office Action dated Nov. 27, 2020 in U.S. Appl. No. 16/468,258.
USPTO; Final Office Action dated May 20, 2021 in U.S. Appl. No. 16/468,258.
USPTO; Non-Final Office Action dated Dec. 28, 2020 in U.S. Appl. No. 16/517,122.
USPTO; Notice of Allowance dated Apr. 26, 2021 in U.S. Appl. No. 16/517,122.
USPTO; Non-Final Office Action dated Nov. 5, 2020 in U.S. Appl. No. 16/546,543.
USPTO; Final Office Action dated May 12, 2021 in U.S. Appl. No. 16/546,543.
USPTO; Non-Final Office Action dated Feb. 1, 2021 in U.S. Appl. No. 16/563,473.
USPTO; Non-Final Office Action dated Feb. 11, 2021 in U.S. Appl. No. 16/565,460.
USPTO; Non-Final Office Action dated Jun. 11, 2020 in U.S. Appl. No. 16/598,768.
USPTO; Notice of Allowance dated Sep. 16, 2020 in U.S. Appl. No. 16/598,768.
USPTO; Non-Final Office Action dated May 10, 2021 in U.S. Appl. No. 16/601,593.
USPTO; Non-Final Office Action dated Feb. 24, 2021 in U.S. Appl. No. 16/637,134.
USPTO; Notice of Allowance dated Jun. 2, 2021 in U.S. Appl. No. 16/637,134.
USPTO; Final Office Action dated Jan. 10, 2020 in U.S. Appl. No. 16/674,894.
USPTO; Notice of Allowance dated Apr. 21, 2020 in U.S. Appl. No. 16/674,894.
USPTO; Non-Final Office Action dated Oct. 16, 2020 in U.S. Appl. No. 16/679,885.
USPTO; Notice of Allowance dated Jan. 25, 2021 in U.S. Appl. No. 16/679,885.
USPTO; Non-Final Office Action dated Feb. 8, 2021 in U.S. Appl. No. 16/685,787.
USPTO; Notice of Allowance dated Apr. 30, 2021 in U.S. Appl. No. 16/685,787.
USPTO; Non-Final Office Action dated Apr. 5, 2021 in U.S. Appl. No. 16/704,835.
USPTO; Non-Final Office Action dated Nov. 16, 2020 in U.S. Appl. No. 16/713,311.
USPTO; Final Office Action dated Feb. 22, 2021 in U.S. Appl. No. 16/713,311.
USPTO; Non-Final Office Action dated Jan. 8, 2021 in U.S. Appl. No. 16/752,514.
USPTO; Notice of Allowance dated May 20, 2021 in U.S. Appl. No. 16/752,514.
USPTO; Notice of Allowance dated May 24, 2021 in U.S. Appl. No. 16/765,125.
USPTO; Non-Final Office Action dated Apr. 15, 2021 in U.S. Appl. No. 16/789,138.

(56) References Cited

OTHER PUBLICATIONS

USPTO; Notice of Allowance dated May 12, 2021 in U.S. Appl. No. 16/800,114.
USPTO; Non-Final Office Action dated Apr. 5, 2021 in U.S. Appl. No. 16/816,078.
USPTO; Non-Final Office Action dated May 19, 2021 in U.S. Appl. No. 16/828,753.
USPTO; Non-Final Office Action dated Apr. 13, 2020 in U.S. Appl. No. 16/833,279.
USPTO; Final Office Action dated Oct. 2, 2020 in U.S. Appl. No. 16/833,279.
USPTO; Notice of Allowance dated Dec. 28, 2020 in U.S. Appl. No. 16/833,279.
USPTO; Non-Final Office Action dated May 4, 2021 in U.S. Appl. No. 16/872,045.
USPTO; Non-Final Office Action dated May 3, 2021 in U.S. Appl. No. 16/878,443.
USPTO; Non-Final Office Action dated Jul. 9, 2020 in U.S. Appl. No. 16/897,158.
USPTO; Notice of Allowance dated Nov. 12, 2020 in U.S. Appl. No. 16/897,158.
USPTO; Non-Final Office Action dated Dec. 31, 2020 in U.S. Appl. No. 16/924,595.
USPTO; Non-Final Office Action dated Aug. 4, 2020 in U.S. Appl. No. 16/926,192.
USPTO; Non-Final Office Action dated May 25, 2021 in U.S. Appl. No. 16/935,280.
USPTO; Non-Final Office Action dated Apr. 14, 2021 in U.S. Appl. No. 17/009,093.
USPTO; Notice of Allowance dated May 14, 2012 in U.S. Appl. No. 29/411,637.
USPTO; Notice of Allowance dated Oct. 2, 2013 in U.S. Appl. No. 29/412,887.
USPTO; Non-Final Office Action dated Mar. 16, 2015 in U.S. Appl. No. 29/447,298.
USPTO; Notice of Allowance dated Jul. 6, 2015 in U.S. Appl. No. 29/447,298.
USPTO; Notice of Allowance dated Dec. 19, 2013 in U.S. Appl. No. 29/448,094.
USPTO; Notice of Allowance dated Nov. 26, 2014 in U.S. Appl. No. 29/481,301.
USPTO; Notice of Allowance dated Feb. 17, 2015 in U.S. Appl. No. 29/481,308.
USPTO; Notice of Allowance dated Jan. 12, 2015 in U.S. Appl. No. 29/481,312.
USPTO; Notice of Allowance dated Apr. 30, 2015 in U.S. Appl. No. 29/481,315.
USPTO; Notice of Allowance dated May 11, 2015 in U.S. Appl. No. 29/511,011.
USPTO; Notice of Allowance dated May 11, 2015 in U.S. Appl. No. 29/514,153.
USPTO; Notice of Allowance dated Dec. 14, 2015 in U.S. Appl. No. 29/514,264.
USPTO; Notice of Allowance dated Jun. 16, 2017 in U.S. Appl. No. 29/570,711.
USPTO; Non-Final Office Action dated Apr. 16, 2019 in U.S. Appl. No. 29/604,101.
USPTO; Notice of Allowance dated Oct. 30, 2019 in U.S. Appl. No. 29/604,101.
USPTO; Notice of Allowance dated Jun. 26, 2018 in U.S. Appl. No. 29/604,288.
USPTO; Ex Parte Quayle Action dated Dec. 17, 2019 in U.S. Appl. No. 29/615,000.
USPTO; Notice of Allowance dated Jun. 10, 2020 in U.S. Appl. No. 29/615,000.
USPTO; Non-Final Office Action dated Aug. 21, 2019 in U.S. Appl. No. 29/634,768.
USPTO; Notice of Allowance dated Jan. 23, 2020 in U.S. Appl. No. 29/634,768.
USPTO; Non-Final Office Action dated Feb. 20, 2019 in U.S. Appl. No. 29/646,377.
USPTO; Final Office Action dated Jul. 15, 2019 in U.S. Appl. No. 29/646,377.
USPTO; Notice of Allowance dated Nov. 14, 2019 in U.S. Appl. No. 29/646,377.
USPTO; Ex Parte Quayle Action dated Apr. 13, 2021 in U.S. Appl. No. 29/679,620.
USPTO; Notice of Allowance dated May 19, 2021 in U.S. Appl. No. 29/702,881.
USPTO; Non-Final Office Action dated Apr. 24, 2020 in U.S. Appl. No. 29/726,623.
USPTO; Final Office Action dated Sep. 9, 2020 in U.S. Appl. No. 29/726,623.
USPTO; Notice of Allowance dated Nov. 23, 2020 in U.S. Appl. No. 29/726,623.
WIPO; International Search Report dated Oct. 13, 1998 in Application No. PCT/FI1998/000571.
WIPO; International Search Report and Written Opinion dated Nov. 16, 2017 in Application No. PCT/IB2017/001015.
WIPO; International Search Report and Written Opinion dated Nov. 13, 2017 in Application No. PCT/IB2017/001050.
WIPO; International Search Report and Written Opinion dated Nov. 30, 2017 in Application No. PCT/IB2017/001070.
WIPO; International Search Report and Written Opinion dated Jan. 25, 2018 in Application No. PCT/IB2017/001262.
WIPO; International Search Report and Written Opinion dated Sep. 14, 2018 in Application No. PCT/IB2017/001640.
WIPO: International Search Report and Written Opinion dated Jun. 1, 2018 in Application No. PCT/IB2017/001644.
WIPO; International Search Report and Written Opinion dated Nov. 6, 2018 in Application No. PCT/IB2017/001652.
WIPO: International Search Report and Written Opinion dated Jun. 1, 2018 in Application No. PCT/IB2017/001656.
WIPO; International Search Report and Written Opinion dated Jan. 25, 2019 in Application No. PCT/IB2018/000192.
WIPO; International Search Report and Written Opinion dated Jul. 9, 2018 in Application No. PCT/IB2018/000419.
WIPO; International Search Report and Written Opinion dated Jan. 4, 2019 in Application No. PCT/IB2018/000936.
WIPO; International Search Report and Written Opinion dated Dec. 20, 2018 in Application No. PCT/IB2018/001003.
WIPO; International Search Report and Written Opinion dated Dec. 20, 2018 in Application No. PCT/IB2018/001022.
WIPO; International Search Report and Written Opinion dated Jun. 28, 2019 in Application No. PCT/IB2019/000084.
WIPO; International Search Report and Written Opinion dated Nov. 19, 2019 in Application No. PCT/IB2019/000127.
WIPO; International Search Report and Written Opinion dated Jan. 10, 2020 in Application No. PCT/IB2019/000729.
WIPO; International Search Report and Written Opinion dated Dec. 20, 2019 in Application No. PCT/IB2019/000805.
WIPO; International Search Report and Written Opinion dated Dec. 20, 2019 in Application No. PCT/IB2019/000817.
WIPO; International Search Report and Written Opinion dated May 23, 2019 in Application No. PCT/IB2019/050974.
WIPO; International Search Report dated Jul. 13, 1990 in Application No. PCT/NL1990/000027.
WIPO; International Search Report dated Jan. 11, 1990 in Application No. PCT/NL1990/000042.
WIPO; International Search Report dated Feb. 26, 1991 in Application No. PCT/NL1990/000166.
WIPO; International Search Report dated Oct. 25, 1991 in Application No. PCT/NL1991/000108.
WIPO; International Search Report dated Oct. 17, 1997 in Application No. PCT/NL1997/000398.
WIPO; International Preliminary Examination Report dated Oct. 2, 1998 in Application No. PCT/NL1997/000398.
WIPO; International Search Report dated Apr. 24, 1998 in Application No. PCT/NL1998/000055.
WIPO; International Preliminary Examination Report dated Feb. 24, 1999 in Application No. PCT/NL1998/000055.

(56) References Cited

OTHER PUBLICATIONS

WIPO; International Search Report dated May 27, 1998 in Application No. PCT/NL1998/000105.
WIPO; International Search Report dated May 8, 1998 in Application No. PCT/NL1998/000151.
WIPO; International Preliminary Examination Report dated Mar. 23, 1999 in Application No. PCT/NL1998/000151.
WIPO; International Search Report dated May 27, 1998 in Application No. PCT/NL1998/000167.
WIPO; International Preliminary Examination Report dated Jul. 13, 1999 in Application No. PCT/NL1998/000167.
WIPO; International Search Report dated Jul. 8, 1998 in Application No. PCT/NL1998/000204.
WIPO; International Search Report dated Aug. 21, 1998 in Application No. PCT/NL1998/000246.
WIPO; International Search Report dated Oct. 16, 1998 in Application No. PCT/NL1998/000383.
WIPO; International Preliminary Examination Report dated Sep. 16, 1999 in Application No. PCT/NL1998/000383.
WIPO; International Search Report dated Apr. 15, 1999 in Application No. PCT/NL1999/000047.
WIPO; International Search Report dated Oct. 12, 1999 in Application No. PCT/NL1999/000487.
WIPO; International Search Report dated Dec. 16, 1999 in Application No. PCT/NL1999/000583.
WIPO; Written Opinion dated Jul. 24, 2000 in Application No. PCT/NL1999/000583.
WIPO; International Preliminary Examination Report dated Jan. 22, 2001 in Application No. PCT/NL1999/000583.
WIPO; International Search Report dated Apr. 19, 2000 in Application No. PCT/NL2000/000020.
WIPO; Written Opinion dated Oct. 17, 2000 in Application No. PCT/NL2000/000020.
WIPO; International Search Report and Written Opinion dated Apr. 17, 2019 in Application No. PCT/NL2018/050787.
WIPO; International Search Report and Written Opinion dated Apr. 29, 2019 in Application No. PCT/NL2018/050791.
WIPO; International Search Report dated Dec. 16, 1999 in Application No. PCT/RU1999/000328.
WIPO; International Preliminary Examination Report dated Jun. 29, 2001 in Application No. PCT/RU1999/000328.
WIPO; International Preliminary Report on Patentability dated Nov. 24, 2009 and International Search Report dated Jul. 31, 2008 in Application No. PCT/US2008/063919.
WIPO; International Preliminary Report on Patentability dated Feb. 24, 2010 in Application No. PCT/US2008/074063.
WIPO; International Preliminary Report on Patentability dated Nov. 26, 2009 in Application No. PCT/US2009/043454.
WIPO; International Preliminary Report on Patentability dated Jun. 14, 2011 in Application No. PCT/US2009/066377.
WIPO; International Search report and Written Opinion dated Nov. 12, 2010 in Application No. PCT/US2010/030126.
WIPO; International Preliminary Report on Patentability dated Oct. 11, 2011 Application No. PCT/US2010/030126.
WIPO; International Preliminary Report on Patentability dated Nov. 9, 2011 in Application No. PCT/US2010/033244.
WIPO; International Preliminary Report on Patentability dated Nov. 9, 2011 in Application No. PCT/US2010/0332348.
WIPO; International Preliminary Report on Patentability dated Nov. 9, 2011 in Application No. PCT/US2010/033252.
WIPO; International Search report and Written Opinion dated Jan. 20, 2011 in Application No. PCT/US2010/045368.
WIPO; International Search report and Written Opinion dated Feb. 6, 2013 in Application No. PCT/US2012/065343.
WIPO; International Search report and Written Opinion dated Feb. 13, 2013 in Application No. PCT/US2012/065347.
Akiyama et al. "Macro- and micro-scale simulation of growth rate and composition in MOCVD of yttria-stabilized zirconia" J. Crystal Growth 241, pp. 352-362 (2002).
Alen, "Atomic layer deposition of TaN, NbN and MoN films for Cu Metallizations," University of Helsinki Finland, 72 pages, (2005).
Altiere et al. "Review Article: Plasma-surface interactions at the atomic scale for patterning metals" J. Vac. Sci. Technol. A 35, 05C203, 13 pages (2017).
Ande et al. "Role of Surface Termination in Atomic Layer Deposition of Silicon Nitride" J. Phys. Chem. Lett., 6(18), 16 pages (2015).
Aoyagi et al. "Laser-assisted atomic layer epitaxy" Materials Science and Engineering, pp. 121-132 (1991).
Arita et al. "Electrical and optical properties of germanium-doped zinc oxide thin films" Materials Transactions, vol. 45, No. 11, pp. 3180-3183 (2004).
Arnold et al., "Novel single-layer vanadium sulphide phases" 2D Materials, 5, 045009, 11 pages (2018).
Athavale et al., "Realization of Atomic Layer Etching of Silicon", Journal of Vacuum Science and Technology B, vol. 14, pp. 3702-3705 (1996).
Atta et al. "The Catalytic Activity of Ruthenates ARuO3 (A=Ca, Sr or Ba) for the Hydrogen Evolution Reaction in Acidic Medium" Int. J. Electrochem, Sci. 7, pp. 725-746 (2012).
Aubin et al. "Very low temperature (450° C.) selective epitaxial growth of heavily in situ boron-doped SiGe layers" Semiconductor Science and Technology, 30, 10 pages (2015).
Ballal "Mass Transfer in Porous Solids under Pulsating Pressure Conditions" SLJ International, vol. 35, Nov, 4, pp. 446-448 (1995).
Bark et al. "Large-area niobium disulfide thin films as transparent electrodes for devices based on two-dimensional materials," Nanoscale, published online, 7 pages (2012).
Barreca et al. "Cobalt oxide nanomaterials by vapor phase synthesis for fast and reversible lithium storage" J Phys Chem C,114, 10054-10060 (2010).
Barnscheidt et al. "Highly boron-doped germanium layers on Si(001) grown by carbon-mediated epitaxy" Semiconductor Science and Technology, 33, 9 pages (2018).
Basuvalingam et al. "NS-WeA6—Low Temperature ALD for Phase-controlled Synthesis of 2D Transition Metal (M=Ti, Nb) di-(MX2) and Tri-(MX3) Sulfides," AVS 19th International Conference on Atomic Layer Deposition (ALD 2019)), Jul. 22, 2019, Abstract, 1 page (2019).
Bearzotti, et al., "Fast Humidity Response of a Metal Halide-Doped Novel Polymer," Sensors and Actuators B, 7, pp. 451-454, (1992).
Becker et al., "Atomic Layer Deposition of Insulating Hafnium and Zirconium Nitrides," Chem. Mater., 16, 3497-3501 (2004).
Belyansky et al. "Low Temperature Borophosphosilicate Glass (BPSG) Process for High Aspect Ratio Gap Fill" www.electrochem.org/dl/ma/201/pdfs/0705.pdf, downloaded May 15, 2021, 1 page.
Beynet et al. "Low temperature plasma-enhanced ALD enables cost-effective spacer defined double patterning," Proceedings of SPIE, 7520, (2009).
Bhatnagar et al., "Copper Interconnect Advances to Meet Moore's Law Milestones," Solid State Technology, 52, 10 (2009).
Boscher et al., "Atmosphere Pressure Chemical Vapour Deposition of NbSe2 Thin Films on Glass" Eur. J. Inorg. Chem., pp. 1255-1259 (2006).
Brewin et al. "UPS to deploy Bluetooth, wireless LAN network" Internet, pp. 1-5 (2001).
Bulletin Plasma Source—12/02: Type AX7610—Downstream Plasma Source. Source location: MKS Instruments, Inc. http://www.mksinst.com/. Accessed: Aug. 6, 2015, pp. 1-4 (2002).
Bulletin ASTRONe—4/02: Type AX7680—Reactive Gas Generator. Source location: MKS Instruments, Inc. http://www.mksinst.com/. Accessed: Aug. 6, 2015, pp. 1-2 (2002).
Bulletin ASTRONex—7/09: Type AX7685—Reactive Gas Generator. Source location: MKS Instruments, Inc. http://www.mksinst.com/. Accessed: Aug. 6, 2015, pp. 1-2 (2002).
Bulletin ASTRON hf-s—3/05: Type AX7645—Reactive Gas Generator. Source location: MKS Instruments, Inc. http://www.mksinst.com/. Accessed: Aug. 6, 2015, pp. 1-2 (2005).
Bulletin ENG-XSTREAM-340-09 OM 8/06: Xstream with Active Matching Network Remote Plasma Source. Advanced Energy Industries, Inc. http://www.advanced-energy.net.cn/upload/File/Sources/ENG-Xstream-340-09. pdf. Accessed: Jul. 19, 2016. pp. 1-4 (2006).

(56) References Cited

OTHER PUBLICATIONS

Bulletin R*evolution—9/06: Type AX7690—Remote Plasma Source. Source location: MKS Instruments, Inc. http://www.mksinst.com/. Accessed: Aug. 6, 2015, pp. 1-2 (2006).
Buriak, "Organometallic Chemistry on Silicon and Germanium Surfaces," Chemical Reviews, 102, 5 (2002).
Cahiez et al. "Cobalt-Catalyzed cross coupling reaction between functionalized primary and secondary alkyl halides and aliphatic grignard reagents" Adv. Synth. Catal, 350, 1484-1488 (2008).
Callaghan et al. "Magnetic Interactions in Ternary Ruthenium Oxides" Inorganic Chemistry, vol. 5, No. 9, pp. 1572-1576 (1966).
Cant et al., "Chemisorption Sites on Porous Silica Glass and on Mixed-Oxide Catalysis," Can. J. Chem. 46, 1373 (1968).
Carmalt et al., "Chemical Vapor Deposition of Niobium Disulfide Thin Films" Eur. J. Inorg. Chem., pp. 4470-4476 (2004).
Casey et al. "Chemical Vapor Deposition of Mo onto Si" J. Electrochem. Soc.: Solid State Science, 114 (2), pp. 201-204 (1967).
Chang et al. "Small-Subthreshold-Swing and Low-Voltage Flexible Organic Thin-Film Transistors Which Use HfLaO as the Gate Dielectric," IEEE Electron Device Letters, Feb. 2009, pp. 133-135; vol. 30, No. 2; IEEE Electron Device Society.
Chatterjee et al. "Chemical Vapor Deposition of Boron Nitride Nanosheets on Metallic Substrates via Decaborane/Ammonia Reactions", Chem. Mater. 23, pp. 4414-4416 (2011).
Chatterjee et al., "Sub-100nm Gate Length Metal Gate NMOS Transistors Fabricated by a Replacement by a Replacement Gate Process," IEEE Semiconductor Process and Device Center, 821-824 (1997).
Chen et al., "A Self-Aligned Airgap Interconnect Scheme," IEEE International Interconnect Technology Conference, vol. 1-3, 146-148 (2009).
Chen et al., "Develop Gap-fill Process of Shallow Trench Isolation in 450mm Wafer by Advanced Flowable CVD Technology for Sub-20nm Node," 2016 27th Annual Semi Advanced Semiconductor.
Cheng et al., "Effect of carrier gas on the structure and electric properties of low dielectric constant SiCOH film using trimethylsilane prepared by plasma enhanced chemical vapor deposition," Thin Solid Films vol. 469-470, pp. 178-183 (2004).
Cheremisin et al. "UV-laser modification and selective ion-beam etching of amorphous vanadium pentoxide thin films" Phys. Status Solidi A, Applications and materials science, 206 (7), pp. 1484-1487 (2009).
Choi et al., "Improvement of Silicon Direct Bonding using Surfaces Activated by Hydrogen Plasma Treatment," Journal of the Korean Physical Society, 37, 6, 878-881 (2000).
Choi et al., "Low Temperature Formation of Silicon Oxide Thin Films by Atomic Layer Deposition Using NH3/O2 Plasma," ECS Solid State Letters, 2(12) p. 114-p. 116 (2013).
Choi et al. "UV irradiation effects on the bonding structure and electrical properties of ultra low-k SiOC(-H) thin films for 45 nm technology node" Current Applied Physics, 11, S109-S113 (2011).
Closser et al., "Molecular Layer Deposition of a Highly Stable Silicon Oxycarbide Thin Film Using An Organic Chlorosilane And Water," ACS Applied Materials & Interfaces 10, pp. 24266-24274 (2018).
Coates, "Process Analytical Technology : Spectroscopic Tools and Implementation Strategies for the Chemical and Pharmaceutical Industries." Blackwell Publishing Ltd, 91-132, (2005).
Conroy et al., "The Preparation and Properties of Single Crystals of the 1S and 2S Polymorphs of Tantalum Disulfide" J. Solid State Chemistry, 4, pp. 345-350 (1972).
Crowell, "Chemical methods of thin film deposition: Chemical vapor deposition, atomic layer deposition, and related technologies," Journal of Vacuum Science & Technology A 21.5, (2003): S88-S95.
Cui et al., "Impact of Reductive N2/H2 Plasma on Porous Low-Dielectric Constant SiCOH Thin Films," Journal of Applied Physics 97, 113302, 1-8 (2005).
Crystal IS "Application Note: Using UV Reflective Materials to Maximize Disinfection"; AN011; Jun. 16, 2016, found at https://www.klaran.com/using-uv-reflective-materials-to-maximize-disinfection.
De Silva et al., "Inorganic Hardmask Development for Extreme Ultraviolet Patterning," Journal of Micro/Nanolithography, MEMS, and MOEMS 18(1) (2018).
Dingemans et al., "Comparison Between Aluminum Oxide Surface Passivation Films Deposited with Thermal Aid," Plasma Aid and Pecvd, 35th IEEE PVCS, Jun. 2010.
Dingemans et al. "Plasma-Assisted ALD for the Conformal Deposition of SiO2: Process, Material and Electronic Properties" J of the Electrochemical Society, 159(3), H277-H285 (2012).
Drummond et al., "Hydrophobic Radiofrequency Plasma-Deposited Polymer Films: Dielectric Properties and Surface Forces," Colloids and Surfaces A, 129-130, 117-129 (2006).
Duffey et al., "Raman Scattering from 1T-TaS2" Solid State Communications 20, pp. 617-621 (1976).
Dufond et al. "Quantifying the Extent of Ligand Incorporation and the Effect on Properties of TiO 2 Thin Films Grown by Atomic Layer Deposition Using an Alkoxide or an Alkylamide" Chemistry of Material, American Chemical Society 32(4), pp. 1393-1407 (2020).
Dultsev et al. "Effect of UV radiation on the reactivity of porous methyl-doped SiO2 layers" Phys. Status Solidi C, 8, No. 6, pp. 1946-1949 (2011).
Easley et al., "Thermal Isolation of Microchip Reaction Chambers for Rapid Non-Contact DNA Amplification," J. Micromech. Microeng. 17, 1758-1766 (2007).
Elam et al., "New Insights into Sequential Infiltration Synthesis", ECS Transactions, vol. 69, pp. 147-157 (2015).
Elers et al. "Film Uniformity in Atomic Layer Deposition," Chemical Vapor Deposition, 12, pp. 13-24 (2006).
Ellis et al. "Nitrous Oxide (N2O) Processing for Silicon Oxynitride Gate Dielectrics." IBM Journal of Research and Development. 1999. 43[3], pp. 287-300. (1999).
Esposito et al. "Preparation and characterization of lead ruthenate based composite cathodes for SOFC applications" Mater. Res. Soc. Symp. Proc., vol. 835, 6 pages (2005).
Fallica et al., "Dynamic Absorption Coefficients Of Chemically Amplified Resists And Nonchemically Amplified Resists At Extreme Ultraviolet", J. Micro/Nanolith. MEMS MOEMS 15(3), pp. 033506-1-033506-7 (2016).
"Fiji F200 200mm Thermal/Plasma ALD Systems: Installation and Use Manual." CAW-02635 Rev. 0.6 (Mar. 13, 2012). Cambridge NanoTech Inc. pp 1-164 (2012).
Fray et al. "Aspects of the Application of Electrochemistry to the Extraction of Titanium and Its Applications" Materials Transactions, vol. 58, No. 3, pp. 306-312 (2017).
Freund et al. "Single crystal growth from separated educts and its application to lithum transition-metal oxides" Sci. Rep. 6, 35362, pp. 1-5 (2016).
Frequestiy Asked Question, "What is a load lock chamber?", Kurt J. Lesker Company, www.lesker.com, p. 1 (2020).
Fu et al., "Controlled Synthesis of Atomically Thin 1T-TaS2 for Tunable Charge Density Wave Phase Transitions" Chem. Mater. 28, pp. 7613-7618 (2016).
G02-1152 "Atomic Layer Deposition of Al2O3 with Alcohol Oxidants for Impeding Substrate Oxidation" Abstract. Oct. 16, 2019 (2019).
Galesic et al. "Formation of vanadium nitride by rapid thermal processing" Thin Solid Films 349(1), 7 pages (1999).
Ge et al., "Carbon Nanotube-Based Synthetic Gecko Tapes," Department of Polymer Science, PNAS, 10792-10795 (2007).
Ge et al. "Large-scale synthesis of NbS2 nanosheets with controlled orientation on graphene by ambient pressure CVD," Nanoscale, vol. 5, 5773-5778 (2013).
George et al., "Atomic Layer Deposition: An Overview," Chem. Rev. 110, 111-131 (2010).
Gesheva et al. "Composition and Micro structure of Black Molybdenum Photothermal Converter Layers Deposited by the Pyrolytic Hydrogen Reduction of $MoO_2Cl_2$" Thin Solid Films, 79, pp. 39-49 (1981).

(56) References Cited

OTHER PUBLICATIONS

Glass et al. "The Chemical Vapor Deposition of Metal Boride Thin Films from Polyhedral Cluster Species", Winter and Hoffman, Inorganic Materials Synthesis. ACS Symposium Series; American Cemical Society: Washington DC, Chapter 10, pp. 130-143 (1999).
Gole et al. "Preparation of Nickel Sulfide Thin Films and Nanocrystallites Using Nickel Furfuraldehyde Thiosemicarbazone as Single-source Precursor," Advanced Materials Research, vols. 383-390, pp. 3828-3834 (2012).
Gordon et al. "A Kinetic Model for Step Coverage by Atomic Layer Deposition in Narrow Holes or Trenches." Chemical Vapor Deposition. 9 [2], pp. 73-78 (2003).
Grill et al., "The Effect of Plasma Chemistry on the Damage Induced Porous SiCOH Dielectrics," IBM Research Division, RC23683 (W0508-008), Materials Science, 1-19 (2005).
Guan et al., "Voltage gated ion and molecule transport in engineered nanochannels: theory, fabrication and applications," Nanotechnology 25 (2014) 122001.
Gupta et al., "Charge carrier transport and electroluminescence in atomic layer deposited poly-GaN/c-Si heterojunction diodes," Journal of Applied Physics, 124, 084503 (2018).
Gupta et al., "Conversion of Metal Carbides to Carbide Derived Carbon by Reactive Ion Etching in Halogen Gas," Proceedings of SPIE—The International Society for Optical Engineering and Nanotechnologies for Space Applications, ISSN: 0277-786X (2006).
Habib et al. "Atmospheric oxygen plasma activation of silicon (100) surfaces," American Vacuum Society, 28(3), pp. 476-485 (2010).
Hamalainen et al., "Atomic Layer Deposition of Rhenium Disulfide," Adv. Mater. 30.24, 6 pages (2018).
Han et al., "van der Waals Metallic Transition Metal Dichalcogenides" Chem. Rev. 118, pp. 6297-6336 (2018).
Hansen. "A Primer on Vacuum Pressure Measurement." Vacuum Technology & Coating. Jun. 2009. pp. 36-42 (2009).
Hansen. "Speed, Pressure and Throughput: Part 1 System Diagnostics." Vacuum Technology & Coating. Sep. 2011. pp. 14-17 (2011).
Hansen. "Speed, Pressure and Throughput: Part 2 Managing Gas Flow in High Vacuum Systems." Vacuum Technology & Coating. Oct. 2011. pp. 19-22 (2011).
Hansen. "Speed, Pressure and Throughput: Part 3 Automating the Pressure Control Process." Vacuum Technology & Coating. Nov. 2011. pp. 22-25 (2011).
Hansen. "Speed, Pressure and Throughput: Part 4 Outgassing and Base Pressure." Vacuum Technology & Coating. Dec. 2011. pp. 22-25 (2011).
Hansen. "Speed, Pressure and Throughput: Part 5 Leaks and Gas Flow in Leak Detection." Vacuum Technology & Coating. Jan. 2012. pp. 18-21 (2011).
Hargreaves et al., "New Fluorides and Oxyfluorides of Rhenium," J. Chem. Soc., pp. 1099-1103 (1960).
Harrison et al., "Poly-gate Replacement Through Contact Hole (PRETCH): A New Method for High-K/ Metal Gate and Multi-Oxide Implementation on Chip," IEEE (2004).
Hayashi et al. "Spectroscopic properties of nitrogen doped hydrogenated amorphous carbon films grown by radio frequency plasma-enhanced chemical vapor deposition," Journal of Applied Physics, vol. 89, No. 12, pp. 7924-7931 (2001).
Heo et al., "Structural Characterization of Nanoporous Low-Dielectric Constant SiCOH Films Using Organosilane Precursors," NSTI-Nanotech, vol. 4, 122-123 (2007).
Henke et al.., "X-Ray Interactions: Photo absorption, Scattering, Transmission, and Reflection at E=50-30,000 eV, Z=1-92," Atomic Data and Nuclear Data Tables, 54, 181-342 (1993).
Heyne et al., "The conversion mechamsm of amorphous silicon to stoichiometric WS2" J. Materials Chemistry C, 6, pp. 4122-4130 (2018).
Hong et al. "Ultralow-dielectric-constant amoprhous boron nitride" Nature, vol. 582, 16 pages (2020).
Hossain et al., "Recent Advances in Two-Dimensional Materials with Charge Density Waves: Synthesis, Characterization and Applications" Crystals 7, 298, 19 pages (2017).
Hubert et al., "A Stacked SONOS Technology, up to 4 Levels and 6nm Crystalline Nanowires, With Gate-All-Around or Independent Gates (-Flash), Suitable for Full 3D Integration," Minatec, IEDM09-637-640 (2009).
Hudis, "Surface Crosslinking of Polyethylene Using a Hydrogen Glow Discharge," J. Appl. Polym. Sci., 16 (1972) 2397.
Imamura et al. "Cyclic C4F8 and O2 plasma etching of TiO2 for high-aspect-ratio three-dimensional devices" Template for JJAP Regular Papers, Jan. 2014, pp. 29 (2014).
Ivanova et al. "ALD of Sc2O3 using Sc(Cp)3 and a Novel Heteroleptic Precursors" Presented on the AVS 19th International Conference on Atomic Layer Deposition, Jul. 23, 2019, Abstract, 1 page (2019).
Jensen et al. "Titanium, Zirconium, and Hafnium Tetrahydroborates as "Tailored" CVD Precursors for Metal Diboride Thin Films", J. Am. Chem. Soc. 110, pp. 1643-1644 (1988).
Johansson et al. "Towards absolute asymmetric synthesis. Synthesis and crystal structure of stereochemically labile MCl2 (M=Co, Ni, Cu, Zn) complexes with diamine ligands," Inorganica Chimica Acta 358, pp. 3293-3302 (2005).
Johnson et al. "A brief review of atomic layer deposition: from fundamentals to applications" Materials Today, vol. 17, Issue 5, pp. 236-246 (2014).
Jones et al., "Growth of Aluminum Films by Low Pressure Chemical Vapour Deposition Using Tritertiarybutylaluminium," Journal of Crystal Growth 135, pp. 285-289, Elsevier Science B.V. (1994).
Jones et al., "Recent Developments in Metalorganic Precursors for Metalorganic Chemical Vapour Deposition," Journal of Crystal Growth 146, pp. 503-510, Elsevier Science B.V. (1995).
Jung et al., "Double Patterning of Contact Array with Carbon Polymer," Proc. Of SPIE, 6924, 69240C, 1-10 (2008).
Jung et al. "New Mechanisms for Ozone-Based ALO Growth of High-k Dielectrics via Nitrogen-Oxygen Species" ECS Transactions, 33(2), pp. 91-99 (2010).
Juppo et al. "Deposition of molybdenum thin fdms by an alternate supply of MoCl 5 and Zn" J of Vacuumn Science & Technology A, 16, pp. 2845-2850 (1998).
Katamreddy et al., "ALD and Characterization of Aluminum Oxide Deposited on Si(100) using Tris(diethylamino) Aluminum and Water Vapor," Journal of The Electrochemical Society, 153 (10) C701-C706 (2006).
Kern et al., "Chemically Vapor-Deposited Borophosphosilicate Glasses for Silicon Device Applications" RCE Review, 43, 3, pp. 423-457 (1982).
Kerrigan et al. "Low Temperature, Selective Atomic Layer Deposition of Cobalt Metal Films Using Bis(1,4-di-tert-butyl-1,3-diazadienyl)cobalt and Alkylamine Precursors," Chem. Materials, 29, pp. 7458-7466 (2017).
Khandelwal et al. "Low-temperature Ar/N2 remote plasma nitridation of SiO2 thin films," J. Vacuum Science & Technology A, 20(6), pp. 1989-1996 (2002).
Kim et al. "Characteristics of Low Temperature High Quality Silicon Oxide by Plasma Enhanced Atomic Layer Deposition with In-Situ Plasma Densification Process," The Electrochemical Society, ECS Transactions, College of Information and Communication Engineering, Sungkyunkwan University, 53(1), 321-329 (2013).
Kim et al. "High Growth Rate in Atomic Layer Deposition of TiO2 Thin Films by UV Irradiation" Electrochemical and Solid-State Letters, 14(4), pp. H146-H148 (2011).
Kim et al. "Novel Flowable CVD Process Technology for sub-20nm Interlayer Dielectrics," IEEE International Interconnect Technology Conference (IITC 2012), San Jose, California, USA, Jun. 4-6, 2012, pp. 1-3 (2012).
Kim et al. "Passivation Effect on Low-k S/OC Dielectrics by H2 Plasma Treatment," Journal of the Korean Physical Society, "40, 1, 94-98 (2002).
Kim et al. "A process for topographically selective deposition on 3D nanostructures by ion implantation" ACS Nano, 10, 4, 4451-4458 (2016).
Kim et al. "Thermal Decomposition of Tetrakis(ethylmethylamido) Titanium for Chemical Vapor Deposition of Titanium Nitride" Bull. Korean Chem. Soc., vol. 27, No. 2, 5 pages (2006).
King, Plasma Enhanced Atomic Layer Deposition of SiNx: H and SiO2, J. Vac. Sci. Technol., A29(4) (2011).

(56) References Cited

OTHER PUBLICATIONS

Kirsch et al. "Dipole model explaining high-k/metal gate field effect transistor threshold voltage tuning" Applied Physics Letters 92, 092901, 3 pages (2008).
Kjesbu, ABB Corporate Research, Internet, pp. 1-37 (2002).
Kliem et al. "Silyl Group Migrations Between Oxygen and Nitrogen in Aminosiloxanes"; Organosilicon Chemistry VI: from Molecules to Materials; pp. 216-221 (2005).
Klug et al., "Atomic Layer Deposition of Amorphous Niobium Carbide-Based Thin Film Superconductors," The Journal of Physical Chemistry C, vol. 115, pp. 25063-25071, (2011).
Kobayshi, et al., "Temperature Dependence of SiO2 Film Growth with Plasma-Enhanced Atomic Layer Deposition," regarding Thin Solid Films, published by Elsevier in the International Journal on the Science and Technology of Condensed Matter, in vol. 520, No. 11, 3994-3998 (2012).
Kofuji et al. "Line-edge roughness increase due to wiggling enhanced by initial pattern waviness" Jpn. J. Appl. Phys. 53, 03DE01, pp. 1-7 (2014).
Kofuji et al. "Mechanism of wiggling enhancement due to HBr gas addition during amorphous carbon etching" Jpn. J. Appl. Phys. 54, 06FH04, pp. 107 (2015).
Kogelschatz et al. "Ozone Generation from Oxygen and Air: Discharge Physics And Reaction Mechanisms" Ozone Science & Engineering, 10, pp. 367-378 (1998).
Koo et al., "Characteristics of Al2O3 Thin Films Deposited Using Dimethylaluminum Isopropoxide and Trimethylaluminum Precursors by the Plasma-Enhanced Atomic-Layer Deposition Method," Journal of Physical Society, 48, 1, 131-136 (2006).
Koutsokeras et al. "Texture and Micro structure Evolution in Single-Phase TixTal-xN Alloys of Rocksalt Structure," Journal of Applied Physics, 110, pp. 043535-1-043535-6, (2011).
Kovalgin et al. "Hot-Wire Assisted ALD: A Study Powered by In Situ Spectroscopic Ellipsometry" Adv. Mater. Interfaces 4, 1700058, 11 pages (2017).
Knoops et al., "Atomic Layer Deposition of Silicon Nitride from Bis(tert-butyloamino) silane and N2 Plasma," Applied Materials & Interfaces, American Chemical Society, A-E (2015).
Krenek et al. "IR Laser CVD of Nanodisperse Ge—Si—Sn Alloys Obtained by Dielectric Breakdown of GeH4/SiH4/SnH4 Mixtures", NanoCon 2014, Nov. 5-7, Brno, Czech Republic, EU.
Krumdieck et al. "Experimental Characterization and Modeling of Pulsed MOCVD with Ultrasonic Atomization of Liquid Precusor" Chem. Vap. Deposition, 7 (2), pp. 85-90 (2001).
Krumdieck "Kinetic Model of Low Pressure Film Deposition from Single Precursor Vapor in a Well-Mixed, Cold-Wall Reactor" Acta mater., 49, pp. 583-588 (2001).
Kucheyev et al. "Mechanisms of Atomic Layer Deposition on Substrates with Ultrahigh Aspect Ratios." Langmuir. 24 [3]. pp. 943-948 (2008).
Kuchumov et al. "Pulsed MO CVD Processes of MgO Layer Deposition from Mg(thd)2" ECS Trans. 25, pp. 927-934 (2009).
Kukli et al. "Atomic Layer Deposition and Chemical Vapor Deposition of Tantalum Oxide by Successive and Simultaneous Pulsing of Tantalum Ethoxide and Tantalum Chloride" Chem. Mater. 12, pp. 1914-1920 (2000).
Kukli et al. "Atomic Layer Epitaxy Growth of Tantalum Oxide Thin Films from Ta(OC2H5)5 and H20" The Electrochemical Society, vol. 142, No. 5, pp. 1670-1674 (1995).
Kukli et al., "Influence of atomic layer deposition parameters on the phase content of Ta2O5 films" J. Crystal Growth, 212, pp. 459-468 (2000).
Kukli et al., "Properties of hafnium oxide films grown by atomic layer deposition from hafnium tetraiodide and oxygen". Journal of Applied Physics, vol. 92, No. 10, Nov. 15, 2002, pp. 5698-5703 (2002).
Kukli et al. "Properties of tantalum oxide thin films grown by atomic layer deposition" Thin Solid Films, 260, pp. 135-142 (1995).
Kumar et al. "Bringing the benefits of Java to Bluetooth" http://www.allembedded.com/story/OEG20020519S001, pp. 1-3 (2002).
Kurosawa et al. "Synthesis and Characterization of Plasma-Polymerized Hexamethyldisiloxane Films," Thin Solid Films, 506-507, 176-179 (2006).
Kwon et al. "Substrate Selectivity of (tBu-Allyl)Co(CO)3 during Thermal Atomic Layer Deposition of Cobalt," Chem. Materials, 24, pp. 1025-1030 (2012).
Lanford et al., "The Hydrogen Content of Plasmadeposited Silicon Nitride," J. Appl. Phys., 49, 2473 (1978).
Lee et al. "Characteristics Of Low-K Sioc Films Deposited Via Atomic Layer Deposition," Thin Solid Films 645, pp. 334-339 (2018).
Lee et al. "Enahancement of Iodine Adsorption on Ruthenium Glue Layer for Seedless CECVD of Cu" Electrochemical and Solid-State Letters, 8(2) C39-C42 (2005).
Lee et al. "Growth without Postannealing of Monoclinic VO2 Thin Film by Atomic Layer Deposition Using VCl4 as Precursor" Coatings, 8, 431, pp. 1-11 (2018).
Lee et al. "Layer Selection by Multi-Level Permutation in 3-D Stacked NAND Flash Memory," IEEE Electron Device Letters, vol. 37, No. 7, 866-869 (2016).
Lee et al. "Photo-Induced Atomic Layer Deposition of Tantalum Oxide Thin Films from Ta(OC2H5)5 and O2" J of the Electrochemical Society. 151(1) pp. C52-C55 (2004).
Lee et al. "Ultraviolet light enhancement of Ta2O5 dry etch rates" J. of Vacuum Science & Technology B: Microelectronics and Nanometer Structures Processing, Measurement, and Phenomena, 18, pp. 293-295 (2000).
Levy et al., "Reflow Mechanisms of Contact Vias in VLSI Processing" J. Electrochem. Soc.: Solid-State Science and Technology, 133, 7, pp. 1417-1424 (1986).
Lewis et al. "Hawley's Condensed Chemical Dictionary" 12th Edition; excerpt pp. 1027-1038 (2005).
Li et al. "Metallic Transition-Metal Dichalcogenide Nanocatalysts for Energy Conversion" Chem. 4, pp. 1510-1537 (2018).
Liang et al. "Conversion of Metal Carbides to Carbide Derived Carbon by Reactive Ion Etching in Halogen Gas" Micro (MEMS) and Nantoechnologies for Space Applications, Thomas George et al. vol. 6223, 2006 p. 62230J-I to 62230J-11 lines 3-14 in the "Abstract" section and lines 7-9 in the "Introduction" section of p. 1, lines 3-4 in the "Introduction" section and lines 3-4 in the "Experimental Procedure" section of p. 2 (2006).
Lieberman, et al., "Principles of Plasma Discharges and Materials Processing," Second Edition, 368-381 (2005).
Lim et al., "Low-Temperature Growth of SiO2 Films by Plasma-Enhanced Atomic Layer Deposition," ETRI Journal, 27 (1), 118-121 (2005).
Lim et al. "Synthesis and Characterization of Volatile, Thermally Stable, Reactive Transistion Metal Amidinates," Inorg. Chem., 42, pp. 7951-7958 (2003).
Liu et al., "Research, Design, and Experiment of End Effector for Wafer Transfer Robot," Industrial Robot: An International Journal, 79-91 (2012).
Liu et al., "Van der Waals metal-semiconductor junction: Weak Fermi level pinning enables effective tuning of Schottky barrier" Sci. Adv. 2: e1600069, 7 pages (2016).
Londergan et al. "Engineered Low Resistivity Titanium-Tantalum Nitride Films by Atomic Layer Deposition," Mat. Res. Soc. Symp. Proc., vol. 714E, pp. L5.3.1-L5.3.6 (2001).
Longrie et al., "Plasma-Enhanced ALD of Platinum with O2, N2 and NH3 Plasmas", ECS Journal of Solid State Science and Technology, vol. 1, pp. Q123-Q129 (2012).
Mackenzie et al. "Stress Control of Si-Based PEVCD Dielectrics," Proc. Symp. Silicon Nitrode and Silicon Dioxide Thin Insulating Films & Other Emerging Dielectrics VIII, 148-159 (2005).
Mackus et al., "Optical Emission Spectroscopy as a Tool for Studying Optimizing and Monitoring Plasma-Assisted Atomic Layer Deposition Processes," Journal of Vacuum Science and Technology, 77-87 (2010).
Maeng et al. Electrical properties of atomic layer disposition Hf02 and Hf0xNy on Si substrates with various crystal orientations, Journal of the Electrochemical Society, Apr. 2008, p. H267-H271,

(56) References Cited

OTHER PUBLICATIONS vol. 155, No. 4, Department of Materials Science and Engineering, Pohang University of Science and Technology, Pohang, Korea (2008).
Maeno, "Gecko Tape Using Carbon Nanotubes," Nitto Denko Gihou, 47, 48-51 (2009).
Makela et al. "Thermal Atomic Layer Deposition of Continuous and Highly Conducting Gold Thin Films," Chem. Materials, 29, pp. 6130-6136 (2017).
Mameli et al. "Area-Selective Atomic Layer Deposition of SiO2 Using Acetylacetone as a Chemoselective Inhibitor in an ABC-Type Cycle" ACS Nano 11, pp. 9303-9311 (2017).
Mameli et al. "Isotropic Atomic Layer Etching of ZnO Using Acetylacetone and O2 Plama" ACS Appl. Mater. Interfaces 10, pp. 38588-38595 (2018).
Marsik et al., "Effect of Ultraviolet Curing Wavelength on Low-k Dielectric Material Properties and Plasma Damage Resistance," Sciencedirect.com, 519, 11, 3619-3626 (2011).
Mason et al., "Hydrolysis of Tri-tert-butylaluminum: The First Structural Characterization of Alkylalumoxanes [(R2Al)2O]n and (RAIO)n," J. American Chemical Society, vol. 115, No. 12, pp. 4971-4984 (1993).
Massachusetts Institute of Technology Lincoln Laboratory, "Solid State Research," Quarterly Technical Report (1995).
Mattinen et al., "Crystalline tungsten sulfide thin films by atomic layer deposition and mild annealing" J. Vac. Sci. Tech. 37, 020921, 35 pages (2019).
Maydannik et al., "Spatial atomic layer deposition: Performance of low temperature H2O and 03oxidant chemistry for flexible electronics encapsulation", Journal of Vacuum Science and Technology: Part A AVS/ AIP, vol. 33 (1901).
Meng et al., "Atomic Layer of Deposition of Silicon Nitride Thin Films: A Review of Recent Progress, Challenges, and Outlooks," Materials, 9, 1007 (2016).
Merdrignac-Conanec et al. "Nitridation under ammonia of high surface area vanadium aerogels" Journal of Solid State Chemistry 178(1), 8 pages (2005).
Miller et al. "Carbon nitrides: synthesis and characterization of a new class of functional materials," Phys.Chem.Chem.Phys., 19, pp. 15613-15638 (2017).
Mix et al., "Characterization of plasma-polymerized allyl alcohol polymers and copolymers with styrene," Adhes. Sci. Technol., 21 (2007), S. 487-507.
Moeen, "Design, Modelling and Characterization of Si/SiGe Structures for IR Bolometer Applications," KTH Royal Institute of Technology. Information and Communication Technology, Department of Integrated Devices and Circuits, Stockholm Sweden (2015).
Morishige et al., "Thermal Desorption and Infrared Studies of Ammonia Amines and Pyridines Chemisorbed on Chromic Oxide," J. Chem. Soc., Faraday Trans. 1, 78, 2947-2957 (1982).
Mosleh et al., "Enhancement of Material Quality of (Si)GeSn Films Grown by SnCl4 Precursor," ECS Transactions, 69 (5), 279-285 (2015).
Musschoot et al. "Atomic layer deposition of titanium nitride from TDMAT precursor" Microelectronic Engineering, 86, pp. 72-77 (2009).
Mukai et al., "A Study of CD Budget in Spacer Patterning Technology," Proc. Of SPIE, 6924, 1-8 (2008).
Naito et al. "Electrical Transport Properties in 2H—NbS2, —NbSe2, —TaS2 and —TaSe2," J. of Physical Society of Japan, vol. 51, No. 1, 219-227 (1982).
Nakano et al., "Layer-by-Layer Epitaxial Growth of Scalable WSe2 on Sapphire by Molecular Beam Epitaxy" Nano. Lett. 17, pp. 5595-5599 (2017).
Naslain et al. "Synthesis of highly tailored ceramic matrix composites by pressure-pulsed CVI" Solid State Ionics, 141-142, pp. 541-548 (2001).
Ngo et al. "Atomic layer deposition of photoactive CoO/SrTiO3 and CoO/Ti02 on Si(001) for visible light driven photoelectrochemical water oxidation," J. Applied Physics, 114, 9 pages (2013).
Niinisto et al. "Advanced electronic and optoelectronic materials by Atomic Layer Deposition: An overview with special emphasis on recent progress in processing of high-k dielectrics and other oxide materials" Pus. Stat. Sol. (a) 201, No. 7, pp. 1443-1452 (2004).
Nikolic et al. "The dependence of the work function of rare earth metals on their electron structure" Microelectronics Journal 27, 93-96 (1996).
Nogueira et al., "Production of Highly Hydrophobic Films Using Low Frequency and High Density Plasma," Revista Brasileira de Aplicacoes de Vacuo, 25(1), 45-53 (2006).
Noircler et al. "Transmission electron microscopy characterization of low temperature boron doped silicon epitaxial films" CrystEngComm, 22(33), pp. 5464-5472 (2020).
Novaro et al. Theoretical Study on a Reaction Pathway of Ziegler-Natta-Type Catalysis, J. Chem. Phys. 68(5), Mar. 1, 1978 p. 2337-2351.
Ohchi et al. "Reducing damage to Si substrates during gate etching processes." Japanese Journal of Applied Physics 47.7R 5324 (2008).
Ohtsu et al. "Influences of Gap Distance on Plasma Characteristics in Narrow Gap Capacitatively Coupled Radio-Frequency Discharge," vol. 43, No. 2, pp. 795-799 (2004).
Ohzawa et al. "Preparation of fibrous SiC shape using pressure-pulsed chemical vapour infiltration and its properties as a high-temperature filter" J. of Materials Processing Technology, 96, pp. 151-156 (1999).
Okamoto et al., "Luminescent Properties of Pr3+-sensitized LaPO4: Gd3+ Ultraviolet-B Phosphor Under Vacuum-Ultraviolet Light Excitation," J. App. Phys. 106, 013522 (2009).
O'Malley et al. "Structure and properties of ordered Li2IrO3 and Li2PtO3" Journal of Solid State Chemistry 181, pp. 1803-1809 (2008).
Oyama et al. "Topotactic synthesis of vanadium nitride solid foams" Journal of Materials Research vol. 8. No. 6, pp. 1450-1454 (1993).
Park et al. "Atomic layer deposition of Y2O3 films using hetroleptic liquid (iPrCp)2Y(iPr-amd) precursor" J. Mater. Chem. C, 2, 9 pages (2014).
Park, "Substituted Aluminum Metal Gate on High-K Dielectric for Low Work-Function and Fermi-Level Pinning Free," 4 pages, IEEE 0-7803-8684-1/04 (2004).
Peters et al., "Aerosol-Assisted Chemical Vapor Deposition of NbS2 and TaS2 Thin Films from Pentakis(dimethylamido)metal Complexes and 2-Methylpropanethiol" Eur. J. Inorg. Chem., pp. 4179-4185 (2005).
Pichler. "Intrinsic Point Defects, Impurities and Their Diffusion in Silicon," Springer-Verlag Wien, p. 367 (2004).
Portet et al., "Impact of Synthesis Conditions on Surface Chemistry and Structure of Carbide-Derived Carbons," Thermochimica Acta, 497, 137-142 (2010).
Posseme et al. "Alternative process for thin layer etching: Application to nitride spacer etching stopping on silicon germanium" Apply. Phys. Lett. 105, 051604, pp. 1-4 (2014).
Potts et al., "Low Temperature Plasma-Enhanced Atomic Layer Deposition of metal Oxide Thin Films," Journal of the Electrochemical Society, 157, 66-74 (2010).
Potts et al., "Room-Temperature ALD of Metal Oxide Thin Films by Energy-Enhanced ALD", Chemical Vapor Deposition, vol. 19, pp. 125-133 (2013).
Presser, et al., "Effect of Pore Size on Carbon Dioxide Sorption by Carbide Derived Carbon," Energy & Environmental Science 4.8, 3059-3066 (2011).
Provine et al. "Atomic Layer Deposition: Introduction to the Theory and Cambridge Nanotech Savannah & Fiji" NNIN ALD Roadshow Presentation, 49 pages (2012).
Provine et al., "Correlation of Film Density and Wet Etch Rate in Hydrofluoric Acid of Plasma Enhanced Atomic Layer Deposited Silicon Nitride," AIP Advances, 6 (2016).
Putkonen et al. "Low-Temperature ALE Deposition of Y2O3 Thin Films from β-Diketonate Precursors" Chemical Vapor Deposition 7(1) pp. 44-50 (2001).
Qin et al., "Chemical Vapor Deposition Growth of Degenerate p-Type Mo-Doped ReS2 Films and Their Homojunction," ACS Appl. Mater. Interfaces, 9(18), pp. 15583-15591 (2007).

(56) References Cited

OTHER PUBLICATIONS

Radamson et al. "Growth of Sn-alloyed Group IV Materials for Photonic and Electronic Applications" Chapter 5 pp. 129-144, Manufacturing Nano Structures (2014).
Rimoldi et al. "Atomic Layer Deposition of Rhenium-Aluminum Oxide Thin Films and ReOx Incorporation in a Metal-Organic Framework" Applied Materials & Interfaces, 9, pp. 35067-35074 (2017).
Roddy, "Transport Reactions and Vaporization Studies of Some Vanadium Halides", Iowa State university of Science and Technology dissertation, 207 pages (1962).
Rosemount 1199 Diaphragm Seal Systems, Product Data Sheet, 92 pages (2008).
Rossing et al. "Acoustics of Eastern and Western bells, Old and New" J of Acoustical Society of Japan; 10(5); pp. 241-252 (1989).
Ryu et al., "Persistent Charge-Density-Wave Order in Single-Layer TaSe2" Nano. Lett. 18, pp. 689-694 (2018).
Saeki et al. "Reaction Process of Vanadium Tetrachloride with Ammonia in the Vapor Phase and Properties of the Vanadium Nitride Formed" Bull. Chem. Soc. Jpn., 55, pp. 3446-3449 (1982).
Sakuma et al., "Highly Scalable Horizontal Channel 3-D NAND Memory Excellent in Compatibility with Conventional Fabrication Technology," IEEE Electron Device Letters, vol. 34, No. 9, 1142-1144 (2013).
Salim, "In-situ Fourier Transform Infrared Spectroscopy of Chemistry and Growth in Chemical Vapor Deposition," Massachusetts Institute of Technology, 187 pages (1995).
Salim et al., "In Situ Concentration Monitoring in a Vertical OMVPE Reactor by Fiber-Optics-Based Fourier Transform Infrared Spectroscopy," Journal of Crystal Growth 169, pp. 443-449, Elsevier Science B.V. (1996).
Samal et al., "Low-Temperature (<200° C.) Plasma Enhanced Atomic Deposition of Dense Titanium Nitride Thin Films" (2012).
Sanders et al., "Crystalline and electronic structure of single-layer $TaS_2$" Phys. Rev. B. 94, 081404, 6 pages (2016).
Schindler, Dissertation, Next Generation High-k Dielectrics for DRAM Produced by Atomic Layer Deposition Studied by Transmission Electron Microscopy (2015).
Schmatz et al., "Unusual Isomerization Reactions in 1.3-Diaza-2-Silcyclopentanes," Organometallics, 23, 1180-1182 (2004).
Sellers, Making Your Own Timber Dogs, Paul Sellers blog, Published on Nov. 18, 2014, [online], [site visted Jun. 10, 2017]. Available from Internet, <URL: https://paulsellers.com/2014/11/making-your-own-timber-dogs/>.
Selvaraj et al., "Selective Atomic Layer Deposition of Zirconia on Copper Patterned Silicon Substrates Using Ethanol as Oxygen Source as Well as Copper Reductant," J. Vac. Sci. Technol. A32(1), (2014).
Selvaraj et al., "Surface Selective Atomic Layer Deposition of Hafnium Oxide for Copper Diffusion Barrier Application Using Tetrakis (diethylamino) Hafnium and Ethanol," 225th ECS Meeting, Meeting Abstract, (May 12, 2014).
Senateur et al. "Pulsed Injection MOCVD of Functional Electronic Oxides" Adv. Mater. Opt. Electron, 10, pp. 155-161 (2000).
Seshadri et al., "Ultrathin Extreme Ultraviolet Patterning Stack Using Polymer Brush As An Adhesion Promotion Layer," Journal of Micro/Nanolithography, MEMS, and MOEMS 16(3) (2017).
Shamma et al., "PDL Oxide Enabled Doubling," Proc. Of SPIE, 6924, 69240D, 1-10 (2008).
Shevtsov et al. "An Apparatus for Pulse Chemical Vapor Deposition of Layers" Instruments and Experimental Techniques, vol. 56, No. 3, pp. 353-357 (2013).
Shevtsov et al. "Effect of Spatial Image Transfer in a Pulse MOCVD Process" Physics Procedia 46, pp. 27-32 (2013).
Simchi et al., "Sulfidation of 2D transition metals (Mo, W, Re, Nb, Ta): thermodynamics, processing, and characterization" J. Materials Science 52: 17, 9 pages (2017).
Spear et al., "Chemical Transport Reactions in the Vanadium-Silicon-Oxygen System and the Ternary Phase Diagram", Journal of the Less-Common Metals, 14, pp. 69-75 (1968).
Standard Motor Products LX249 Ignition Pick Up, Nov. 11, 2005, Amazon.com, May 10, 2021. URL: https://www.amazon.com/Standard-Motor-Products-LX249-Ignition/dp/B000C7ZTS4/ (2005).
Stanley et al. "Feedgas for Modern High-Performance Ozone Generators" Ozonia Ltd., Duebendorf, Switzerland. 7 pages. Available Jul. 14, 2017 online at: http://www.degremont-technologies.com/cms_medias/pdf/tech_ozonia_feedgas.pdf (1999).
Stannowski et al. "Growth process and properties of silicon nitride deposited by hot-wire chemical vapor deposition" J Applied Physics, vol. 93 No. 5, 9 pages (2013).
Su et al. "A Polymer Precursor Route to Metal Borides", Chem. Mater., 5, pp. 1659-1668 (1993).
Svetin et al., "Three-dimensional resistivity and switching between correlated electronic states in 1T-$TaS_2$" Nature, Scientific Reports Apr. 12, 2017, 7:46048, 10 pages (2017).
Tao et al. "Improved performance of GeON as charge storage layer in flash memory by optimal annealing" Microelectronics Reliability, vol. 52, pp. 2597-2601 (2012).
Tatehaba et al., "Adhesion Energy of Polystyrene and Substrate in Function Water," 5th International Symposium of Cleaning Technology in Semiconductor Device Manufacturing, pp. 560-565 (1998).
Tidman et al. "Resistivity of thin TaS2 crystals," Can. J. Phys., vol. 54, 2306-2309 (1976).
Todi et al., "Characterization of Pt—Ru Binary Alloy Thin Films for Work Function Tuning," IEEE Electron Device Letters, vol. 27, No. 7, pp. 542-545 (2006).
Tomozeiu et al. "Effects of UV photon irradiation on SiOx (0<x<2) structural properties" Applied Surface Science 253, pp. 376-380 (2006).
Trumbore et al. "Solid solubilities of aluminum and gallium in germanium," J. of Physics and Chemistry of Solids, vol. 11, Issues 3-4, 239-240 (1959).
Tseng et al., "Etch Properties of Resists Modified by Sequential Infiltration Synthesis," American Vacuum Society (2011).
Tseng et al., "Enhanced Block Copolymer Lithography Using Sequntial Infiltration Synthesis," Journal of Physical Chemistry, vol. 5, 17725-17729 (2011).
Ueda et al. "Enhanced Sidewall Grown (ESG) process: towards PEALD with conformality above 100%," Extended Abstracts of the 2011 International Conference on Solid State Devices and Materials, Nagoya, pp. 34-35 (2011).
U.S. Appl. No. 60/394,086, filed Jul. 3, 2002 in the name of Jacques Schmitt, and entitled "ALD on a Rotary Susceptor" pp. 1-23 (2002).
U.S. Appl. No. 62/274,238, filed Jan. 1, 2016 in the names of Alexander S. Polyak et al., and entitled "Non-Metallic Thermal CVD/ALD Gas Injector and Purge System" pp. 1-63 (2016).
U.S. Appl. No. 62/293,897, filed Feb. 11, 2016 in the names of Bernardo Donoso et al., and entitled "Vapor Based Site-Isolated Processing Systems and Methods" pp. 1-51 (2016).
Vallat et al. "Area selective deposition of TiO2 by intercalation of plasma etching cycles in PEALD process: A bottom up approach for the simplification of 3D integration scheme" Journal of Vacuum Science & Technology A 37(2), 12 pages (2019).
Vallat et al. "Selective deposition of Ta2O5 by adding plasma etching super-cycles in plasma enhanced atomic layer deposition steps" Journal of Vacuum Science & Technology A 35(1), 7 pages (2016).
Varma, et al., "Effect of Metal Halides on Thermal, Mechanical, and Electrical Properties of Polypyromelitimide Films," Journal of Applied Polymer Science, vol. 32, pp. 3987-4000, (1986).
Vasilev, "Borophosphosilicate Glass Films in Silicon Microelectronics, Part 1: Chemical Vapor Deposition, Composition, and Properties" Russian Microelectronics, vol. 33, No. 5, pp. 271-284 (2004).
Vayrynen et al. "Photo-Assisted Atomic Layer Deposition and Chemical Vapor Deposition of Metal and Metal Oxide Thin Films" Thesis, Oct. 2015, 146 pages (2005).
Venkatesan et al. "A rugged lead-ruthenate pyrochlore membrane catalyst for highly seelctive oxidation of alcohols" J. Molecular Catalysis A: Chemical 250, pp. 87-93 (2006).
Voltaix, "Meterial Safety Data Sheet for: Trisilylamine", pp. 1-8, (2014).

(56) References Cited

OTHER PUBLICATIONS

Wang et al., "Tritertiarybutylaluminum as an Organometallic Source for Epitaxial Growth of AlGaSb," Appl. Phys. Lett. 67 (10), Sep. 4, pp. 1384-1386, American Institute of Physics (1995).
Wirths et al. "Low temperature RPCVD epitaxial growth of Si1xGex using Si2H6 and Ge2H6" Solid-State Electronics, 88, pp. 2-9 (2013).
Wirths et al., "SiGeSn Growth Indies Using Reduced Pressure Chemical Vapor Deposition Towards Optoeleconic Applications," This Soid Films, 557, 183-187 (2014).
Xiao "Introduction to Semiconductor Manufacturing Technology" SPIE Press, ISBN 978-0-08194-9092-6, pp. 237-245 (2012).
Xing et al., "Ising Superconductivity and Quantum Phase Transition in Macro-Size Monolayer NbSe2" Nano. Lett. 17, pp. 6802-6807 (2017).
Xu et al., "14NM Metal Gate Film Stack Development and Challenges," Smic et al. (2016).
Xu et al., "Contacts between Two- and Three-Dimensional Materials: Ochmic, Schottky, and p-n Heterojunctions" ACS Nano 10, pp. 4895-4919 (2016).
Yanguas-Gil et al. "Modulation of the Growth Per Cycle in Atomic Layer Deposition Using Reversible Surface Functionalization" Chemistry of Materials, 25, pp. 4849-4860 (2013).
Yoshida, et al., Threshold Voltage Tuning for 10NM and Beyond CMOS Integration, Solid State Technology, 57(7): 23-25 (2014).
Yu et al., "Modulation of the Ni FUSI Workfunction by Yb Doping: from Midgap to N-Type Band-Edge," 4 pages, IEEE 0-7803-9269-8/05 (2005).
Yuan et al. "A Bifunctional Air Electrode Catalyzed by Lead Ruthenate for Li-Air Batteries" ECS Transactions 69(19), pp. 23-32 (2015).
Yuan et al., "Facile Synthesis of Single Crystal Vanadium Disulfide Nanosheets by Chemical Vapor Deposition for Efficient Hydrogen Evolution Reaction" Adv. Mater. 27, pp. 5605-5609 (2015).
Yun et al., "Behavior of Various Organosilicon Molecules in PECVD Processes for Hydrocarbon-Doped Silicon Oxide Films," Solid State Phenomena, vol. 124-126, 347-350 (2007).
Yun et al., "Comparison of Atomic Scale Etching of Poly-Si in Inductively Coupled Ar and He Plasmas", Korean Journal of Chemical Engineering, vol. 24, 670-673 (2007).
Yun et al., "Single-Crystalline Si Stacked Array (STAR) NAND Flash Memory," IEEE Transactions on Electron Devices, vol. 58, No. 4, 1006-1014 (2011).
Yun et al., "Effect of Plasma on Characteristics of Zirconium Oxide Films Deposited by Plasma-Enhanced Atomic Layer Deposition," Electrochemical and Solid State Letters, 8(11) F47-F50 (2005).
Yushin et al., "Carbon-Derived Carbon," Department of Materials Science and Engineering, Taylor & Francis Group, LLC (2006).
Zhao et al. "Surface Chemistry of Thermal Dry Etching of Cobalt Thin Films Using Hexafluoroacetylacetone (hfacH)" Appl Surf Sci. 455, pp. 438-445 (2018).
Zhao et al. "Thermal and Plasma-Enhanced Atomic Layer Deposition of Yttrium Oxide Films and the Properties of Water Wettability" Appl, Mater, Interfac. 12(2), 9 pages (2019).
Zhou et al., "A library of atomically thin metal chalcogenides" Nature 556, pp. 355-361 (2018).
Chemistry Stack Exchange, "Why is CF4 Non-Polar and CHF Polar," https://chemistry.stackexchange.com/questions/31604/why-is-cf4-non-polar-and-chf3-polar, (2015).
Crystal IS "Application Note: Using UV Reflective Materials to Maximize Disinfection"; AN011; Jun. 16, 2016.
IPS Water Heater Pan Adapter Kit, Nov. 1, 2015, [online], [site visited Dec. 4, 2019]; URL: http://es.ipscorp.com/watertite/protectivesystem/whpanadapter (2015).
"Polyurethane_HF"; webpage; no date. Cited in Notice of References dated May 18, 2017 in U.S. Appl. No. 14/884,695.
Rhenium trioxide; https://en.wikipedia.org/wiki/Rhenium_trioxide [online]; last edited on Feb. 18, 2017.
Scientific and Technical Information Center EIC 2800 Search Report dated Feb. 16, 2012.
CNIPA; Office Action dated Jul. 21, 2021 in Application No. 201610131743.1.
CNIPA; Office Action dated Jul. 23, 2021 in Application No. 201710131319.1.
CNIPA; Notice of Allowance dated Jun. 3, 2021 in Application No. 201711057929.8.
CNIPA; Office Action dated Sep. 13, 2021 in Application No. 201780076230.8.
CNIPA; Office Action dated Sep. 13, 2021 in Application No. 201780076321.1.
CNIPA; Office Action dated Apr. 30, 2021 in Application No. 201810018936.5.
CNIPA; Office Action dated Apr. 16, 2021 in Application No. 201810116717.0.
CNIPA; Notice of Allowance dated Sep. 15, 2021 in Application No. 201810116717.0.
CNIPA; Office Action dated May 26, 2021 in Application No. 201810215131.X.
CNIPA; Office Action dated Jun. 16, 2021 in Application No. 201810344382.8.
CNIPA; Notice of Allowance dated Oct. 11, 2021 in Application No. 201810344382.8.
CNIPA; Office Action dated Jul. 5, 2021 in Application No. 201810530514.6.
CNIPA; Office Action dated Jun. 30, 2021 in Application No. 201810755771.X.
CNIPA; Office Action dated Sep. 23, 2021 in Application No. 201880048547.5.
CNIPA; Office Action dated May 19, 2021 in Application No. 201880072606.2.
CNIPA; Office Action dated May 31, 2021 in Application No. 201910857144.1.
CNIPA; Office Action dated Jun. 2, 2021 in Application No. 201910920881.1.
CNIPA; Office Action dated Jul. 5, 2021 in Application No. 201911042495.3.
CNIPA; Office Action dated Apr. 27, 2021 in Application No. 201911250100.9.
CNIPA; Office Action dated Jul. 7, 2021 in Application No. 201980011788.7.
CNIPA; Notice of Allowance dated Jun. 16, 2021 in Application No. 202130111248.6.
EPO; Extended European Search Report dated Aug. 11, 2021 in Application No. 21169226.4.
JPO; Notice of Allowance dated Aug. 11, 2021 in Application No. 2018-024655.
JPO; Office Action dated Aug. 2, 2021 in Application No. 2019-504674.
JPO; Office Action dated Sep. 10, 2021 in Application No. 2019-531445.
JPO; Notice of Allowance dated Jun. 30, 2021 in Application No. 2021-004208.
KIPO; Office Action dated Jun. 28, 2021 in Application No. 10-2014-0027217.
KIPO; Notice of Allowance dated May 27, 2021 in Application No. 10-2014-0105478.
KIPO; Notice of Allowance dated Aug. 17, 2021 in Application No. 10-2014-0122903.
KIPO; Notice of Allowance dated Sep. 8, 2021 in Application No. 10-2014-0136089.
KIPO; Notice of Allowance dated Jul. 6, 2021 in Application No. 10-2014-0145220.
KIPO; Notice of Allowance dated Sep. 23, 2021 in Application No. 2014-0156196.
KIPO; Notice of Allowance dated Jul. 21, 2021 in Application No. 10-2015-0025314.
KIPO; Office Action dated May 19, 2021 in Application No. 10-2015-0036819.
KIPO; Office Action dated Jun. 23, 2021 in Application No. 10-2015-0037658.
KIPO; Office Action dated Sep. 6, 2021 in Application No. 10-2015-0046393.

(56) References Cited

OTHER PUBLICATIONS

KIPO; Office Action dated Jun. 10, 2021 in Application No. 2015-61391.
KIPO; Office Action dated Sep. 3, 2021 in Application No. 2017-37847.
KIPO; Office Action dated Aug. 2, 2021 in Application No. 2017-43865.
KIPO; Office Action dated Oct. 1, 2021 in Application No. 2017-43919.
KIPO; Office Action dated Sep. 28, 2021 in Application No. 2017-49172.
KIPO; Notice of Allowance dated Sep. 28, 2021 in Application No. 2017-54647.
KIPO; Office Action dated in Aug. 30, 2021 in Application No. 2017-81515.
KIPO; Office Action dated Sep. 10, 2021 in Application No. 2017-86083.
KIPO; Office Action dated Jun. 29, 2021 in Application No. 10-2017-0066979.
KIPO; Notice of Allowance dated Jun. 24, 2021 in Application No. 10-2019-0044213.
KIPO; Office Action dated Jun. 17, 2021 in Application No. 10-2021-0051860.
KIPO; Office Action dated Aug. 18, 2021 in Application No. 10-2021-0090283.
KIPO; Notice of Allowance dated Sep. 2, 2021 in Application No. 30-2020-0047043.
TIPO; Office Action dated Jun. 22, 2021 in Application No. 104108277.
TIPO; Notice of Allowance dated Sep. 22, 2021 in Application No. 104108277.
TIPO; Office Action dated Jun. 2, 2021 in Application No. 105129977.
TIPO; Notice of Allowance dated Sep. 9, 2021 in Application No. 105129977.
TIPO; Notice of Allowance dated Jun. 4, 2021 in Application No. 105131896.
TIPO; Notice of Allowance dated Jul. 30, 2021 in Application No. 105134275.
TIPO; Notice of Allowance dated Feb. 24, 2021 in Application No. 106113604.
TIPO; Notice of Allowance dated Sep. 3, 2021 in Application No. 106115126.
TIPO; Office Action dated Jun. 21, 2021 in Application No. 106120902.
TIPO; Notice of Allowance dated Jun. 30, 2021 in Application No. 106121797.
TIPO; Notice of Allowance dated Sep. 1, 2021 in Application No. 106122231.
TIPO; Notice of Allowance dated Jun. 3, 2021 in Application No. 106123203.
TIPO; Notice of Allowance dated Aug. 24, 2021 in Application No. 106124129.
TIPO; Notice of Allowance dated Jul. 28, 2021 in Application No. 106129491.
TIPO; Notice of Allowance dated Aug. 10, 2021 in Application No. 106129971.
TIPO; Office Action dated Jun. 15, 2021 in Application No. 106133152.
TIPO; Notice of Allowance dated Oct. 12, 2021 in Application No. 106135925.
TIPO; Office Action dated Jul. 13, 2021 in Application No. 106138996.
TIPO; Notice of Allowance dated Sep. 24, 2021 in Application No. 106143559.
TIPO; Office Action dated Aug. 5, 2021 in Application No. 106143566.
TIPO; Office Action dated May 26, 2021 in Application No. 106143568.
TIPO; Notice of Allowance dated Jul. 30, 2021 in Application No. 106143570.
TIPO; Office Action dated Jun. 7, 2021 in Application No. 107103230.
TIPO; Office Action dated Aug. 10, 2021 in Application No. 107103230.
TIPO; Office Action dated Sep. 8, 2021 in Application No. 107105788.
TIPO; Office Action dated Aug. 3, 2021 in Application No. 107105982.
TIPO; Office Action dated Aug. 16, 2021 in Application No. 107114888.
TIPO; Office Action dated Sep. 28, 2021 in Application No. 109112983.
TIPO; Office Action dated Sep. 13, 2021 in Application No. 109119438.
TIPO; Office Action dated Oct. 18, 2021 in Application No. 109300594.
TIPO; Notice of Allowance dated Jun. 9, 2021 in Application No. 109303437.
TIPO; Notice of Allowance dated Oct. 1, 2021 in Application No. 110118827.
TIPO; Notice of Allowance dated Jun. 30, 2021 in Application No. 110301018.
TIPO; Notice of Allowance dated Jul. 29, 2021 in Application No. 110301101.
TIPO; Notice of Allowance dated Jul. 27, 2021 in Application No. 110302670.
USPTO; Final Office Action dated Aug. 4, 2021 in U.S. Appl. No. 14/219,879.
USPTO; Non-Final Office Action dated Jun. 10, 2021 in U.S. Appl. No. 15/262,990.
USPTO; Final Office Action dated Oct. 1, 2021 in U.S. Appl. No. 15/262,990.
USPTO; Non-Final Office Action dated Jul. 9, 2021 in U.S. Appl. No. 15/286,503.
USPTO; Notice of Allowance dated Jun. 29, 2021 in U.S. Appl. No. 15/377,439.
USPTO; Non-Final Office Action dated Jun. 25, 2021 in U.S. Appl. No. 15/380,909.
USPTO; Final Office Action dated Jun. 21, 2021 in U.S. Appl. No. 15/380,921.
USPTO; Advisory Action dated Aug. 30, 2021 in U.S. Appl. No. 15/380,921.
USPTO; Non-Final Office Action dated Oct. 6, 2021 in U.S. Appl. No. 15/380,921.
USPTO; Advisory Action dated Jul. 27, 2021 in U.S. Appl. No. 15/402,993.
USPTO; Final Office Action dated Jun. 9, 2021 in U.S. Appl. No. 15/491,726.
USPTO; Advisory Action dated Aug. 24, 2021 in U.S. Appl. No. 15/491,726.
USPTO; Non-Final Office Action dated Sep. 28, 2021 in U.S. Appl. No. 15/491,726.
USPTO; Notice of Allowance dated Aug. 25, 2021 in U.S. Appl. No. 15/611,707.
USPTO; Non-Final Office Action dated Sep. 16, 2021 in U.S. Appl. No. 15/636,307.
USPTO; Advisory Action dated Jun. 11, 2021 in U.S. Appl. No. 15/690,017.
USPTO; Non-Final Office Action dated Jun. 17, 2021 in U.S. Appl. No. 15/690,017.
USPTO; Final Office Action dated Jul. 15, 2021 in U.S. Appl. No. 15/726,959.
USPTO; Advisory Action dated Sep. 21, 2021 in U.S. Appl. No. 15/726,959.
USPTO; Notice of Allowance dated Sep. 15, 2021 in U.S. Appl. No. 15/835,328.
USPTO; Advisory Action dated Jun. 11, 2021 in U.S. Appl. No. 15/909,705.
USPTO; Notice of Allowance dated Jun. 4, 2021 in U.S. Appl. No. 15/923,834.
USPTO; Final Office Action dated Jun. 28, 2021 in U.S. Appl. No. 15/925,532.
USPTO; Advisory Action dated Aug. 27, 2021 in U.S. Appl. No. 15/925,532.
USPTO; Non-Final Office Action dated Oct. 6, 2021 in U.S. Appl. No. 15/925,532.
USPTO; Non-Final Office Action dated Jun. 16, 2021 in U.S. Appl. No. 15/940,729.
USPTO; Notice of Allowance dated Sep. 28, 2021 in U.S. Appl. No. 15/940,729.

(56) References Cited

OTHER PUBLICATIONS

USPTO; Non-Final Office Action dated Aug. 2, 2021 in U.S. Appl. No. 15/962,980.
USPTO; Non-Final Office Action dated Oct. 4, 2021 in U.S. Appl. No. 15/967,146.
USPTO; Final Office Action dated Aug. 3, 2021 in U.S. Appl. No. 15/974,948.
USPTO; Advisory Action dated Oct. 21, 2021 in U.S. Appl. No. 15/974,948.
USPTO; Final Office Action dated Oct. 12, 2021 in U.S. Appl. No. 15/996,286.
USPTO; Non-Final Office Action dated Jul. 9, 2021 in U.S. Appl. No. 15/997,445.
USPTO; Final Office Action dated Aug. 5, 2021 in U.S. Appl. No. 16/000,109.
USPTO; Final Office Action dated Oct. 20, 2021 in U.S. Appl. No. 16/000,125.
USPTO; Final Office Action dated Sep. 3, 2021 in U.S. Appl. No. 16/004,041.
USPTO; Non-Final Office Action dated Oct. 22, 2021 in U.S. Appl. No. 16/042,791.
USPTO; Non-Final Office Action dated Sep. 28, 2021 in U.S. Appl. No. 16/105,745.
USPTO; Non-Final Office Action dated Sep. 29, 2021 in U.S. Appl. No. 16/105,761.
USPTO; Non-Final Office Action dated Jun. 25, 2021 in U.S. Appl. No. 16/105,802.
USPTO; Final Office Action dated Jul. 27, 2021 in U.S. Appl. No. 16/108,950.
USPTO; Advisory Action dated Oct. 1, 2021 in U.S. Appl. No. 16/108,950.
USPTO; Non-Final Office Action dated Jun. 18, 2021 in U.S. Appl. No. 16/117,530.
USPTO; Final Office Action dated Jul. 8, 2021 in U.S. Appl. No. 16/151,074.
USPTO; Notice of Allowance dated Sep. 17, 2021 in U.S. Appl. No. 16/151,074.
USPTO; Non-Final Office Action dated Sep. 16, 2021 in U.S. Appl. No. 16/152,260.
USPTO; Advisory Action dated Aug. 2, 2021 in U.S. Appl. No. 16/172,535.
USPTO; Non-Final Office Action dated Oct. 15, 2021 in U.S. Appl. No. 16/172,535.
USPTO; Final Office Action dated Jun. 14, 2021 in U.S. Appl. No. 16/202,941.
USPTO; Advisory Action dated Aug. 16, 2021 in U.S. Appl. No. 16/202,941.
USPTO; Non-Final Office Action dated Sep. 20, 2021 in U.S. Appl. No. 16/202,941.
USPTO; Final Office Action dated Jul. 26, 2021 in U.S. Appl. No. 16/206,589.
USPTO; Notice of Allowance dated Sep. 13, 2021 in U.S. Appl. No. 16/206,589.
USPTO; Non-Final Office Action dated Aug. 25, 2021 in U.S. Appl. No. 16/210,922.
USPTO; Final Office Action dated Sep. 1, 2021 in U.S. Appl. No. 16/240,392.
USPTO; Notice of Allowance dated Oct. 15, 2021 in U.S. Appl. No. 16/240,392.
USPTO; Final Office Action dated Sep. 7, 2021 in U.S. Appl. No. 16/251,534.
USPTO; Final Office Action dated Aug. 18, 2021 in U.S. Appl. No. 16/252,567.
USPTO; Final Office Action dated Jul. 21, 2021 in U.S. Appl. No. 16/252,569.
USPTO; Advisory Action dated Jul. 15, 2021 in U.S. Appl. No. 16/468,258.
USPTO; Non-Final Office Action dated Oct. 21, 2021 in U.S. Appl. No. 16/468,258.
USPTO; Advisory Action dated Jul. 8, 2021 in U.S. Appl. No. 16/546,543.
USPTO; Ex Parte Quayle Action dated Aug. 6, 2021 in U.S. Appl. No. 16/563,473.
USPTO; Notice of Allowance dated Sep. 30, 2021 in U.S. Appl. No. 16/563,473.
USPTO; Non-Final Office Action dated Oct. 5, 2021 in U.S. Appl. No. 16/588,807.
USPTO; Notice of Allowance dated Oct. 18, 2021 in U.S. Appl. No. 16/601,593.
USPTO; Non-Final Office Action dated Jun. 11, 2021 in U.S. Appl. No. 16/671,847.
USPTO; Non-Final Office Action dated Jun. 24, 2021 in U.S. Appl. No. 16/673,860.
USPTO; Non-Final Office Action dated Sep. 28, 2021 in U.S. Appl. No. 16/692,859.
USPTO; Notice of Allowance dated Jul. 20, 2021 in U.S. Appl. No. 16/704,835.
USPTO; Non-Final Office Action dated Aug. 31, 2021 in U.S. Appl. No. 16/712,707.
USPTO; Non-Final Office Action dated Sep. 21, 2021 in U.S. Appl. No. 16/736,336.
USPTO; Final Office Action dated Sep. 15, 2021 in U.S. Appl. No. 16/789,138.
USPTO; Non-Final Office Action dated Jun. 24, 2021 in U.S. Appl. No. 16/792,058.
USPTO; Notice of Allowance dated Oct. 19, 2021 in U.S. Appl. No. 16/792,058.
USPTO; Non-Final Office Action dated Oct. 6, 2021 in U.S. Appl. No. 16/792,544.
USPTO; Notice of Allowance dated Sep. 27, 2021 in U.S. Appl. No. 16/792,571.
USPTO; Non-Final Office Action dated Aug. 17, 2021 in U.S. Appl. No. 16/797,346.
USPTO; Notice of Allowance dated Jul. 21, 2021 in U.S. Appl. No. 16/816,078.
USPTO; Non-Final Office Action dated Jun. 23, 2021 in U.S. Appl. No. 16/827,012.
USPTO; Non-Final Office Action dated Feb. 23, 2021 in U.S. Appl. No. 16/827,506.
USPTO; Notice of Allowance dated May 27, 2021 in U.S. Appl. No. 16/827,506.
USPTO; Final Office Action dated Oct. 6, 2021 in U.S. Appl. No. 16/828,753.
USPTO; Non-Final Office Action dated Jul. 28, 2021 in U.S. Appl. No. 16/835,283.
USPTO; Non-Final Office Action dated Oct. 4, 2021 in U.S. Appl. No. 16/840,960.
USPTO; Non-Final Office Action dated Aug. 3, 2021 in U.S. Appl. No. 16/849,793.
USPTO; Non-Final Office Action dated Jun. 15, 2021 in U.S. Appl. No. 16/861,144.
USPTO; Final Office Action dated Sep. 17, 2021 in U.S. Appl. No. 16/861,144.
USPTO; Non-Final Office Action dated Sep. 1, 2021 in U.S. Appl. No. 16/867,385.
USPTO; Final Office Action dated Oct. 7, 2021 in U.S. Appl. No. 16/872,045.
USPTO; Final Office Action dated Oct. 14, 2021 in U.S. Appl. No. 16/878,443.
USPTO; Non-Final Office Action dated Oct. 4, 2021 in U.S. Appl. No. 16/886,405.
USPTO; Non-Final Office Action dated Jul. 28, 2021 in U.S. Appl. No. 16/888,423.
USPTO; Non-Final Office Action dated Oct. 13, 2021 in U.S. Appl. No. 16/893,206.
USPTO; Notice of Allowance dated Jun. 17, 2021 in U.S. Appl. No. 16/924,595.
USPTO; Non-Final Office Action dated Jul. 27, 2021 in U.S. Appl. No. 16/930,193.
USPTO; Non-Final Office Action dated Jun. 25, 2021 in U.S. Appl. No. 16/930,305.

(56) References Cited

OTHER PUBLICATIONS

USPTO; Non-Final Office Action dated Sep. 14, 2021 in U.S. Appl. No. 16/932,707.
USPTO; Non-Final Office Action dated Oct. 4, 2021 in U.S. Appl. No. 16/935,275.
USPTO; Notice of Allowance dated Sep. 22, 2021 in U.S. Appl. No. 16/935,280.
USPTO; Non-Final Office Action dated Aug. 23, 2021 in U.S. Appl. No. 16/938,868.
USPTO; Non-Final Office Action dated Oct. 12, 2021 in U.S. Appl. No. 16/944,763.
USPTO; Non-Final Office Action dated Aug. 19, 2021 in U.S. Appl. No. 16/992,806.
USPTO; Non-Final Office Action dated Jul. 7, 2021 in U.S. Appl. No. 16/999,065.
USPTO; Final Office Action dated Oct. 21, 2021 in U.S. Appl. No. 16/999,065.
USPTO; Final Office Action dated Jul. 23, 2021 in U.S. Appl. No. 17/009,093.
USPTO; Advisory Action dated Oct. 5, 2021 in U.S. Appl. No. 17/009,093.
USPTO; Non-Final Office Action dated Sep. 28, 2021 in U.S. Appl. No. 17/023,129.
USPTO; Notice of Allowance dated Oct. 14, 2021 in U.S. Appl. No. 17/024,092.
USPTO; Notice of Allowance dated Oct. 4, 2021 in U.S. Appl. No. 17/028,066.
USPTO; Non-Final Office Action dated Sep. 10, 2021 in U.S. Appl. No. 17/038,514.
USPTO; Non-Final Office Action dated Oct. 22, 2021 in U.S. Appl. No. 17/073,544.
USPTO; Non-Final Office Action dated Sep. 30, 2021 in U.S. Appl. No. 17/093,224.
USPTO; Non-Final Office Action dated Sep. 22, 2021 in U.S. Appl. No. 17/126,275.
USPTO; Non-Final Office Action dated Sep. 23, 2021 in U.S. Appl. No. 17/254,111.
USPTO; Non-Final Office Action dated Sep. 27, 2021 in U.S. Appl. No. 17/254,366.
USPTO; Notice of Allowance dated Jul. 1, 2021 in U.S. Appl. No. 29/679,620.
USPTO; Notice of Allowance dated Jul. 9, 2021 in U.S. Appl. No. 29/692,490.
USPTO; Non-Final Office Action dated Jul. 14, 2021 in U.S. Appl. No. 29/695,044.
USPTO; Notice of Allowance dated Jun. 8, 2021 in U.S. Appl. No. 29/696,472.
USPTO; Notice of Allowance dated Sep. 21, 2021 in U.S. Appl. No. 29/702,865.
Alen et al. "Atomic layer deposition of molybdenum nitride thin films for cu metallizations" J of The Electrochemical Society, 152(5) G361-G366 (2005).
Best et al. "Complex Halides of the Transition Metals. 24.1 Reactions of Dimeric Molybdenum (II) Halide Complexes Containing Strong Metal-Metal Bonds with Bidentate Tertiary Phosphines and Arsines" Inorganic Chemistry, vol. 17, No. 1, pp. 99-104 (1978).
Blakeney et al. "Atomic Layer Deposition of Aluminum Metal Films Using a Thermally Stable Aluminum Hydride Reducing Agent" Chem. Mater., 30, pp. 1844-1848 (2018).
Buitrago et al. "SnOx high-efficiency EUV interference lithography gratings towards the ultimate resolution in photolithography" Abstract, 1 page (2016).
Buitrago et al. "State-of-the-art EUV materials and processes for the 7 nm node and beyond" Proc of SPIE, vol. 10143, 8 pages (2017).
Cheng et al. "Improved High-Temperature Leakage in High-Density MIM Capcitors by Using a TiLaO Dielectric and an Ir Electrode" IEEE Electron Device Letters, vol. 28, No. 12, 3 pages (2007).
Firestop Support Plate, Type B, 6 In Apr. 4, 2012, Amazon. Com, May 10, 2021, https://www.amazon.com/AmeriVent-Firestop-Support-Plate-Type/dp/B007R7W951/ (2012).
Gertsch et al. "SF4 as the Fluorination Reactant for Al2O3 and VO2 Thermal Atomic Layer Etching" Chem. Mater., 31, pp. 3624-3635 (2019).
Han et al. "Synthesis and characterization of novel zinc precursors for ZnO thin film deposition by atomic layer deposition" Dalton Transactions 49.14 (2020): 4306-4314.
Hayashi et al. "2,2-Difluoro-1,3-dimethylimidazolidine (DFI). A new fluorinating agent" Chem. Commun. pp. 1618-1619 (2002).
Imai et al. "Energetic stability and magnetic moment of tri-, tetra-, and octa-ferromagnetic element nitrides predicted by first-principle calculations" J of Alloys and Compounds, vol. 611, 19 pages (2019).
Jacoby "Chemical deposition methods to the rescue" Cen. Acs. Org., pp. 29-32 (2018).
Jiang et al. "Sensitizer for EUV Chemically Amplified Resist: Metal versus Halogen" J of Photopolymer Science and Technology, vol. 32, No. 1, pp. 21-25 (2019).
Kang et al. "Optical Performance of Extreme Ultraviolet Lithography Mask with an Indium Tin Oxide Absorber" J of Nanoscience and Nanotechnology, vol. 12, pp. 3330-3333 (2012).
Kim et al. "Atomic layer deposition of transition metals for silicide contact formation: Growth characteristics and silicidation" Microelectronic Engineering, 106, pp. 69-75 (2013).
Lim et al. "Atomic layer deposition of transition metals" Nature Materials, vol. 2 pp. 749-754 (2003).
Maina et al. "Atomic layer deposition of transition metal films and nanostructures for electronic and catalytic applications" Critical Reviews in Solid State and Materials Sciences, Abstract, 2 pages (2020).
Miikkulainen et al. "Crystallinity of inorganic films grown by atomic layer deposition: Overview and general trends" Journal of Applied Physics, 112, 102 pages (2013).
Niskanen et al. "Radical-enhanced atomic layer deposition of metallic copper thin films" Journal of the Electrochemical Society 152(1) pages, G25-G28 (2004).
O'Hanlon "A User's Guide to Vacuum Technology" Third Edition, Chapter 19, pp. 359-378 (2003).
Ovanesyan et al. "Atomic Layer Deposition of SiCxNy Using Si2Cl6 and CH3NH2 Plasma" Chem. Mater. 2017, 29, pp. 6269-6278 (2017).
Park et al. "Superfilling CVD of copper using a catalytic surfactant" Proceedings of the IEEE 2001 International Interconnect Technology Conference, 3 pages (2001).
Petrov et al. "1,1,2,2-Tetrafluoroethyl-N,N-dimethylamine: a new selective fluorinating agent" J of Fluorine Chemistry, 109, pp. 25-31 (2001).
Popov et al. "Atomic Layer Deposition of PbI2 Thin Films" Chem. Mater. 31, pp. 1101-1109 (2019).
Popovici et al. "High-performance (EOT<0.4nm, Jg~10-7 A/cm2) ALD-deposited Ru\SrTiO3 stack for next generations DRAM pillar capacitor" 2018 IEEE International Electron Devices Meeting (IEDM), 4 pages (2018).
Puurunen "Surface Chemistry of Atomic Layer Depostion: A Case Study for the Trimethylaluminum/Water Process" Journal of Applied Physics, 97, 55 pages (2005).
Rahemi et al. "Variation in electron work function with temperature and its effect on the Young's modulus of metals" Scripta Materialia, 99, pp. 41-44 (2015).
SciFinder Search Results on hydrazido-based precursor for boron nitride films, search conducted Nov. 5, 2020, 5 pages (2020).
Shiba et al. "Stable yttrium oxyfluoride used in plasma process chamber" J. Vac. Sci. Technol. A, 35(2), 6 pages (2017).
Shigemoto et al. "Thermal cleaning of silicon nitride with fluorine and additive mixture" 1 page (2007).
Takaoka et al. "F-Propene-Dialkylamine Reaction Products as Fluorinating Agents" Bulletin of the Chemical Socity of Japan, vol. 52 (11), pp. 3377-3380 (1979).
Tsoutsou et al. "Atomic layer deposition of LaxZr1-xO2-d (x=0.25) high-k dielectrics for advanced gate stacks" Applied Physics Letters, 94, 3 pages (2009).

(56) References Cited

OTHER PUBLICATIONS

U.S. Appl. No. 60/545,181, filed Feb. 13, 2004 in the names of Matthew G. Goodman et al., and entitled "Forced Flow Susceptor with Exit Holes and Veins for Improvided Process" pp. 1-15 (2004).
U.S. Appl. No. 60/591,258, filed Jul. 26, 2004 in the names of Jeroen Stoutyesdijk et al., and entitled "Susceptor Support for Eliminating Backside Nodules" pp. 1-71 (2004).
U.S. Appl. No. 62/504,470, filed May 10, 2017 in the names of Jennifer Y. Sun et al., and entitled "Metal-Oxy-Fluoride Films for Chamber Components" pp. 1-82 (2017).
Van Asselt et al. "New Palladium Complexes of Cis-Fixed Bidentate Nitrogen Ligands as Catalysts for Carbon-Carbon Bond Formation" Organometallics, 11, pp. 1999-2001 (1992).
Van Asselt et al. "On the Mechanism of Formation of Homocoupled Products in the Carbon-Carbon Cross-Coupling Reaction Catalyzed by Palladium Complexes Containing Rigid Bidentate Nitrogen Ligands" Organometallics, 13, pp. 1972-1980 (1994).
Vayrynen et al. "Atomic Layer Deposition of Nickel Nitride Thin Films Using NiCL2 (TMPDA) and Tert-Butylhydrazine as Precursors" Phy. Status Solidi A, 216, 9 pages (2019).
Vesters et al. "Sensitizers in EUV Chemically Amplified Resist: Mechamsm of sensitivity improvement" Proc. SPIE 10583 Extreme Ultraviolet (EUV) Lithography IX, 1058307, 11 pages (2018).
Wilklow-Marnell et al. "First-row transitional-metal oxalate resists for EUV" J. Micro/Nanolith. MEMS MOEMS 17(4) Oct-Dec. 2018, 9 pages (2018).
Zhang et al. "Mechanical Stability of Air-gap Interconnects" Proc. Future Fab International, pp. 81-87 (2008).
Zientara et al. Journal of the European Ceramic Society, 27, Abstract, 1 page (2007).

* cited by examiner

SUBSTRATE PROCESSING METHOD

CROSS-REFERENCE TO RELATED APPLICATIONS

This application claims the benefit of and priority to U.S. Provisional Application No. 63/046,511, filed on Jun. 30, 2020 in the United States Patent and Trademark Office, the disclosure of which is incorporated herein in its entirety by reference.

BACKGROUND

1. Field

One or more embodiments relate to a substrate processing method, and more particularly, to a substrate processing method capable of improving etch selectivity without increasing the power.

2. Description of the Related Art

Recently, the necessity of performing a selective deposition process on a patterned three-dimensional (3D) structure has increased. For example, in manufacturing a 3D NAND flash device, a process of selectively depositing only an upper portion of a stepwise structure has been used. In order to implement such selective deposition, it is necessary to increase the etch selectivity of thin films deposited on the top and side of a pattern structure.

For example, plasma may be applied to increase the etch selectivity of the thin films deposited on the top and side of the pattern structure. Due to the straightness and ion bombardment effect of radicals generated by plasma application, thin films on the top and bottom of the pattern structure in a direction perpendicular to a traveling direction of the radicals may be densified. On the other hand, the thin film on the side of the pattern structure in a direction parallel to the traveling direction of the radicals may be less dense than the thin films on the top and bottom of the pattern structure. Therefore, the thin film on the side of the pattern structure is removed by wet etching, and the thin films on the top and bottom of the pattern structure may remain.

There is a limit to densification of thin films by radicals and improvement of etching selectivity. For example, even when certain RF power is applied, the desired etch selectivity of the thin films deposited on the top and side of the pattern structure may not be achieved. Therefore, higher RF power may be applied to overcome this, in which case damage may occur inside a reactor. Components inside the reactor, such as a shower head, may be destroyed or damaged by, for example, high ion bombardment or a plasma arc.

SUMMARY

One or more embodiments include a method of selectively depositing a thin film on an area of a structure having a step without performing a separate photolithography process, and more particularly, a method capable of improving etch selectivity without increasing the power to selectively deposit a thin film on a pattern structure (e.g., a stepwise structure) without a photolithography process.

Additional aspects will be set forth in part in the description which follows and, in part, will be apparent from the description, or may be learned by practice of the presented embodiments of the disclosure.

According to one or more embodiments, a substrate processing method includes supplying a first gas onto a structure, supplying a second gas to form a first thin film on the structure, forming a second material layer by supplying the first gas on the first thin film, removing a portion of the second material layer to expose a portion of the first thin film, removing the exposed portion of the first thin film, and removing the second material layer.

According to an example of the substrate processing method, first plasma may be applied during the supplying of the second gas, and second plasma may be applied during the forming of the second material layer.

According to another example of the substrate processing method, during the supplying of the first gas, a first material layer may be formed on the structure, and the second gas may be changed to have reactivity with the first material layer by applying the first plasma.

According to another example of the substrate processing method, the first gas may be dissociated by the application of the second plasma to form the second material layer.

According to another example of the substrate processing method, the removing of a portion of the second material layer and the removing of the exposed portion of the first thin film may be performed by isotropic etching.

According to another example of the substrate processing method, the removing of a portion of the second material layer and the removing of the exposed portion of the first thin film may be performed using an identical etchant.

According to another example of the substrate processing method, the second plasma may include directional plasma, and properties of the second material layer may be partially changed by the second plasma.

According to another example of the substrate processing method, during the isotropic etching, the remaining portion of the second material layer functions as a mask, so that a portion of the first thin film under the second material layer remains and the remaining portion of the first thin film may be removed.

According to another example of the substrate processing method, a frequency of first power supplied during the application of the first plasma may be greater than a frequency of second power supplied during the application of the second plasma.

According to another example of the substrate processing method, the first gas may include a silicon source including a carbon element, and the second material layer may include a silicon element and a carbon element.

According to another example of the substrate processing method, the first thin film may include at least one of silicon oxide or silicon nitride, and the second material layer may further include oxygen or nitrogen.

According to another example of the substrate processing method, the second material layer may have etch selectivity with respect to the first thin film.

According to another example of the substrate processing method, the second material layer may include a carbon element, and a WER for hydrogen fluoride (HF) of the first thin film may be greater than a WER for hydrogen fluoride of the second material layer.

According to another example of the substrate processing method, for a certain etchant, a first portion of the second material layer has a first WER, and a second portion of the second material layer has a second WER greater than the first WER, and the first thin film may have a third WER greater than the second WER.

According to another example of the substrate processing method, the substrate processing method may further include trimming the first thin film.

According to another example of the substrate processing method, the trimming of the first thin film may include removing an overhang of the first thin film.

According to one or more embodiments, a substrate processing method includes supplying a silicon-containing source gas onto a structure to form a first silicon-containing material layer adsorbed on the structure, forming a first thin film on the structure by supplying a reaction gas reactive with the silicon-containing source gas, supplying the silicon-containing source gas on the first thin film and applying directional plasma to form a second silicon-containing material layer adsorbed on the first thin film, wherein the second silicon-containing material layer is partially densified or weakened by the directional plasma, exposing a portion of the first thin film by performing isotropic etching on the second silicon-containing material layer, removing the exposed portion of the first thin film, and performing anisotropic etching to remove the second silicon-containing material layer.

According to one or more embodiments, a substrate processing method includes forming a first thin film on a structure, forming a material layer having wet etch resistance greater than that of the first thin film on the first thin film, removing a portion of the material layer using wet etching to expose a portion of the first thin film, and removing the exposed portion of the first thin film.

According to an example of the substrate processing method, the forming of the material layer may include forming a material layer adsorbed on the first thin film by supplying a first gas.

According to another example of the substrate processing method, during the forming of the first thin film, the first gas used in the forming of the material layer may be used. In addition, during the forming of the material layer, the first gas used in the forming of the first thin film may be used.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
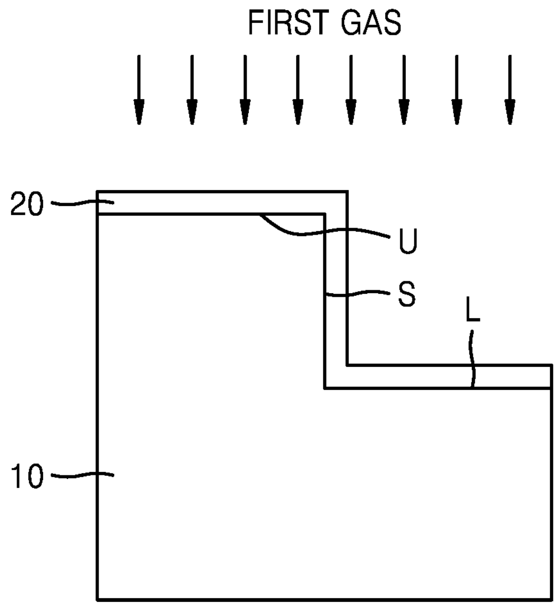
FIGS. 1 to 7 are flowcharts of a substrate processing method according to embodiments of the inventive concept.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, one or more embodiments will be described more fully with reference to the accompanying drawings.

In this regard, the present embodiments may have different forms and should not be construed as being limited to the descriptions set forth herein. Rather, these embodiments are provided so that the present disclosure will be thorough and complete, and will fully convey the scope of the present disclosure to one of ordinary skill in the art.

The terminology used herein is for the purpose of describing particular embodiments and is not intended to limit the disclosure. As used herein, the singular forms "a", "an", and "the" are intended to include the plural forms as well, unless the context clearly indicates otherwise. It will be further understood that the terms "includes", "comprises" and/or "including", "comprising" used herein specify the presence of stated features, integers, steps, processes, members, components, and/or groups thereof, but do not preclude the presence or addition of one or more other features, integers, steps, processes, members, components, and/or groups thereof. As used herein, the term "and/or" includes any and all combinations of one or more of the associated listed items.

It will be understood that, although the terms first, second, etc. may be used herein to describe various members, components, regions, layers, and/or sections, these members, components, regions, layers, and/or sections should not be limited by these terms. These terms do not denote any order, quantity, or importance, but rather are only used to distinguish one component, region, layer, and/or section from another component, region, layer, and/or section. Thus, a first member, component, region, layer, or section discussed below could be termed a second member, component, region, layer, or section without departing from the teachings of embodiments.

In the disclosure, "gas" may include evaporated solids and/or liquids and may include a single gas or a mixture of gases. In the disclosure, a process gas introduced into a reaction chamber through a shower head may include a precursor gas and an additive gas. The precursor gas and the additive gas may typically be introduced as a mixed gas or may be separately introduced into a reaction space. The precursor gas may be introduced together with a carrier gas such as an inert gas. The additive gas may include a dilution gas such as a reaction gas and an inert gas. The reaction gas and the dilution gas may be mixedly or separately introduced into the reaction space. The precursor may include two or more precursors, and the reaction gas may include two or more reaction gases. The precursor may be a gas that is chemisorbed onto a substrate and typically contains metalloid or metal elements constituting a main structure of a matrix of a dielectric film, and the reaction gas for deposition may be a gas that is reactive with the precursor chemisorbed onto the substrate when excited to fix an atomic layer or a monolayer on the substrate. The term "chemisorption" may refer to chemical saturation adsorption. A gas other than the process gas, that is, a gas introduced without passing through the shower head, may be used to seal the reaction space, and it may include a seal gas such as an inert gas. In some embodiments, the term "film"

may refer to a layer that extends continuously in a direction perpendicular to a thickness direction without substantially having pinholes to cover an entire target or a relevant surface, or may refer to a layer that simply covers a target or a relevant surface. In some embodiments, the term "layer" may refer to a structure, or a synonym of a film, or a non-film structure having any thickness formed on a surface. The film or layer may include a discrete single film or layer or multiple films or layers having some characteristics, and the boundary between adjacent films or layers may be clear or unclear and may be set based on physical, chemical, and/or some other characteristics, formation processes or sequences, and/or functions or purposes of the adjacent films or layers.

In the disclosure, the expression "containing an Si—N bond" may be referred to as characterized by an Si—N bond or Si—N bonds having a main skeleton substantially constituted by the Si—N bond or Si—N bonds and/or having a substituent substantially constituted by the Si—N bond or Si—N bonds. A silicon nitride layer may be a dielectric layer containing a Si—N bond, and may include a silicon nitride layer (SiN) and a silicon oxynitride layer (SiON).

In the disclosure, the expression "same material" should be interpreted as meaning that main components (constituents) are the same. For example, when a first layer and a second layer are both silicon nitride layers and are formed of the same material, the first layer may be selected from the group consisting of Si2N, SiN, Si3N4, and Si2N3 and the second layer may also be selected from the above group but a particular film quality thereof may be different from that of the first layer.

Additionally, in the disclosure, according as an operable range may be determined based on a regular job, any two variables may constitute an operable range of the variable and any indicated range may include or exclude end points. Additionally, the values of any indicated variables may refer to exact values or approximate values (regardless of whether they are indicated as "about"), may include equivalents, and may refer to an average value, a median value, a representative value, a majority value, or the like.

In the disclosure where conditions and/or structures are not specified, those of ordinary skill in the art may easily provide these conditions and/or structures as a matter of customary experiment in the light of the disclosure. In all described embodiments, any component used in an embodiment may be replaced with any equivalent component thereof, including those explicitly, necessarily, or essentially described herein, for intended purposes, and in addition, the disclosure may be similarly applied to devices and methods.

Hereinafter, embodiments of the disclosure will be described with reference to the accompanying drawings. In the drawings, variations from the illustrated shapes may be expected as a result of, for example, manufacturing techniques and/or tolerances. Thus, the embodiments of the disclosure should not be construed as being limited to the particular shapes of regions illustrated herein but may include deviations in shapes that result, for example, from manufacturing processes.

FIGS. 1 to 7 are flowcharts of a substrate processing method according to embodiments of the inventive concept.

Referring to FIG. 1, a stepwise structure 10 is provided. The stepwise structure 10 may be on a substrate (not shown). The stepwise structure 10 may include one layer or a plurality of layers. For example, the stepwise structure 10 may be formed by reactive ion etching and/or resist sliming with respect to a stacked structure including a plurality of layers.

Upon forming the stepwise structure 10, the stepwise structure 10 has an upper surface U, a lower surface L, and a side surface S connecting the upper surface U to the lower surface L. For example, the stepwise structure 10 may include at least one step, and the at least one step may have the upper surface U, the lower surface L, the side surface S connecting the upper surface U to the lower surface L.

Although the stepwise structure 10 is illustrated in the present embodiment and the substrate processing method is described based on this, the inventive concept is not limited thereto. For example, the substrate processing method according to embodiments of the inventive concept may be utilized for selective deposition of any type of a three-dimensional (3D) structure. For example, selective deposition of a pattern structure including a plurality of overhangs may be achieved.

Figure 2:
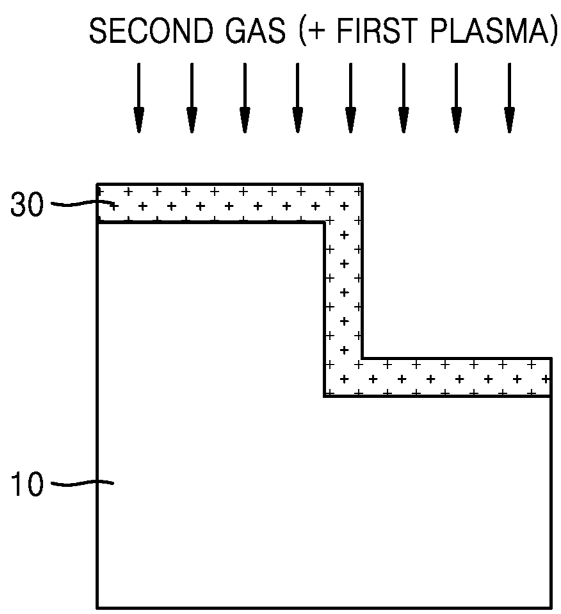

When the stepwise structure 10 is provided, at least one thin film is formed on the stepwise structure 10. The thin film may be formed through any kind of deposition process (e.g., deposition processes such as sputtering, chemical vapor deposition (CVD), physical vapor deposition (PVD), and atomic layer deposition (ALD)). For example, a first material layer 20 is formed by supplying a first gas on a structure (FIG. 1), and a second gas is supplied to form a first thin film 30 on the structure (FIG. 2). The first material layer 20 and the second gas may react to form the first thin film 30.

For example, the first thin film 30 may be a silicon oxide film, a silicon nitride film, or a silicon oxynitride film. The first gas used to form the first thin film 30 may include a silicon-containing source gas. Thus, a silicon-containing source gas may be supplied onto the structure to form a silicon-containing material layer chemisorbed onto the structure.

For example, the first gas may be an aminosilane-based silicon-containing source gas containing a methyl group ($—C_nH_{2n+1}$) or an ethyl group ($—C_nH_{2n+2}$). That is, the first gas may include a silicon source containing a carbon element. Accordingly, a material layer formed by the first gas may include a silicon element and a carbon element. As will be described later below, the material layer including the carbon element may have good etch selectivity to silicon oxide or silicon nitride.

In some embodiments, in order to form the first thin film 30, an ALD process may be used. For example, a basic cycle of source supply, source purge, reactant supply, and reactant purge may be repeated several times to form the first thin film 30 having a desired thickness. In this case, the first gas is supplied during the source supply to form the first material layer 20, and the second gas is supplied during the reactant supply to form the first thin film 30.

In an alternative embodiment, energy may be applied to promote reaction of the first material layer 20 and the second gas. For example, during supplying of the second gas, the first plasma may be applied. By applying energy such as the first plasma, the second gas may be changed (e.g., excited) to be reactive with the first material layer 20. Therefore, the second gas and the first material layer 20 may react to form the first thin film 30.

Figure 3:
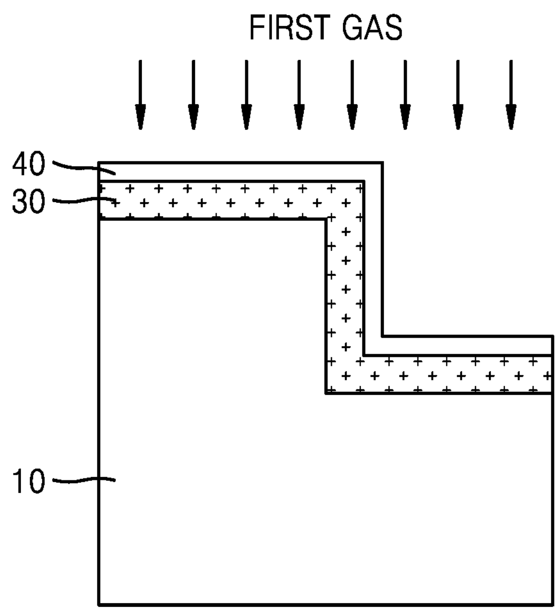

Referring to FIG. 3, a second material layer 40 is formed by supplying a first gas on the first thin film 30. The supplying of the first gas on the first thin film 30 may be repeated a plurality of times. For example, a cycle including supplying a first gas and purging the first gas may be performed a plurality of times. By repeating this cycle, the second material layer 40 of a desired thickness may be formed.

The second material layer 40 may have different chemical properties from those of the first thin film 30. In more detail, the second material layer 40 may have higher wet etch resistance than that of the first thin film 30. Accordingly, when wet etching of the first thin film 30 and the second material layer 40 is performed, the amount of the first thin film 30 removed may be greater than the amount of the second material layer 40 removed. Thus, during the etching process for the first thin film 30, the second material layer 40 may function as an etch mask.

A gas supplied during the forming of the second material layer 40 and a gas supplied during the forming of the first thin film 30 may be the same. That is, while forming the second material layer 40, a first gas including a silicon source containing a carbon element may be supplied. Therefore, the second material layer 40 may include silicon elements and carbon elements.

The carbon element included in the second material layer 40 may reduce a wet etch rate (WER) for hydrogen fluoride (HF). Therefore, when the first thin film 30 and the second material layer 40 are wet-etched using HF, a WER for HF of the first thin film 30 containing no carbon element may be greater than a WER for HF of the second material layer 40 containing the carbon element.

The second material layer 40 may be a material layer adsorbed on the first thin film 30. For example, the first gas used to form the second material layer 40 may include a source gas used in an ALD process. In this case, the second material layer 40 may be formed by chemically adsorbing the first gas on the first thin film 30.

In some embodiments, the second material layer 40 formed on the first thin film 30 may include at least a portion of components of the first thin film 30. For example, when the first thin film 30 includes silicon oxide, the second material layer 40 may include an oxygen element. In another example, when the first thin film 30 includes silicon nitride, the second material layer 40 may include a nitrogen element.

In some embodiments, second plasma may be applied while supplying the first gas to form the second material layer 40. In a conventional ALD process, plasma is not applied while supplying the source gas. On the other hand, it is noted that according to embodiments of the inventive concept, plasma is applied while supplying the source gas. The first gas may be dissociated by the application of the second plasma, and thus the formation of the second material layer 40 may be promoted.

In some embodiments, the application of the second plasma may be performed after the supplying of the first gas. In other words, the application of the second plasma may be included in one cycle to form the second material layer 40. Hereinafter, it is assumed that the supplying of the first gas and the applying of the second plasma included in the forming of the second material layer 40 are sequentially performed.

Figure 4:
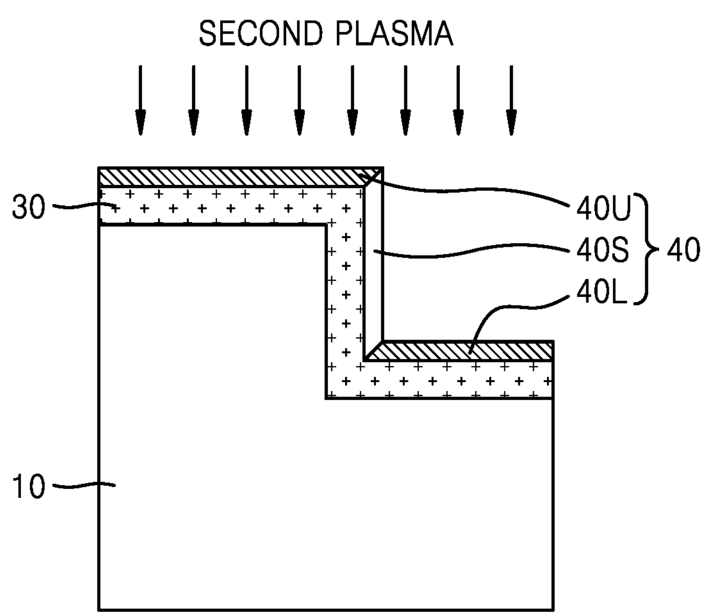

FIG. 4 shows the applying of the second plasma. The second plasma may partially change properties of the second material layer 40. For example, the second plasma may have directionality. As an example, the second plasma may be applied to face upper and lower surfaces of the second material layer 40, and thus properties of an upper surface portion 40U and a lower surface portion 40L of the second material layer 40 may be changed by application of the directional second plasma.

In some embodiments, process conditions of applying first plasma to form the first thin film 30 may be different from process conditions of applying second plasma. For example, a frequency of first power supplied during the application of the first plasma may be greater than a frequency of second power supplied during the application of the second plasma. By applying second plasma at a relatively low frequency, linearity (i.e., directionality) of ions may be improved.

In an example, application of directional second plasma may densify portions of a second material layer located on upper and lower surfaces of the stepwise structure 10. In another example, the application of the directional second plasma may weaken the portions of the second material layer located on the upper and lower surfaces of the stepwise structure 10. This change in properties may be achieved by adjusting parameters (e.g., the amount of power) during a plasma process. Hereinafter, it will be described on the premise that the upper and lower surface portions 40U and 40L of the second material layer 40 are densified due to application of plasma.

Figure 5:
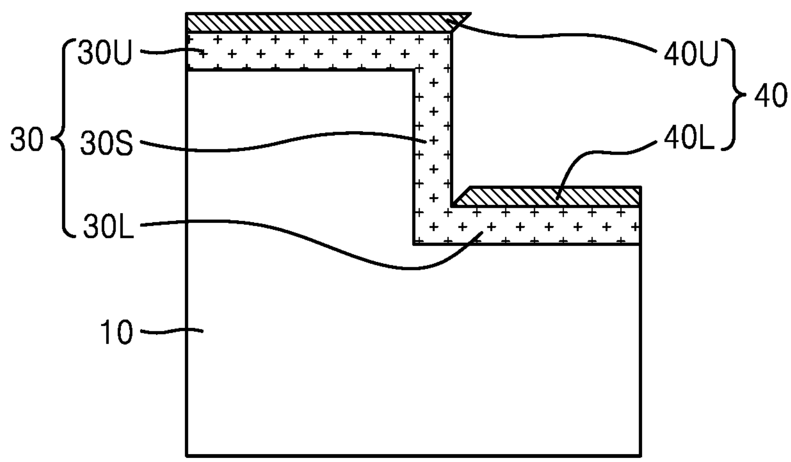

Referring to FIG. 5, a portion of the second material layer 40 is removed to expose a portion of the first thin film 30. A first isotropic etching process, such as wet etching, may be used to remove the second material layer 40. When the upper and lower surface portions 40U and 40L of the second material layer 40 are densified due to application of directional second plasma, during first isotropic etch, a side portion 40S (of FIG. 4) of the second material layer 40 are removed, while the upper and lower surface portions 40U and 40L of the second material layer 40 may remain. Therefore, after the first isotropic etching, a side surface portion 30S of the stepwise structure 10 of the first thin film 30 is exposed, while upper and lower surface portions 30U and 30L of the stepwise structure 10 of the first thin film 30 may be covered with the second material layer 40.

Figure 6:
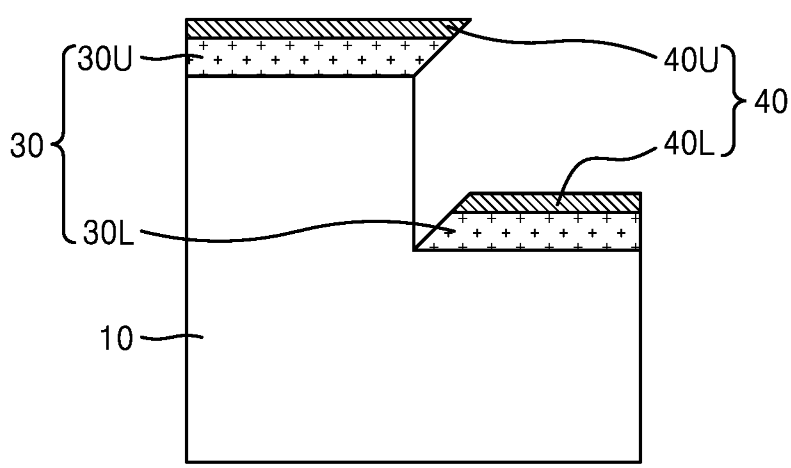

Thereafter, referring to FIG. 6, an exposed portion of the first thin film 30 is removed. For example, a second isotropic etching may be performed on a structure after the first isotropic etching. During the second isotropic etching, the remaining portions 40U and 40L of the second material layer 40 may act as an etch mask. Therefore, the portions 30U and 30L of the first thin film under the second material layer 40 remains without being etched, while the remaining portion (i.e., exposed portion 30S) of the first thin film 30 may be removed to expose a surface of the stepwise structure 10.

In some embodiments, removing of the portion 40S of the second material layer 40 and the removing of the exposed portion 30S of the first thin film 30 may be performed simultaneously. For example, in other words, the removing of the portion 40S of the second material layer 40 and the removing of the exposed portion 30S of the first thin film 30 may be performed by a single etching process. That is, the first isotropic etching and the second isotropic etching may be the same etching process.

For example, for a certain etchant, densified portions (the upper and lower surface portions 40U and 40L of the stepwise structure 10) of the second material layer 40 may have a first WER, a non-densified portion (the side portion 40S of the stepwise structure 10) of the second material layer 40 may have a second WER greater than the first WER, and the first thin film 30 may have a third WER greater than the second WER.

In this case, isotropic etching of the first thin film 30 and the second material layer 40 may be performed using the certain etchant. First, the second material layer 40 is exposed to the etchant, so that the upper and lower surface portions 40U and 40L of the second material layer 40 with the lowest value of the first WER may remain, and the side portion 40S of the second material layer 40 with the relatively high value of the second WER may be removed.

Because the isotropic etching is continuously performed using the etchant, the upper and lower surface portions 40U and 40L of the second material layer 40 with the lowest value of the first WER and the upper and lower surface portions 30U and 30L of the first thin film 30 under the upper and lower surface portions 40U and 40L remain, while the exposed portion of the first thin film 30 with the highest value of the third WER, that is, the side surface portion 30S of the stepwise structure 10 may be removed.

In an alternative embodiment, the first isotropic etching and the second isotropic etching may be different etching processes. For example, removing the portion 40S of the second material layer 40 using the first isotropic etching and removing the exposed portion 30S of the first thin film 30 using the second isotropic etch may be performed using different types of etchant. As another example, the first isotropic etching and the second isotropic etching are performed using the same type of etchant, but at least some of process parameters may be different.

Figure 7:
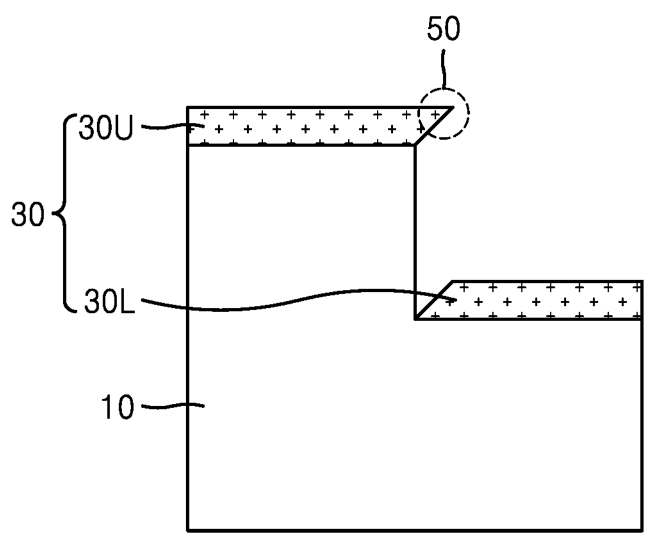

Referring to FIG. 7, the second material layer 40 remaining after isotropic etching is removed. Anisotropic etching processes, such as dry etching, may be used to remove the remaining second material layer 40. The first thin film 30 partially formed on upper and lower surfaces of the stepwise structure 10 may be exposed by removing the second material layer 40.

As shown in FIG. 7, the exposed first thin film 30 may include an overhang 50. The overhang 50 may have a shape protruding from the side surface S of the stepwise structure 10. In order to eliminate this protruding shape, trimming of the first thin film 30 may be performed. In some embodiments, a sputtering process may be performed during the trimming of the first thin film 30. In another embodiment, any further processing (e.g., annealing) of the first thin film 30 may be performed during the trimming of the first thin film 30.

Figure 8:
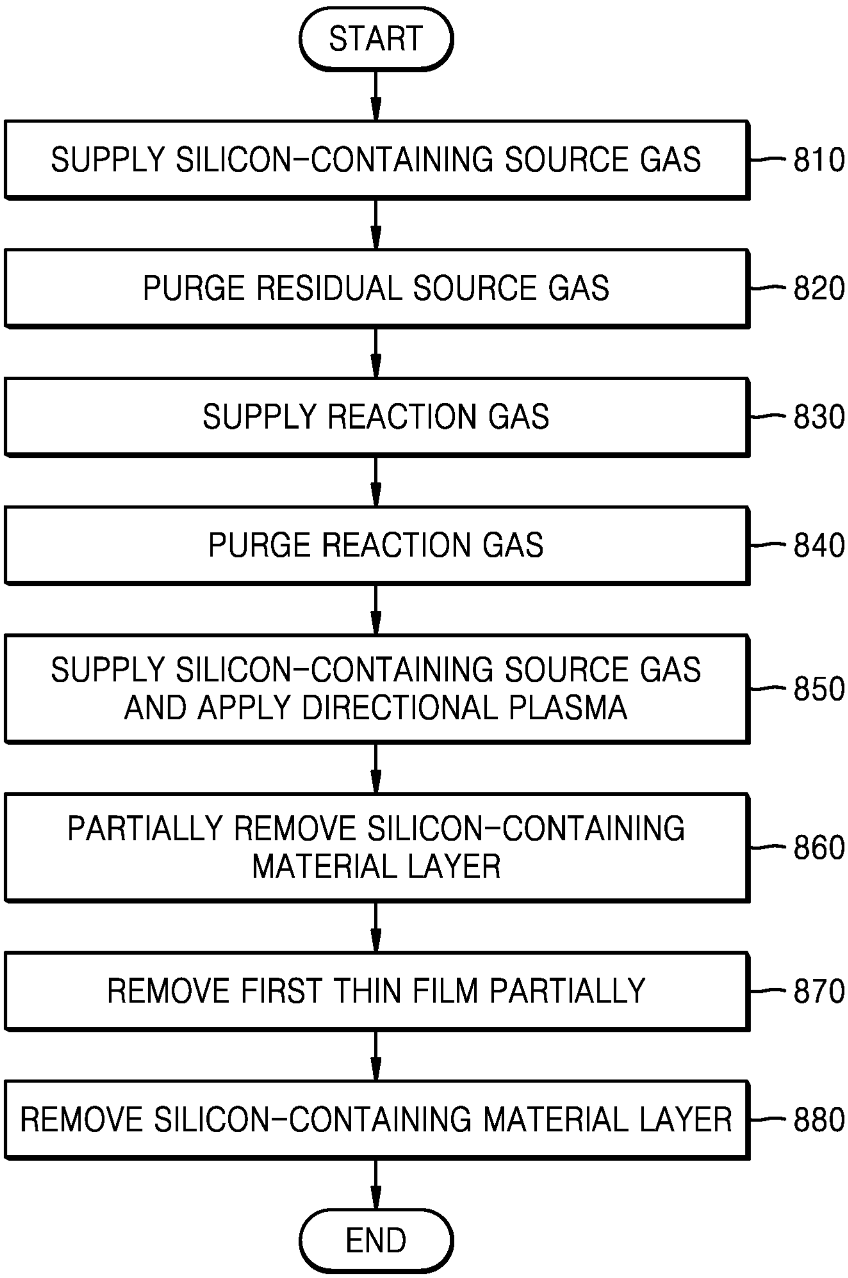
FIG. 8 is a flowchart of a substrate processing method according to embodiments of the inventive concept.

FIG. 8 is a flowchart of a substrate processing method according to embodiments of the inventive concept. The substrate processing method according to the embodiments may be a variation of the substrate processing method according to the above-described embodiments. Hereinafter, repeated descriptions of the embodiments will not be given herein.

Referring to FIG. 8, in operation 810, a silicon-containing source gas is supplied onto a structure (e.g., a stepwise structure). A first silicon-containing material layer may be formed by adsorbing the silicon-containing source gas onto the structure. In operation 820, after the first silicon-containing material layer is formed, a residual source gas is purged.

Thereafter, in operation 830, a reaction gas reactive with the silicon-containing source gas is supplied. Because the first silicon-containing material layer adsorbed on the structure reacts with the reaction gas, a first thin film may be formed on the structure. In operation 840, after the first thin film is formed, a residual reaction gas is purged.

In operation 850, when the first thin film is formed, a silicon-containing source gas is supplied on the first thin film to form a second silicon-containing material layer adsorbed on the first thin film. Directional plasma may be applied while supplying the silicon-containing source gas, and the second silicon-containing material layer may be partially densified or weakened by the directional plasma.

Thereafter, in operation 860, first isotropic etching is performed on the second silicon-containing material layer to partially remove the second silicon-containing material layer. The first thin film may be partially exposed by the first isotropic etching. Because properties of the second silicon-containing material layer are partially changed by the directional plasma, patterning of the second silicon-containing material layer may be achieved only by isotropic etching without a separate lithography process, and the first thin film may be partially exposed.

Thereafter, in operation 870, the exposed portion of the first thin film is removed. For example, isotropic etching may be performed on the exposed portion of the first thin film by using second isotropic etching. Because the second silicon-containing material layer exists on an unexposed portion of the first thin film, the unexposed portion of the first thin film may remain after the second isotropic etching. Therefore, patterning of the first thin film may be achieved only by isotropic etching without a separate lithography process.

Thereafter, in operation 880, the second silicon-containing material layer is removed. For example, the second silicon-containing material layer may be removed using anisotropic etching.

According to embodiments of the inventive concept as described above, because a relatively thin material layer adsorbed (e.g., chemically adsorbed) with a source gas is formed on a thin film to be patterned (i.e., the first thin film) and selective densification/weakening is performed on the material layer without using direct selective densification/weakening of the thin film to be patterned, a thin film may be selectively deposited on a pattern structure (e.g., a stepwise structure) without a photolithography process and without increasing power.

Figure 9:
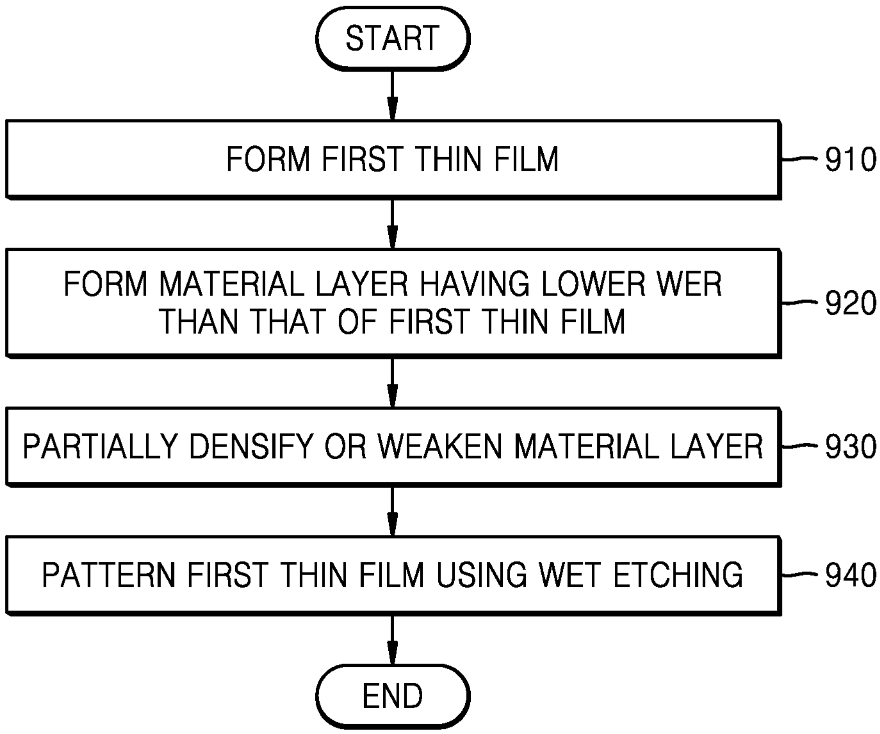
FIG. 9 is a flowchart of a substrate processing method according to embodiments of the inventive concept.

FIG. 9 is a flowchart of a substrate processing method according to embodiments of the inventive concept. The substrate processing method according to the embodiments may be a variation of the substrate processing method according to the above-described embodiments. Hereinafter, repeated descriptions of the embodiments will not be given herein.

Referring to FIG. 9, in operation 910, a first thin film is formed on the structure. The first thin film may be formed through any kind of deposition process (e.g., deposition processes such as sputtering, CVD, PVD, and ALD), and a first gas may be used during the deposition process. In an example, the first gas may include components of the first thin film. In a further example, the first gas may include an elemental component that is resistant to an etchant used in a subsequent etching process.

Thereafter, in operation 920, a material layer having wet etch resistance greater than that of the first thin film is formed on the first thin film. For example, a material layer having a lower WER than that of the first thin film may be formed. The forming of the material layer may include forming a material layer adsorbed on the first thin film by supplying the first gas. In other words, during the forming of the material layer, the first gas used in the forming of the first thin film may be used.

In operation 930, after the material layer is formed or during the forming of the material layer, partial densification or weakening of the material layer is performed. By applying certain energy (e.g., plasma) towards the material layer, properties of the material layer may be partially changed. In this case, a WER of the material layer may also be partially changed.

Thereafter, in operation 940, the first thin film is patterned using wet etching. In more detail, wet etching is performed on a material layer having partially different WER properties, so that a portion of the material layer may be removed, and consequently, a part of a lower portion of the material layer may be exposed. Thereafter, an exposed portion of the first thin film is removed by continuous wet etching, so that the first thin film may be patterned.

Figure 10:
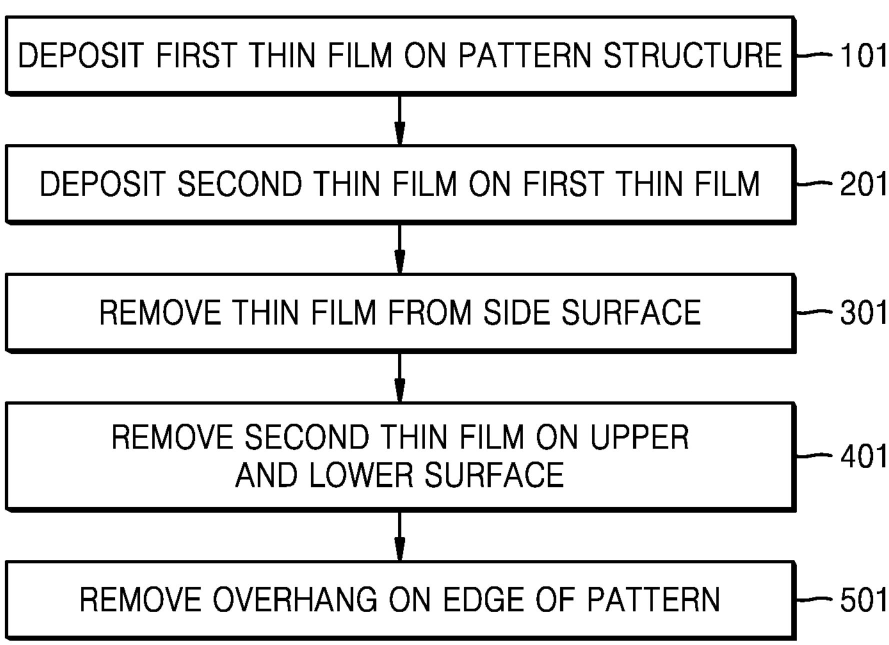
FIG. 10 is a process flowchart of a substrate processing method according to embodiments of the inventive concept.
Figure 11:
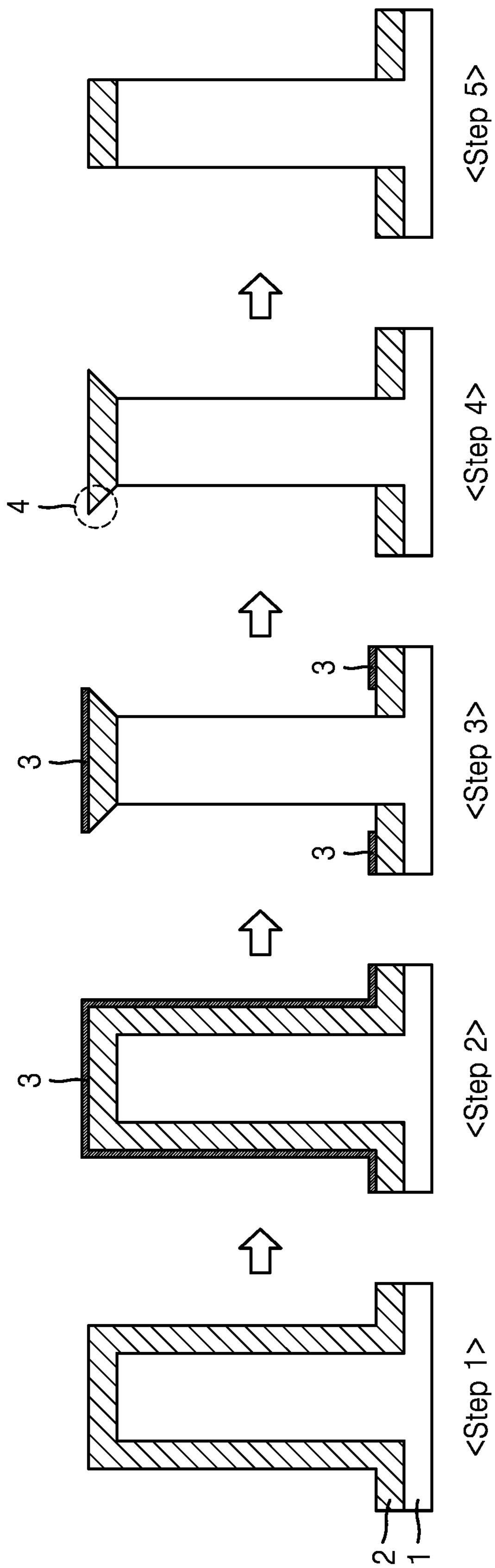
FIG. 11 is a schematic view of a process in which the process of FIG. 10 is performed.

In addition to the above-described embodiments, the disclosure discloses a method of increasing etch selectivity of upper and side portions of a material having low etch resistance deposited on a pattern structure. FIG. 10 is a process flowchart of a substrate processing method according to the disclosure, and FIG. 11 is a schematic view of a process in which the process of FIG. 10 is performed.

First step 101: In this step, a first thin film 2 is uniformly deposited on a surface of a pattern structure 1 to form a conformal film. The thin film deposition is performed by a PEALD method, and a precursor, a purge gas, and a reaction gas are alternately supplied to activate at least one gas by plasma.

Second step 201: In this step, a second thin film 3 is deposited as a mask layer on the first thin film. The second thin film 3 is formed by dissociating a precursor molecule with plasma while supplying only a precursor and a purge gas without supplying a reaction gas. The dissociated precursor molecule is deposited on the first thin film 2. Because the second thin film 3 has different wet etch resistance from the first thin film 2 and does not supply a reaction gas, a thin film is not formed by chemical bonding between heterogeneous elements and dissociated precursor constituent elements are densified by radicals. That is, in this step, a mask layer having different etch resistance is introduced to increase selectivity.

Third step 301: In this step, the thin film is selectively removed through wet etching. In particular, in the second step, the first thin film and the second thin film on upper and lower surfaces of the second thin film (mask layer), which are densified by an ion bombardment effect and are simultaneously etch resistant, remain, and the second thin film and the first thin film on a side surface that are less dense are removed. For example, wet etching is performed using a 100:1 hydrofluoric acid (HF) solution.

Fourth step 401: In this step, the second thin film on the upper and lower surfaces is removed. The removal of the second thin film is performed by dry etching. The second thin film is removed using an etching gas containing fluorine (F), such as $C_xF_{2x}$.

Fifth step 501: In this step, an overhang 4 remaining on an edge of the upper surface is removed. The removal of the overhang 4 proceeds with a sputtering process. For example, in order to enhance straightness of ions, low frequency Ar plasma is supplied to remove the overhang 4.

Figure 12:
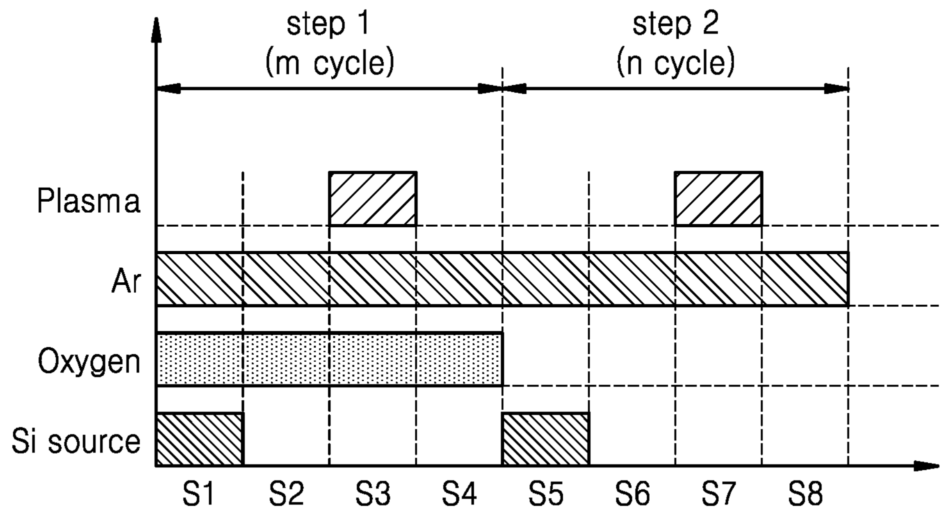
FIG. 12 is a view showing an embodiment of the first and second steps of FIGS. 10 and 11.

FIG. 12 is a view showing an embodiment of the first and second steps of FIGS. 10 and 11. In the first step of FIG. 12, a Si source gas, an oxygen reaction gas, an Ar purge gas and plasma are sequentially supplied to a substrate to deposit a first thin film of $SiO_2$ on a pattern structure on the substrate. This step is repeated several times (m cycles) to uniformly form a first thin film having a thickness of 300 Å on a pattern. Thereafter, in the second step, a second thin film is deposited on the first thin film. In the second thin film, the oxygen reaction gas is not supplied, and the Si source gas, the Ar purge gas and the plasma are sequentially supplied as one cycle which is repeated several times (n cycles), and a second thin film having a thickness of 30 Å is deposited on an upper surface of the pattern. In step 2, because there is no reaction gas, the Si source gas is deposited on the first thin film while being dissociated by an Ar radical. In an embodiment of the disclosure, a Si source containing a carbon element, for example, an aminosilane-based Si source containing a methyl group ($—C_nH_{2n+1}$) or an ethyl group ($—C_nH_{2n+2}$) is used. In more detail, in an embodiment of the disclosure, a diisopropylaminosilane (DIPAS) Si source is used. Therefore, the second thin film deposited on the first thin film includes Si and C components. In addition, the second thin film may include oxygen elements. For example, on locations above the first thin film contacting the second thin film, some of oxygen elements from an $O_2$-terminated site or dangling bonded oxygens of the first thin film of $SiO_2$ may be included in the second thin film. Therefore, the second thin film may include a small amount of oxygen components. The second thin film including the carbon components and the oxygen components may be expressed as Si(O)C.

As described above, because the second thin film is not a film formed by chemical bonding between heterogeneous elements, the bonding force may be weaker than that of the first thin film. Therefore, the thin film is densified while supplying plasma. In addition, the second thin film is not a thin film by chemical bonding, and a thickness of the second thin film on a side of the pattern is less than a thickness of the second thin film on the upper surface of the pattern. Furthermore, the second thin film on the side of the pattern also has a small densification effect by plasma. Therefore, the second thin film on the side of the pattern has lower wet etch resistance than that of the second thin film on the upper surface of the pattern. On the other hand, because the second thin film on the upper surface of the pattern is arranged on a pattern surface in the direction perpendicular to a direction of a radical, the second thin film is densified by plasma and has strong wet etch resistance. As described above, according to embodiments of the inventive concept, a second thin film having different wet etch resistance may be selectively formed.

Table 1 below shows an example of process conditions of the first step described above.

TABLE 1

| Items | | Conditions |
|---|---|---|
| Process temperature (° C.) | | Room temperature to 550° C. (preferably 50° C. to 300° C.) |
| Process pressure (Torr) | | 1.0 Torr to 5.0 Torr (preferably 2.0 Torr to 3.0 Torr) |
| Si precursor | | DIPAS (diisopropylaminosilane) |
| Reactant | | O2 |
| Purge gas | | Ar |
| First step (SiO2 layer forming step) | | |
| Process time (sec) | Source supply (S1) | 0.05 sec to 2.0 sec (preferably 0.1 sec to 1.0 sec) |
| | Source purge (S2) | 0.05 sec to 2.0 sec (preferably 0.1 sec to 1.0 sec) |
| | Plasma application (S3) | 0.05 sec to 2.0 sec (preferably 0.1 sec to 1.0 sec) |
| | Purge (S4) | 0.05 sec to 2.0 sec (preferably 0.1 sec to 1.0 sec) |
| Gas flow rate (sccm) | Source carrier (Ar) | 100 sccm to 10,000 sccm (preferably 600 sccm to 1,200 sccm) |
| | Reactant (O2) | 50 sccm to 400 sccm (preferably 100 sccm to 300 sccm) |
| | Purge gas (Ar) | 1,000 sccm to 10,000 sccm (preferably 3,000 sccm to 6,000 sccm) |
| Plasma conditions | RF power (W) | 100 W to 1,000 W (preferably 200 W to 400 W) |
| | RF frequency | 13 MHz to 100 MHz (preferably 27 MHz to 60 MHz) |

Table 2 below shows an example of the process conditions of the second step described above.

TABLE 2

| Item | | Condition |
|---|---|---|
| Process temperature (° C.) | | Room temperature to 550° C. (preferably 50° C. to 300° C.) |
| Process pressure (Torr) | | 1.0 Torr to 5.0 Torr (preferably 2.0 Torr to 3.0 Torr) |
| Si precursor | | DIPAS (diisopropylaminosilane) |
| Purge gas | | Ar |
| Second step (mask layer forming step) | | |
| Process time (sec) | Source supply (S1) | 0.05 sec to 2.0 sec (preferably 0.1 sec to 1.0 sec) |
| | Source purge (S2) | 0.05 sec to 2.0 sec (preferably 0.1 sec to 1.0 sec) |
| | Plasma application (S3) | 0.05 sec to 2.0 sec (preferably 0.1 sec to 1.0 sec) |
| | Purge (S4) | 0.05 sec to 2.0 sec (preferably 0.1 sec to 1.0 sec) |
| Gas flow rate (sccm) | Source carrier (Ar) | 100 sccm to 10,000 sccm (preferably 600 sccm to 1,200 sccm) |
| | Purge gas (Ar) | 1,000 sccm to 10,000 sccm (preferably 3,000 sccm to 6,000 sccm) |
| Plasma conditions | RF power (W) | 100 W to 1,000 W (preferably 200 W to 400 W) |
| | RF frequency | 13 MHz to 100 MHz (preferably 27 MHz to 60 MHz) |

The RF power applied in the first step of Table 1 and the second step of Table 2 may remain the same. That is, it is not necessary to increase the RF power in the second step in order to increase etch selectivity of thin films on the upper surface and the side of the pattern. This is because the etch selectivity may be increased by introducing two thin films having different wet etch resistances, as described later below. Therefore, the substrate processing method according to the disclosure has a technical effect that may prevent problems such as increased fatigue of a substrate processing device due to an increase in applied RF power, for example, damage to components constituting the substrate processing device and resulting reduction in uptime of the substrate processing device.

An RF frequency of the RF power applied in the second step of Table 2 may remain the same as in step 1, but in another embodiment, relatively low frequency RF power may be applied in the second step. Low-frequency RF power has low ion density compared to high-frequency RF power, but has a technical effect to further increase the density of the second thin film on the upper surface of the pattern because ion straightness is improved. Preferably, an RF frequency of about 300 kHz to about 500 kHz may be applied.

In the case of the third step 301 of FIG. 10, wet etching is performed for 3 minutes in an HF solution diluted to 100:1. Table 3 below shows wet etch resistances to HF of the first $SiO_2$ thin film and the second Si(O)C thin film according to the disclosure. The etch resistance below is measured by depositing each thin film on a flat substrate under the conditions shown in Table 1 and Table 2 and etching the each thin film for 3 minutes in the HF solution diluted to 100:1.

TABLE 3

| | SiO2 | Si(O)C |
|---|---|---|
| WER (Å/min) | ~120 | ~0.88 |

As can be seen from Table 3, the wet etch resistance of the second Si(O)C thin film to HF is significantly greater than that of the first SiO2 thin film. Because the carbon component (C) is known to have strong etch resistance to HF, a precursor containing a carbon component is introduced such that a second thin film may include the carbon component. As described above, the substrate processing method according to the disclosure has a technical effect that may further improve etch selectivity of upper and side surfaces of a pattern without increasing RF power by introducing two thin films with different wet etch resistances or elements with strong etch resistance.

Also, as described above, because the second thin film on a side surface of the pattern is less dense than the second thin film on the upper surface of the pattern, there is a technical effect of promoting etching of the first and second thin films on the side surface of the pattern more than those on the upper surface of the pattern.

TABLE 4 below shows etching conditions of the fourth and fifth steps of FIG. 11.

| Items | | Conditions |
|---|---|---|
| Fourth step (dry etching step) | | |
| $CF_4$ gas | Temperature (° C.) | Room temperature to 550° C. |
| | Pressure (Torr) | 5 Torr or less (preferably 3 Torr or less) |
| | Flow rate (sccm) | 50 sccm to 200 sccm (preferably 100 sccm to 150 sccm) |
| | Supply time (sec) | 5.0 seconds to 20.0 seconds (preferably 10.0 seconds to 15.0 seconds) |
| Fifth step (sputtering step) | | |
| Ar gas | Temperature (° C.) | Room temperature to 550° C. |
| | Pressure (Torr) | 7 Torr or less (preferably 5 Torr or less) |
| | Flow rate (sccm) | 8,000 sccm to 15,000 sccm (preferably 10,000 sccm to 12,000 sccm) |
| | Supply time (sec) | 5.0 seconds to 20.0 seconds (preferably 10.0 seconds to 15.0 seconds) |
| | RF plasma | 400 watt, 430 kHz, 10 seconds. |

Figure 13:
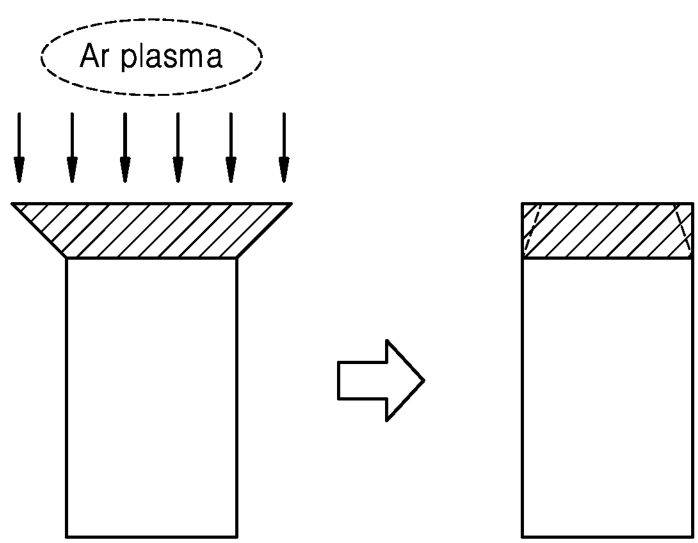
FIG. 13 is a detailed view of a process of the fifth step of FIGS. 10 and 11.

FIG. 13 is a detailed view of the process of the fifth step. Referring to FIG. 13, an Ar radical physically removes an overhang of a first thin film, such as a $SiO_2$ thin film on an upper surface of a pattern. In order to increase a sputtering effect, an Ar gas is supplied, which is heavier than other elements, and low frequency RF power is supplied to enhance straightness of a radical. After sputtering, the overhang is removed, and a portion of the first thin film on the upper surface of the pattern may be etched depending on the size and time of applied RF power (see dashed lines in FIG. 13). In addition, a portion of an upper surface of the first $SiO_2$ thin film on the upper surface of the pattern may be etched together due to sputtering.

According to the disclosure, in order to improve etch selectivity of the first thin film deposited on the pattern, a second thin film having different wet etch resistance from that of the first thin film is formed on the first thin film as a mask layer. In an embodiment according to the disclosure, the second thin film has a high wet etch resistance compared to the first thin film, and has a technical effect of improving etching selectivity of upper and side portions of the pattern without increasing RF power.

In addition, the substrate processing method according to the disclosure has a technical effect of preventing an increase in fatigue of a substrate processing device due to high RF power application.

In addition, in an embodiment according to the disclosure, by selectively forming a film having strong wet etch resistance on an upper surface of the pattern compared to a side surface of the pattern, the substrate processing method has a technical effect that may further accelerate an etching rate of the film on the side surface.

In addition, the substrate processing method according to the disclosure has a technical effect of physically removing the overhang of the thin film on the upper surface of the pattern by realizing etching selectivities of the thin films on the upper and side surfaces of the pattern and by applying a sputtering method to the overhang of the thin film.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing method comprising:

supplying a first gas onto a structure;

supplying a second gas to form a first thin film on the structure;

forming a second material layer by supplying the first gas on the first thin film;

removing a portion of the second material layer to expose a portion of the first thin film;

removing the exposed portion of the first thin film;

removing the second material layer; and trimming the first thin film, wherein the step of trimming the first thin film occurs after the step of removing the second material layer, and wherein the step of trimming comprises:

contacting the first thin film with a low frequency Ar plasma, a sputtering process, or annealing the first thin film.

2. The substrate processing method of claim 1, wherein first plasma is applied during the supplying of the second gas, and second plasma is applied during the forming of the second material layer.

3. The substrate processing method of claim 2, wherein during the supplying of the first gas, a first material layer is formed on the structure, and the second gas is changed to have reactivity with the first material layer by applying the first plasma.

4. The substrate processing method of claim 2, wherein the first gas is dissociated by the application of the second plasma to form the second material layer.

5. The substrate processing method of claim 2, wherein the removing of the portion of the second material layer and the removing of the exposed portion of the first thin film are performed by isotropic etching.

6. The substrate processing method of claim 5, wherein the removing of the portion of the second material layer and the removing of the exposed portion of the first thin film are performed using an identical etchant.

7. The substrate processing method of claim 5, wherein the second plasma comprises directional plasma, and properties of the second material layer are partially changed by the second plasma.

8. The substrate processing method of claim 7, wherein during the isotropic etching, a remaining portion of the second material layer functions as a mask, so that a portion of the first thin film under the second material layer remains and a remaining portion of the first thin film is removed.

9. The substrate processing method of claim 2, wherein a frequency of first power supplied during the application of the first plasma is greater than a frequency of second power supplied during the application of the second plasma.

10. The substrate processing method of claim 1, wherein the first gas comprises a silicon source including a carbon element, and the second material layer comprises a silicon element and a carbon element.

11. The substrate processing method of claim 10, wherein the first thin film further comprises at least one of silicon oxide and silicon nitride, and the second material layer further comprises oxygen or nitrogen.

12. The substrate processing method of claim 1, wherein the second material layer has etch selectivity with respect to the first thin film.

13. The substrate processing method of claim 12, wherein the second material layer comprises a carbon element, and a wet etching rate (WER) for hydrogen fluoride (HF) of the first thin film is greater than a WER for hydrogen fluoride of the second material layer.

14. The substrate processing method of claim 1, wherein with respect to a certain etchant, a first portion of the second material layer has a first WER, a second portion of the second material layer has a second WER greater than the first WER, and the first thin film has a third WER greater than the second WER.

15. The substrate processing method of claim 1, wherein the trimming of the first thin film comprises: removing an overhang of the first thin film.

16. The substrate processing method of claim 1, wherein trimming the first thin film comprises contacting the first thin film with the low frequency Ar plasma.

17. The substrate processing method of claim 1, wherein trimming the first thin film comprises the sputtering process.

18. The substrate processing method of claim 1, wherein trimming the first thin film comprises annealing the first thin film.

19. A substrate processing method comprising:

supplying a silicon-containing source gas on a structure to form a first silicon-containing material layer adsorbed on the structure;

supplying a reaction gas reactive with the silicon-containing source gas to form a first thin film on the structure;

supplying the silicon-containing source gas on the first thin film and applying directional plasma to form a second silicon-containing material layer adsorbed on the first thin film, wherein the second silicon-containing material layer is partially densified or weakened by the directional plasma;

performing isotropic etching on the second silicon-containing material layer to expose a portion of the first thin film;

removing the exposed portion of the first thin film;

performing isotropic etching to remove the second silicon-containing material layer; and trimming the first thin film, wherein the step of trimming comprises:

contacting the first thin film with a low frequency Ar plasma, a sputtering process, or annealing the first thin film.

20. A substrate processing method comprising:

forming a first thin film on a structure;

forming a material layer having wet etch resistance greater than that of the first thin film on the first thin film;

removing a portion of the material layer using wet etching to expose a portion of the first thin film;

removing the exposed portion of the first thin film; and trimming the first thin film, wherein the step of trimming comprises:

contacting the first thin film with a low frequency Ar plasma, a sputtering process, or annealing the first thin film.

21. The substrate processing method of claim 20, wherein the forming of the material layer comprises forming a material layer adsorbed on the first thin film by supplying a first gas.

22. The substrate processing method of claim 20, wherein during the forming of the material layer, the first gas used in the forming of the first thin film is used.

* * * * *